United States Patent
Lee et al.

(10) Patent No.: US 12,082,487 B2
(45) Date of Patent: *Sep. 3, 2024

(54) ORGANOMETALLIC COMPOUND AND ORGANIC LIGHT-EMITTING DEVICE INCLUDING THE SAME

(71) Applicant: Samsung Display Co., Ltd., Yongin-si (KR)

(72) Inventors: Eunyoung Lee, Yongin-si (KR); Sunwoo Kang, Yongin-si (KR); Soobyung Ko, Yongin-si (KR); Sungbum Kim, Yongin-si (KR); Jaejin Lyu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 667 days.

This patent is subject to a terminal disclaimer.

(21) Appl. No.: 17/306,593

(22) Filed: May 3, 2021

(65) Prior Publication Data
US 2021/0367167 A1 Nov. 25, 2021

(30) Foreign Application Priority Data
May 14, 2020 (KR) .................. 10-2020-0057825

(51) Int. Cl.
*H01L 51/00* (2006.01)
*H10K 85/30* (2023.01)
*H10K 50/15* (2023.01)
*H10K 50/16* (2023.01)
(Continued)

(52) U.S. Cl.
CPC .......... *H10K 85/346* (2023.02); *H10K 50/15* (2023.02); *H10K 50/16* (2023.02); *H10K 50/171* (2023.02); *H10K 50/18* (2023.02)

(58) Field of Classification Search
None
See application file for complete search history.

(56) References Cited

U.S. PATENT DOCUMENTS

| | | | |
|---|---|---|---|
| 7,381,479 B2 | 6/2008 | Lamansky et al. | |
| 7,393,599 B2 | 7/2008 | Thompson et al. | |
| 7,585,573 B2 | 9/2009 | Lee et al. | |

(Continued)

FOREIGN PATENT DOCUMENTS

| | | |
|---|---|---|
| CN | 104370974 A | 2/2015 |
| CN | 108250248 A | 7/2018 |

(Continued)

OTHER PUBLICATIONS

Extended European Search Report dated Sep. 2, 2021, for corresponding European Patent Application No. 21173959.4 (7 pages).

*Primary Examiner* — Jay Yang
(74) *Attorney, Agent, or Firm* — Lewis Roca Rothgerber Christie LLP

(57) ABSTRACT

An organometallic compound is represented by Formula 1 and an organic light-emitting device includes the same. The organic light-emitting device includes: a first electrode; a second electrode facing the first electrode; and an interlayer located between the first electrode and the second electrode and including an emission layer, wherein the interlayer includes at least one of the organometallic compound represented by Formula 1.

20 Claims, 3 Drawing Sheets

(51) Int. Cl.
  *H10K 50/17*  (2023.01)
  *H10K 50/18*  (2023.01)

(56) References Cited

U.S. PATENT DOCUMENTS

| | | |
|---|---|---|
| 7,776,458 B2 | 8/2010 | Ragini et al. |
| 8,680,760 B2 | 3/2014 | Cheng et al. |
| 9,051,344 B2 | 6/2015 | Lin et al. |
| 9,318,725 B2 | 4/2016 | Li |
| 9,385,329 B2 | 7/2016 | Li et al. |
| 9,923,155 B2 | 3/2018 | Li et al. |
| 10,008,679 B2 | 6/2018 | Chen et al. |
| 10,381,580 B2 | 8/2019 | Xia et al. |
| 11,849,630 B2 * | 12/2023 | Lee .............. C09K 11/06 |
| 2005/0287394 A1 | 12/2005 | Yang et al. |
| 2008/0018221 A1 | 1/2008 | Egen et al. |
| 2011/0186871 A1 * | 8/2011 | Vaufrey ............ H10K 50/852 257/E51.018 |
| 2014/0309428 A1 | 10/2014 | Egen et al. |
| 2014/0364605 A1 | 12/2014 | Li et al. |
| 2015/0105556 A1 | 4/2015 | Li et al. |
| 2017/0040554 A1 | 2/2017 | Brooks et al. |
| 2018/0026210 A1 | 1/2018 | Dyatkin et al. |
| 2018/0182981 A1 | 6/2018 | Chen et al. |
| 2018/0301641 A1 | 10/2018 | Li et al. |
| 2018/0305385 A1 | 10/2018 | Chen et al. |
| 2018/0337339 A1 * | 11/2018 | Senkovskyy ........ C07F 9/65522 |
| 2018/0337350 A1 | 11/2018 | Li et al. |
| 2018/0362567 A1 | 12/2018 | Hwang et al. |
| 2018/0375036 A1 | 12/2018 | Chen et al. |
| 2019/0036042 A1 | 1/2019 | Kim et al. |
| 2019/0074455 A1 | 3/2019 | Chen et al. |
| 2019/0109287 A1 | 4/2019 | Wu et al. |
| 2019/0157579 A1 | 5/2019 | Jeon et al. |
| 2019/0214584 A1 | 7/2019 | Chen et al. |
| 2019/0296254 A1 | 9/2019 | Ko et al. |
| 2019/0319196 A1 | 10/2019 | Sim et al. |
| 2019/0393431 A1 | 12/2019 | Layek et al. |
| 2020/0152891 A1 | 5/2020 | Li et al. |
| 2020/0216481 A1 | 7/2020 | Chen et al. |

FOREIGN PATENT DOCUMENTS

| | | |
|---|---|---|
| CN | 109111487 A | 1/2019 |
| CN | 109810145 A | 5/2019 |
| CN | 110299457 A | 10/2019 |
| EP | 3 486 250 A1 | 5/2019 |
| JP | 2006-148012 A | 6/2006 |
| JP | 2007-045742 A | 2/2007 |
| KR | 10-0730115 B1 | 6/2007 |
| KR | 10-2015-0043225 A | 4/2015 |
| KR | 10-2015-0118549 A | 10/2015 |
| KR | 10-2016-0012941 A | 2/2016 |
| KR | 10-2018-0077023 A | 7/2018 |
| KR | 10-2018-0137311 A | 12/2018 |
| KR | 10-2019-0000812 A | 1/2019 |
| KR | 10-2013113 B1 | 8/2019 |
| KR | 10-2020-0000370 A | 1/2020 |
| WO | WO 2012/121936 A2 | 9/2012 |

* cited by examiner

ORGANOMETALLIC COMPOUND AND ORGANIC LIGHT-EMITTING DEVICE INCLUDING THE SAME

CROSS-REFERENCE TO RELATED APPLICATION

This application claims priority to and the benefit of Korean Patent Application No. 10-2020-0057825, filed on May 14, 2020, in the Korean Intellectual Property Office, the entire content of which is hereby incorporated by reference.

BACKGROUND

1. Field

One or more embodiments of the present disclosure relate to an organometallic compound and an organic light-emitting device including the same.

2. Description of Related Art

Organic light-emitting devices (OLEDs) are self-emission devices that, as compared with other devices in the art, have wide viewing angles, high contrast ratios, short response times, and excellent characteristics in terms of brightness, driving voltage, and response speed, and produce full-color images.

OLEDs may include a first electrode located on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition (or relax) from an excited state to a ground state to thereby generate light.

SUMMARY

Provided are novel organometallic compounds and organic light-emitting devices including the same.

Additional aspects of embodiments will be set forth in part in the description which follows and, in part, will be apparent from the description, or may be learned by practice of the presented embodiments of the disclosure.

Provided is an organometallic compound represented by Formula 1:

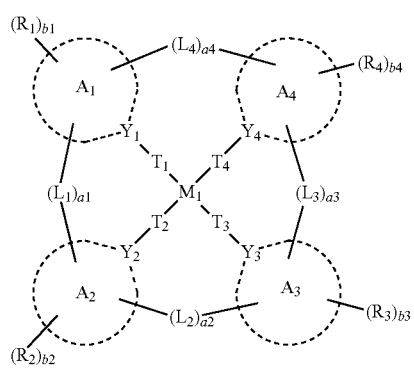

Formula 1 wherein, in Formula 1, $M_1$ may be selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), Terbium (Tb), and thulium (Tm), $Y_1$ to $Y_4$ may each independently be selected from a carbon atom (C) and a nitrogen atom (N), $T_1$ to $T_4$ may each independently be a chemical bond (e.g., a single covalent bond or a dative bond or coordinate covalent bond), O, S, B(R'), N(R'), P(R'), C(R')(R''), Si(R')(R''), Ge(R')(R''), C(=O), B(R')(R''), N(R')(R''), or P(R')(R''), when $T_1$ is a chemical bond, $Y_1$ and $M_1$ directly bond to each other, when $T_2$ is a chemical bond, $Y_2$ and $M_1$ directly bond to each other, when $T_3$ is a chemical bond, $Y_3$ and $M_1$ directly bond to each other, and when $T_4$ is a chemical bond, $Y_4$ and $M_1$ directly bond to each other, two bonds selected from a bond between $Y_1$ or $T_1$ and $M_1$, a bond between $Y_2$ or $T_2$ and $M_1$, a bond between $Y_3$ or $T_3$ and $M_1$ and a bond between $Y_4$ or $T_4$ and $M_1$ may each be a coordination bond (e.g., a dative bond or coordinate covalent bond), and the other two bonds may each be a covalent bond, $A_1$ to $A_4$ may each independently be selected from a $C_5$-$C_{60}$ carbocyclic group and a $C_1$-$C_{60}$ heterocyclic group, $L_1$ to $L_4$ may each independently be selected from a single bond, a double bond, *—N($R_5$)—*', *—B($R_5$)—*', *—P($R_5$)—*', *—C($R_5$)($R_6$)—*', *—Si($R_5$)($R_6$)—*', *—Ge($R_5$)($R_6$)—*', *—S—*', *—Se—*', *—O—*', *—C(=O)—*', *—S(=O)—*', *—S(=O)$_2$—*', *—C($R_5$)=*', *=C($R_5$)—*', *—C($R_5$)=C($R_6$)—*', *—C(=S)—*', and *—C≡C—*', a1 to a4 may each independently be an integer selected from 0 to 3, and, when a1 is 0, $A_1$ and $A_2$ may not be linked to each other, when a2 is 0, $A_2$ and $A_3$ may not be linked to each other, when a3 is 0, $A_3$ and $A_4$ may not be linked to each other, and when a4 is 0, $A_4$ and $A_1$ may not be linked to each other, the sum of a1, a2, a3, and a4 may be equal to or greater than 1, at least one of $L_1$ to $L_4$ may be *—$CF_2$—*', R', R'', and $R_1$ to $R_6$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), b1 to b4 may each independently be an integer selected from 1 to 20, any two neighboring groups of $R_1$ to $R_6$ may optionally be linked to each other to form a substituted or unsubstituted $C_5$-$C_{60}$ carbocyclic group or a substituted or unsubstituted $C_1$-$C_{60}$ heterocyclic group, \* and \*' each indicate a binding site to a neighboring atom, at least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si$(Q_{11})(Q_{12})(Q_{13})$, —N$(Q_{11})(Q_{12})$, —B$(Q_{11})(Q_{12})$, —C(=O)$(Q_{11})$, —S(=O)$_2(Q_{11})$, and —P(=O)$(Q_{11})(Q_{12})$, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si$(Q_{21})(Q_{22})(Q_{23})$, —N$(Q_{21})(Q_{22})$, —B$(Q_{21})(Q_{22})$, —C(=O)$(Q_{21})$, —S(=O)$_2(Q_{21})$, and —P(=O)$(Q_{21})(Q_{22})$, and —Si$(Q_{31})(Q_{32})(Q_{33})$, —N$(Q_{31})(Q_{32})$, —B$(Q_{31})(Q_{32})$, —C(=O)$(Q_{31})$, —S(=O)$_2(Q_{31})$, and —P(=O)$(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amino group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

Another aspect of an embodiment provides an organic light-emitting device including a first electrode, a second electrode, and an interlayer including an emission layer and located between the first electrode and the second electrode, wherein the interlayer includes at least one organometallic compound represented by Formula 1.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
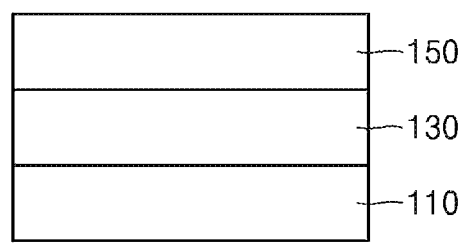
FIG. 1 is a schematic view of an organic light-emitting device according to an embodiment of the present disclosure.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

An aspect of an embodiment of the present disclosure provides an organometallic compound represented by Formula 1 below:

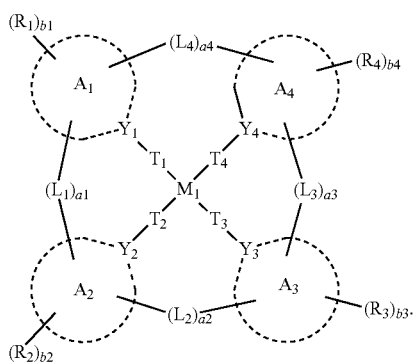

Formula 1

$M_1$ in Formula 1 may be selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm).

In an embodiment, $M_1$ may be selected from Pt, Pd, Cu, Ag, Au, Rh, Ir, Ru, and Os.

In an embodiment, $M_1$ may be Pt, but embodiments of the present disclosure are not limited thereto.

$Y_1$ to $Y_4$ in Formula 1 may each independently be selected from a carbon atom (C) and a nitrogen atom (N), $T_1$ to $T_4$ may each independently be a chemical bond, O, S, B(R'), N(R'), P(R'), C(R')(R''), Si(R')(R''), Ge(R')(R''), C(=O), B(R')(R''), N(R')(R''), or P(R')(R''), when $T_1$ is a chemical bond, $Y_1$ and $M_1$ directly bond to each other, when $T_2$ is a chemical bond, $Y_2$ and $M_1$ directly bond to each other, when $T_3$ is a chemical bond, $Y_3$ and $M_1$ directly bond to each other, and when $T_4$ is a chemical bond, $Y_4$ and $M_1$ directly bond to each other, two bonds selected from a bond between $Y_1$ or $T_1$ and $M_1$, a bond between $Y_2$ or $T_2$ and $M_1$, a bond between $Y_3$ or $T_3$, and $M_1$ and a bond between $Y_4$ or $T_4$ and $M_1$ may each be a coordination bond (e.g., a dative bond or coordinate covalent bond) and the other two bonds may each be a covalent bond.

In an embodiment, $T_1$ to $T_4$ may each be a chemical bond, and at least one selected from a bond between $Y_1$ and $M_1$ and a bond between $Y_2$ and $M_1$ may be a coordination bond (e.g., a dative bond or coordinate covalent bond).

In an embodiment, $Y_1$ to $Y_3$ may each be C and $Y_4$ may be N.

$A_1$ to $A_4$ in Formula 1 may each independently be selected from a $C_5$-$C_{60}$ carbocyclic group and a $C_1$-$C_{60}$ heterocyclic group.

In an embodiment, $A_1$ to $A_4$ may each independently be selected from:

a benzene group, a naphthalene group, an anthracene group, a phenanthrene group, a triphenylene group, a pyrene group, a chrysene group, a cyclopentane group, a cyclopentadiene group, a cyclohexane group, a cyclohexene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, 1,2,4-triazole group, a tetrazole group, a 2,3-dihydrotriazole group, an azasilole group, a diazasilole group, a triazasilole group, an oxazole group, an isooxazole group, a thiazole group, an isothiazole group, an oxadiazole group, a thiadiazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

In an embodiment, at least one of $A_1$ to $A_4$ may be a 5-membered ring having two or more N(s) or a condensed cyclic group including the 5-membered ring having two or more N(s), and at least one of $A_1$ to $A_4$ may be a 5-membered ring having one or more N(s) or a condensed cyclic group including the 5-membered ring having one or more N(s).

In an embodiment, $A_1$ may be selected from an imidazole group and a benzimidazole group.

In an embodiment, $A_2$ may be selected from a benzene group, a naphthalene group, an anthracene group, and a phenanthrene group.

In an embodiment, $A_3$ may be selected from an indole group, a carbazole group, an indolopyridine group, and an indolopyrimidine group.

In an embodiment, $A_4$ may be selected from a pyridine group, a pyrimidine group, a pyrazine group, a pyridazine group, and a triazine group.

According to an embodiment, $A_1$ may be a group represented by one of Formulae 2A-1 to 2A-17, $A_2$ may be a group represented by one of Formulae 2B-1 to 2B-15, $A_3$ may be a group represented by one of Formulae 2C-1 to 2C-17, and $A_4$ may be a group represented by one of Formulae 2D-1 to 2D-16:

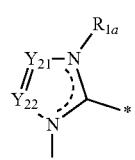

2A-1

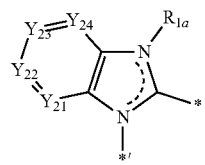

2A-2

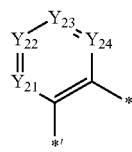

2A-3

-continued
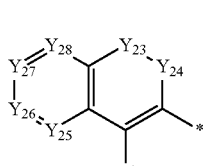
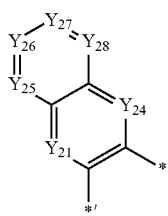
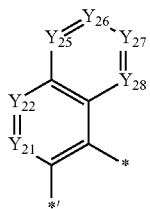
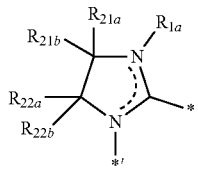
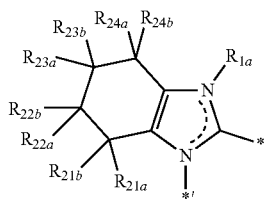
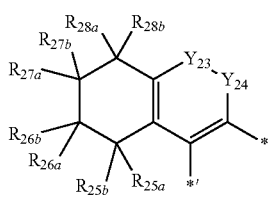
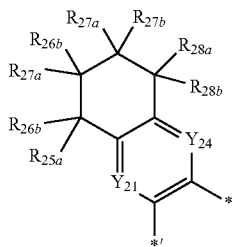
-continued
2A-4
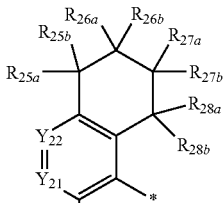
2A-11
2A-5
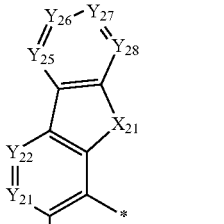
2A-12
2A-6
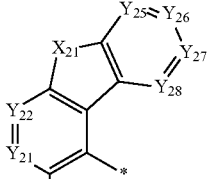
2A-13
2A-7
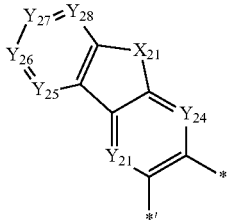
2A-14
2A-8
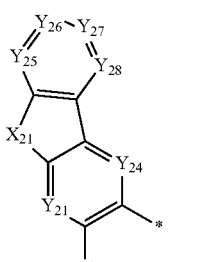
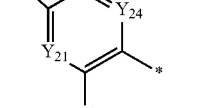
2A-15
2A-9
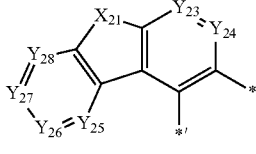
2A-16
2A-10
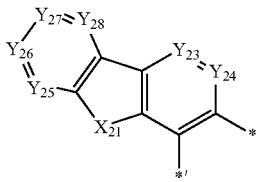
2A-17

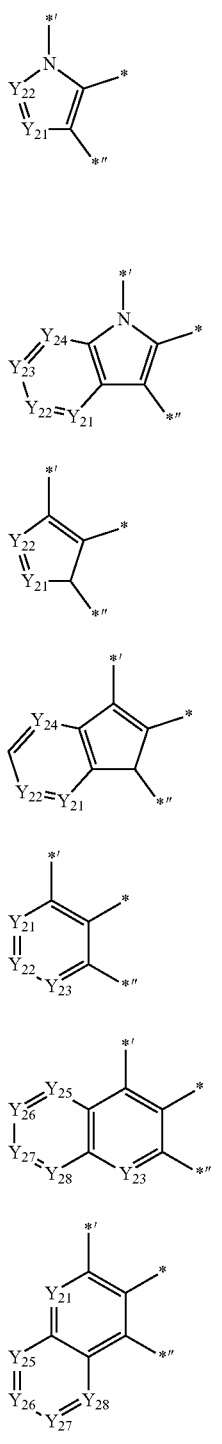
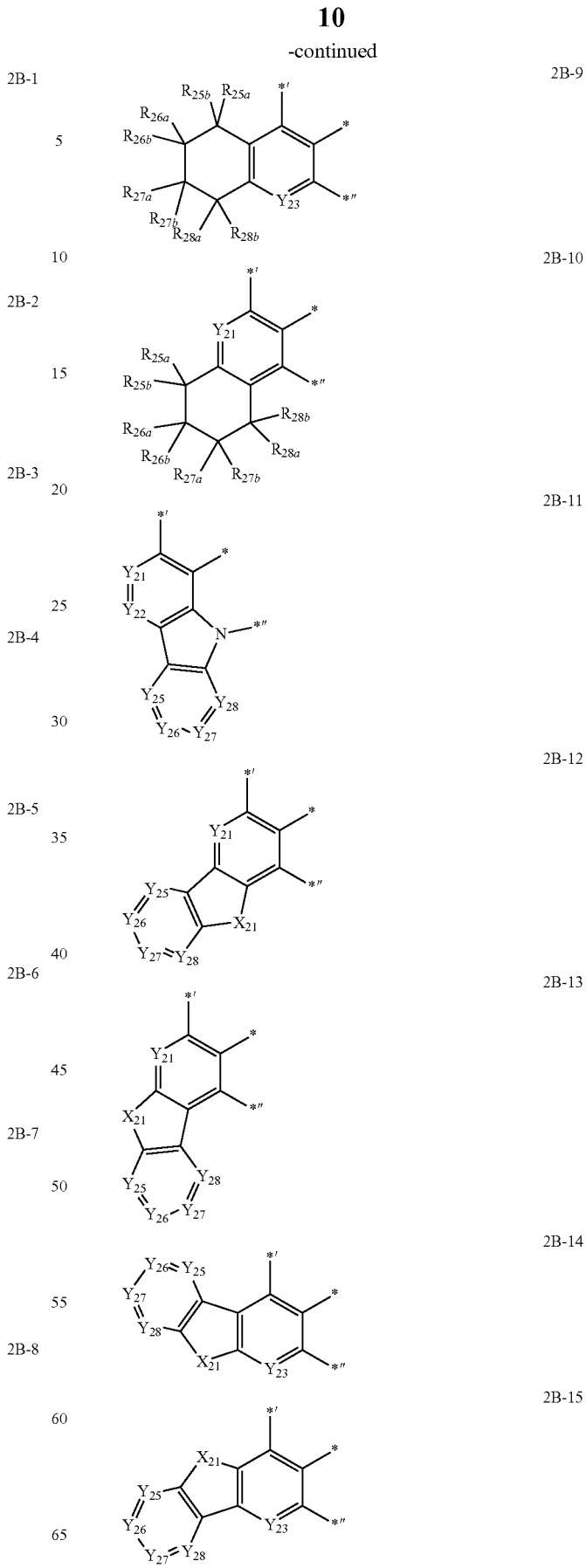

-continued
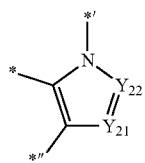
2C-1
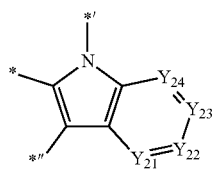
2C-2
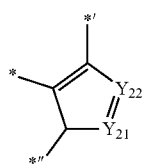
2C-3
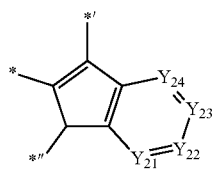
2C-4
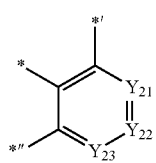
2C-5
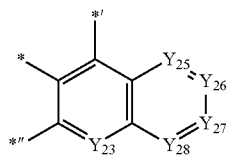
2C-6
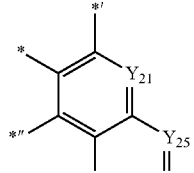
2C-7
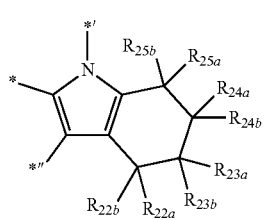
2C-8
-continued
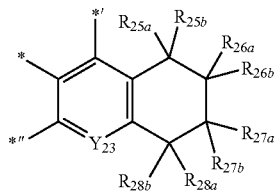
2C-9
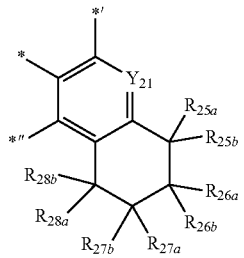
2C-10
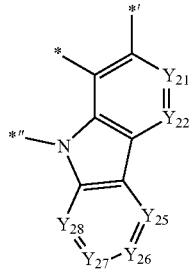
2C-11
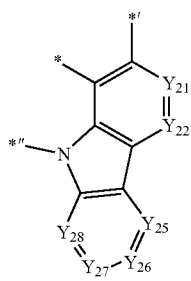
2C-12
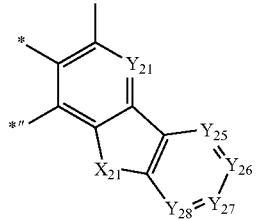
2C-13
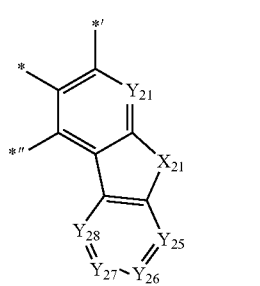
2C-14
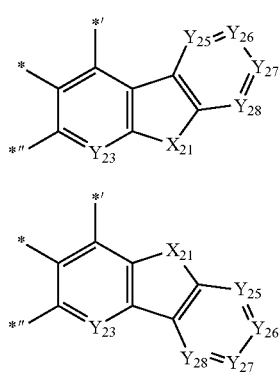
2C-15

-continued 2C-16, 2C-17, 2D-1, 2D-2, 2D-3, 2D-4, 2D-5, 2D-6, 2D-7, 2D-8, 2D-9, 2D-10, 2D-11, 2D-12

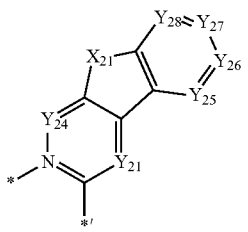

2D-13

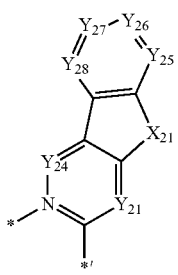

2D-14

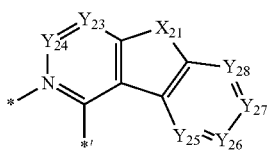

2D-15

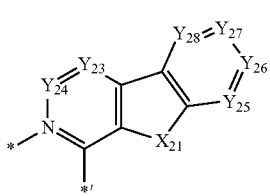

2D-16 wherein, in Formulae 2A-1 to 2A-17, Formulae 2B-1 to 2B-15, Formulae 2C-1 to 2C-17, and Formulae 2D-1 to 2D-16, $Y_{21}$ may be N or $C(R_{21})$, $Y_{22}$ may be N or $C(R_{22})$, $Y_{23}$ may be N or $C(R_{23})$, $Y_{24}$ may be N or $C(R_{24})$, $Y_{25}$ may be N or $C(R_{25})$, $Y_{26}$ may be N or $C(R_{26})$, and $Y_{27}$ may be N or $C(R_{27})$, and $Y_{28}$ may be N or $C(R_{28})$, $X_{21}$ may be $N(R_{21})$ or $C(R_{21})(R_{22})$, $R_{1a}$, $R_{4a}$, $R_{21}$ to $R_{28}$, $R_{21a}$ to $R_{28a}$, and $R_{21b}$ to $R_{28b}$ may be the same as described in connection with R', R", and $R_1$ to $R_6$,

* indicates a binding site to a neighboring $T_1$, $T_2$, $T_3$, or $T_4$, and *' and *" each indicate a binding site to a neighboring $L_1$, $L_2$, $L_3$, or $L_4$.

In an embodiment, $A_1$ may be a group represented by Formula 2A-1 or Formula 2A-2.

In an embodiment, $R_{1a}$ in Formula 2A-1 and Formula 2A-2 may not be hydrogen.

In an embodiment, $R_{1a}$ in Formula 2A-1 and Formula 2A-2 may be selected from a $C_1$-$C_{20}$ alkyl group, a $C_6$-$C_{20}$ aryl group, a $C_1$-$C_{20}$ heteroaryl group; and a $C_1$-$C_{20}$ alkyl group, a $C_6$-$C_{20}$ aryl group, and a $C_1$-$C_{20}$ heteroaryl group, each substituted with at least one selected from deuterium, a $C_1$-$C_{20}$ alkyl group, a $C_6$-$C_{20}$ aryl group, a $C_1$-$C_{20}$ heteroaryl group, a $C_1$-$C_{20}$ alkyl group substituted with at least one deuterium, and a $C_6$-$C_{20}$ aryl group substituted with at least one deuterium.

In an embodiment, $A_2$ may be a group represented by Formula 2B-5.

In an embodiment, in Formula 2B-5, $Y_{21}$ may be $C(R_{21})$, $Y_{22}$ may be $C(R_{22})$, and $Y_{23}$ may be $C(R_{23})$.

In an embodiment, $A_3$ may be a group represented by Formula 2C-16 or 2C-17.

In an embodiment, in Formula 2C-16, $Y_{21}$ may be $C(R_{21})$, $Y_{22}$ may be $C(R_{22})$, $Y_{25}$ may be $C(R_{25})$, $Y_{26}$ may be $C(R_{26})$, $Y_{27}$ may be $C(R_{27})$, and $Y_{28}$ may be $C(R_{28})$.

In an embodiment, $R_{21}$, $R_{22}$, and $R_{25}$ to $R_{28}$ in Formula 2C-16 may be hydrogen.

In an embodiment, $A_4$ may be a group represented by Formula 2D-3.

In an embodiment, in Formula 2D-3, $Y_{21}$ may be $C(R_{21})$, $Y_{22}$ may be $C(R_{22})$, $Y_{23}$ may be $C(R_{23})$, and $Y_{24}$ may be $C(R_{24})$.

In Formula 1, $L_1$ to $L_4$ may each independently be selected from a single bond, a double bond, *—N($R_5$)—*', *—B($R_5$)—*', *—P($R_5$)—*', *—C($R_5$)($R_6$)—*', *—Si($R_5$)($R_6$)—*', *—Ge($R_5$)($R_6$)—*', *—S—*', *—Se—*', *—O—*', *—C(=O)—*', *—S(=O)—*', *—S(=O)$_2$—*', *—C($R_5$)=*', *=C($R_5$)—*', *—C($R_5$)=C($R_6$)—*', *—C(=S)—*', and *—C≡C—*', and a1 to a4 may each independently be an integer selected from 0 to 3, wherein, when a1 is 0, $A_1$ and $A_2$ may not be linked to each other, when a2 is 0, $A_2$ and $A_3$ may not be linked to each other, when a3 is 0, $A_3$ and $A_4$ may not be linked to each other, when a4 is 0, $A_4$ and $A_1$ may not be linked to each other, the sum of a1, a2, a3, and a4 may be equal to or greater than 1 or more, at least one of $L_1$ to $L_4$ may be *—$CF_2$—*', and * and *' may each independently be a binding site to a neighboring atom.

In an embodiment, at least one of $L_1$ to $L_3$ may be *—$CF_2$—*'.

In an embodiment, a1 to a3 may each be 1, a4 may be 0, and $L_2$ may be *—$CF_2$—*'.

In an embodiment, $L_1$ may be a single bond.

In an embodiment, $L_3$ may be a single bond.

R', R", and $R_1$ to $R_6$ in Formula 1 may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), b1 to b4 may each independently be an integer selected from 1 to 20, any two neighboring groups of $R_1$ to $R_6$ may optionally be linked to each other to form a substituted or unsubstituted $C_5$-$C_{60}$ carbocyclic group or a substituted or unsubstituted $C_1$-$C_{60}$ heterocyclic group.

In an embodiment, R', R" and $R_1$ to $R_6$ may each independently be selected from: hydrogen, deuterium, —F, —$C_1$, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —C1, —Br, —I, a hydroxyl group, a cyano group, a nitro group, an amidino group, a hydrazino group, a hydrazono group, a $C_1$-$C_{20}$ alkyl group, and $C_1$-$C_{20}$ alkoxy group;

a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, a pyrrolyl group, an indolyl group, an isoindolyl group, an indazolyl group, a quinolinyl group, an isoquinolinyl group, a quinoxalinyl group, a quinazolinyl group, a cinnolinyl group, and a triazinyl group; and a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$);

a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$); and —Si($Q_1$)($Q_2$)($Q_3$), —N($Q_1$)($Q_2$), —B($Q_1$)($Q_2$), —C(=O)($Q_1$), —S(=O)$_2$($Q_1$), —P(=O)($Q_1$)($Q_2$), —P(=S)($Q_1$)($Q_2$), =O, =S, =N($Q_1$), and =C($Q_1$)($Q_2$), wherein $Q_1$ to $Q_3$ and $Q_{31}$ to $Q_{33}$ may each independently be selected from:

hydrogen, deuterium, —F, —Cl, —Br, —I, a cyano group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group.

In an embodiment, the organometallic compound represented by Formula 1 may be represented by Formula 1-1:

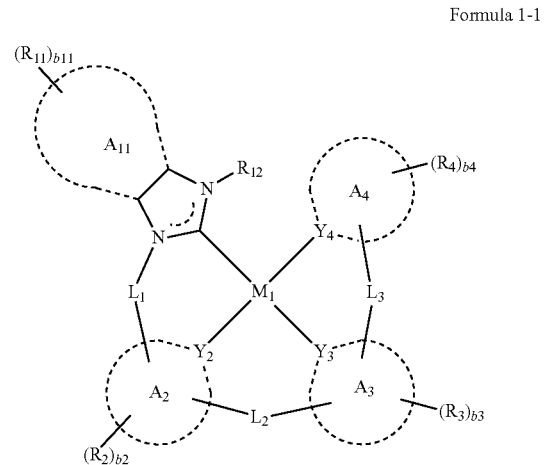

Formula 1-1 wherein, in Formula 1-1, $M_1$, $A_2$ to $A_4$, $Y_2$ to $Y_4$, $L_1$ to $L_3$, $R_2$ to $R_4$, and b2 to b4 are the same as described above, at least one of $L_1$ to $L_3$ may be *—$CF_2$—*", $A_{11}$ is the same as described in connection with $A_1$ to $A_4$, $R_{11}$ and $R_{12}$ are the same as described in connection with R', R", and $R_1$ to $R_6$, and b11 is the same as described in connection with b1 to b4.

In an embodiment, $A_{11}$ may be a benzene group.

In an embodiment, $R_{12}$ may not be hydrogen.

According to an embodiment, the organometallic compound represented by Formula 1 may be represented by Formula 1A:

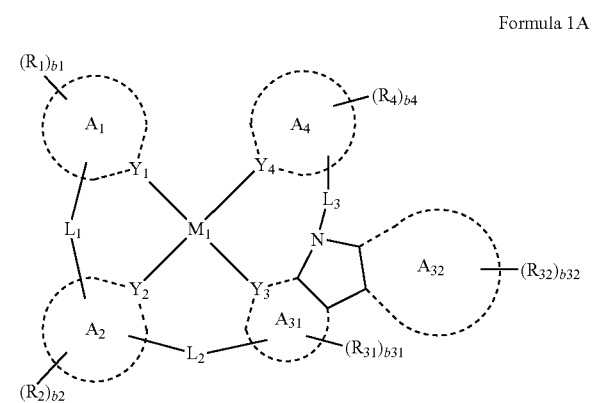

Formula 1A wherein, in Formula 1A,

M$_1$, A$_1$, A$_2$, A$_4$, Y$_1$ to Y$_4$, L$_1$ to L$_3$, R$_1$, R$_2$, R$_4$, b1, b2, and b4 are the same as described above, at least one of L$_1$ to L$_4$ may be *—CF$_2$—*", A$_{31}$ and A$_{32}$ are the same as described in connection with A$_1$ to A$_4$, R$_{31}$ and R$_{32}$ are the same as described in connection with R', R", and R$_1$ to R$_6$, and b31 and b32 are the same as described in connection with b1 to b4.

In an embodiment, A$_{31}$ and A$_{32}$ may each be a benzene group.

According to an embodiment, the organometallic compound represented by Formula 1 may be represented by Formula 1A-1:

Formula 1A-1

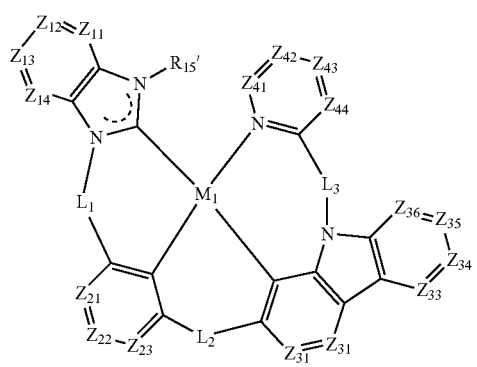

wherein, in Formula 1A-1,

M$_1$, and L$_1$ to L$_3$ are the same as described above, at least one of L$_1$ to L$_3$ may be *—CF$_2$—*', Z$_{11}$ may be N or C(R$_{11}$'), Z$_{12}$ may be N or C(R$_{12}$'), Z$_{13}$ may be N or C(R$_{13}$'), Z$_{14}$ may be N or C(R$_{14}$'), Z$_{21}$ may be N or C(R$_{21}$'), Z$_{22}$ may be N or C(R$_{22}$'), Z$_{23}$ may be N or C(R$_{23}$'), Z$_{31}$ may be N or C(R$_{31}$'), Z$_{32}$ may be N or C(R$_{32}$'), Z$_{33}$ may be N or C(R$_{33}$'), Z$_{34}$ may be N or C(R$_{34}$'), Z$_{35}$ may be N or C(R$_{35}$'), Z$_{36}$ may be N or C(R$_{36}$'), Z$_{41}$ may be N or C(R$_{41}$'), Z$_{42}$ may be N or C(R$_{42}$'), Z$_{43}$ may be N or C(R$_{43}$'), and Z$_{44}$ may be N or C(R$_{44}$'), R$_{11}$' to R$_{15}$', R$_{21}$' to R$_{23}$', R$_{31}$' to R$_{36}$', and R$_{41}$' to R$_{44}$' are the same as described in connection with R', R", and R$_1$ to R$_6$.

In an embodiment, at least one of R$_{11}$' to R$_{15}$', R$_{21}$' to R$_{23}$', R$_{31}$' to R$_{36}$', and R$_{41}$' to R$_{44}$' may not be hydrogen.

In an embodiment, the organometallic compound represented by Formula 1 may be selected from Compounds 1 to 120, but embodiments of the present disclosure are not limited thereto:

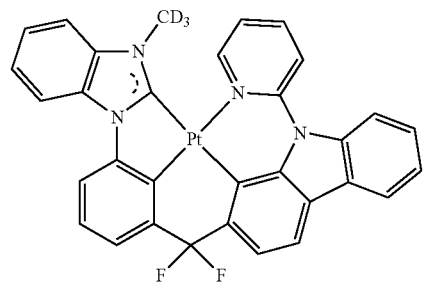

1

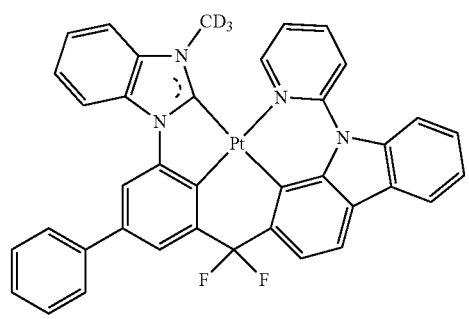

2

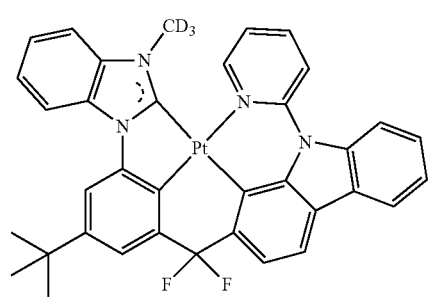

3

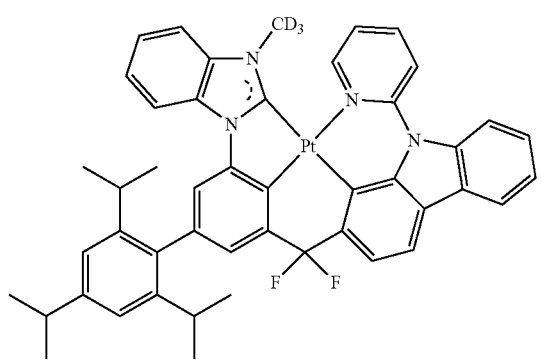

4

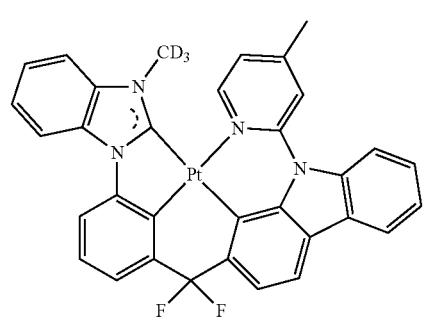

5

6
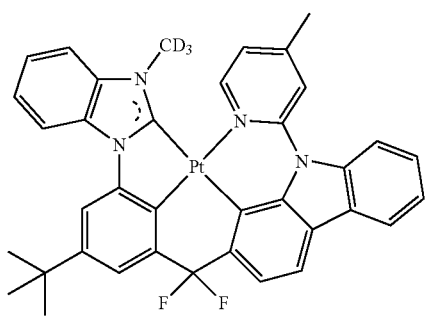
7
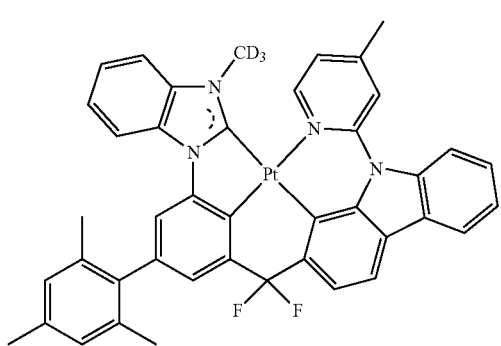
8
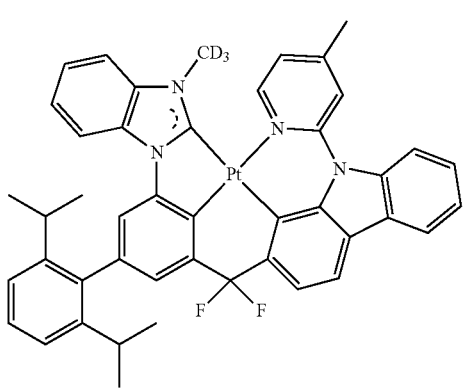
9
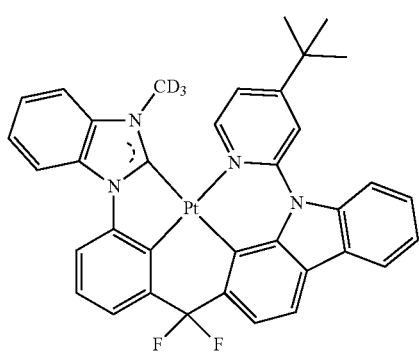
10
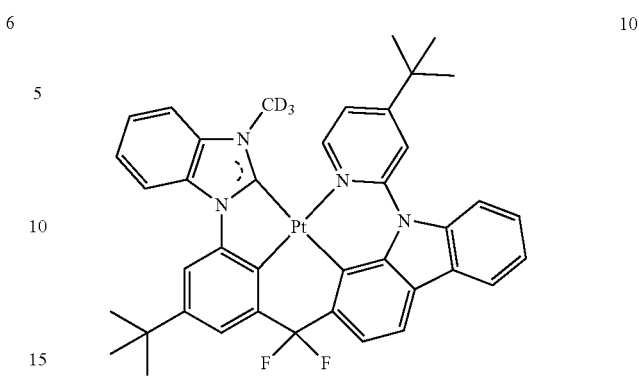
11
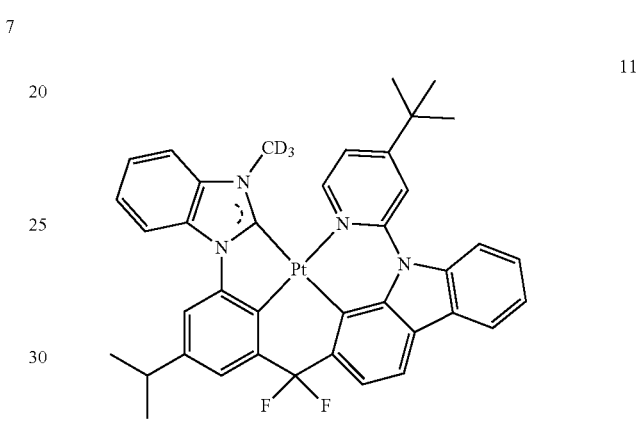
12
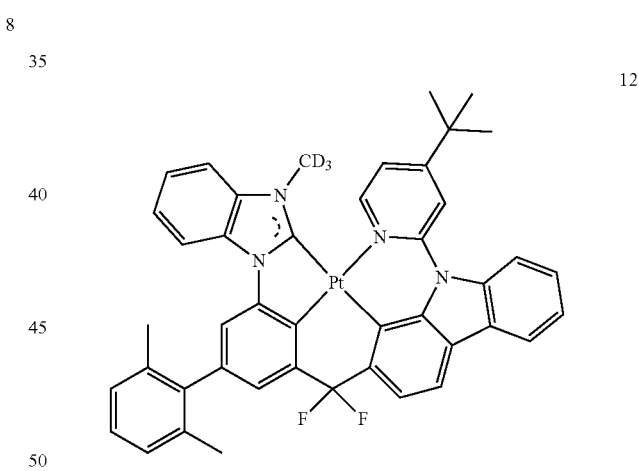
13
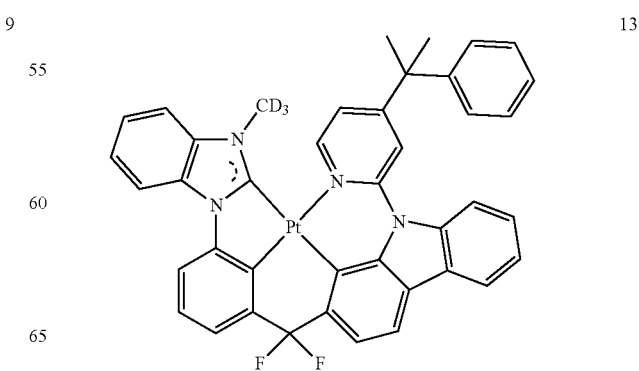

14
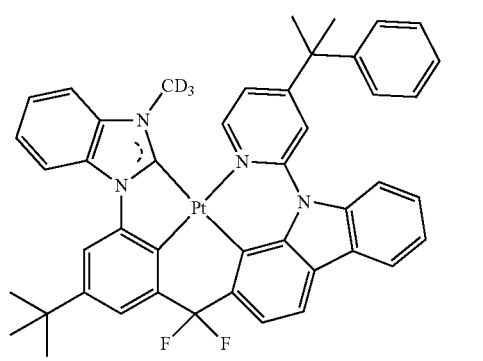
15
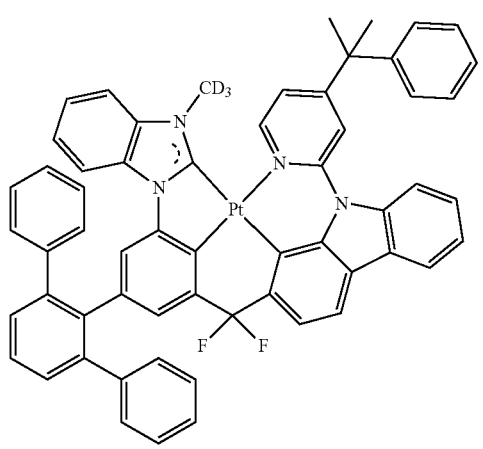
16
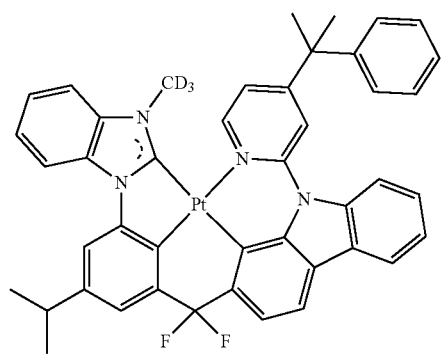
17
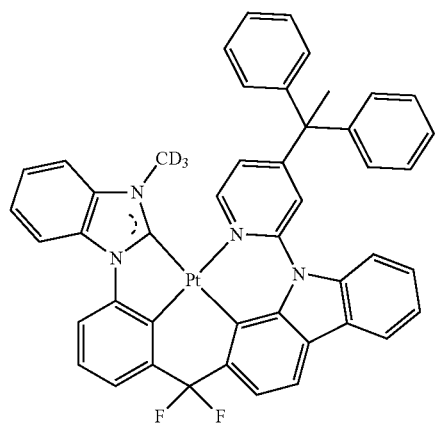
18
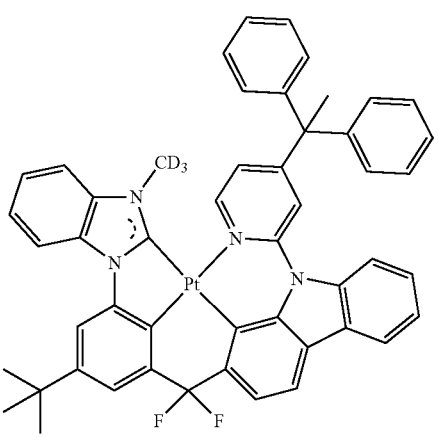
19
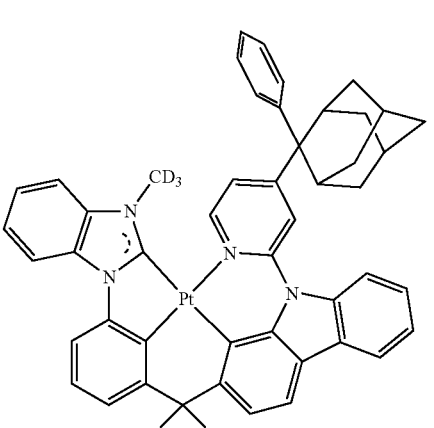
20
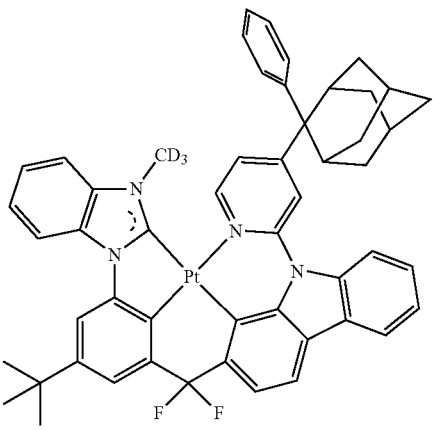
21
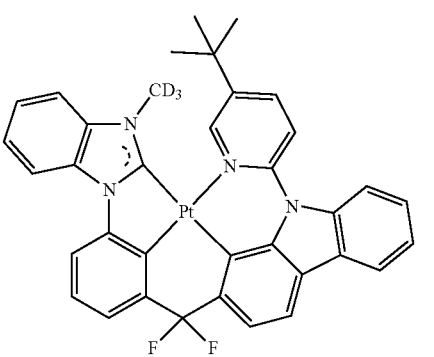

22
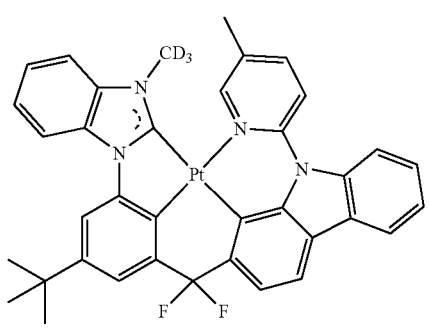
23
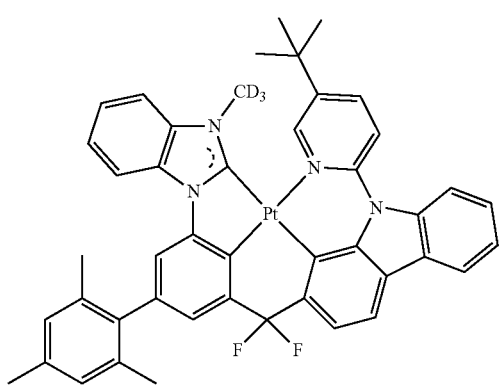
24
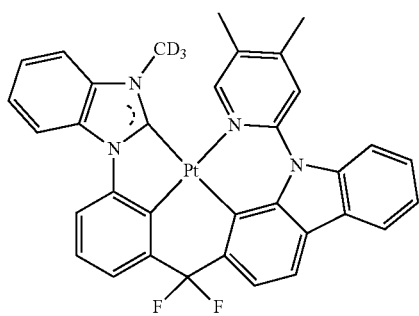
25
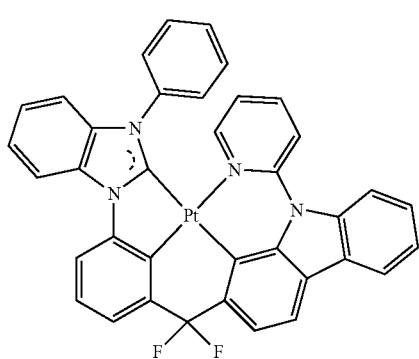
26
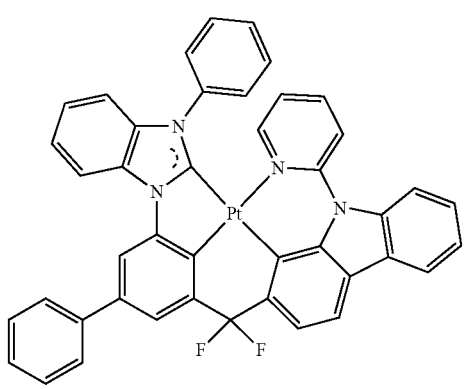
27
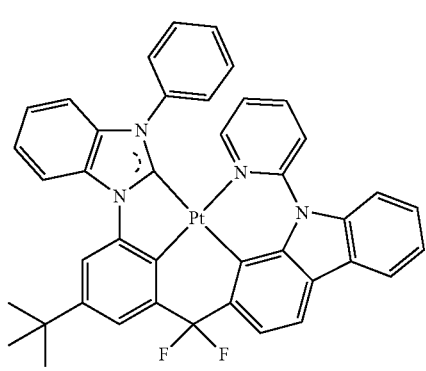
28
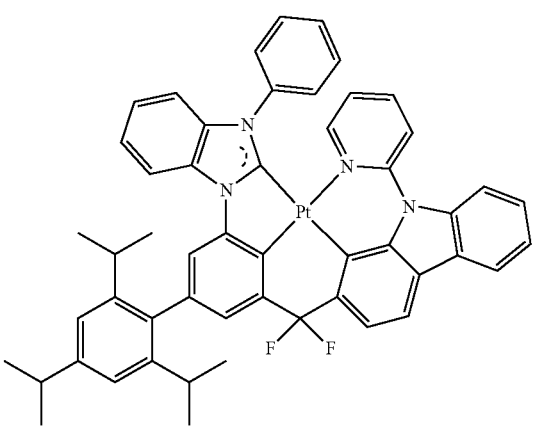
29
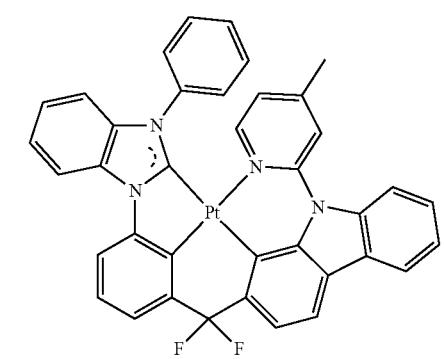

30
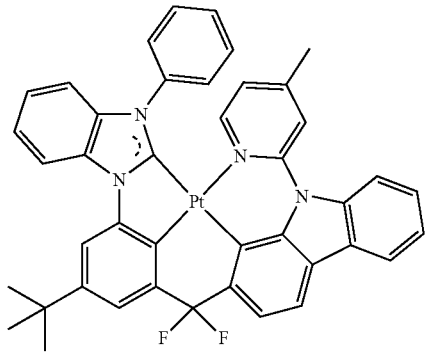
31
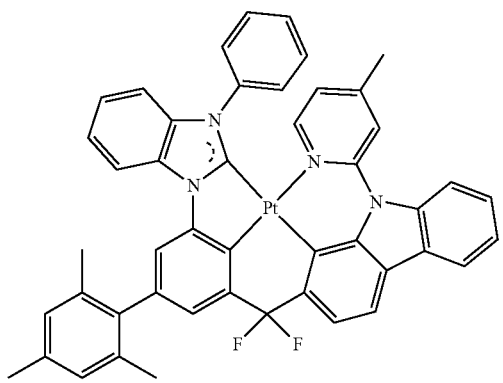
32
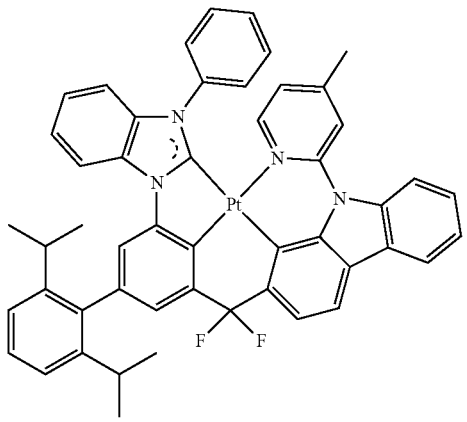
33
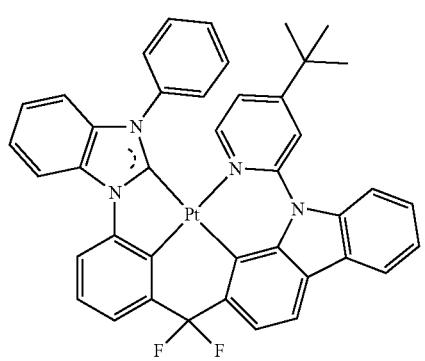
34
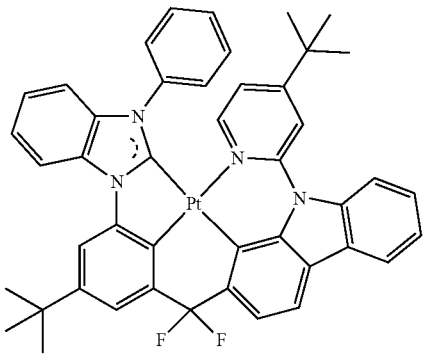
35
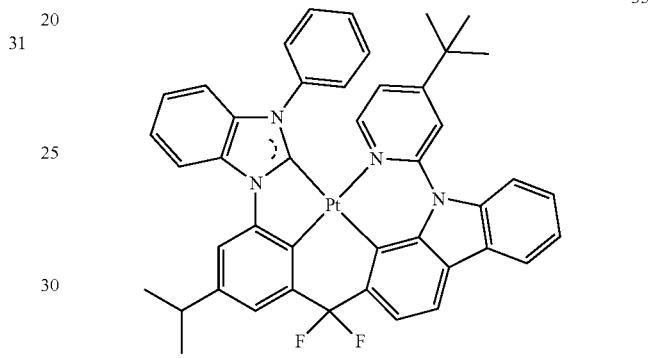
36
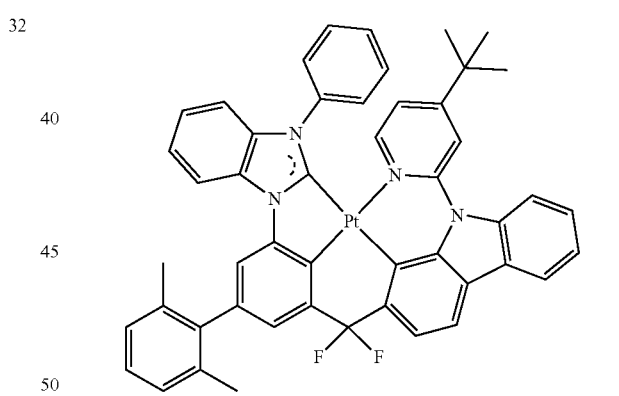
37
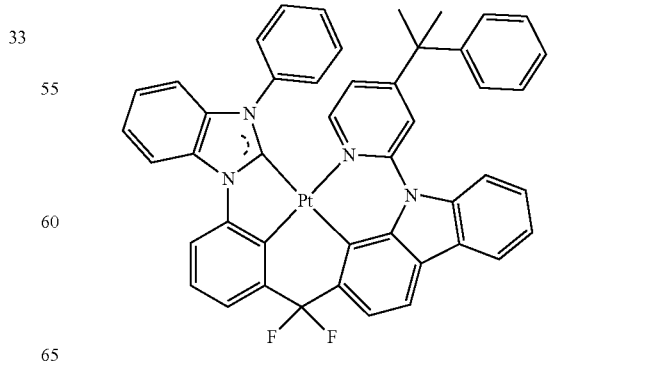

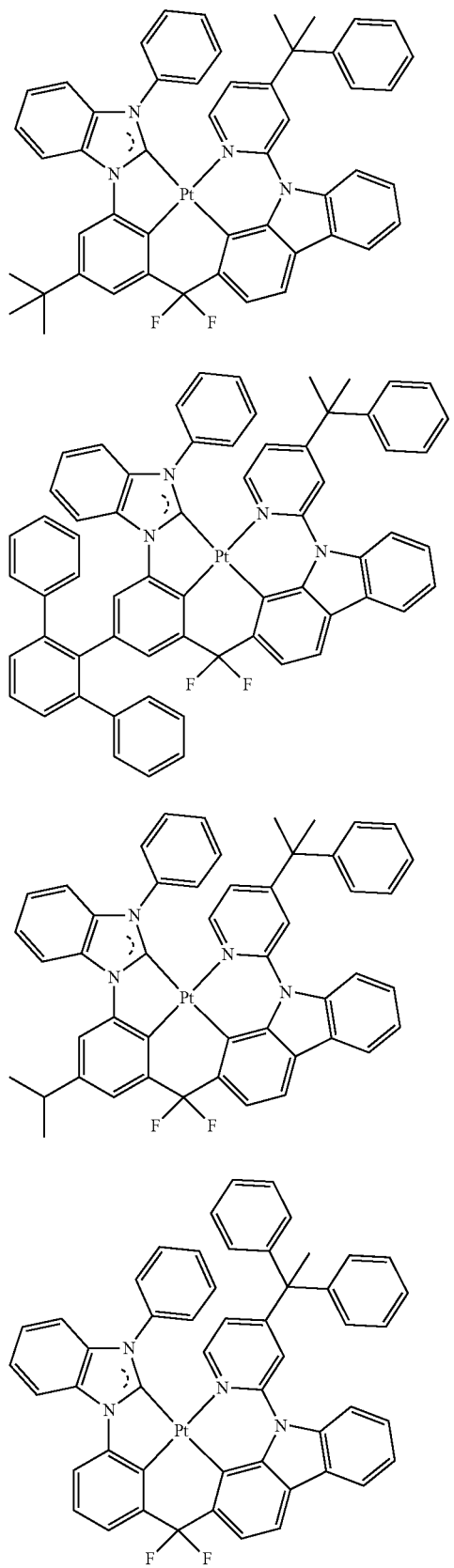
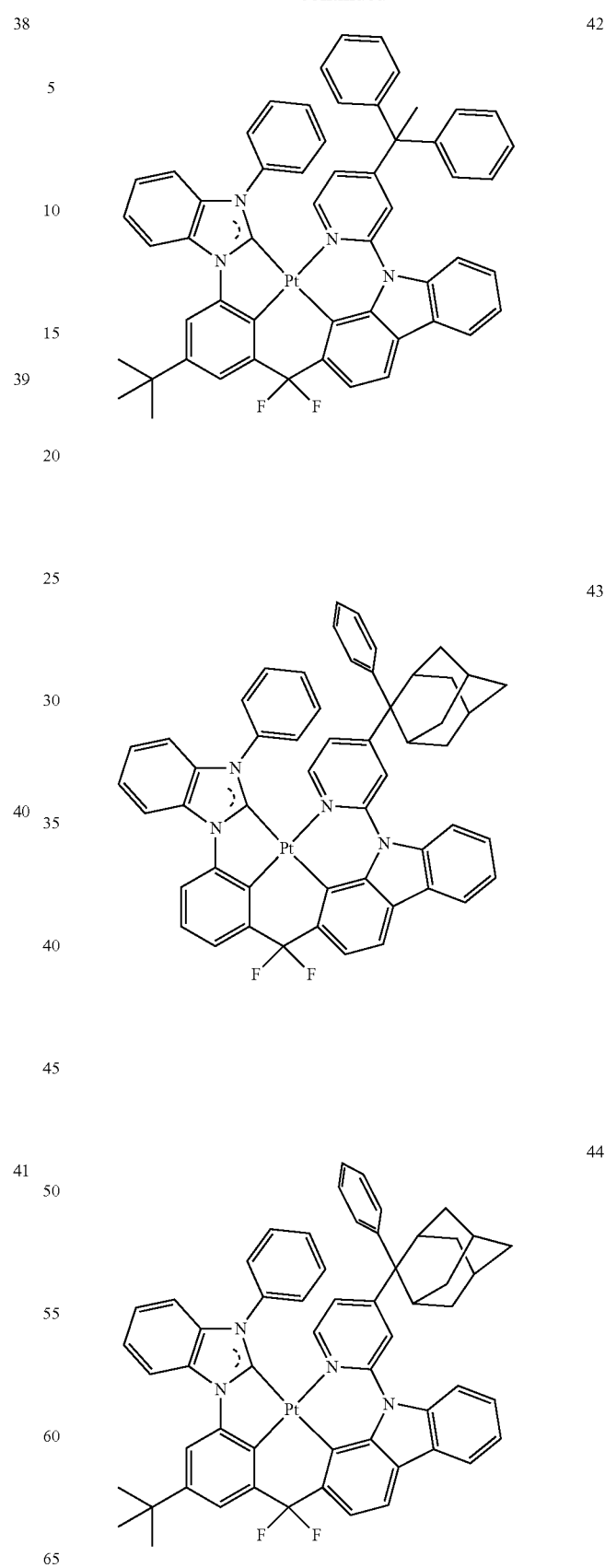

45
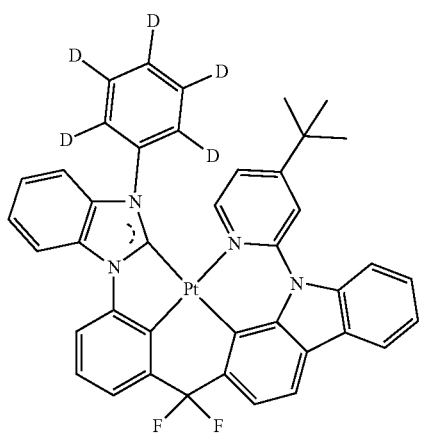
46
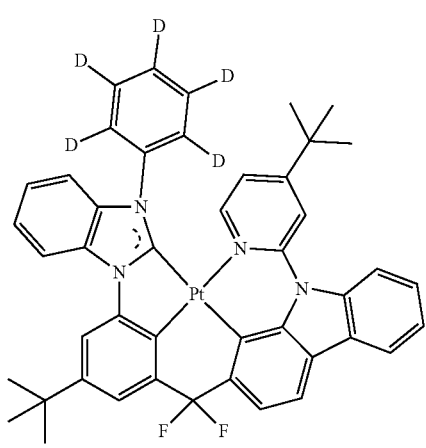
47
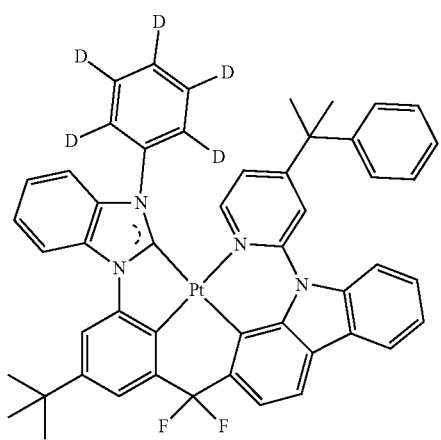
48
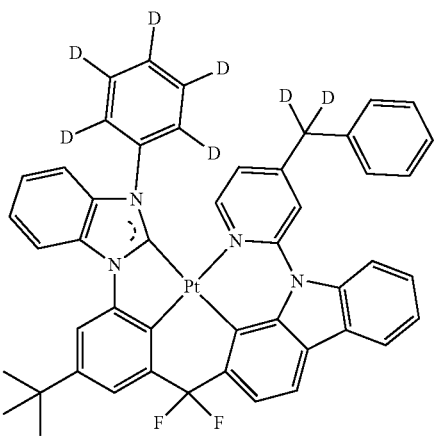
49
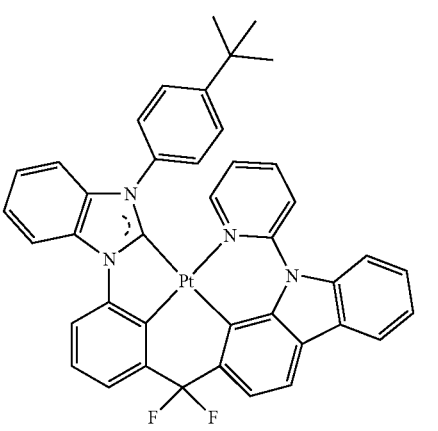
50
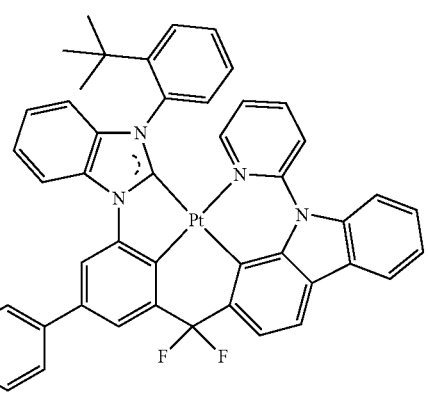
51
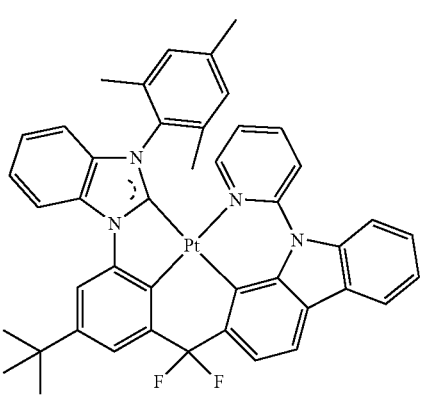

52
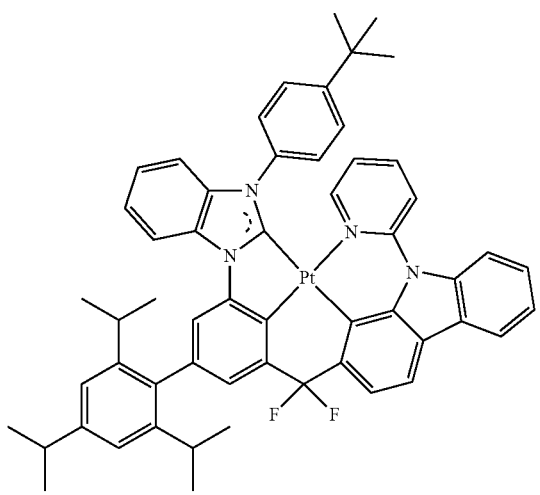
53
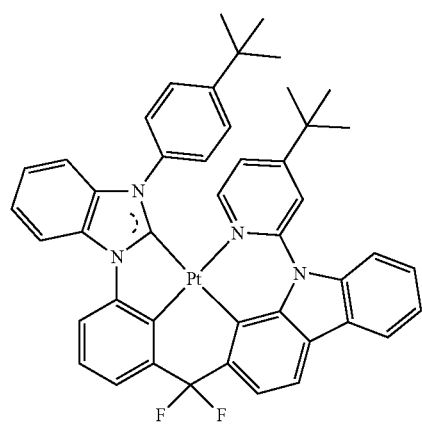
54
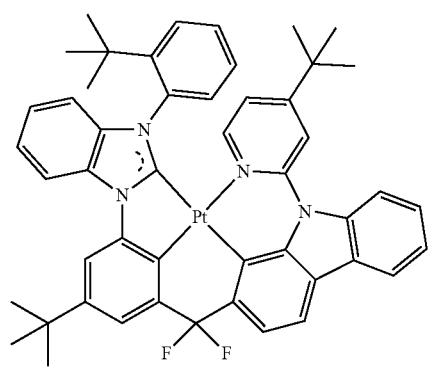
55
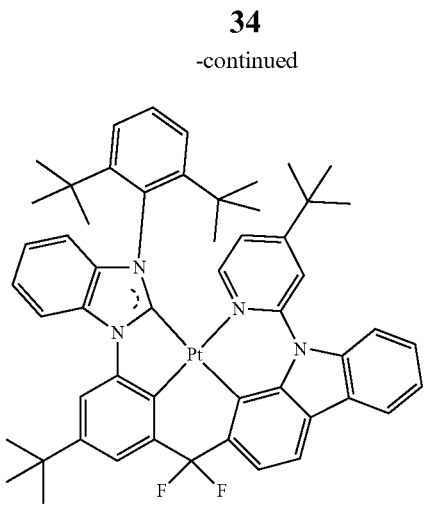
56
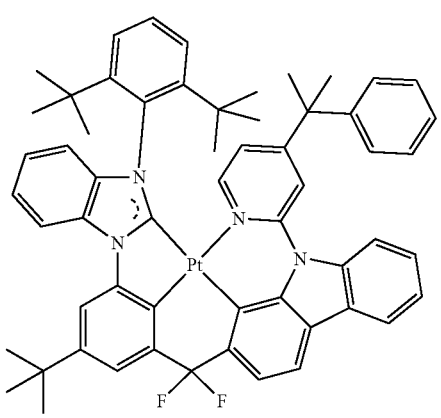
57
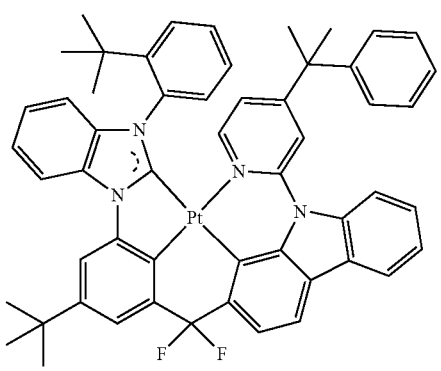
58
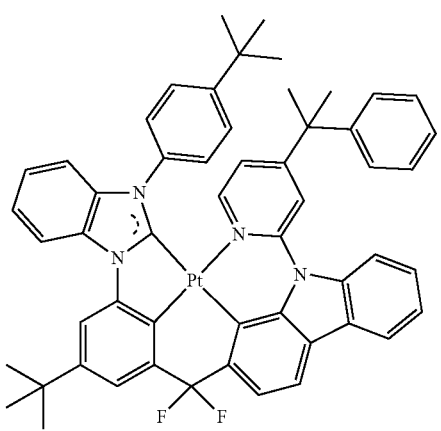

59
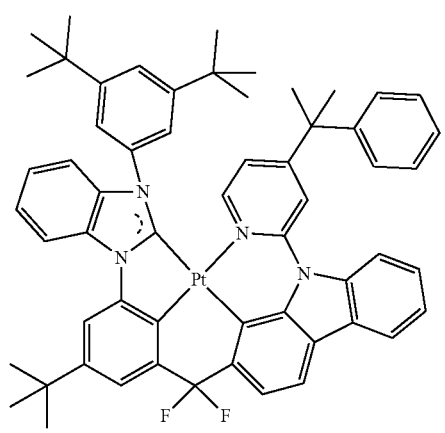
60
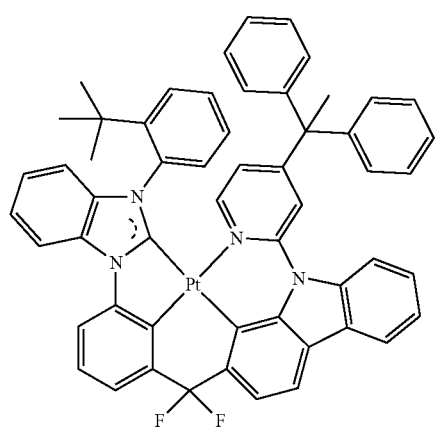
61
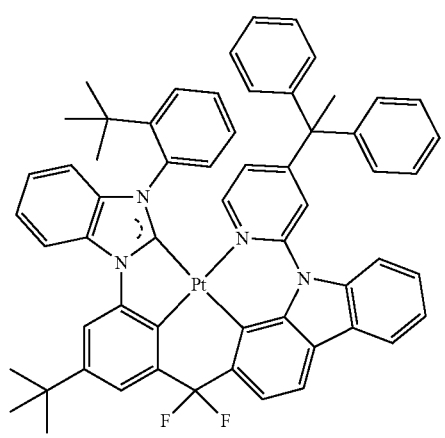
62
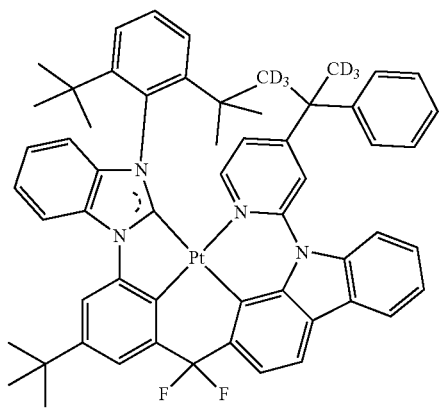
63
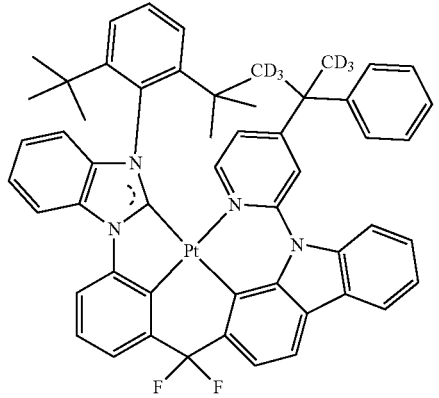
64
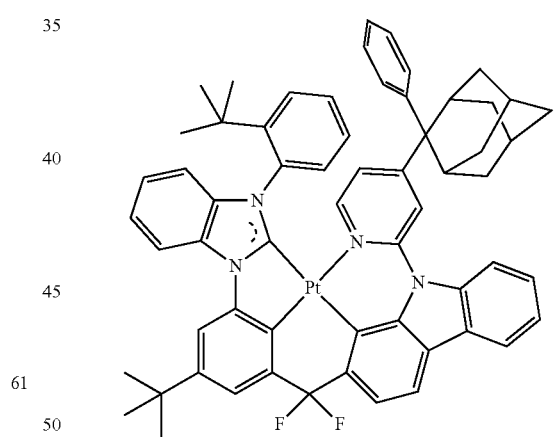
65
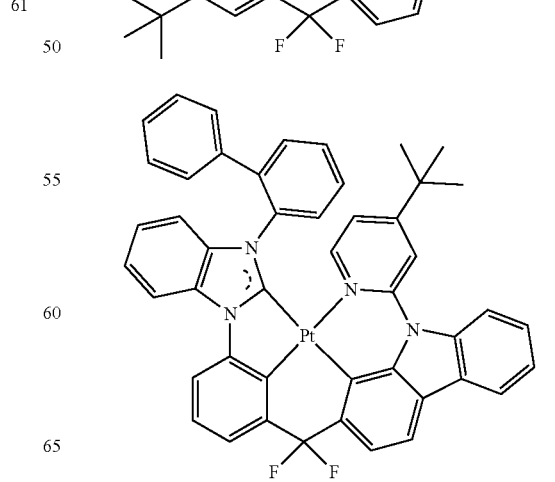

66
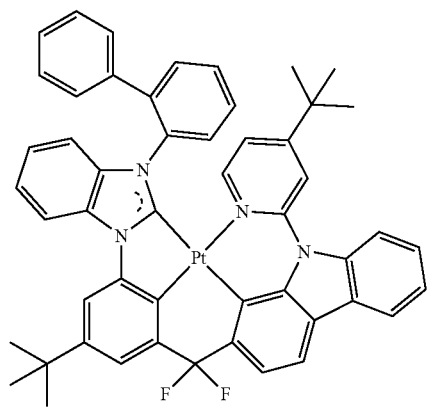
67
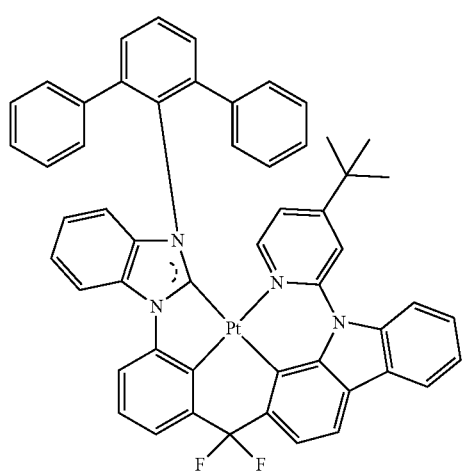
68
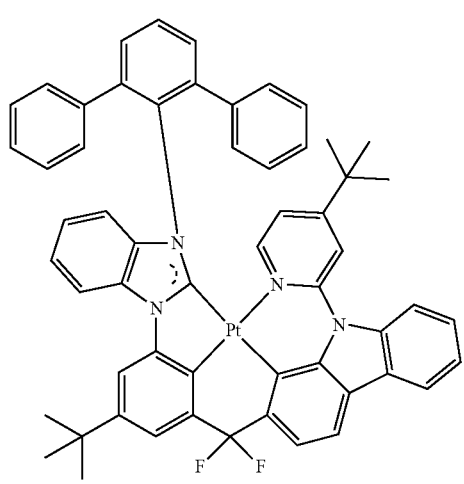
69
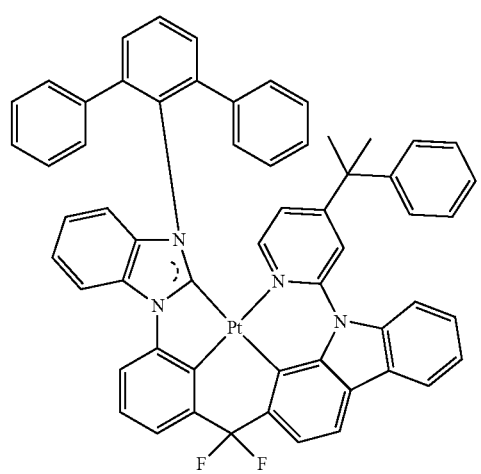
70
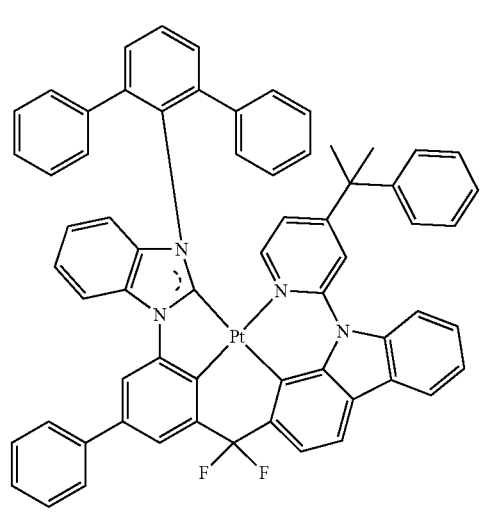
71
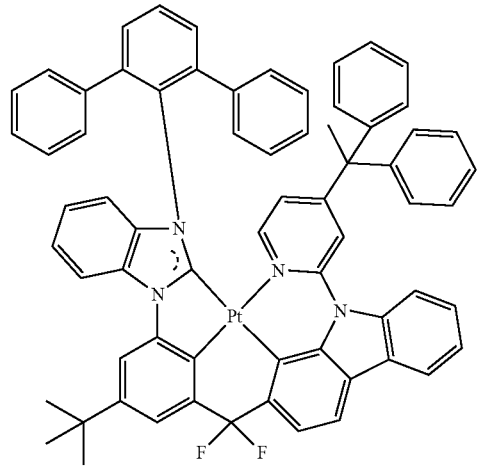

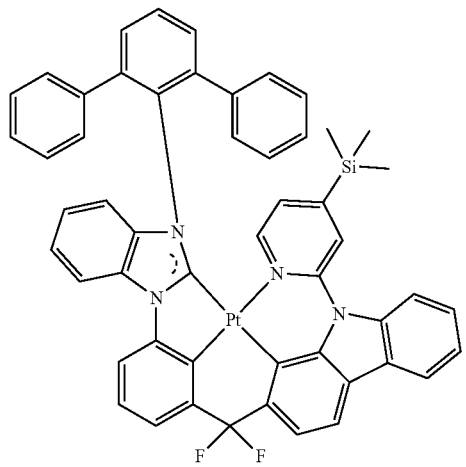
72
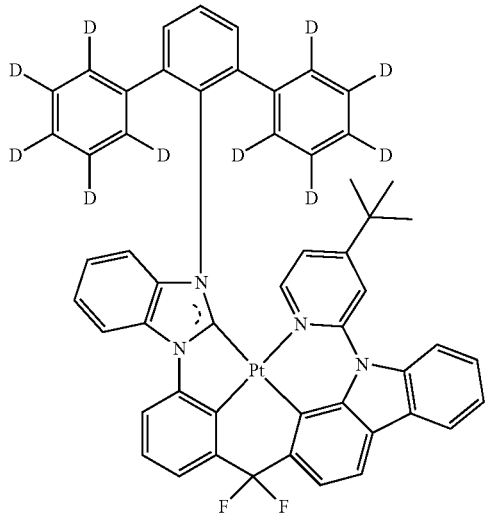
75
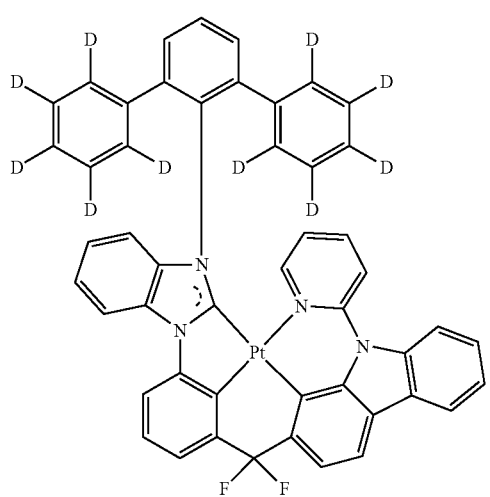
73
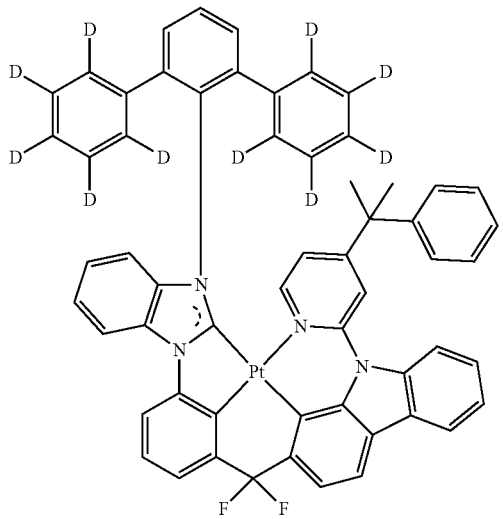
76
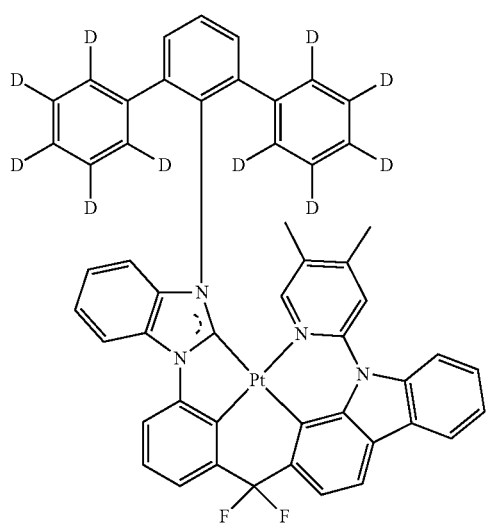
74
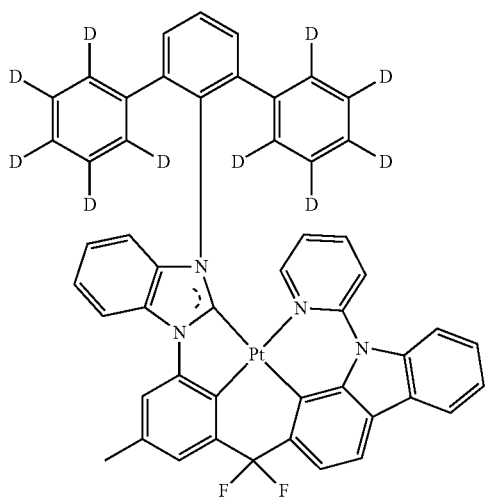
77

-continued
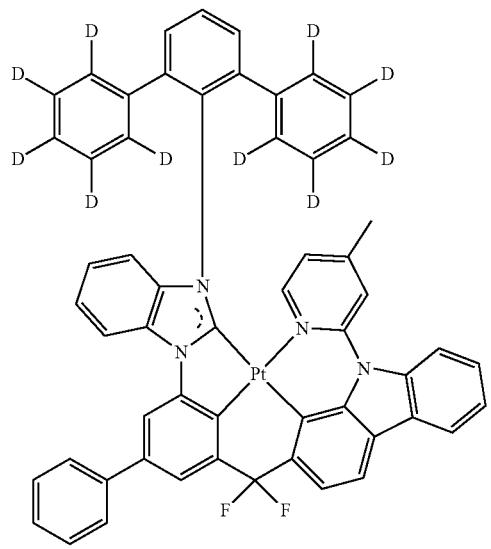
78
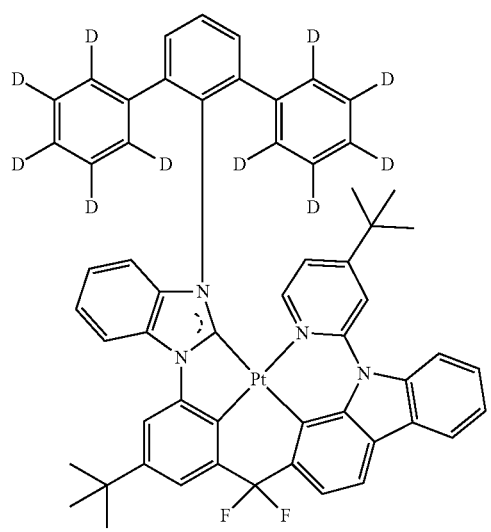
79
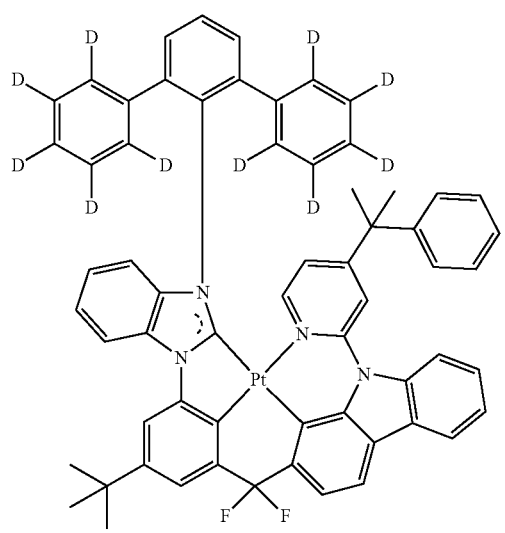
80
-continued
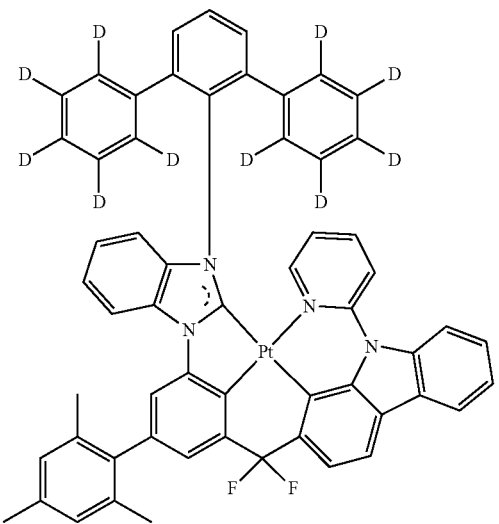
81
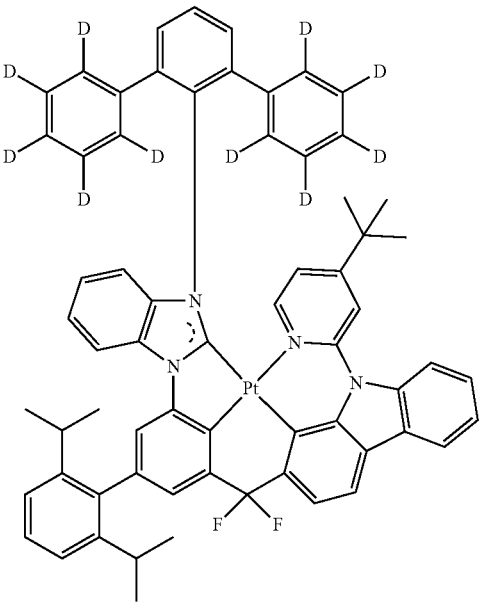
82

83
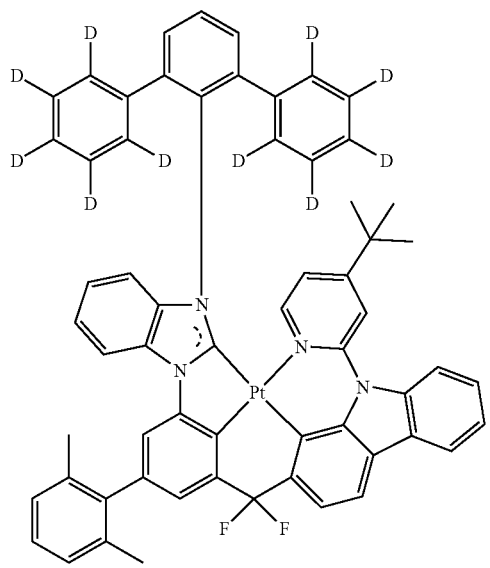
84
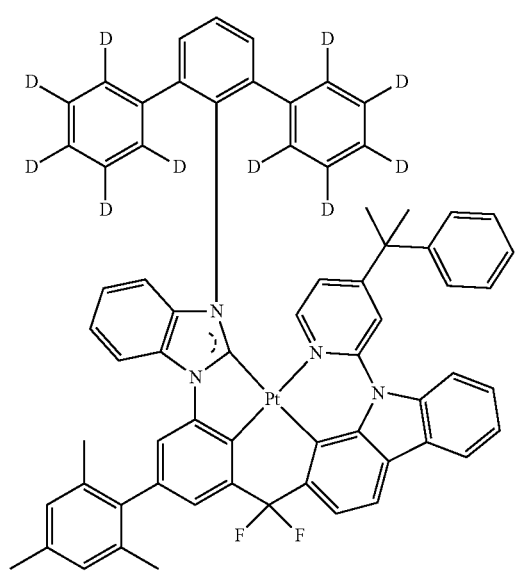
85
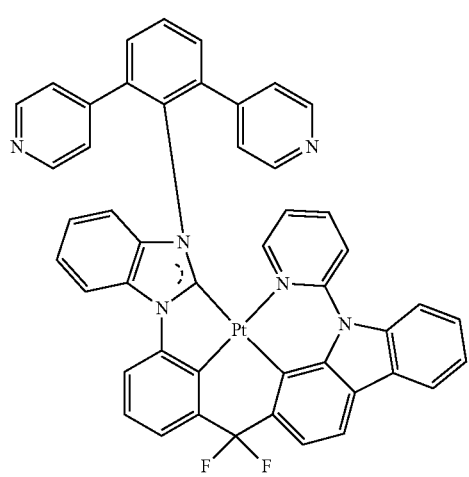
86
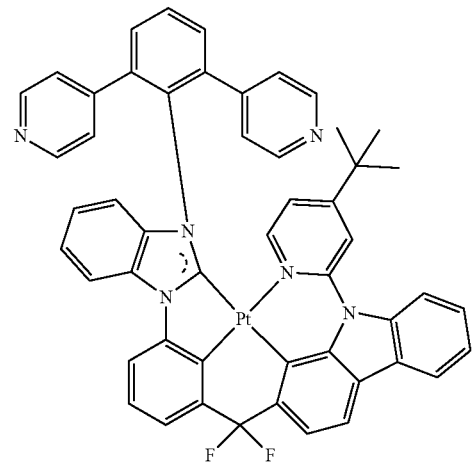
87
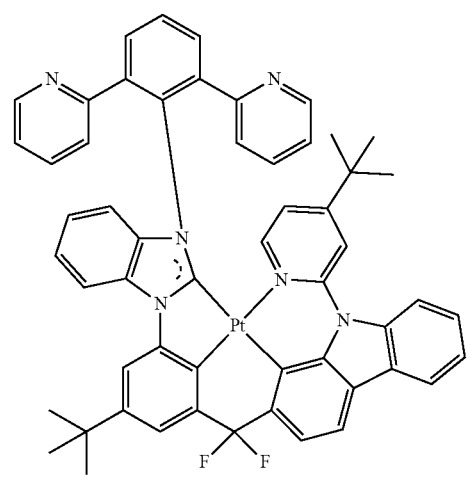
88
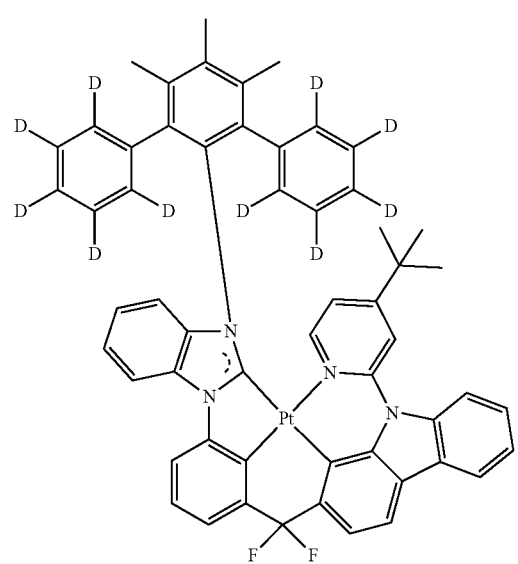

89
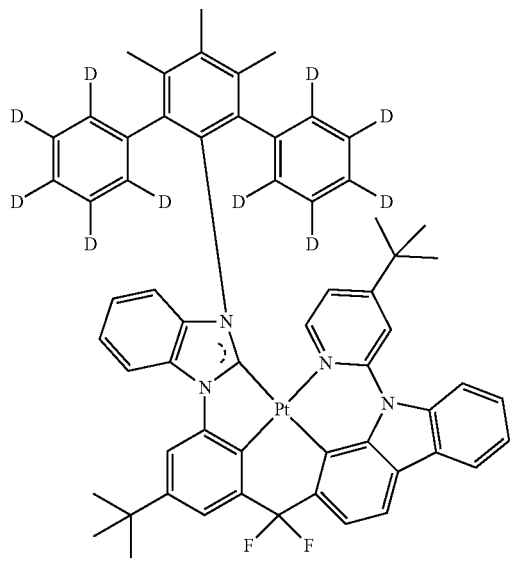
91
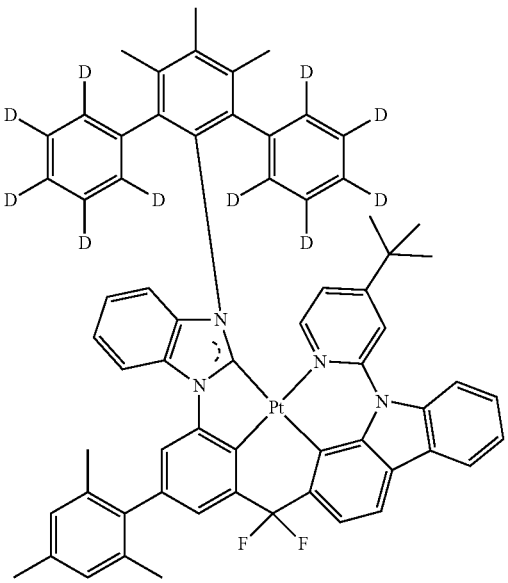
90
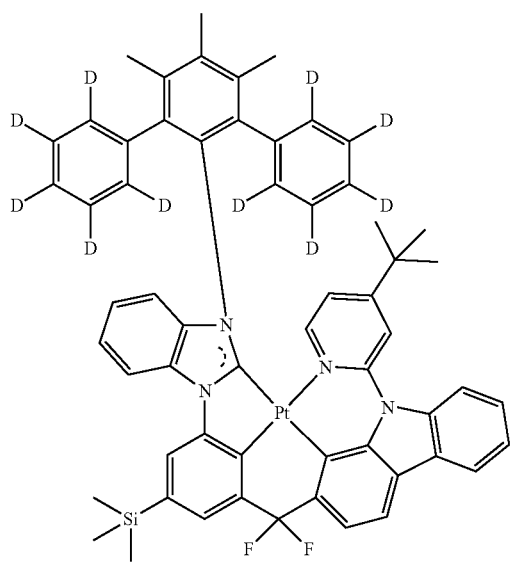
92
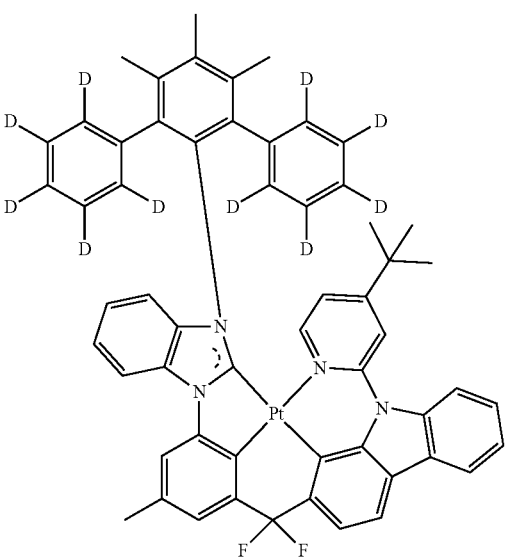

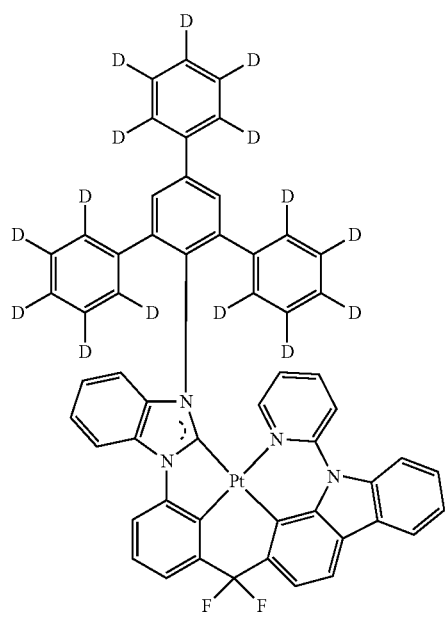
93
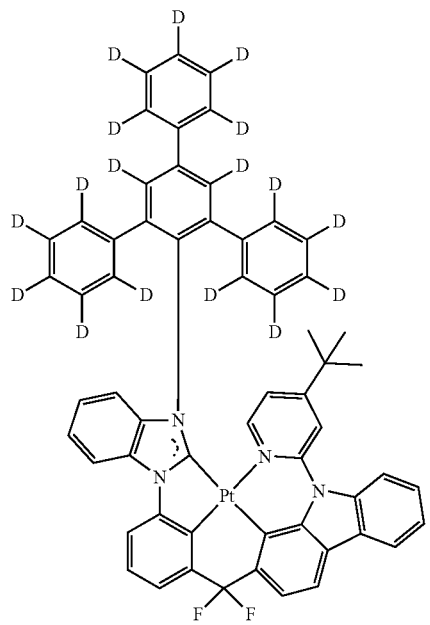
95
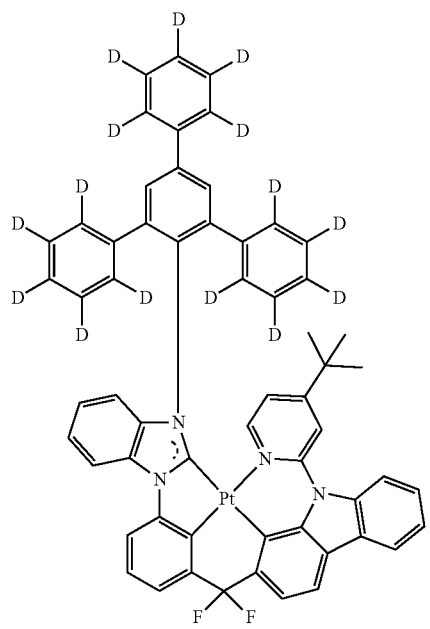
94
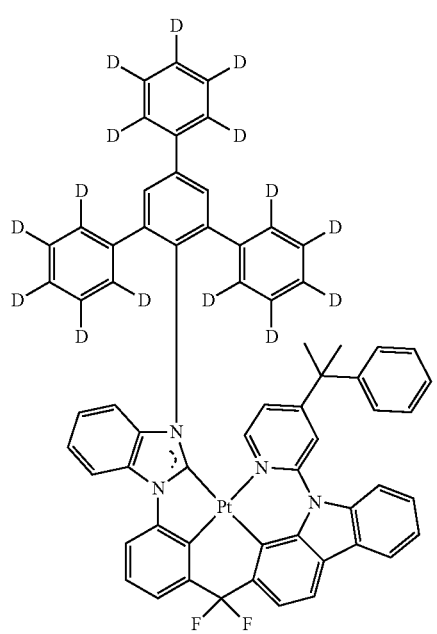
96

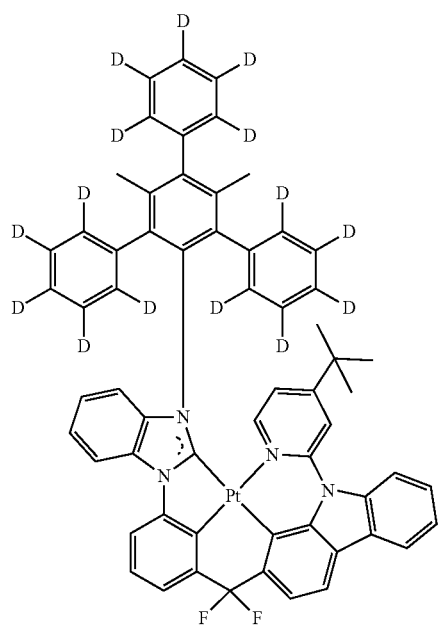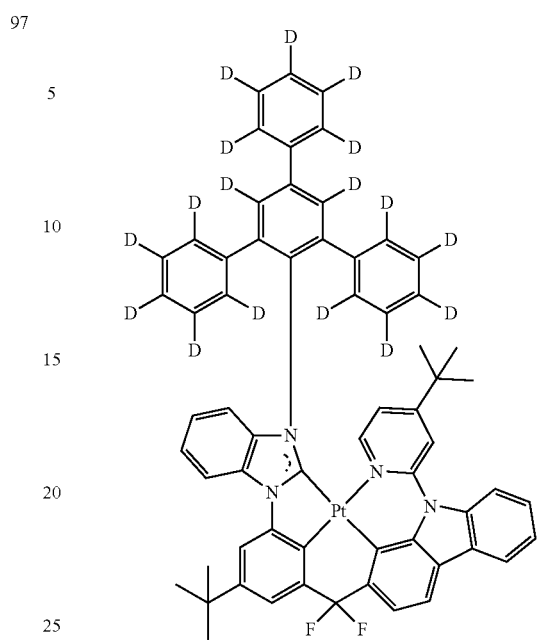

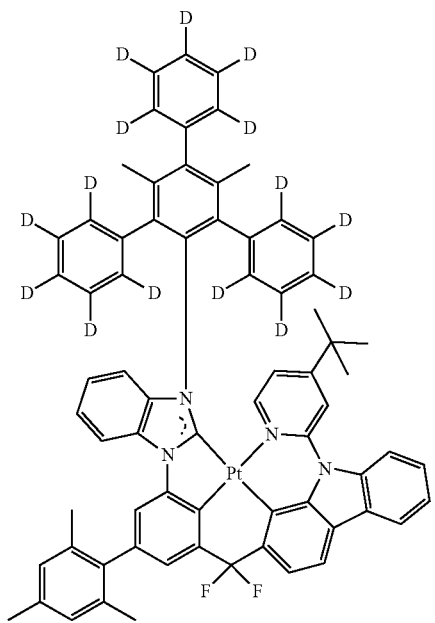
101
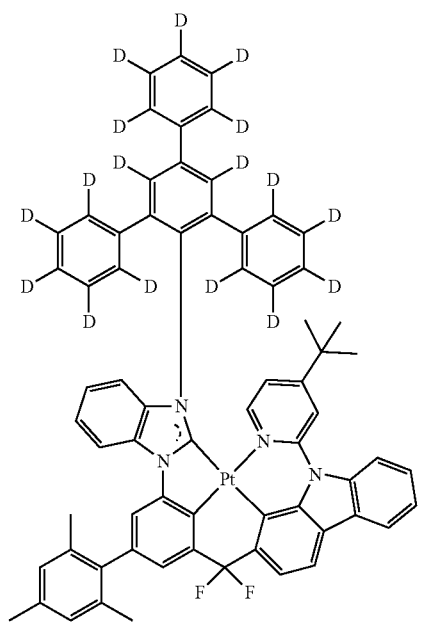
103
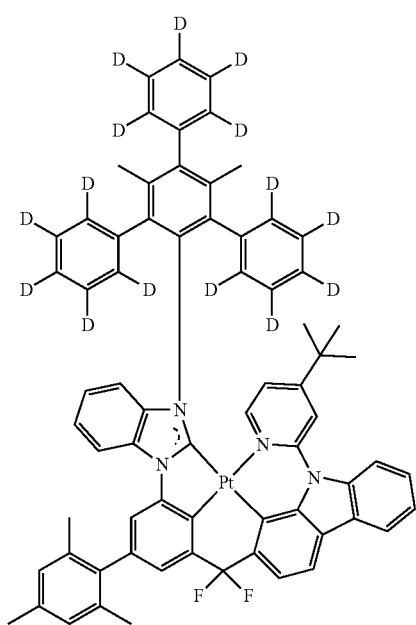
102
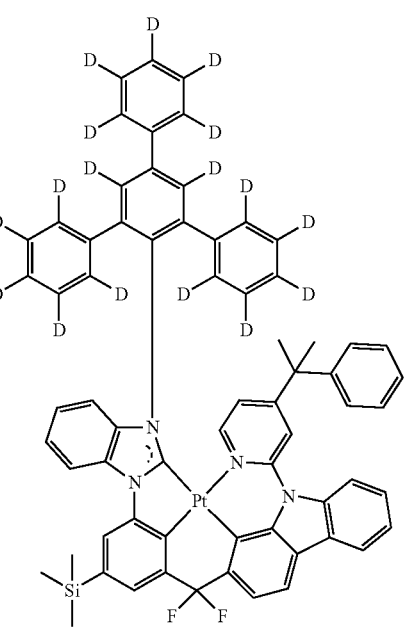
104

105
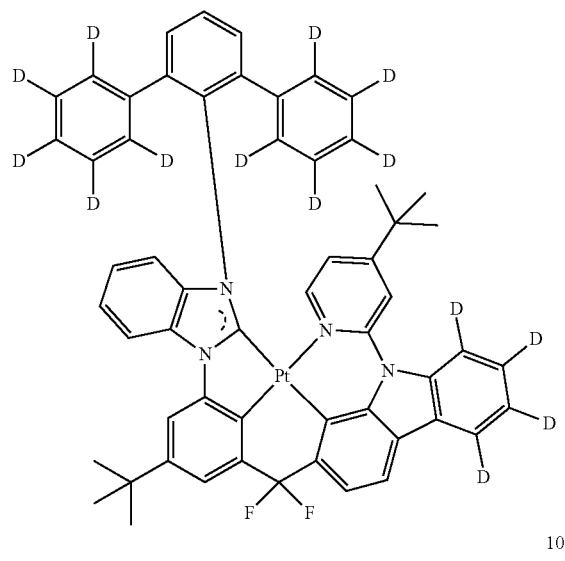
106
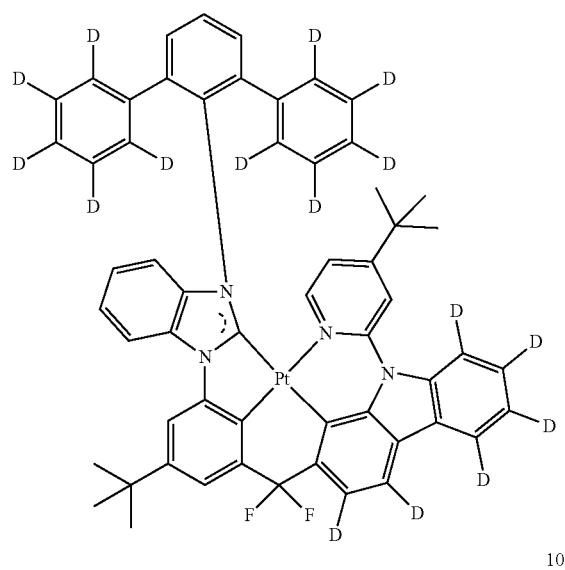
107
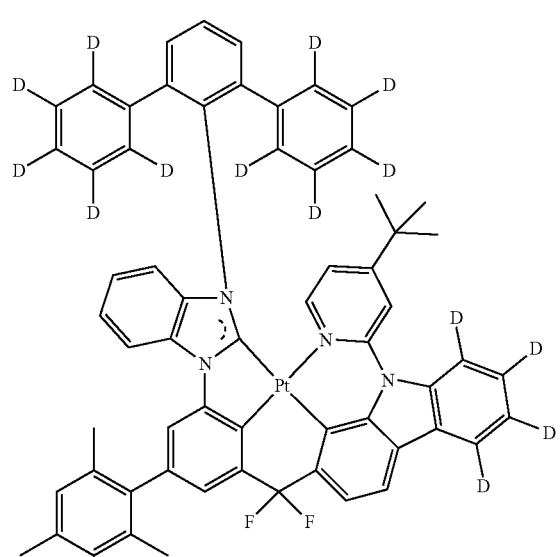
108
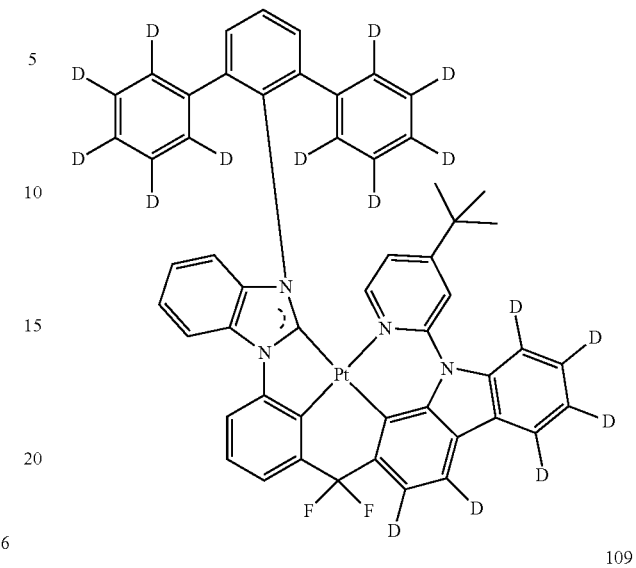
109
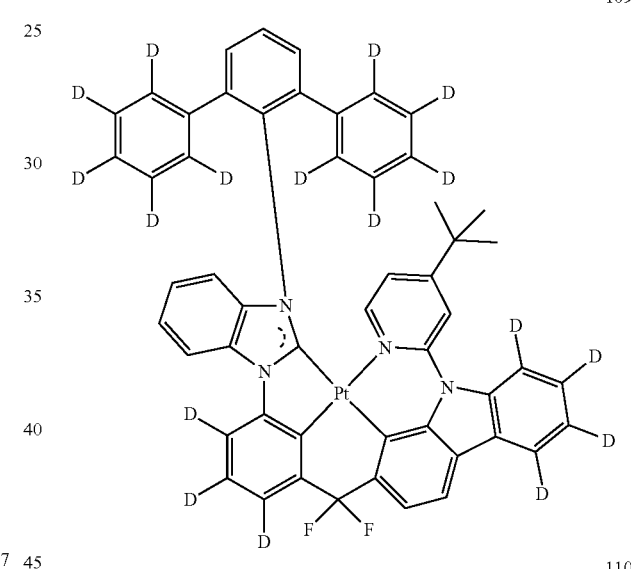
110
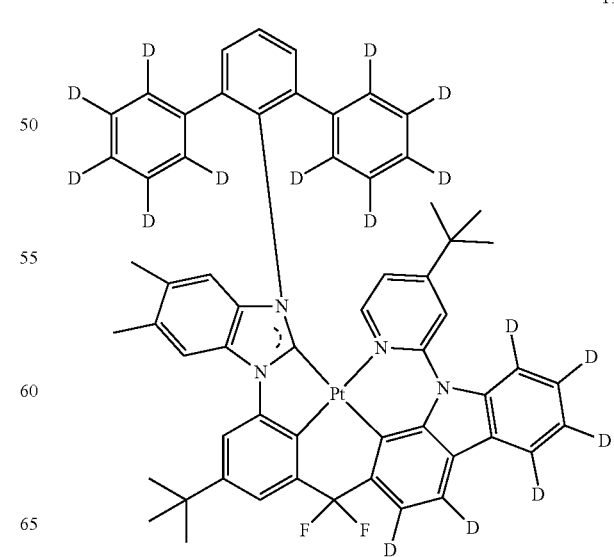

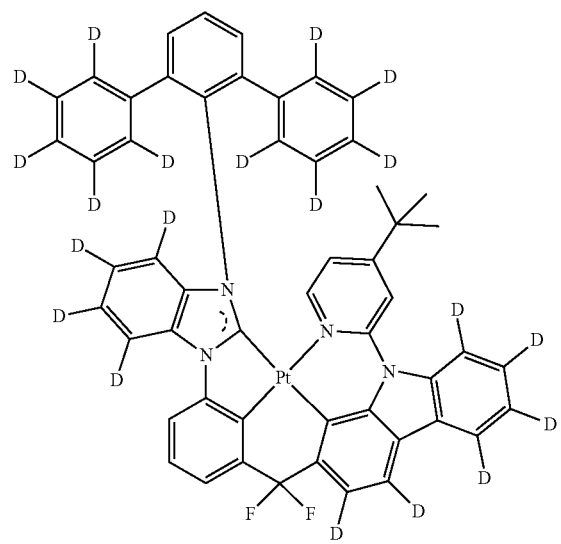
111
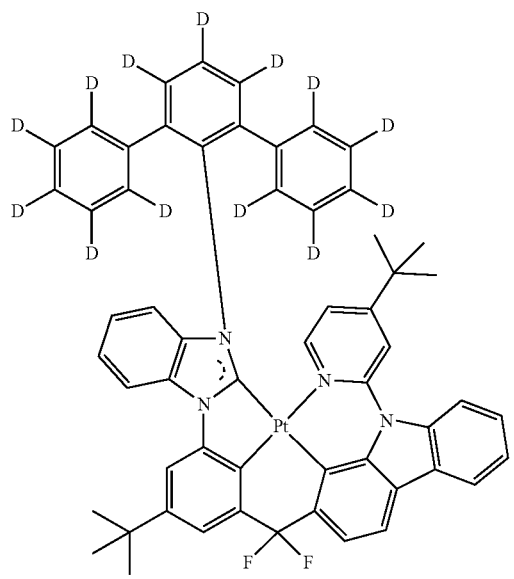
113
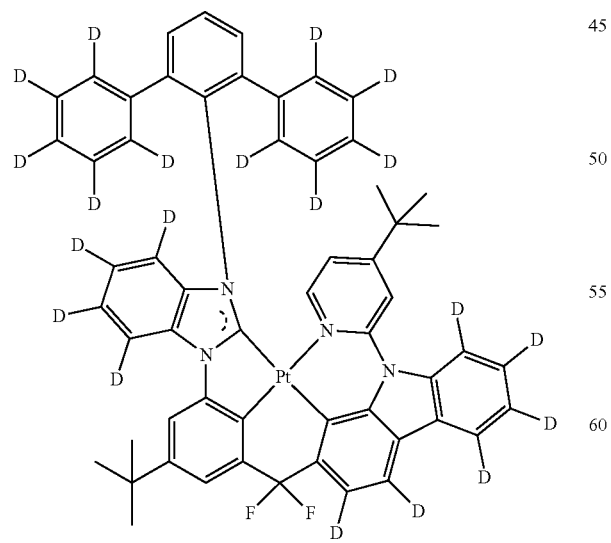
112
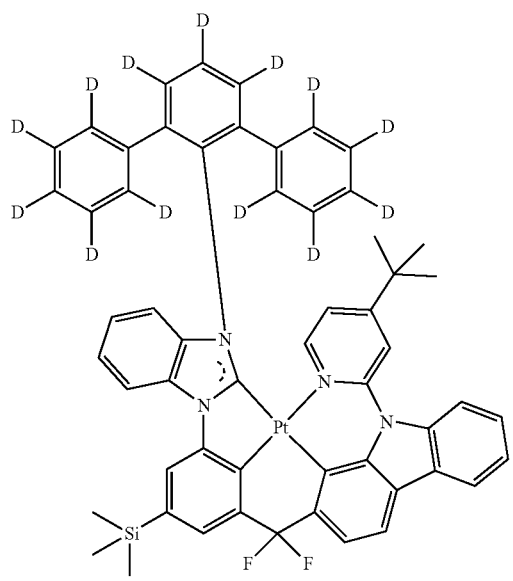
114

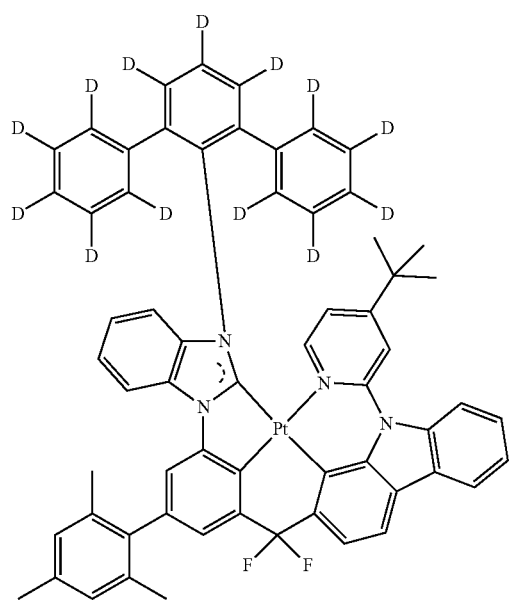
115
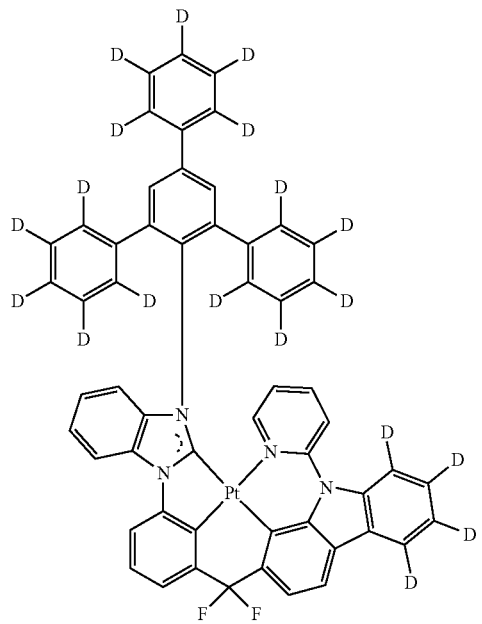
117
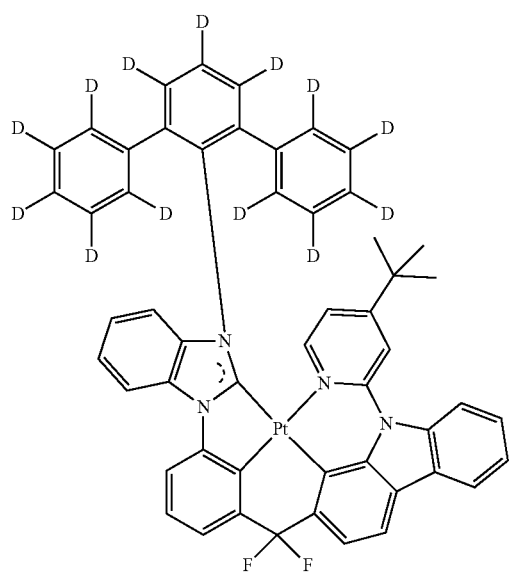
116
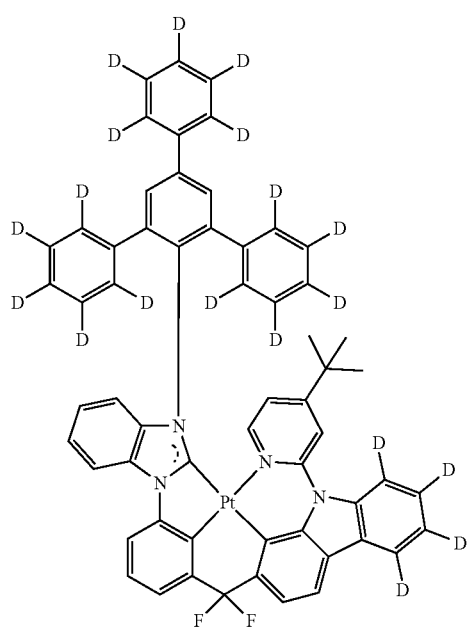
118

-continued

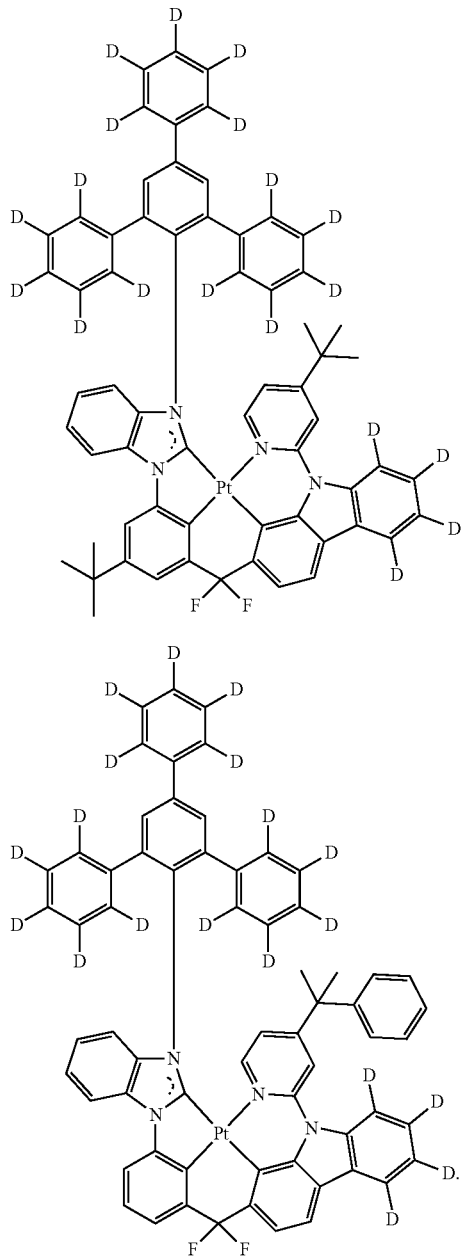

The organometallic compound represented by Formula 1 includes at least one *—CF$_2$—* as a linker for linking of a ligand. Accordingly, the triplet (T$_1$) energy of the organometallic compound represented by Formula 1 may be greater than that of a compound including *—O—* linker instead of *—CF$_2$—* by at least 0.05 eV (for example, at least 0.1 eV), and the HOMO/LUMO energy of the organometallic compound represented by Formula 1 is slightly reduced as compared to that of the compound including *—O—* linker instead of *—CF$_2$—*. Accordingly, when the organometallic compound represented by Formula 1 is included in an interlayer of the organic light-emitting device, the high color purity and low driving voltage effects of the organic light-emitting device may be induced (or improved).

The organometallic compound represented by Formula 1 may emit blue light. In an embodiment, the organometallic compound represented by Formula 1 may emit blue light (bottom emission CIE$_{x,y}$ color coordinates X=0.13, and Y=0.05 to 0.18) having a maximum emission wavelength of about 430 nm or more and about 480 nm or less, but embodiments of the present disclosure are not limited thereto. Accordingly, the organometallic compound represented by Formula 1 may be useful for the manufacturing of an organic light-emitting device that emits blue light.

Synthesis methods of the organometallic compound represented by Formula 1 may be recognizable by one of ordinary skill in the art by referring to Examples provided below.

At least one of such organometallic compounds represented by Formula 1 may be used between a pair of electrodes of an organic light-emitting device. In an embodiment, the organometallic compound may be included in an emission layer. The organometallic compound included in the emission layer may act as a dopant. In one or more embodiments, the organometallic compound of Formula 1 may be used as a material for a capping layer located outside a pair of electrodes of an organic light-emitting device.

Accordingly, in some embodiments, an organic light-emitting device includes: a first electrode; a second electrode facing the first electrode; and an interlayer located between the first electrode and the second electrode and including an emission layer, wherein the interlayer includes at least one of the organometallic compound represented by Formula 1.

The expression "(an interlayer) includes at least one of organometallic compounds represented by Formula 1" used herein may include a case in which "(an interlayer) includes identical organometallic compounds represented by Formula 1" and a case in which "(an interlayer) includes two or more different organometallic compounds represented by Formula 1."

In an embodiment, the interlayer may include the organometallic compound represented by Formula 1, and may include only Compound 1. In this embodiment, Compound 1 may be included in the emission layer of the organic light-emitting device. In one or more embodiments, the interlayer may include, as the organometallic compound represented by Formula 1, Compound 1 and Compound 2. In this regard, Compound 1 and Compound 2 may exist in an identical layer (for example, Compound 1 and Compound 2 may all exist in an emission layer), or different layers (for example, Compound 1 may exist in an emission layer and Compound 2 may exist in an electron transport region).

In some embodiments,
the first electrode of the organic light-emitting device may be an anode,
the second electrode of the organic light-emitting device may be a cathode, and
the interlayer further includes a hole transport region located between the first electrode and the emission layer and an electron transport region located between the emission layer and the second electrode,
the hole transport region includes a hole injection layer, a hole transport layer, an emission auxiliary layer, an electron blocking layer, or any combination thereof, and
the electron transport region may include a buffer layer, a hole blocking layer, an electron transport layer, an electron injection layer, or any combination thereof.

In an embodiment, a second capping layer may be located on the second electrode, and
the second capping layer may include a material having a refractive index of 1.6 or more at a wavelength of 589 nm.

The term "an interlayer," as used herein, refers to a single layer and/or a plurality of layers located between the first electrode and the second electrode of an organic light-emitting device. A material included in the "interlayer" is not limited to an organic material. For example, the interlayer may include an inorganic material.

In an embodiment, the emission layer may include the organometallic compound represented by Formula 1.

In an embodiment, the emission layer includes the organometallic compound represented by Formula 1, the emission layer further includes a host, and an amount of the host of the emission layer may be greater than the amount of the organometallic compound represented by Formula 1 in the emission layer.

In an embodiment, the emission layer may further include a host, and the amount of the organometallic compound represented by Formula 1 may be from 0.01 parts by weight to 49.99 parts by weight based on 100 parts by weight of the emission layer.

In an embodiment, the electron transport region may include a phosphine oxide-containing compound.

Description of FIG. 1

FIG. 1 is a schematic cross-sectional view of an organic light-emitting device 10 according to an embodiment. The organic light-emitting device 10 includes a first electrode 110, an interlayer 130, and a second electrode 150.

Hereinafter, the structure of the organic light-emitting device 10 according to an embodiment and a method of manufacturing the organic light-emitting device 10 will be described in connection with FIG. 1.

First Electrode 110

In FIG. 1, a substrate may be additionally located under the first electrode 110 or above the second electrode 150. The substrate may be a glass substrate and/or a plastic substrate. The substrate may be a flexible substrate. In one or more embodiments, the substrate may include plastics with excellent heat resistance and/or durability, such as polyimide, polyethylene terephthalate (PET), polycarbonate, polyethylene naphthalate, polyarylate (PAR), polyetherimide, or a combination thereof.

The first electrode 110 may be formed by, for example, depositing and/or sputtering a material for forming the first electrode 110 on the substrate. When the first electrode 110 is an anode, a high work function material that can easily inject holes may be used as a material for a first electrode 110.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combinations thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be used as a material for forming a first electrode 110.

The first electrode 110 may have a single-layered structure including (or consisting of) a single layer or a multi-layered structure including a plurality of layers. In an embodiment, the first electrode 110 may have a three-layered structure of ITO/Ag/ITO.

Interlayer 130

The interlayer 130 is located on the first electrode 110. The interlayer 130 includes an emission layer.

The interlayer 130 may further include a hole transport region located between the first electrode 110 and the emission layer and an electron transport region located between the emission layer and the second electrode 150.

The interlayer 130 may further include metal-containing compounds such as organometallic compounds, inorganic materials such as quantum dots, and/or the like, in addition to various suitable organic materials.

In one or more embodiments, the interlayer 130 may include, i) two or more emitting units sequentially stacked between the first electrode 110 and the second electrode 150 and ii) a charge generation layer located between the two emitting units. When the interlayer 130 includes the emitting unit and the charge generation layer as described above, the organic light-emitting device 10 may be a tandem light-emitting device.

Hole Transport Region in Interlayer 130

The hole transport region may have: i) a single-layered structure including (or consisting of) a single layer including (or consisting of) a single material, ii) a single-layered structure including (or consisting of) a single layer including (or consisting of) a plurality of different materials, or iii) a multi-layered structure including a plurality of layers including different materials.

The hole transport region may include at least one layer selected from a hole injection layer, a hole transport layer, an emission auxiliary layer, and an electron blocking layer.

In an embodiment, the hole transport region may have a single-layered structure including a single layer including a plurality of different materials, or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein for each structure, constituting layers are sequentially stacked from the first electrode 110 in this stated order, but the structure of the hole transport region is not limited thereto.

The hole transport region may include a compound represented by Formula 201, a compound represented by Formula 202, or any combination thereof:

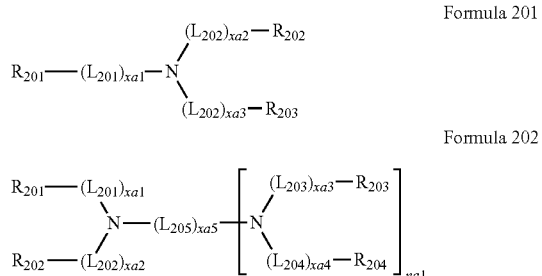

wherein, in Formulae 201 and 202, $L_{201}$ to $L_{204}$ may each independently be a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer selected from 0 to 5, xa5 may be an integer selected from 1 to 10, and $R_{201}$ to $R_{204}$ and $Q_{201}$ may each independently be a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$ (for example, a carbazole group or the like) (for examples of $R_{201}$ and $R_{202}$, refer to the following compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ poly cyclic group unsubstituted or substituted with at least one $R_{10a}$, and na1 may be an integer selected from 1 to 4.

In an embodiment, Formulae 201 and 202 may each include at least one of the groups represented by Formulae CY201 to CY217:

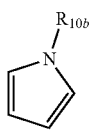

CY201

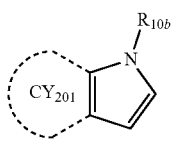

CY202

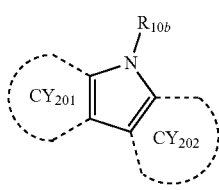

CY203

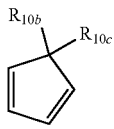

CY204

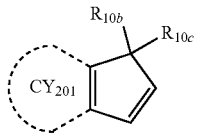

CY205

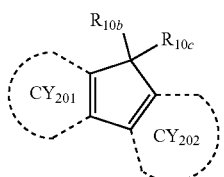

CY206

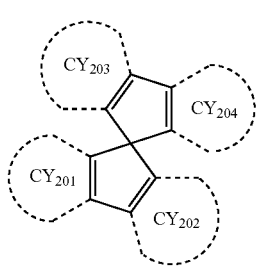

CY207

CY208

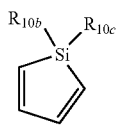

CY209

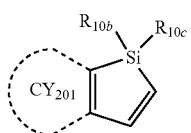

CY210

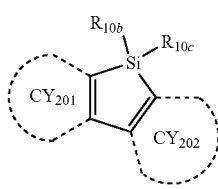

CY211

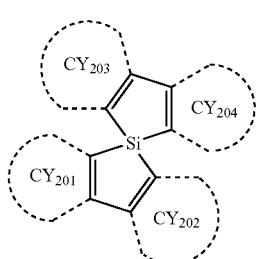

CY212

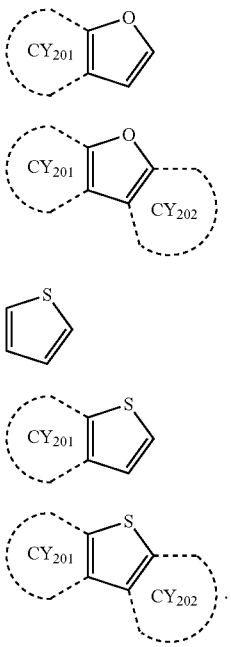

CY213
CY214
CY215
CY216
CY217

Regarding Formulae CY201 to CY217, $R_{10b}$ and $R_{10c}$ are the same as described in connection with $R_{10a}$, ring CY201 to ring CY204 may each independently be a $C_3$-$C_{20}$ carbocyclic group or a $C_1$-$C_{20}$ heterocyclic group, and at least one hydrogen in Formula CY201 to CY217 may be unsubstituted or substituted with at least one $R_{10a}$ described herein.

In an embodiment, ring CY201 to ring CY204 in Formulae CY201 to CY217 may each independently be a benzene group, a naphthalene group, a phenanthrene group, or an anthracene group.

In an embodiment, Formulae 201 and 202 may each include at least one of the groups represented by Formulae CY201 to CY203.

In one or more embodiments, Formula 201 may include at least one of the groups represented by Formulae CY201 to CY203 and at least one of the groups represented by Formulae CY204 to CY217.

In one or more embodiments, in Formula 201, xa1 is 1, $R_{201}$ is a group represented by one of Formulae CY201 to CY203, xa2 is 0, $R_{202}$ is a group represented by one of Formulae CY204 to CY207.

In one or more embodiments, each of Formulae 201 and 202 may not include a group represented by one of Formulae CY201 to CY203.

In one or more embodiments, each of Formulae 201 and 202 may not include a group represented by one of Formulae CY201 to CY203 and may include at least one of the groups represented by Formulae CY204 to CY217.

In an embodiment, each of Formulae 201 and 202 may not include a group represented by one of Formulae CY201 to CY217.

In an embodiment, the hole transport region may include one of Compounds HT1 to HT44, m-MTDATA, TDATA, 2-TNATA, NPB(NPD), β—NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

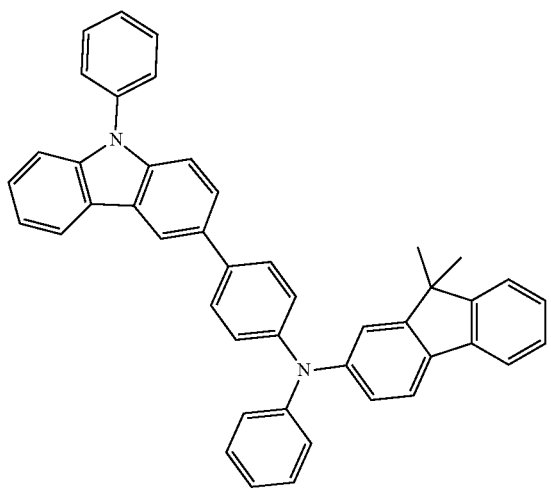

HT1

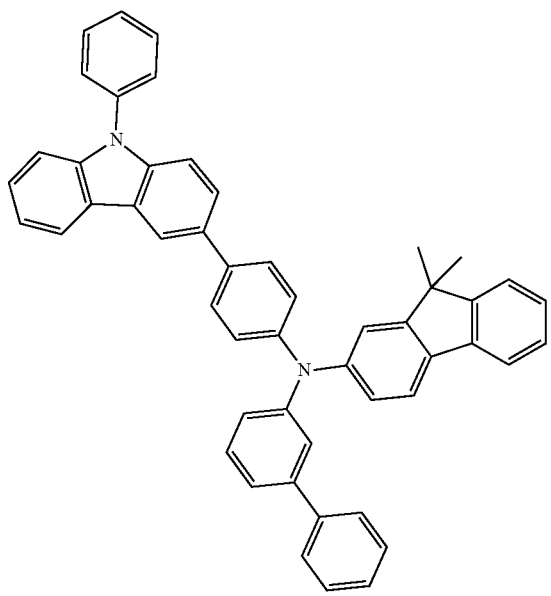

HT2

-continued
HT3
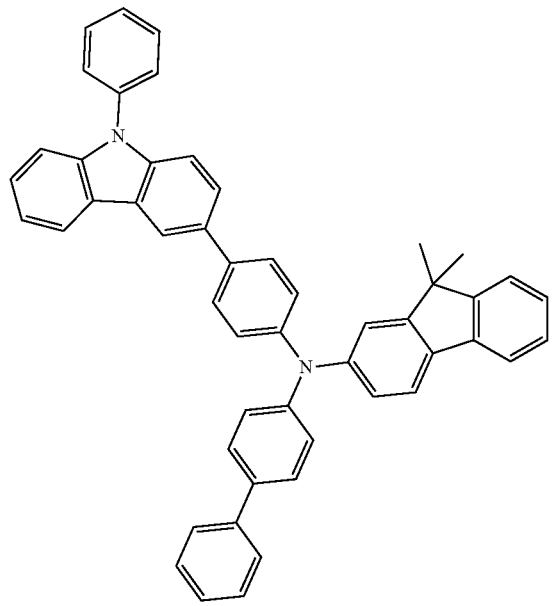
HT4
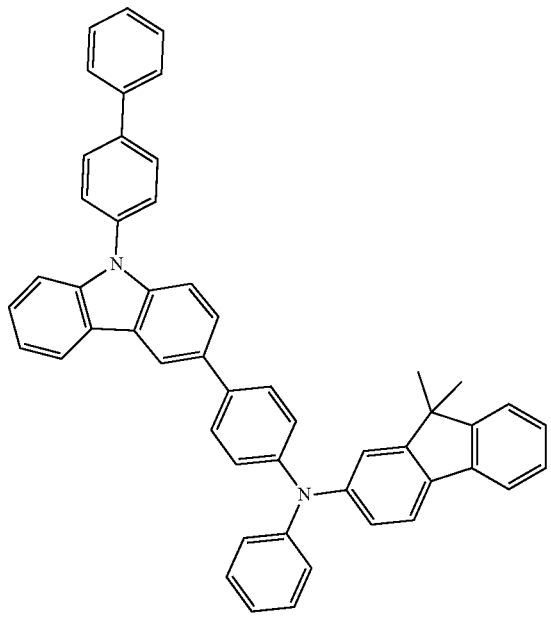
HT5
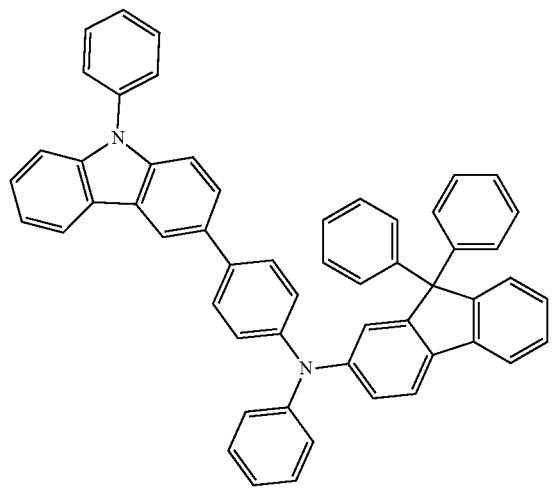
HT6
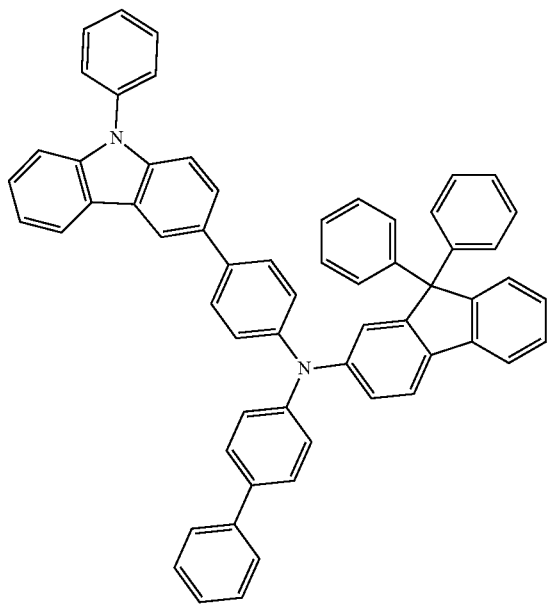

-continued
HT7
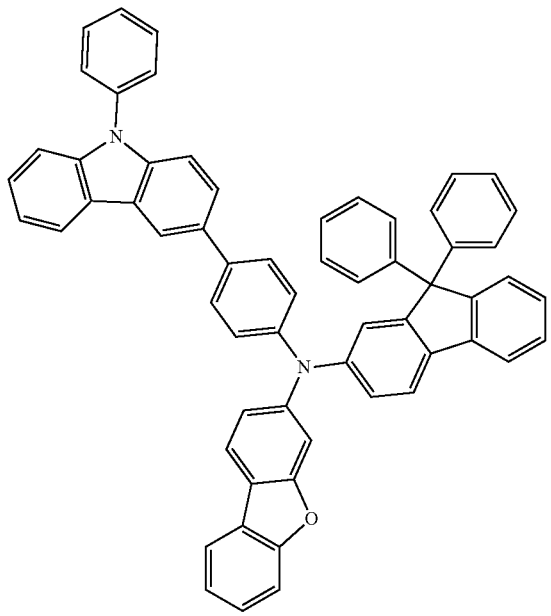
HT8
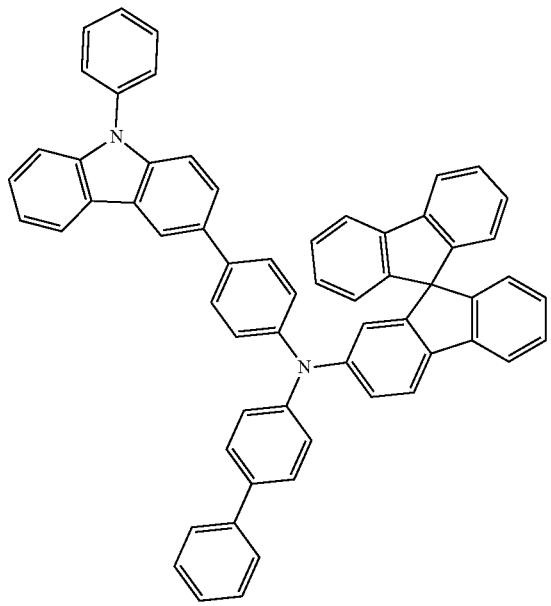
HT9
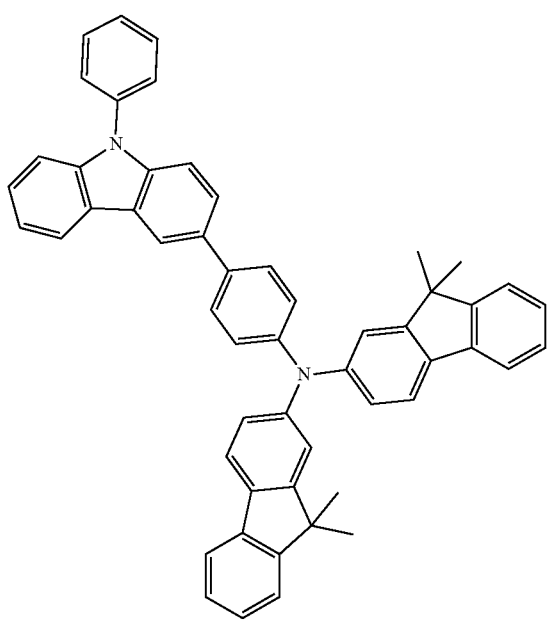
HT10
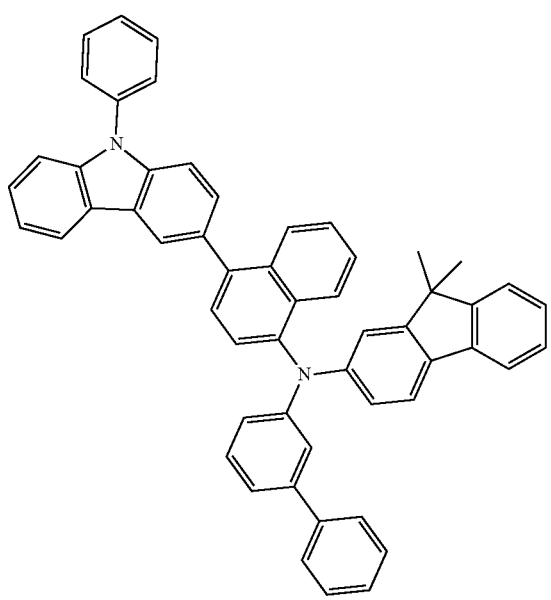

-continued
HT11
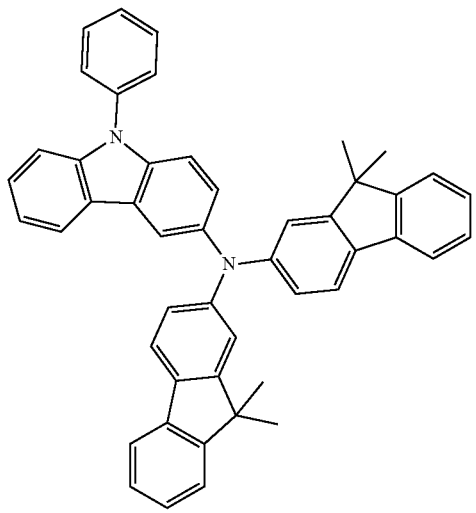
HT12
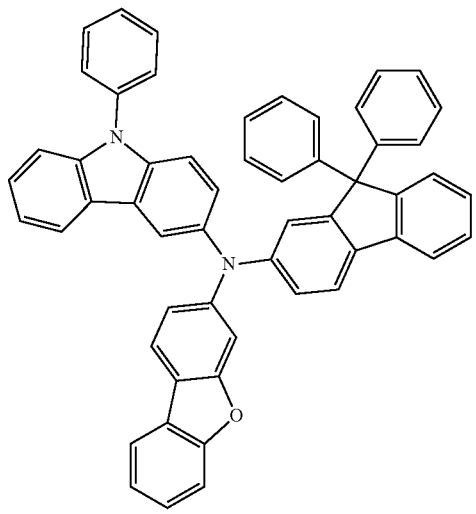
HT13
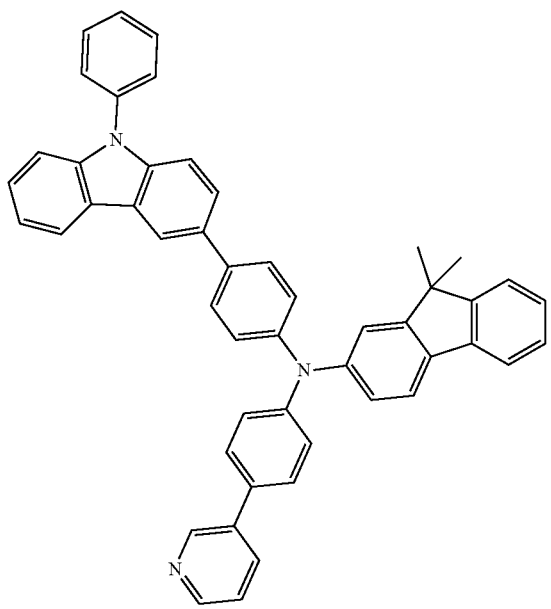
HT14
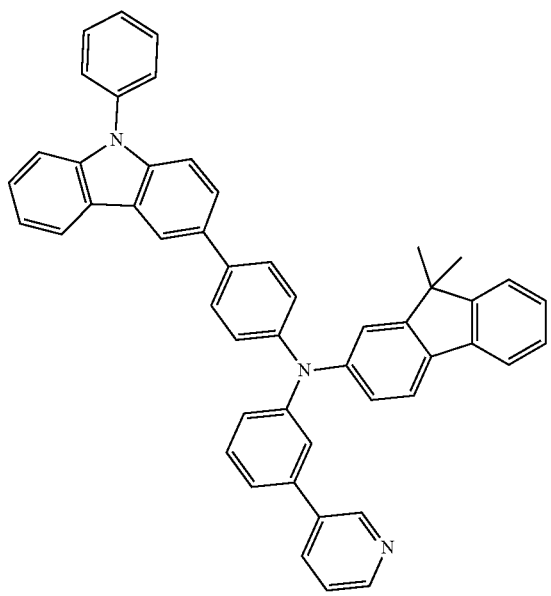
HT15
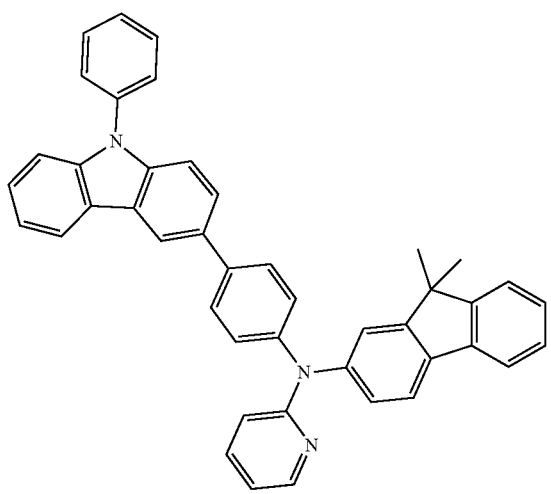
HT16
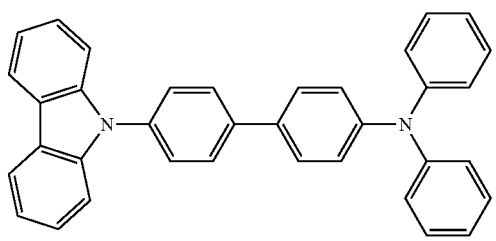

-continued
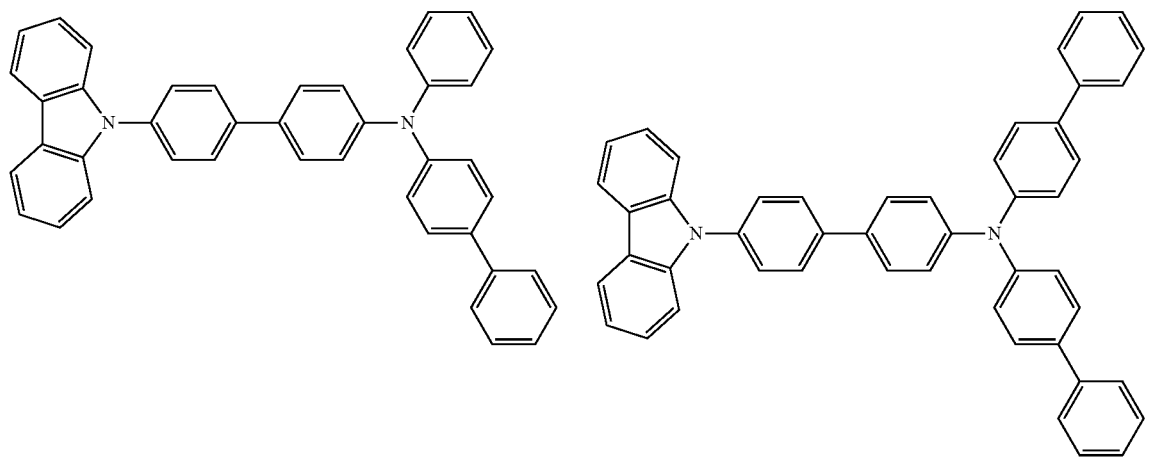
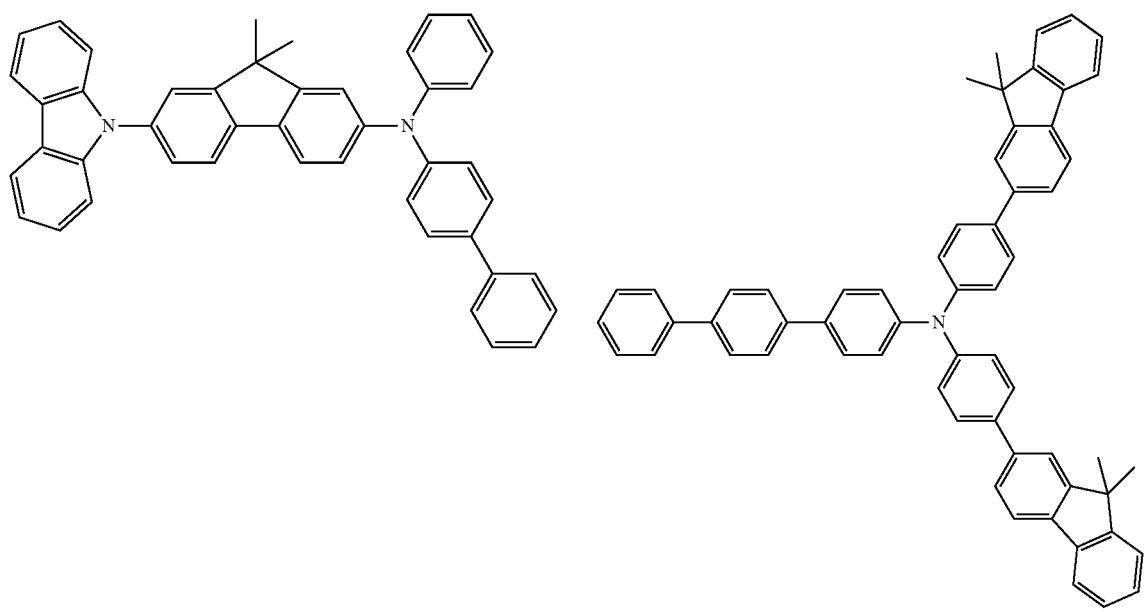

-continued
HT21
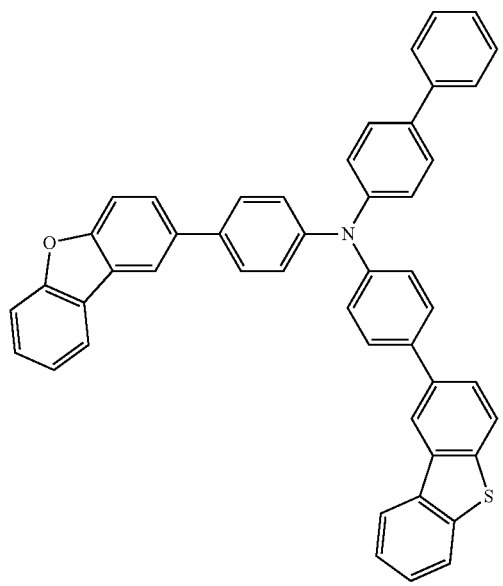
HT22
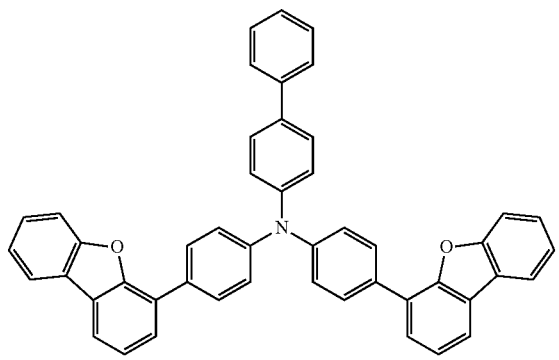
HT23
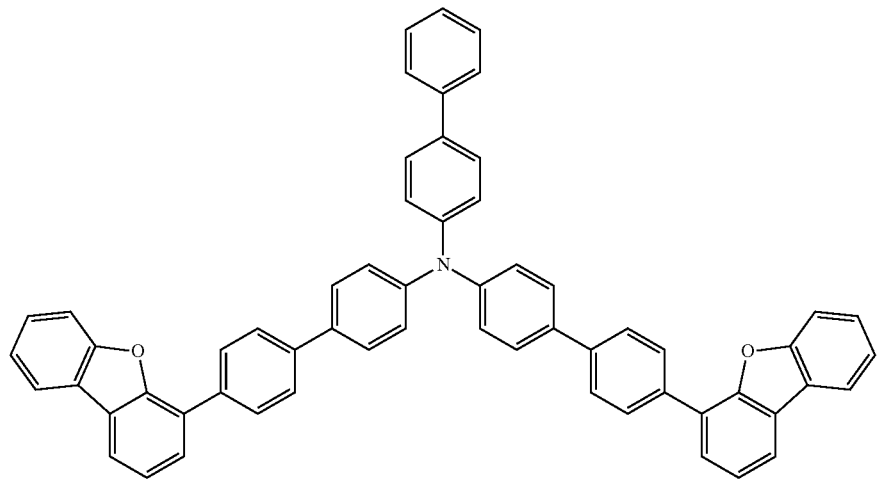

-continued
HT24
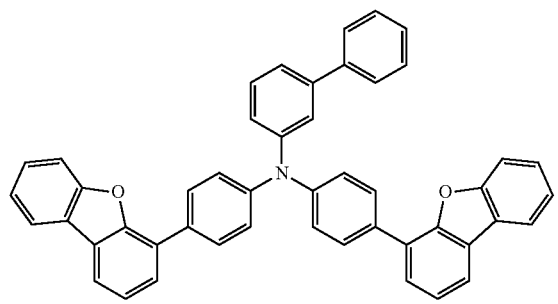
HT25
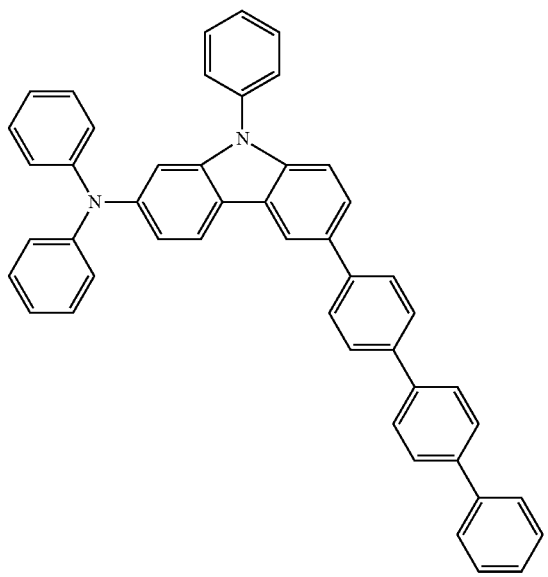
HT26
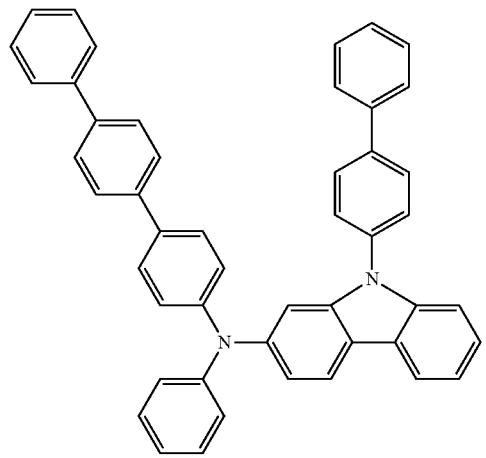
HT27
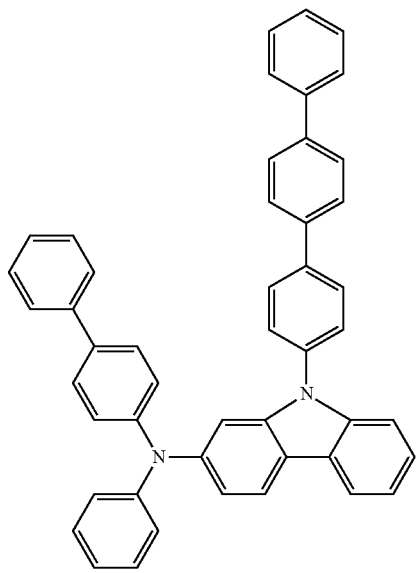
HT28
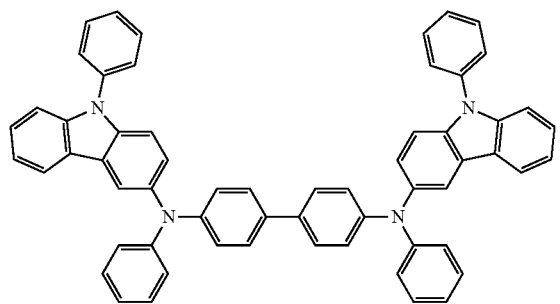
HT29
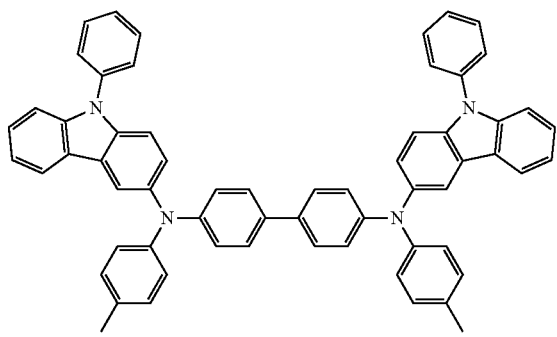

-continued
HT30
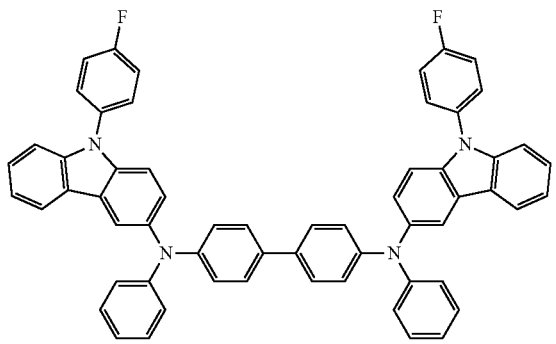
HT31
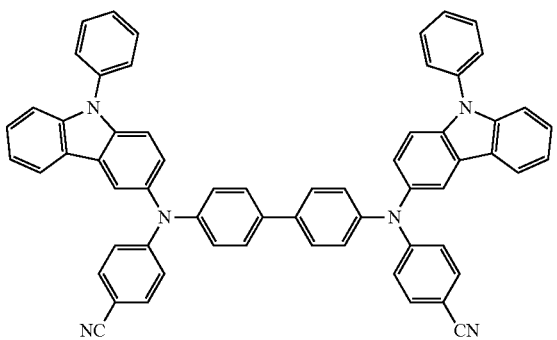
HT32
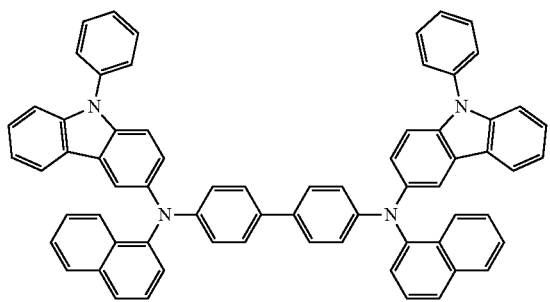
HT33
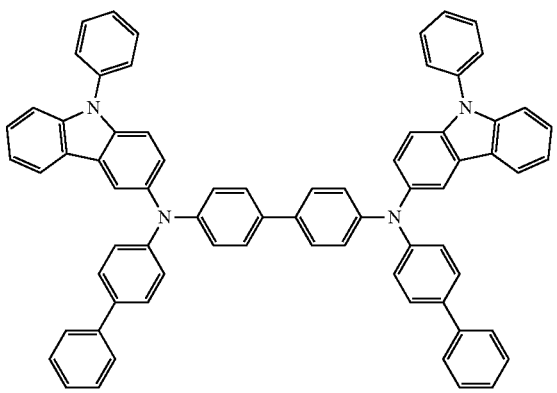
HT34
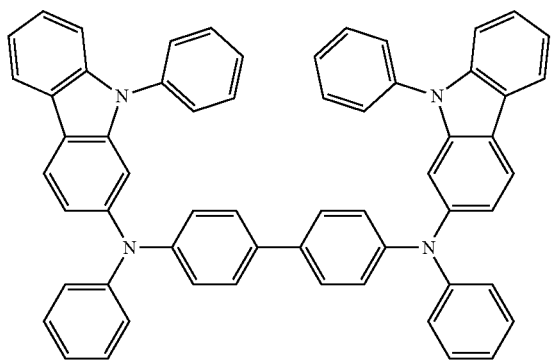
HT35
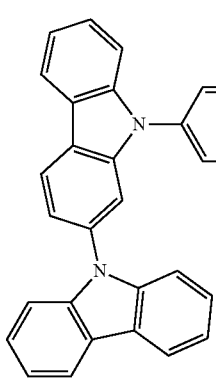

-continued
HT36
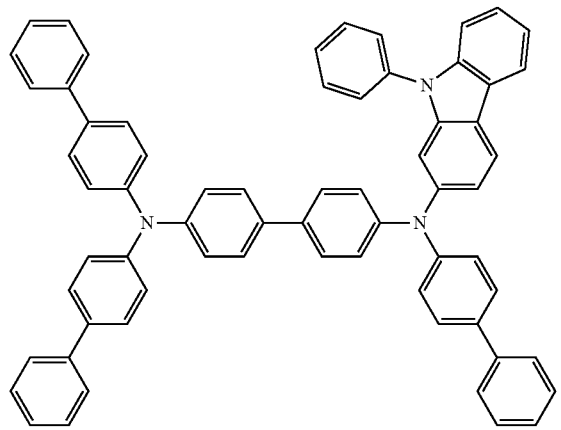
HT37
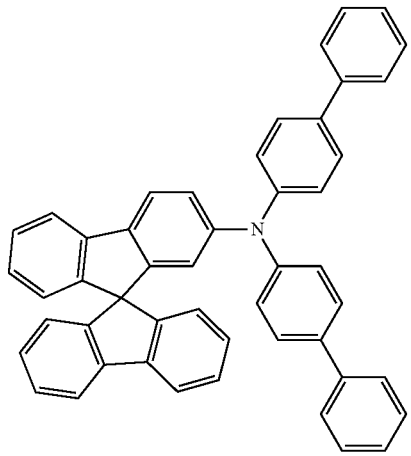
HT38
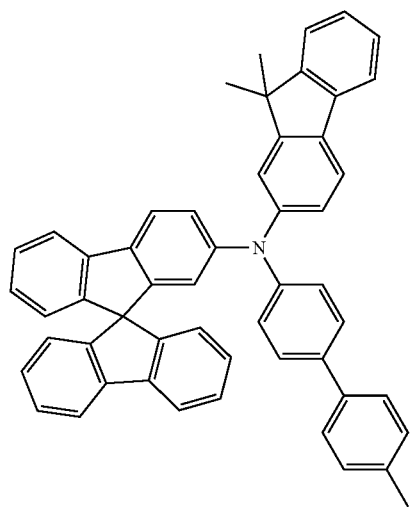
HT39
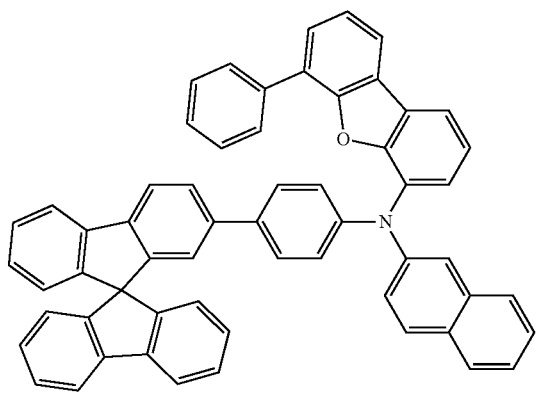
HT40
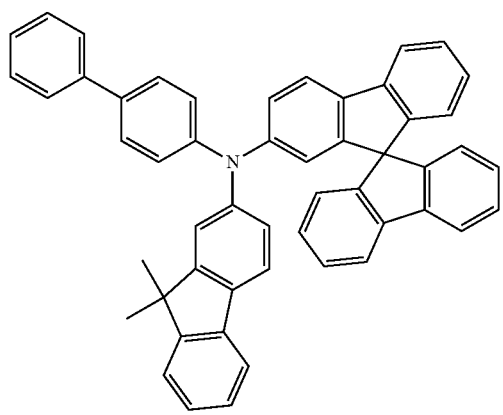
HT41
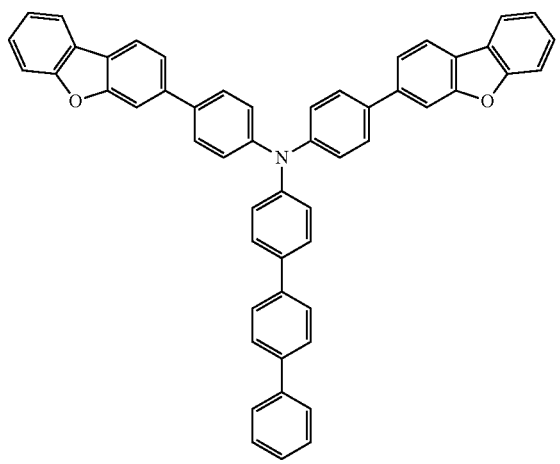

HT42
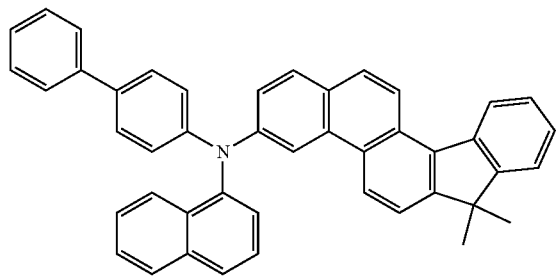
HT43
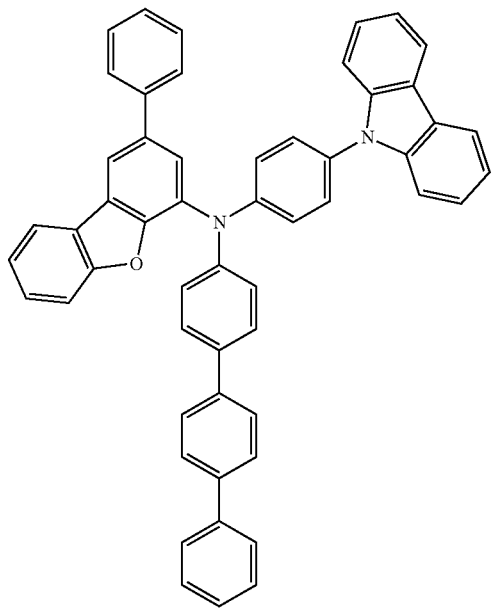
HT44
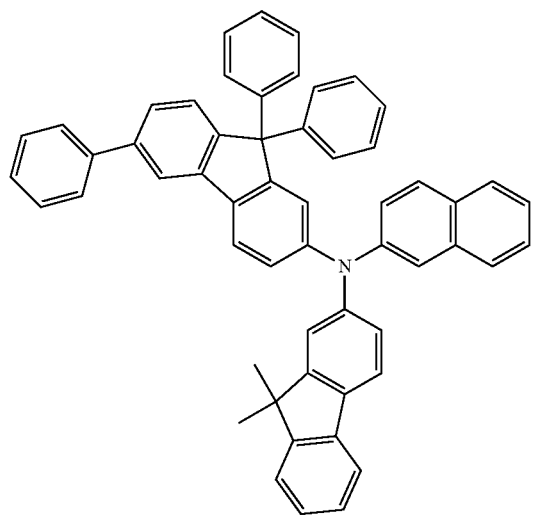

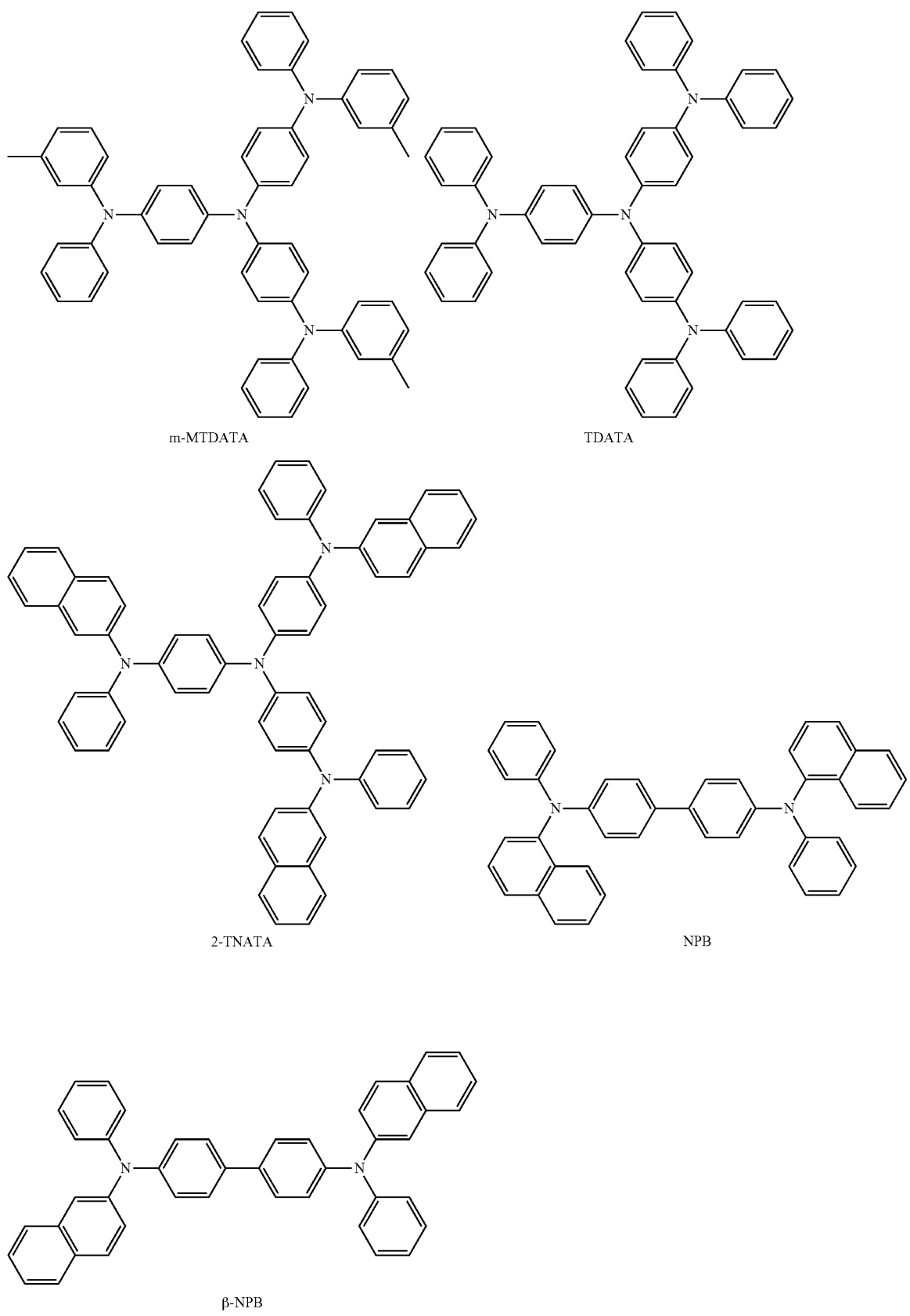

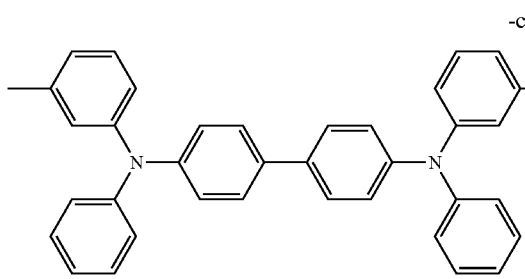
TPD

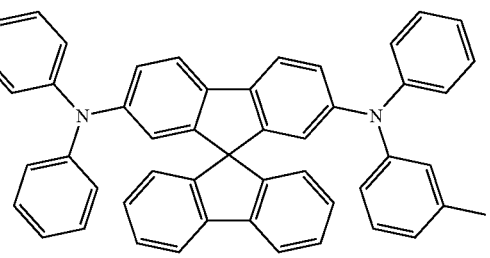
Spiro-TPD

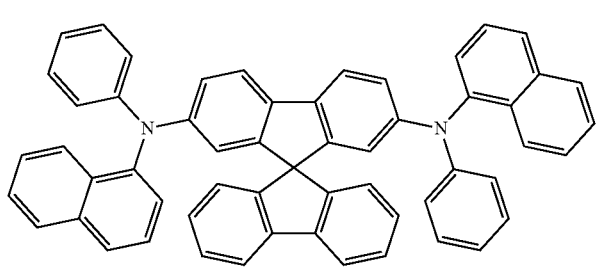
Spiro-NPB

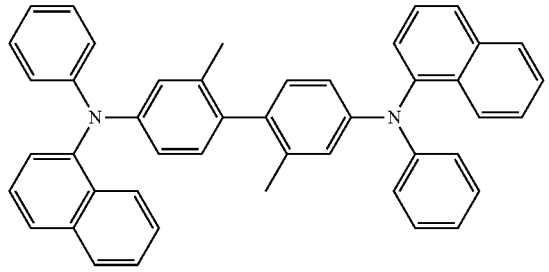
methylated-NPB

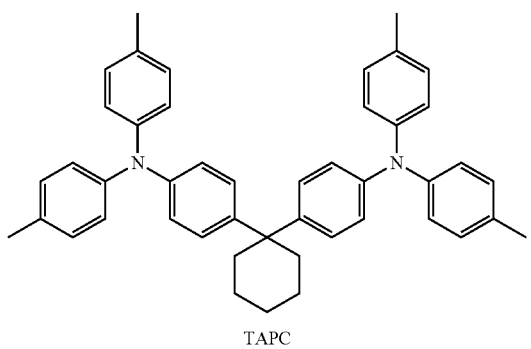
TAPC

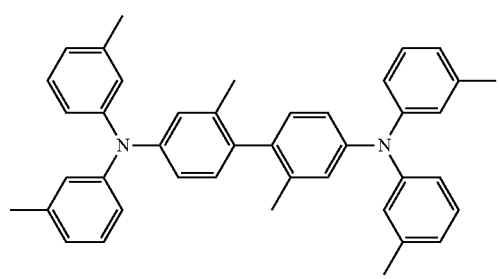
HMTPD

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, suitable or satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block or reduce the flow of electrons from an electron transport region. The emission auxiliary layer and the electron blocking layer may include the materials as described above.

P-Dopant

The hole transport region may further include, in addition to these materials, a charge-generating material for the improvement of conductive properties (e.g., electrical conductivity). The charge-generating material may be uniformly or non-uniformly dispersed in the hole transport region (for example, in the form of a single layer of a charge-generating material).

The charge-generation material may be, for example, a p-dopant.

In an embodiment, the lowest unoccupied molecular orbital (LUMO) energy level of the p-dopant may be −3.5 eV or less.

In an embodiment, the p-dopant may include a quinone derivative, a cyano group-containing compound, element EL1, an element EL2-containing compound, or any combination thereof.

Examples of the quinone derivative are TCNQ and F4-TCNQ.

Examples of the cyano group-containing compound are HAT-CN and a compound represented by Formula 221 below:

TCNQ

-continued

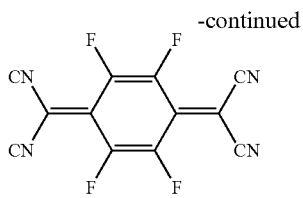

F4-TCNQ

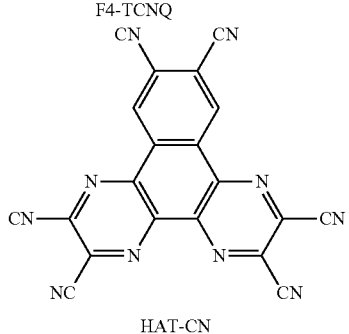

HAT-CN

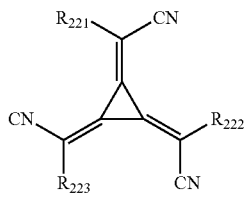

Formula 221 wherein, in Formula 221, $R_{221}$ to $R_{223}$ may each independently be a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_5$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —$C_1$, —Br, —I, or any combination thereof; or any combination thereof.

Regarding the element EL1 and element EL2-containing compound, element EL1 may be a metal, a metalloid, or a combination thereof, and element EL2 may be a non-metal, a metalloid, or a combination thereof.

Examples of the metal are: an alkali metal (for example, lithium (Li), sodium (Na), potassium (K), rubidium (Rb), cesium (Cs), and/or the like); alkaline earth metal (for example, beryllium (Be), magnesium (Mg), calcium (Ca), strontium (Sr), barium (Ba), and/or the like); transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), and/or the like); post-transition metals (for example, zinc (Zn), indium (In), tin (Sn), and/or the like); and lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and/or the like).

Examples of the metalloid are silicon (Si), antimony (Sb), and tellurium (Te).

Examples of the non-metal are oxygen (O) and halogen (for example, F, Cl, Br, I, etc.).

In an embodiment, examples of element EL1 and the element EL2-containing compound are a metal oxide, a metal halide (for example, a metal fluoride, a metal chloride, a metal bromide, and/or a metal iodide), a metalloid halide (for example, a metalloid fluoride, a metalloid chloride, a metalloid bromide, and/or a metalloid iodide), a metal telluride, and any combination thereof.

Examples of the metal oxide are tungsten oxide (for example, WO, $W_2O_3$, $WO_2$, $WO_3$, and/or $W_2O_5$), vanadium oxide (for example, VO, $V_2O_3$, $VO_2$, and/or $V_2O_5$), molybdenum oxide (MoO, $Mo_2O_3$, $MoO_2$, $MoO_3$, and/or $Mo_2O_5$), and rhenium oxide (for example, $ReO_3$).

Examples of the metal halide are alkali metal halide, alkaline earth metal halide, transition metal halide, post-transition metal halide, and lanthanide metal halide.

Examples of the alkali metal halide are LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide are $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide are titanium halide (for example, $TiF_4$, $TiCl_4$, $TiBr_4$, and/or $TiI_4$), zirconium halide (for example, $ZrF_4$, $ZrCl_4$, $ZrBr_4$, and/or $ZrI_4$), hafnium halide (for example, $HfF_4$, $HfCl_4$, $HfBr_4$, and/or $HfI_4$), vanadium halide (for example, $VF_3$, $VCl_3$, $VBr_3$, and/or $VI_3$), niobium halide (for example, $NbF_3$, $NbCl_3$, $NbBr_3$, and/or $NbI_3$), tantalum halide (for example, $TaF_3$, $TaCl_3$, $TaBr_3$, and/or $TaI_3$), chromium halide (for example, $CrF_3$, $CrCl_3$, $CrBr_3$, and/or $CrI_3$), molybdenum halide (for example, $MoF_3$, $MoCl_3$, $MoBr_3$, and/or $MoI_3$), tungsten halide (for example, $WF_3$, $WCl_3$, $WBr_3$, and/or $WI_3$), manganese halide (for example, $MnF_2$, $MnCl_2$, $MnBr_2$, and/or $MnI_2$), technetium halide (for example, $TcF_2$, $TcCl_2$, $TcBr_2$, and/or $TcI_2$), rhenium halide (for example, $ReF_2$, $ReCl_2$, $ReBr_2$, and/or $ReI_2$), iron halide (for example, $FeF_2$, $FeCl_2$, $FeBr_2$, and/or $FeI_2$), ruthenium halide (for example, $RuF_2$, $RuCl_2$, $RuBr_2$, and/or $RuI_2$), osmium halide (for example, $OsF_2$, $OsCl_2$, $OsBr_2$, and/or $OsI_2$), cobalt halide (for example, $CoF_2$, $CoCl_2$, $CoBr_2$, and/or $CoI_2$), rhodium halide (for example, $RhF_2$, $RhCl_2$, $RhBr_2$, and/or $RhI_2$), iridium halide (for example, $IrF_2$, $IrCl_2$, $IrBr_2$, and/or $IrI_2$), nickel halide (for example, $NiF_2$, $NiCl_2$, $NiBr_2$, and/or $NiI_2$), palladium halide (for example, $PdF_2$, $PdCl_2$, $PdBr_2$, and/or $PdI_2$), platinum halide (for example, $PtF_2$, $PtCl_2$, $PtBr_2$, and/or $PtI_2$), copper halide (for example, CuF, CuCl, CuBr, and/or CuI), silver halide (for example, AgF, AgCl, AgBr, and/or AgI), and gold halide (for example, AUF, AuCl, AuBr, and/or AuI).

Examples of the post-transition metal halide are zinc halide (for example, $ZnF_2$, $ZnCl_2$, $ZnBr_2$, and/or $ZnI_2$), indium halide (for example, $InI_3$), and tin halide (for example, $SnI_2$).

Examples of the lanthanide metal halide are YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, and $SmI_3$.

Examples of the metalloid halide are antimony halide (for example, $SbCl_5$).

Examples of the metal telluride are an alkali metal telluride (for example, $Li_2Te$, $Na_2Te$, $K_2Te$, $Rb_2Te$, and/or $Cs_2Te$), alkaline earth metal telluride (for example, BeTe, MgTe, CaTe, SrTe, and/or BaTe), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, and/or $Au_2Te$), post-transition metal telluride (for example, ZnTe), and lanthanide metal telluride (for example, LaTe, CeTe, PrTe, NdTe, PmTe, EuTe, GdTe, TbTe, DyTe, HoTe, ErTe, TmTe, YbTe, and/or LuTe).

Emission Layer in Interlayer 130

When the organic light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers of a red emission layer, a green emission layer, and a blue emission layer, in which the two or more layers contact (e.g., physically contact) each other or are separated from each other. In one or more embodiments, the emission layer may include two or more materials of a red light-emitting material, a green light-emitting material, and a blue light-emitting material, in which the two or more materials are mixed with each other in a single layer to emit white light.

The emission layer may include a host and a dopant. The dopant may include at least one selected from a phosphorescent dopant and a fluorescent dopant. The phosphorescent dopant may include the organometallic compound represented by Formula 1.

The amount of the dopant in the emission layer may be in a range of from about 0.01 to about 15 parts by weight based on 100 parts by weight of the host.

In one or more embodiments, the emission layer may include a quantum dot.

In some embodiments, the emission layer may include a delayed fluorescent material. The delayed fluorescent material may act as a host or a dopant in the emission layer.

A thickness of the emission layer may be in a range of about 100 Å to about 1,000 Å, for example, about 200 Å to about 600 Å. When the thickness of the emission layer is within any of the foregoing ranges, excellent light-emission characteristics may be obtained without a substantial increase in driving voltage.

Host in Emission Layer

In one or more embodiments, the host may include a compound represented by Formula 301 below:

$$[Ar_{301}]_{xb11}-[(L_{301})_{xb1}-R_{301}]_{xb21} \qquad \text{Formula 301}$$

wherein, in Formula 301,
Ar$_{301}$ and L$_{301}$ may each independently be a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$,
xb11 may be 1, 2, or 3,
xb1 may be an integer selected from 0 to 5,
R$_{301}$ may be hydrogen, deuterium, —F, —Cl, —Br, —I, hydroxyl group, cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si(Q$_{301}$)(Q$_{302}$)(Q$_{303}$), —N(Q$_{301}$)(Q$_{302}$), —B(Q$_{301}$)(Q$_{302}$), —C(=O)(Q$_{301}$), —S(=O)$_2$(Q$_{301}$), or —P(=O)(Q$_{301}$)(Q$_{302}$),
xb21 may be an integer selected from 1 to 5,
Q$_{301}$ to Q$_{303}$ are the same as described in connection with Q$_1$.

In one or more embodiments, when xb11 in Formula 301 is 2 or more, two or more of Ar$_{301}$(s) may be linked to each other via a single bond.

In an embodiment, the host may include a compound represented by Formula 301-1, a compound represented by Formula 301-2, or any combination embodiment:

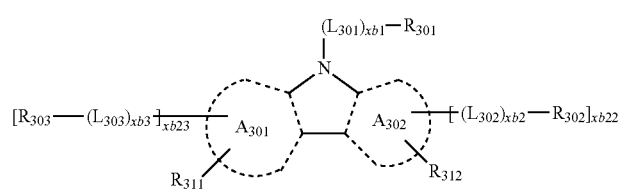

Formula 301-1

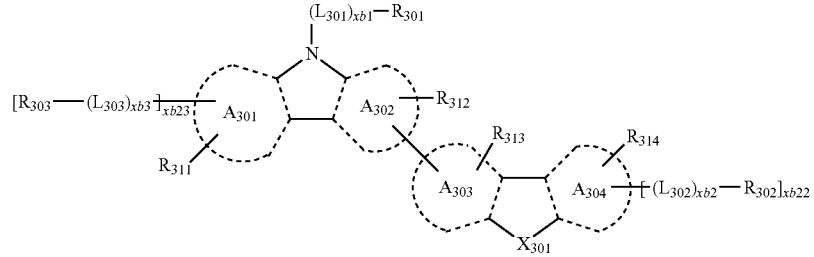

Formula 301-2 wherein, in Formulae 301-1 and 301-2,
ring A$_{301}$ to ring A$_{304}$ may each independently be a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$,
X$_{301}$ may be O, S, N-[(L$_{304}$)$_{xb4}$-R$_{304}$], C(R$_{304}$)(R$_{305}$), or Si(R$_{304}$)(R$_{305}$),
xb22 and xb23 may each independently be 0, 1, or 2,
L$_{301}$, xb1, and R$_{301}$ are the same as described above,
L$_{302}$ to L$_{304}$ are each independently the same as described in connection with L$_{301}$,
xb2 to xb4 may each independently be the same as described in connection with xb1, and
R$_{302}$ to R$_{305}$ and R$_{311}$ to R$_{314}$ are the same as described in connection with R$_{301}$.

In one or more embodiments, the host may include an alkaline earth metal complex. In an embodiment, the host may be a Be complex (for example, Compound H55), a Mg complex, a Zn complex, or any combination thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), or any combination thereof, but embodiments of the present disclosure are not limited thereto:

H1
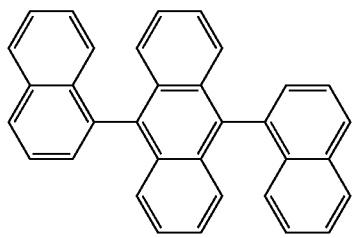

H2
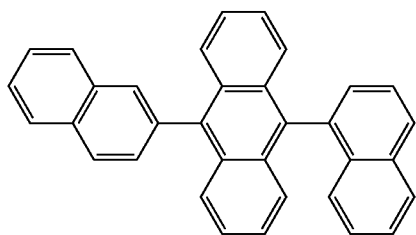

H3
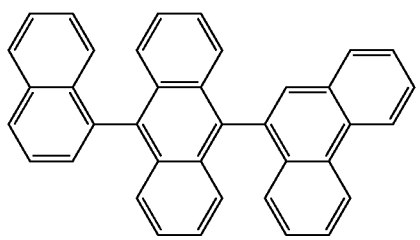

H4
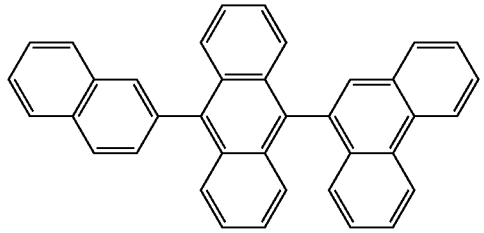

H5
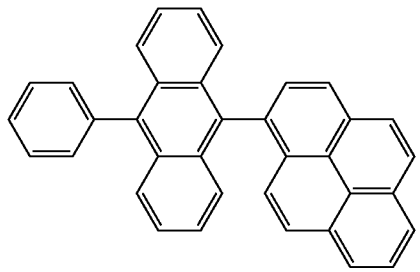

H6
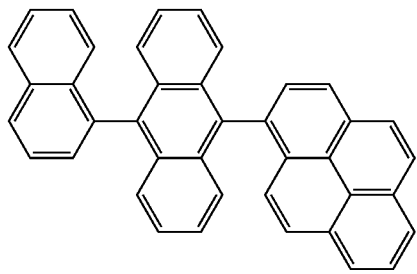

H7
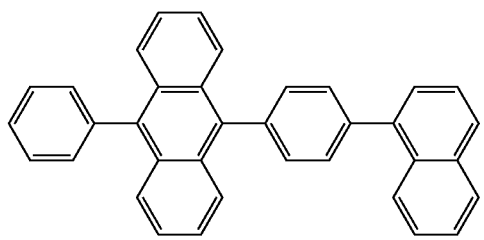

H8
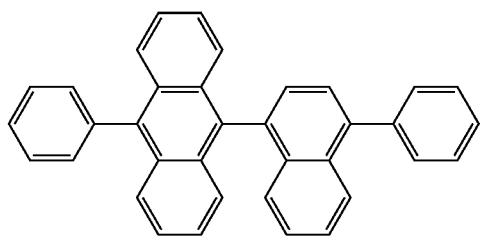

H9
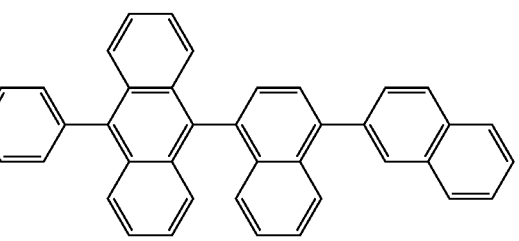

H10
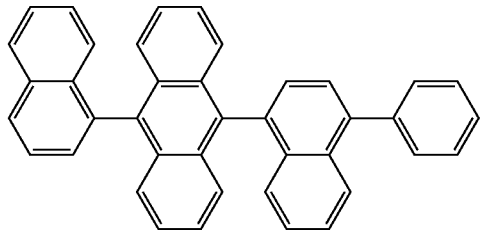

H11
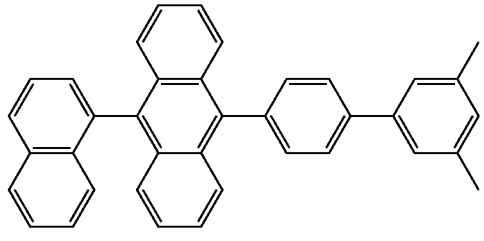

H12
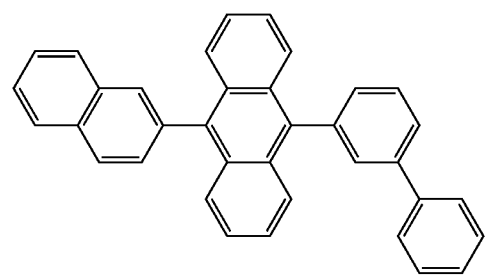
H13
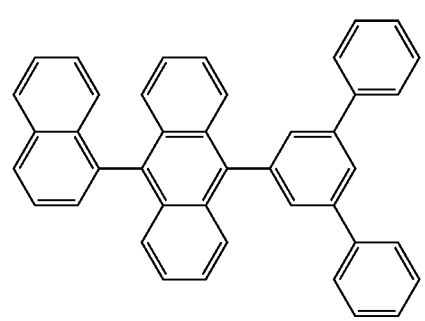
H14
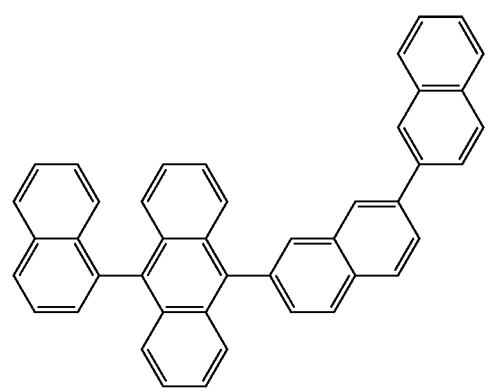
H15
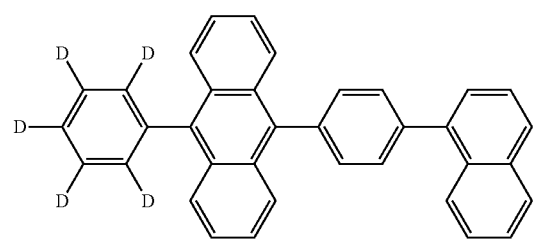
H16
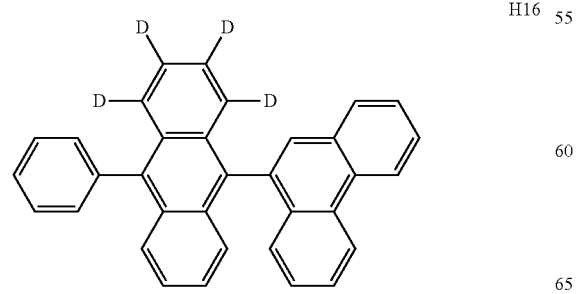
H17
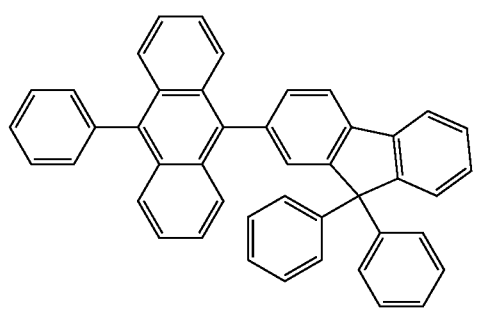
H18
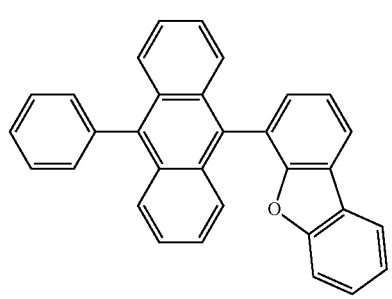
H19
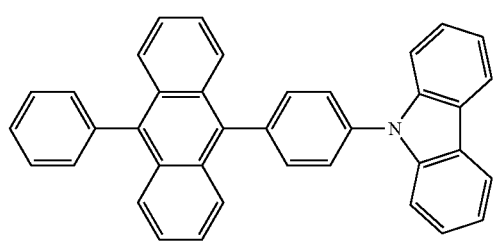
H20
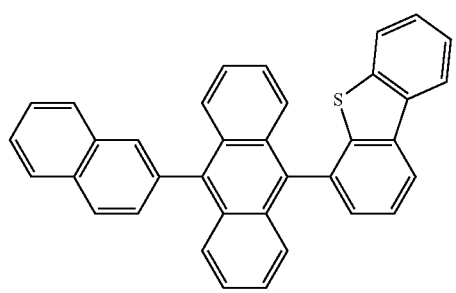
H21
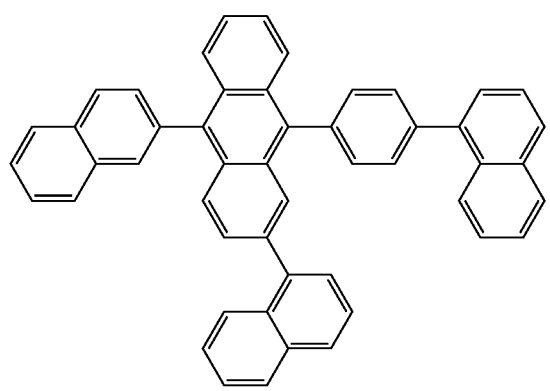

H22
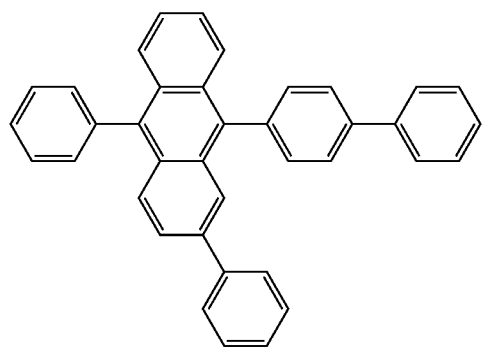
H23
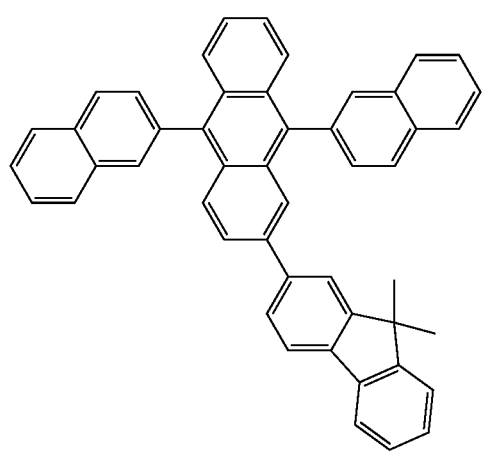
H24
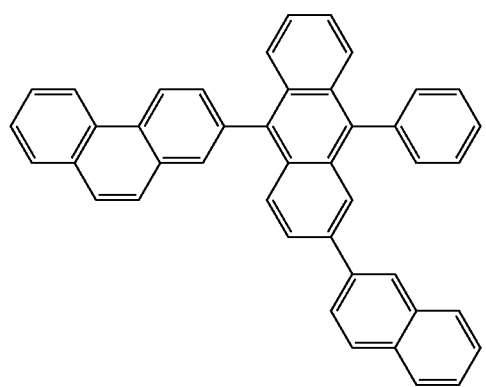
H25
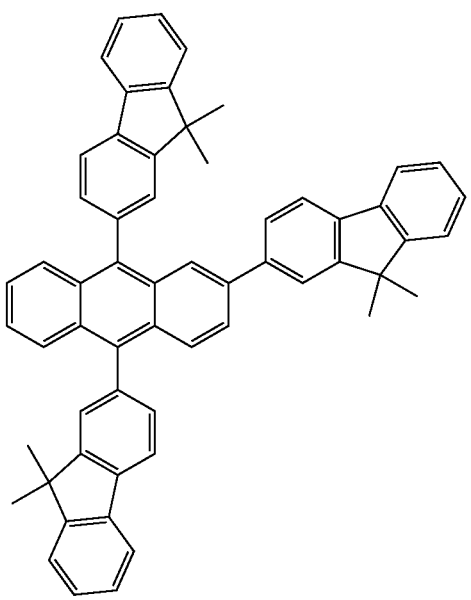
H26
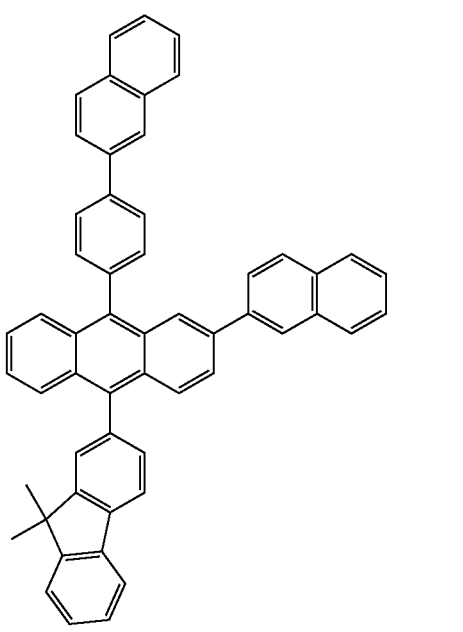

-continued
H27
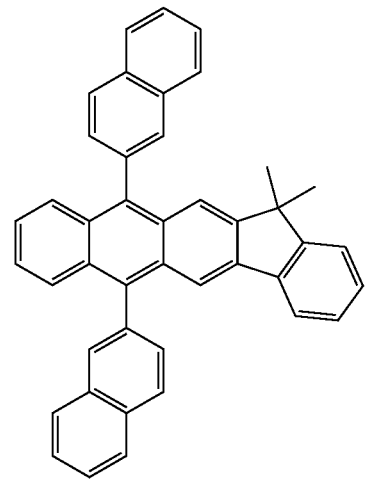
H28
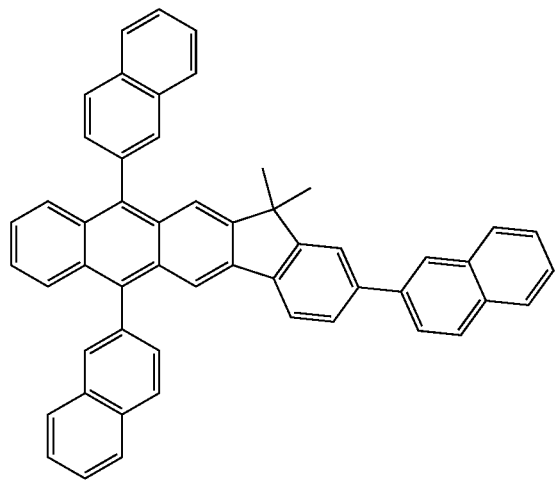
H29
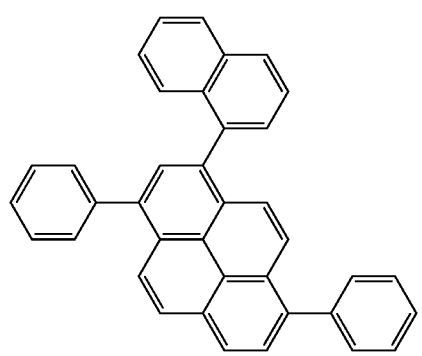
-continued
H30
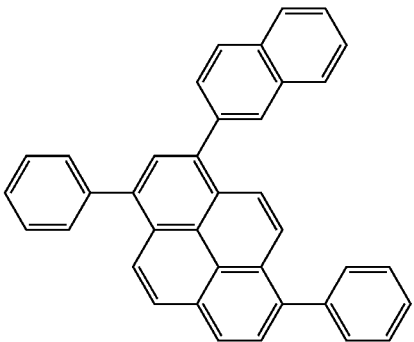
H31
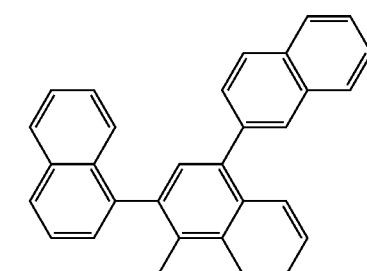
H32
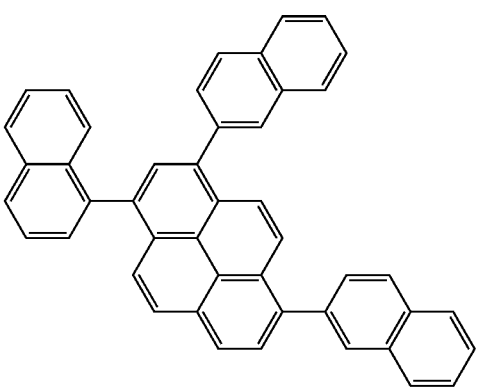
H33
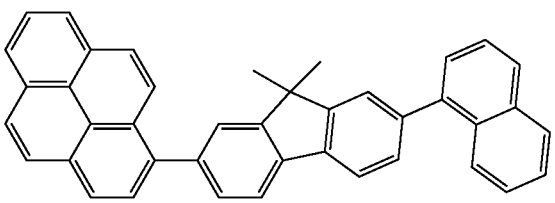
H34
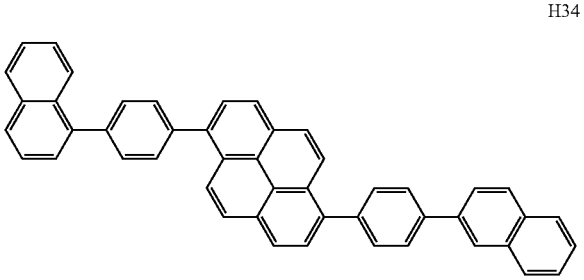

101
-continued
H35
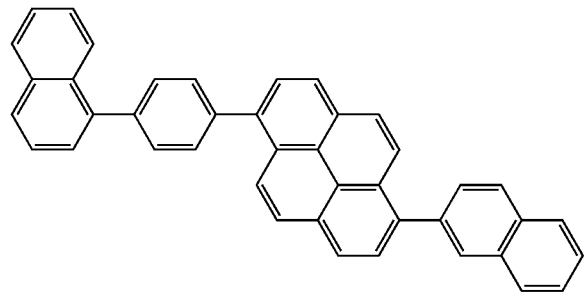
H36
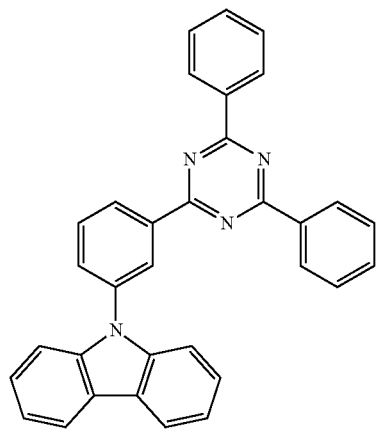
H37
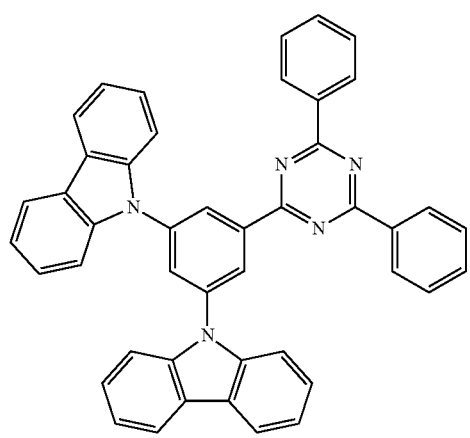
H38
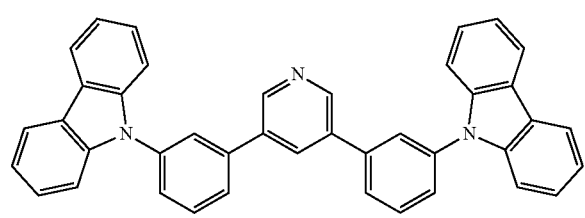
102
-continued
H39
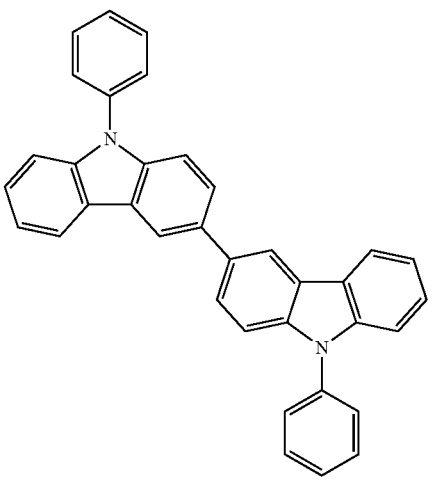
H40
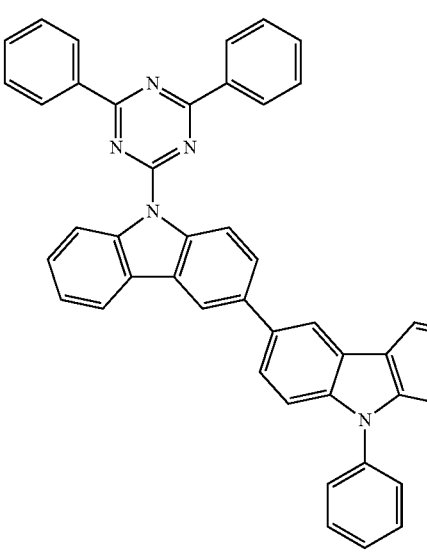
H41
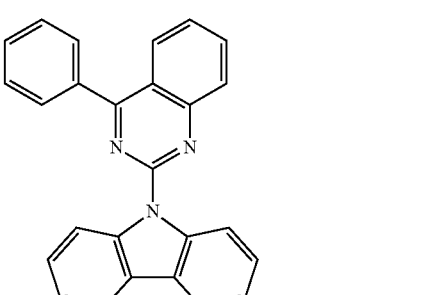

103
-continued
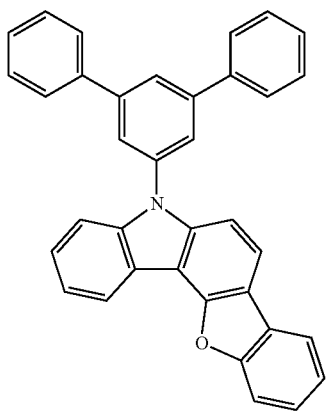
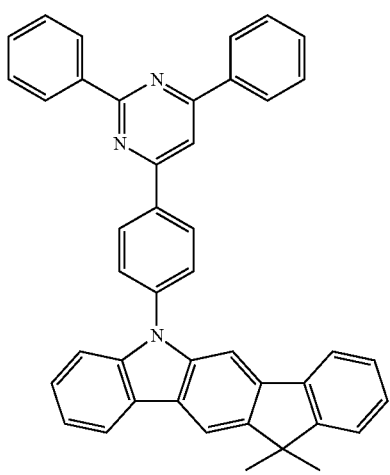
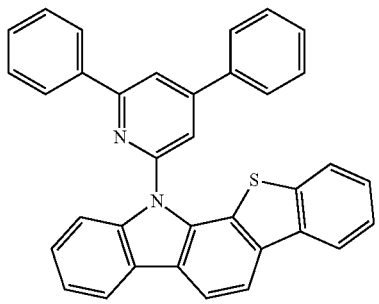
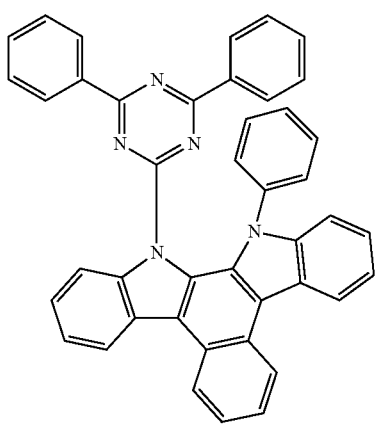
104
-continued
H42
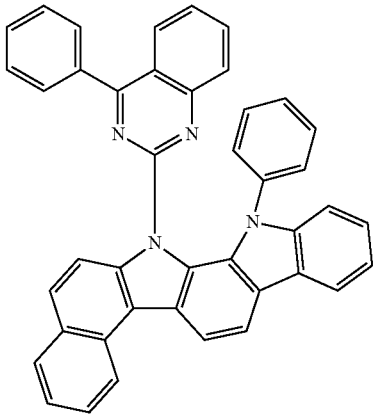
H43
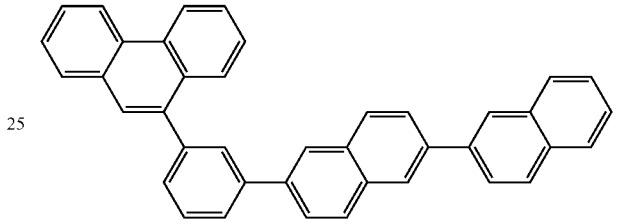
H44
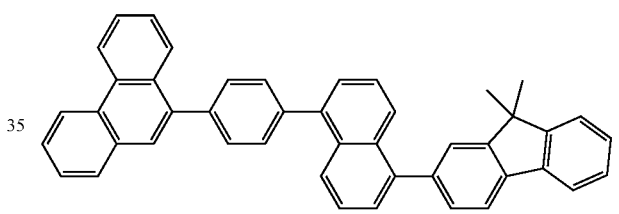
H45
H46
H47
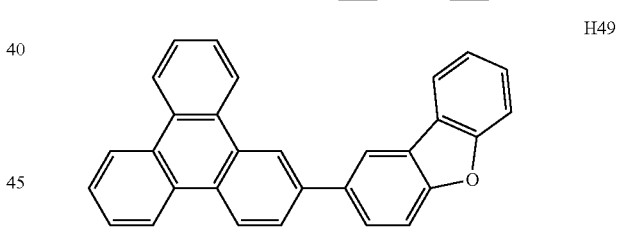
H48
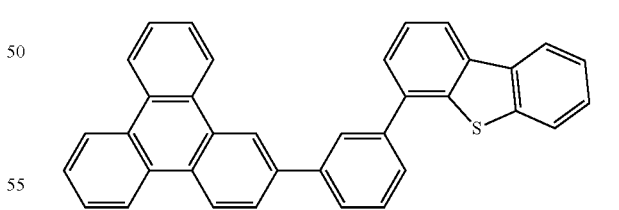
H49
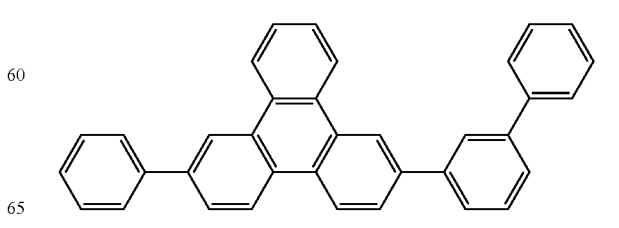
H50
H51

H52
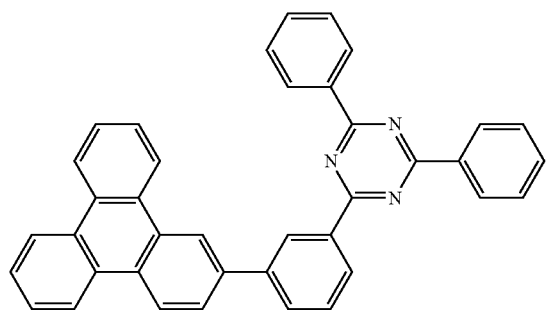
H56
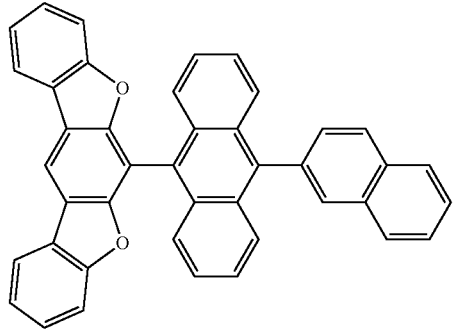
H53
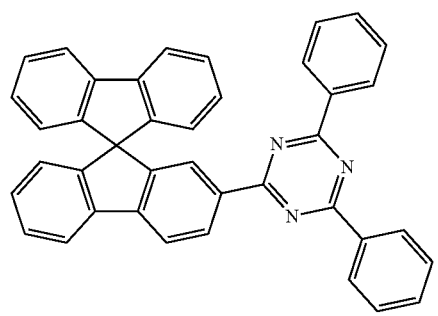
H57
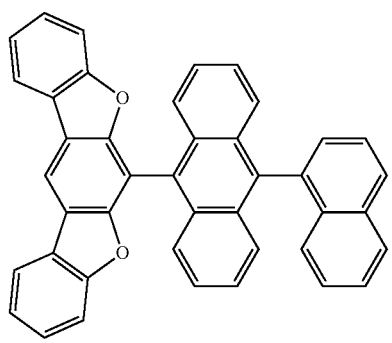
H54
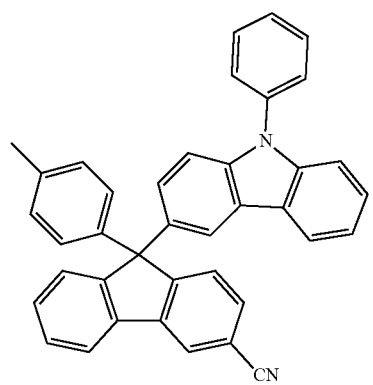
H58
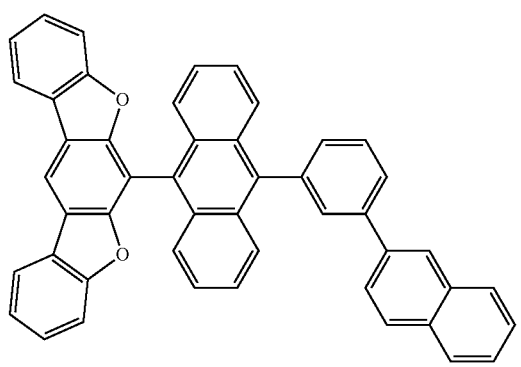
H55
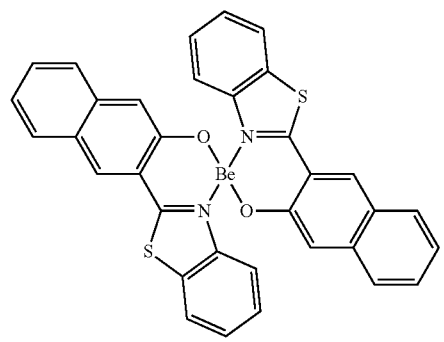
H59
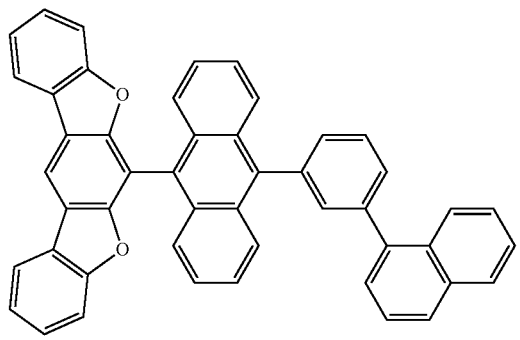

H60
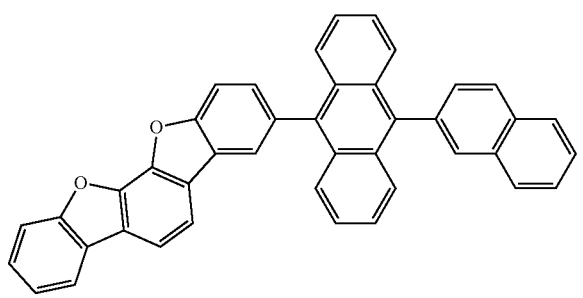
H61
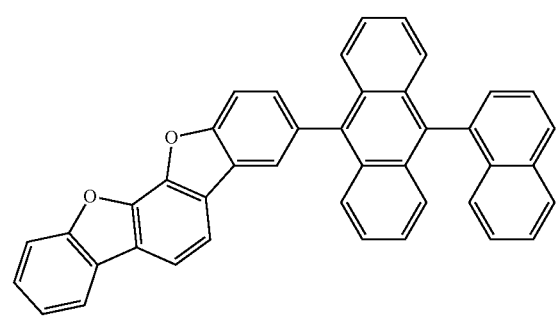
H62
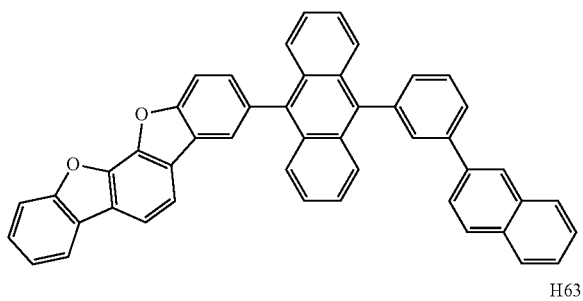
H63
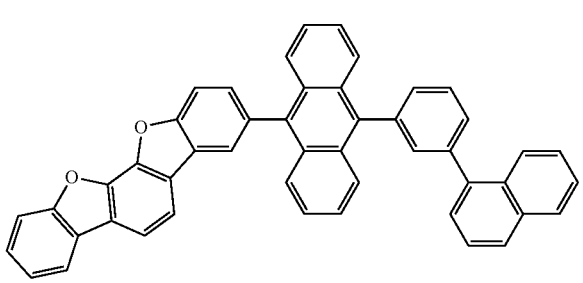
H64
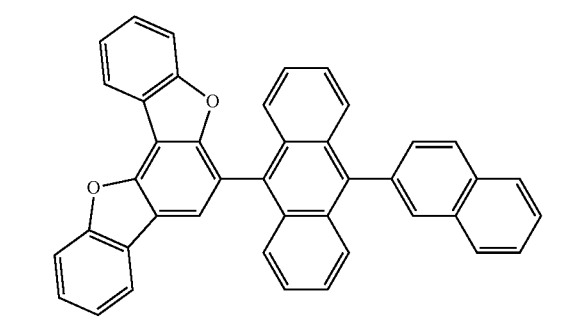
H65
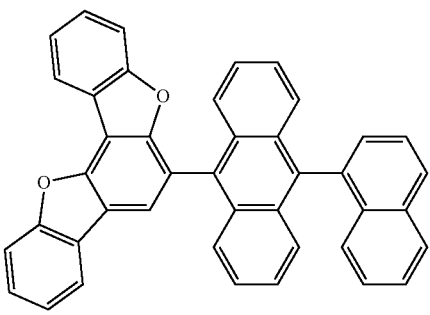
H66
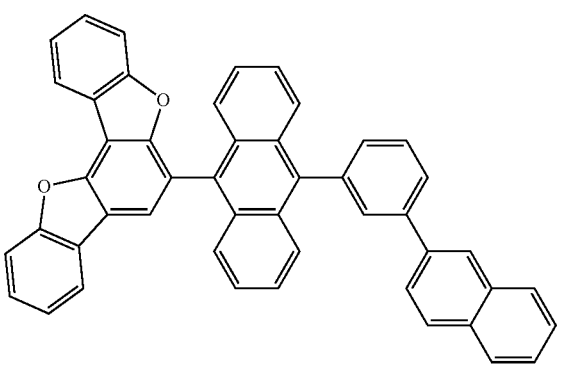
H67
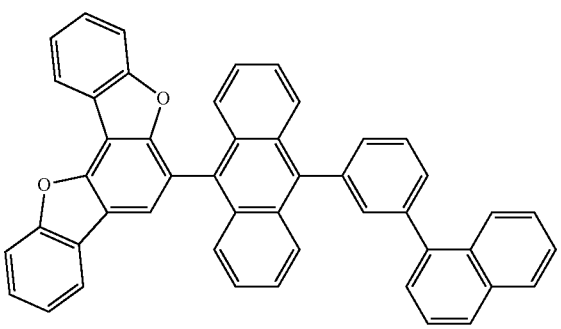
H68
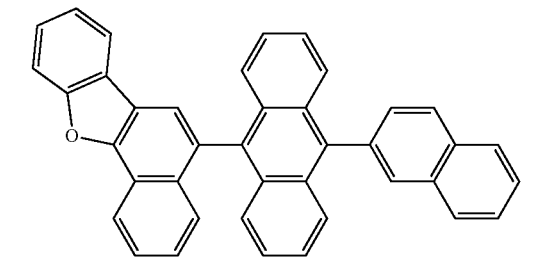
H69
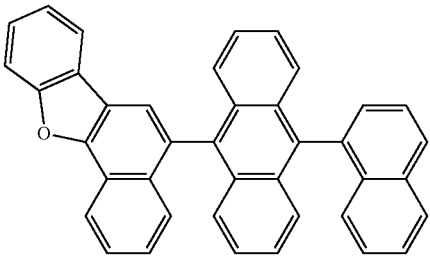

-continued
H70
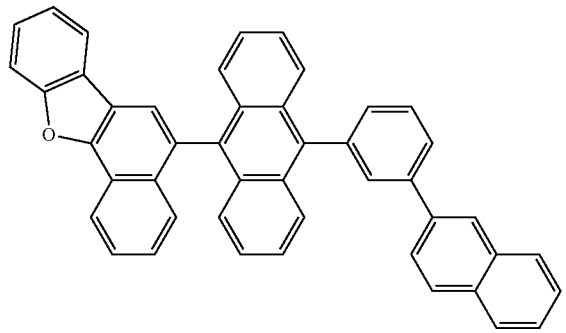
H71
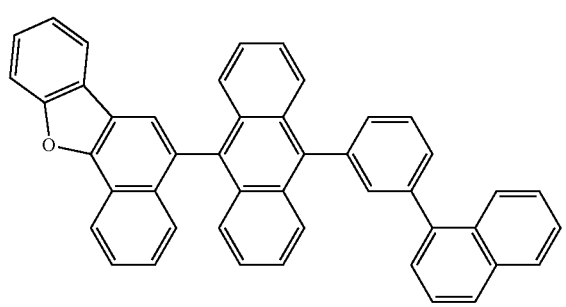
H72
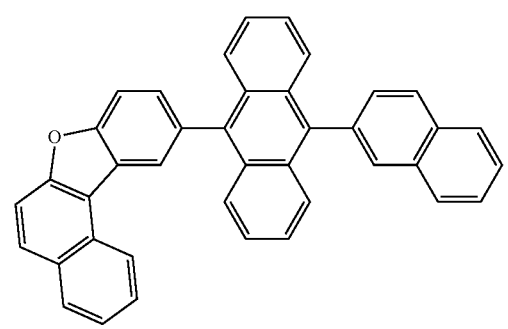
H73
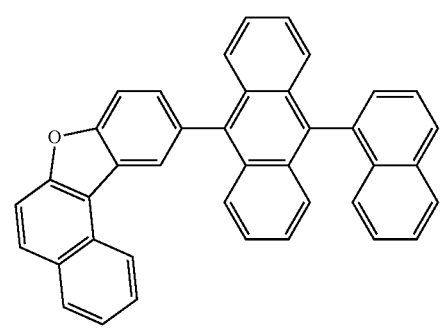
-continued
H74
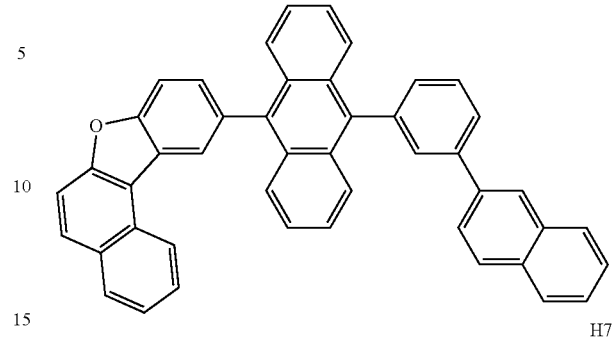
H75
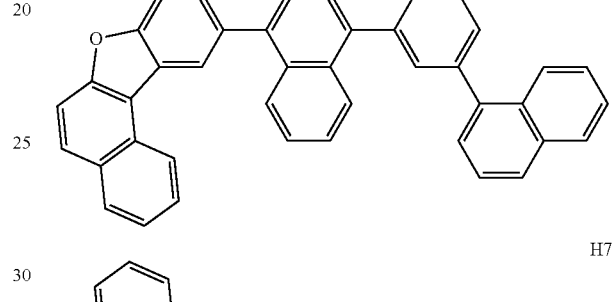
H76
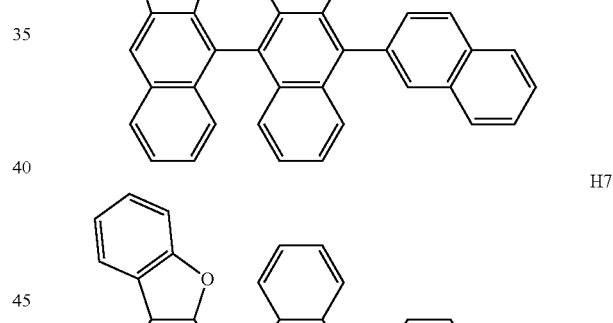
H77
H78
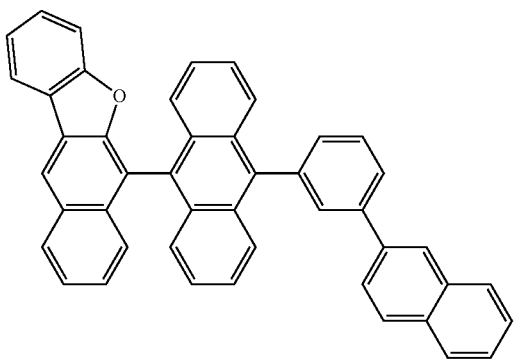

H79
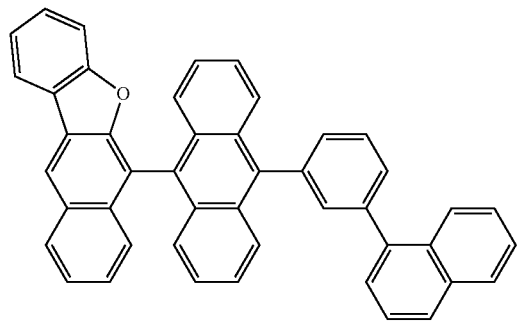
H83
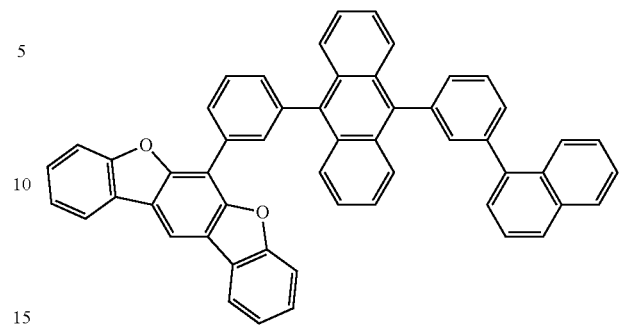
H80
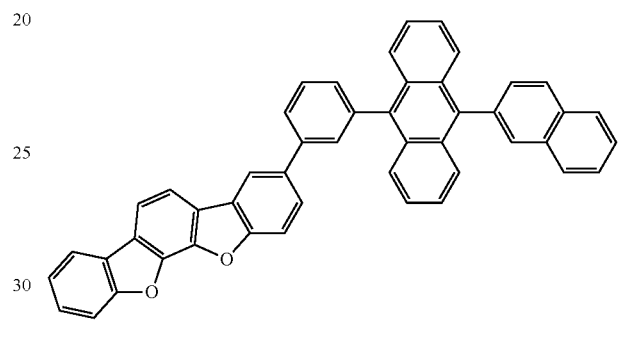
H84
H81
H85
H82
H86
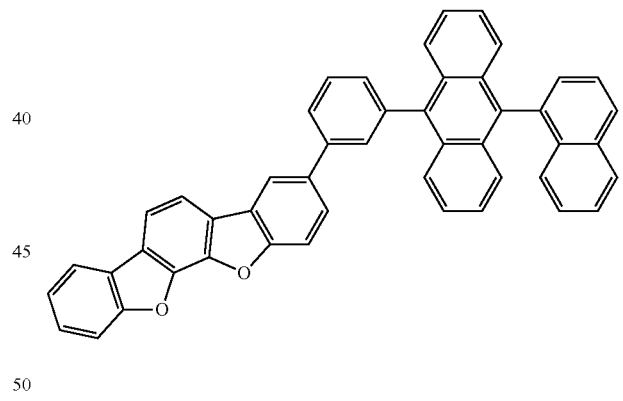
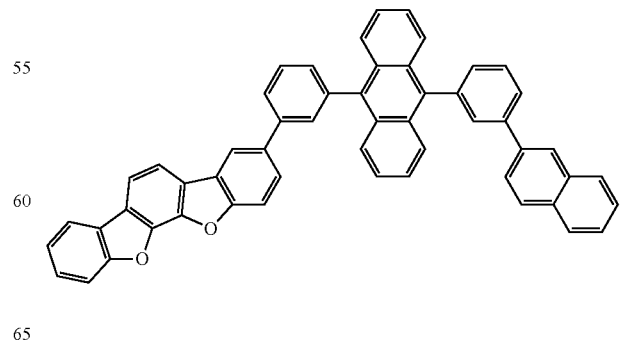

H87
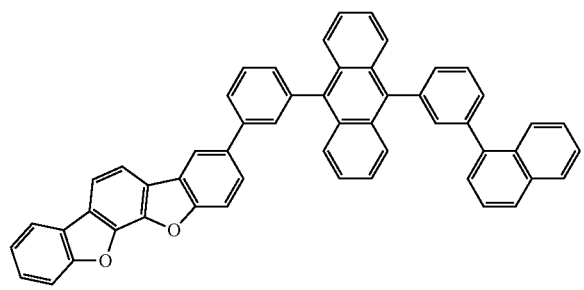
H88
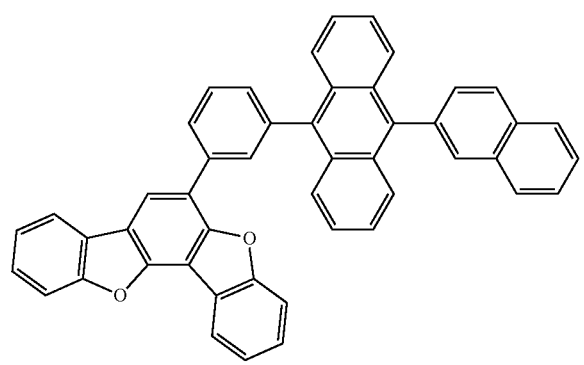
H89
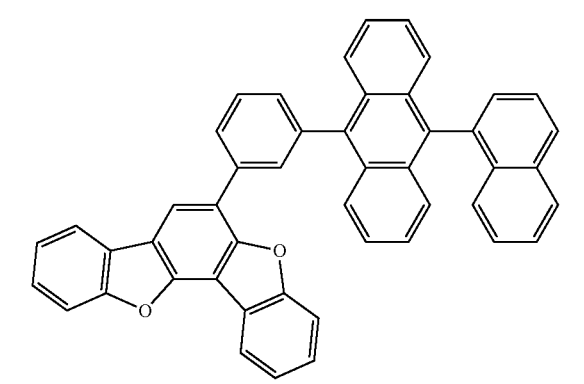
H90
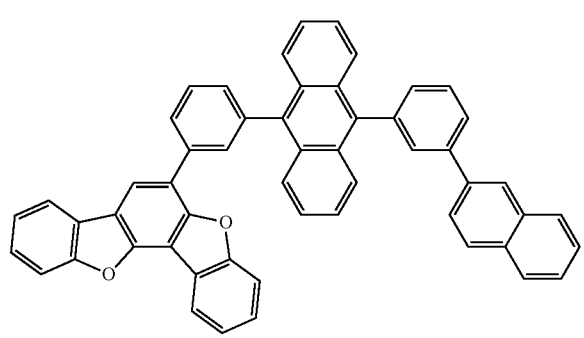
H91
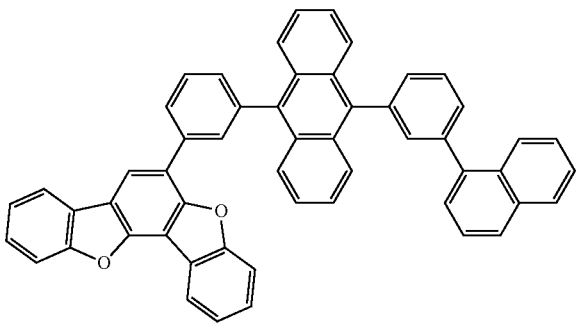
H92
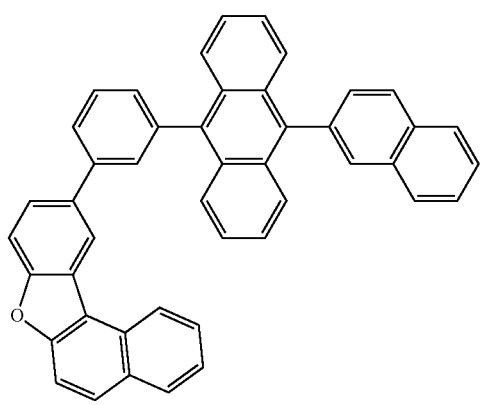
H93
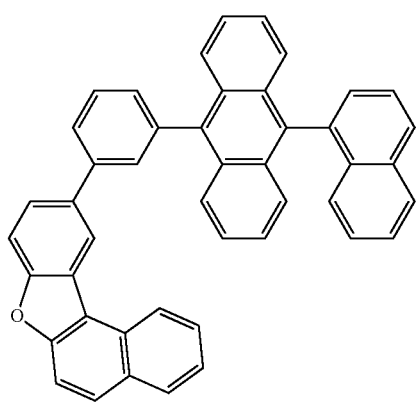
H94
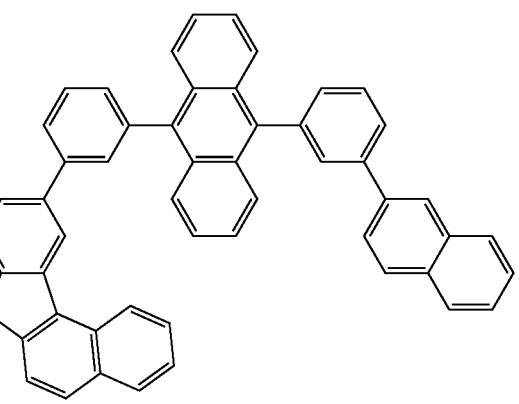

H95
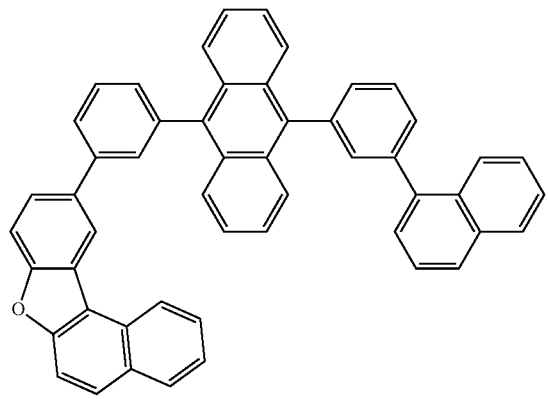
H99
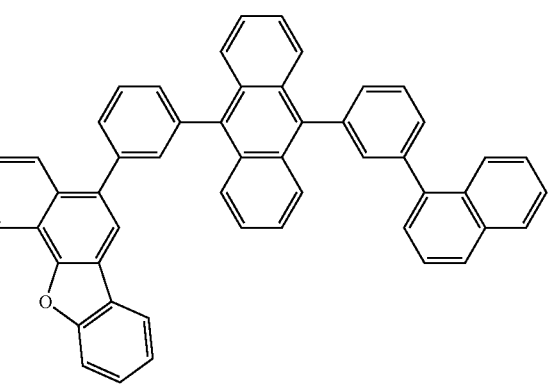
H96
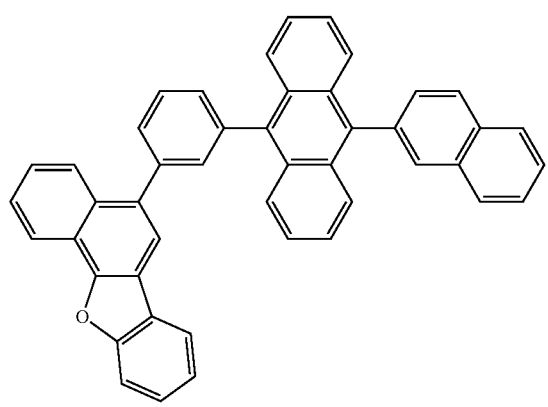
H100
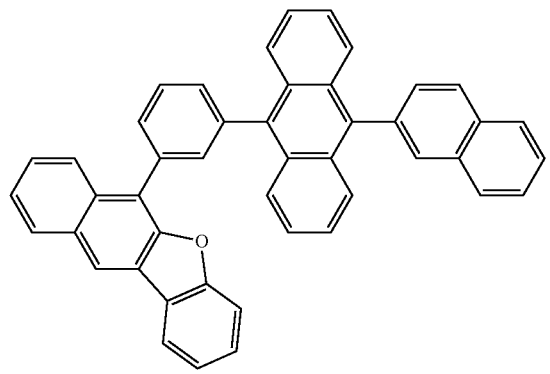
H97
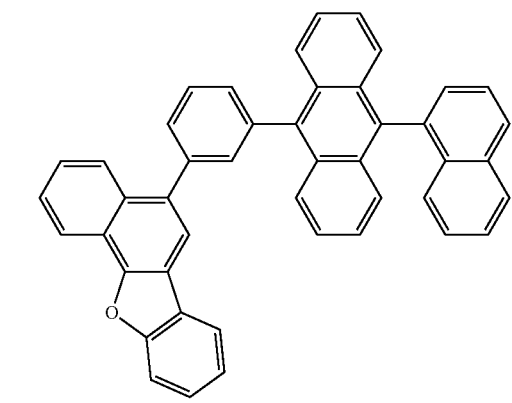
H101
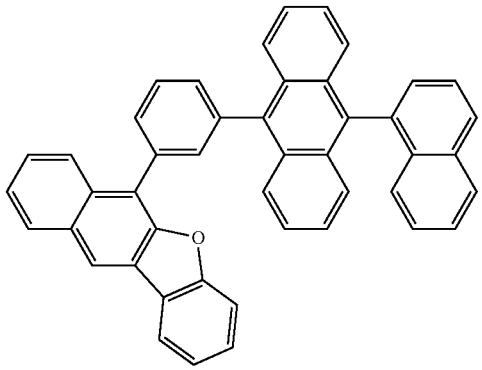
H98
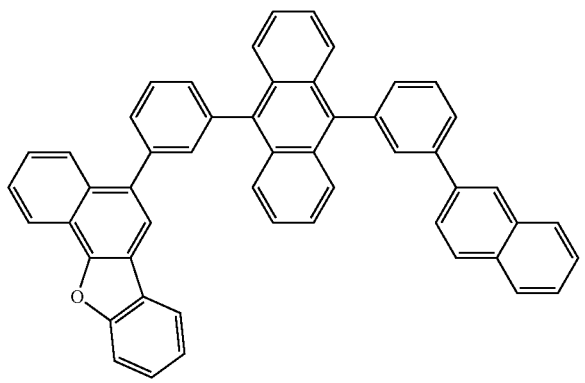
H102
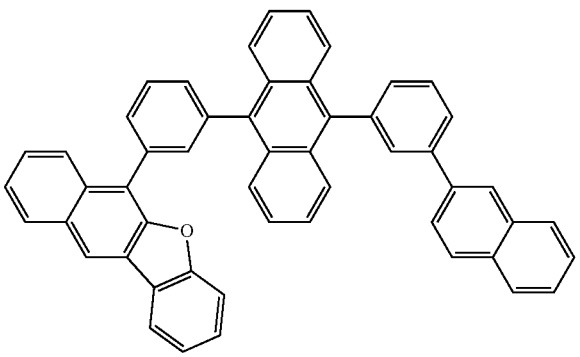

-continued
H103
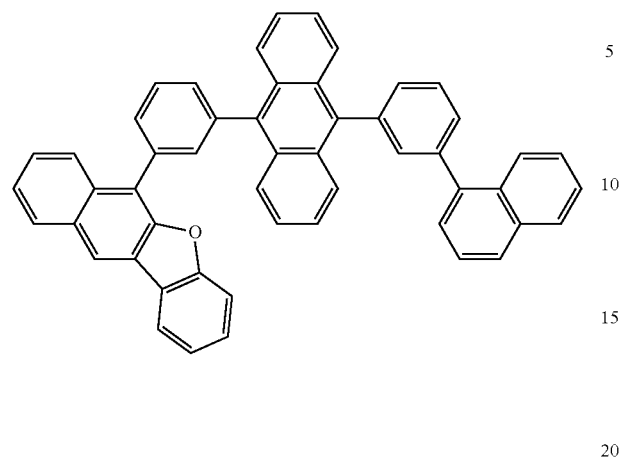
H104
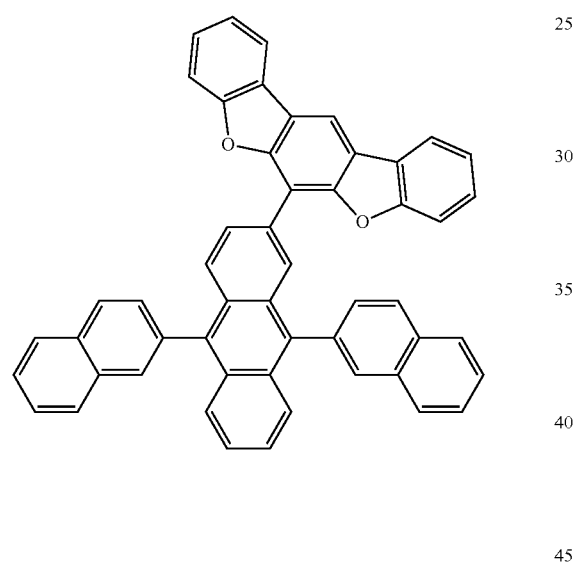
H105
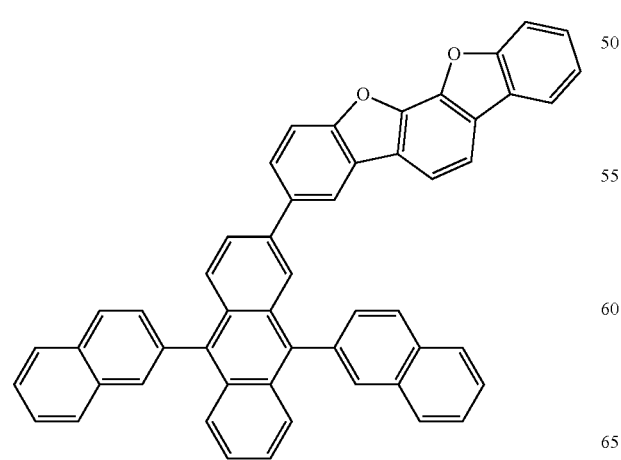
-continued
H106
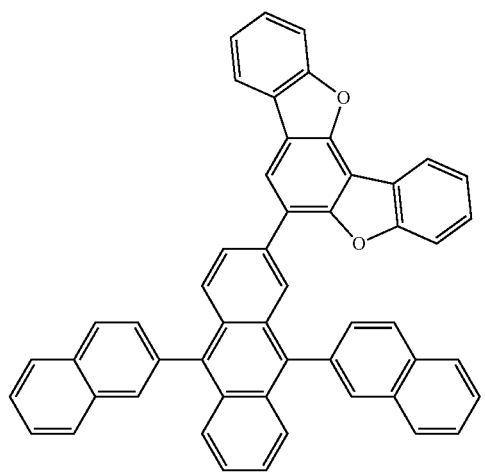
H107
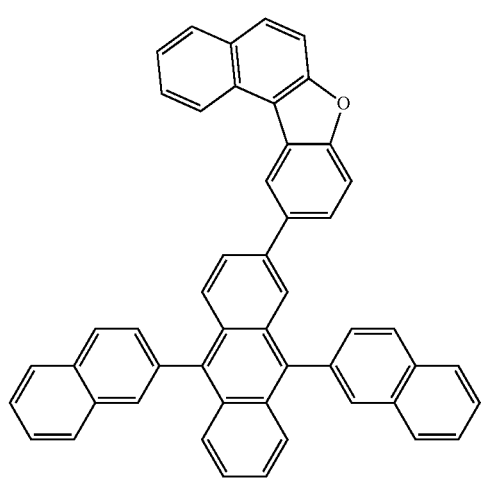
H108
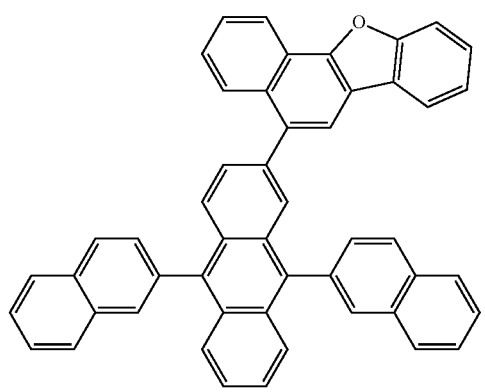

H109
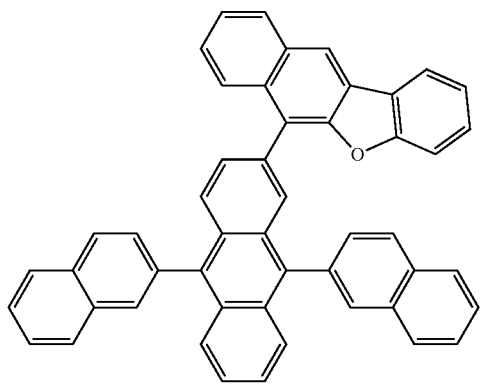
H110
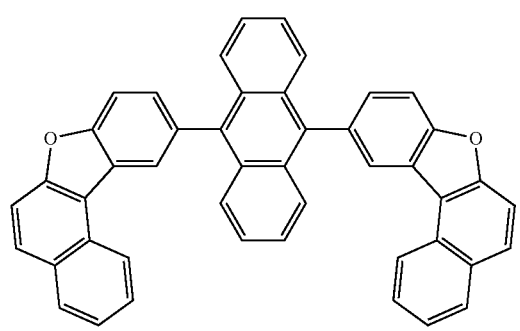
H111
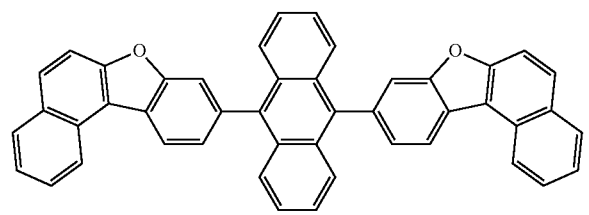
H112
H113
H114
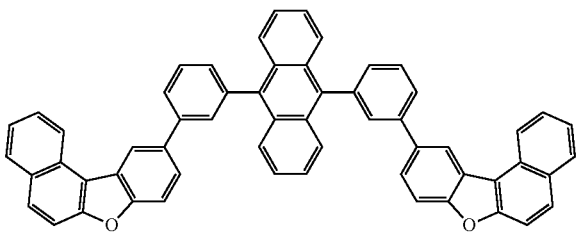
H115
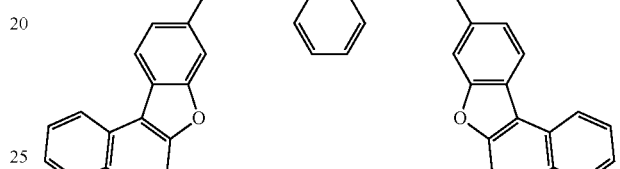
H116
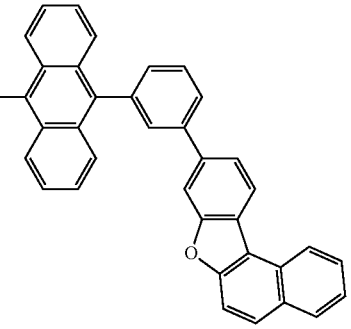
H117
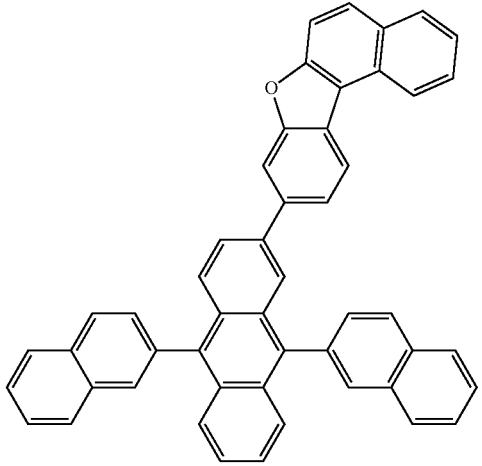

-continued
H118
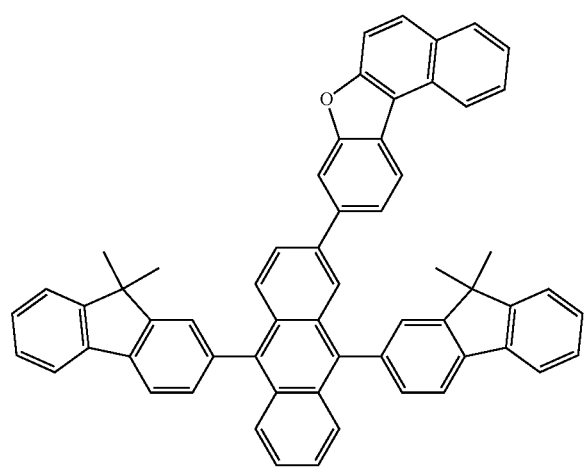
H119
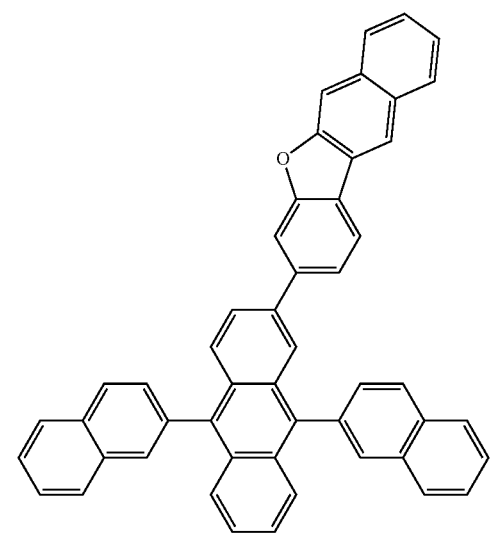
H120
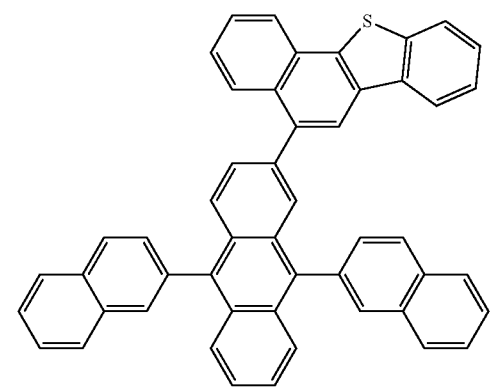
-continued
H121
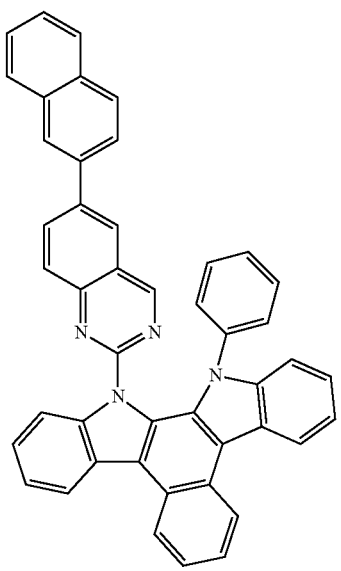
H122
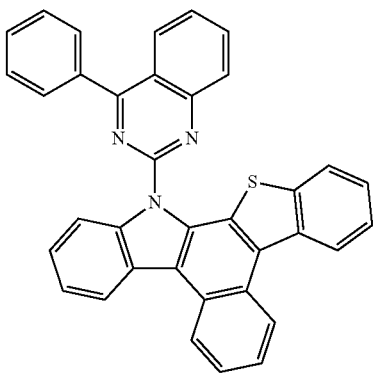
H123
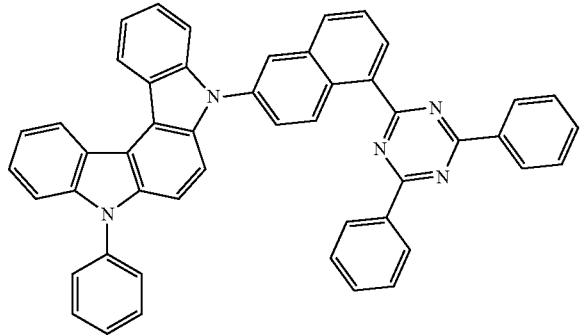

H124

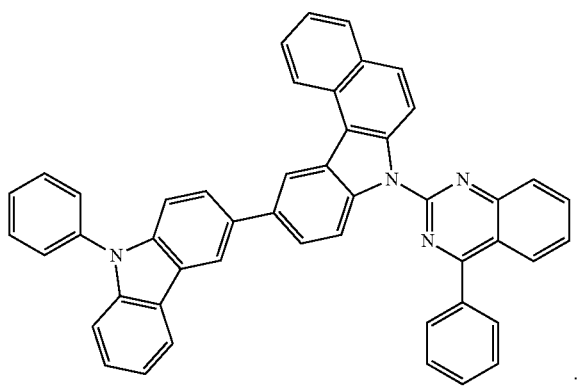

Phosphorescent Dopant Included in Emission Layer in Interlayer 130

The phosphorescent dopant may include an organometallic compound represented by Formula 1.

In an embodiment, the phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In an embodiment, the phosphorescent dopant may include an organometallic compound represented by Formula 401:

$$M(L_{401})_{xc1}(L_{402})_{xc2} \quad \text{Formula 401}$$

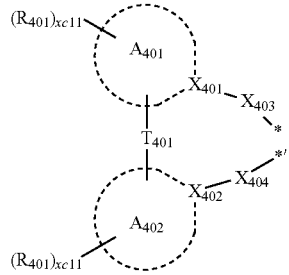

Formula 402 wherein, in Formulae 401 and 402,
M may be transition metal (for example, iridium (Ir), platinum (Pt), palladium (Pd), osmium (Os), titanium (Ti), gold (Au)hafnium (Hf), europium (Eu), terbium (Tb), rhodium (Rh), rhenium (Re), or thulium (Tm)),
$L_{401}$ may be a ligand represented by Formula 402, and xc1 may be 1, 2, or 3, wherein, when xc1 is 2 or more, two or more $L_{401}(s)$ may be identical to or different from each other,
$L_{402}$ may be an organic ligand, xc2 may be 0, 1, 2, 3, or 4, and when xc2 is 2 or more, two or more of $L_{402}(s)$ may be identical to or different from each other,
$X_{401}$ and $X_{402}$ may each independently be nitrogen or carbon,
ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordinate bond (e.g., a dative bond or coordinate covalent bond)), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ are the same as described in connection with $Q_1$, xc11 and xc12 may each independently be an integer selected from 0 to 10, and

* and *' in Formula 402 each indicate a binding site to M in Formula 401.

In one or more embodiments, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 402 is 2 or more, two ring $A_{401}(s)$ in two or more $L_{401}(s)$ may optionally be linked to each other via $T_{402}$, which is a linking group, or two ring $A_{402}(s)$ in two or more $L_{401}(s)$ may optionally be linked to each other via $T_{403}$, which is a linking group (see Compounds PD1 to PD4 and PD7). $T_{402}$ and $T_{403}$ are the same as described in connection with $T_{401}$.

$L_{402}$ in Formula 401 may be an organic ligand. In an embodiment, $L_{402}$ may be a halogen group, a diketone group (for example, an acetylacetonate group), a carboxylic acid group (for example, picolinate group), —C(=O), an isonitrile group, a —CN group, a phosphorus group (for example, a phosphine group or a phosphite group), or any combination thereof.

The phosphorescent dopant may include, for example, one of the following Compound PD1 to PD25, or any combination:

PD1

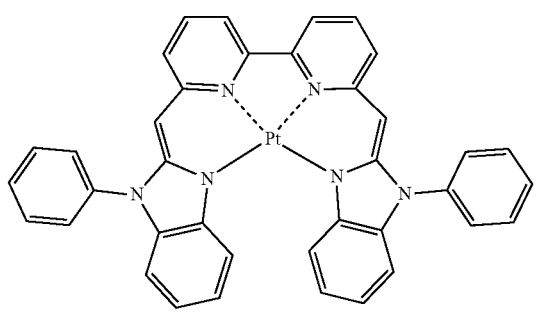

-continued
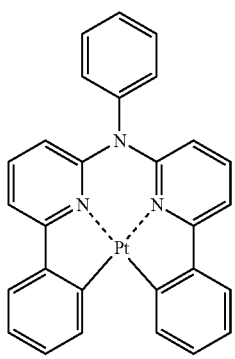
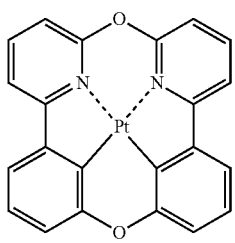
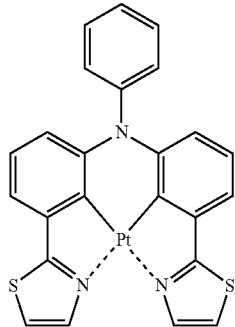
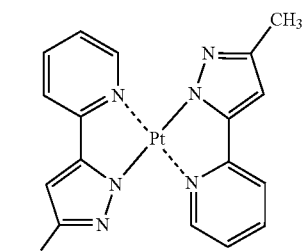
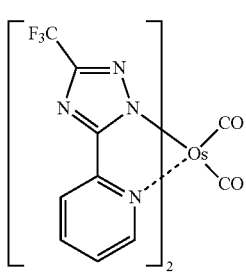
-continued
PD2
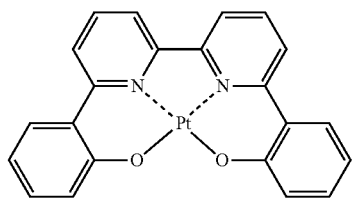
PD3
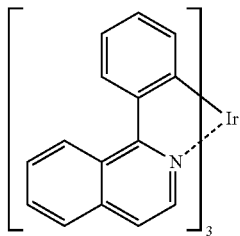
PD4
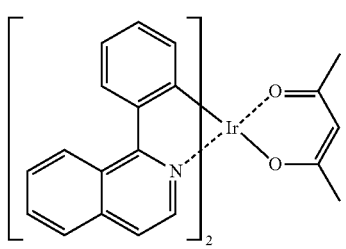
PD5
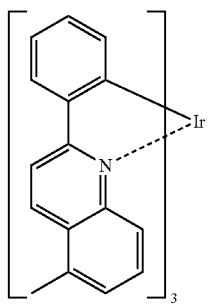
PD6
PD7
PD8
PD9
PD10
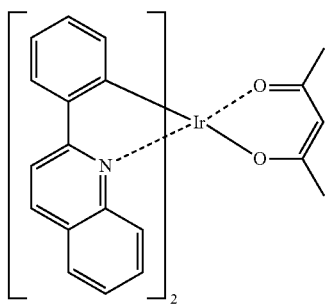
PD11

-continued
PD12
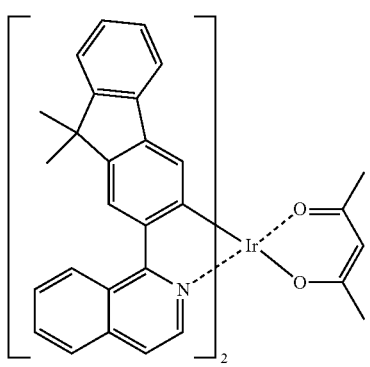
PD13
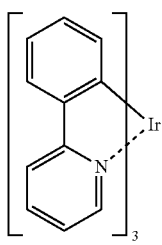
PD14
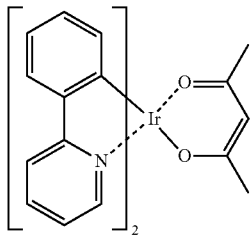
PD15
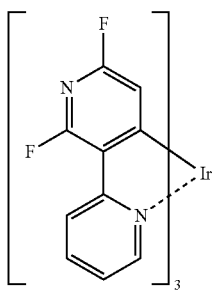
PD16
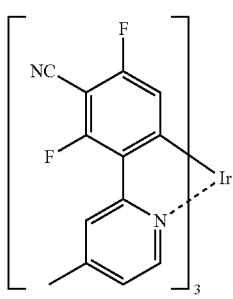
-continued
PD17
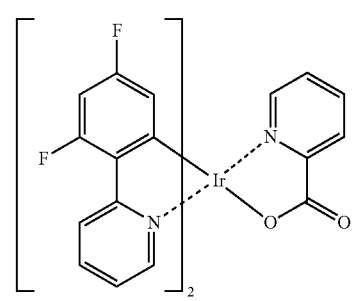
PD18
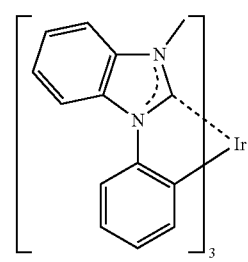
PD19
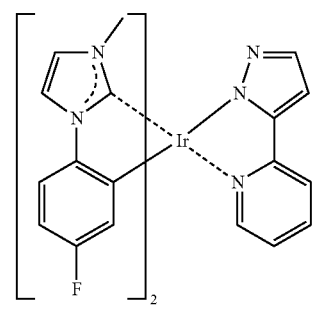
PD20
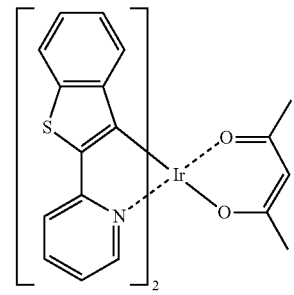
PD21
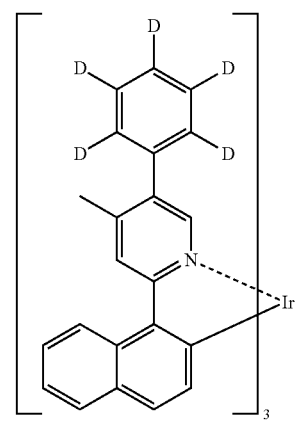

-continued

PD22
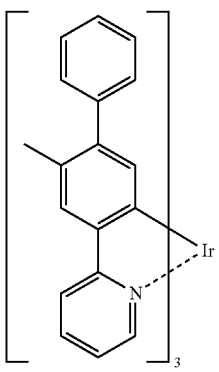

PD23
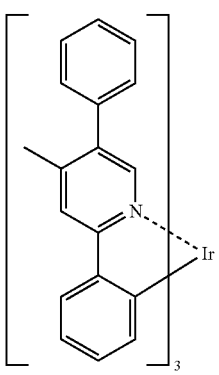

PD24
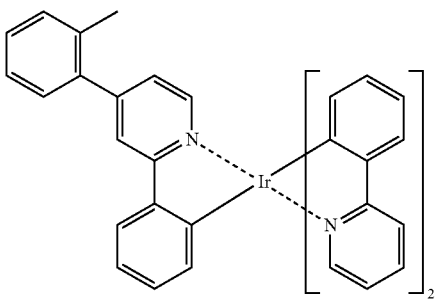

PD25
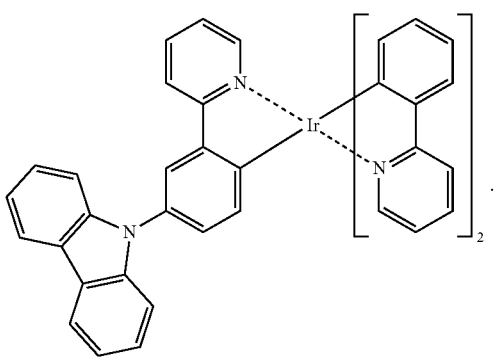

Fluorescent Dopant in Emission Layer

The fluorescent dopant may include an amine group-containing compound, a styryl group-containing compound, or any combination thereof.

In an embodiment, the fluorescent dopant may include a compound represented by Formula 501:

Formula 501
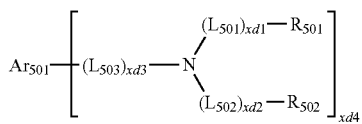

wherein, in Formula 501, $Ar_{501}$, $L_{501}$ to $L_{503}$, $R_{501}$, and $R_{502}$ may each independently be a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed.

In one or more embodiments xd4 in Formula 501 may be 2.

In an embodiment, the fluorescent dopant may include: one of Compounds FD1 to FD36; DPVBi; DPAVBi; or any combination thereof.

FD1
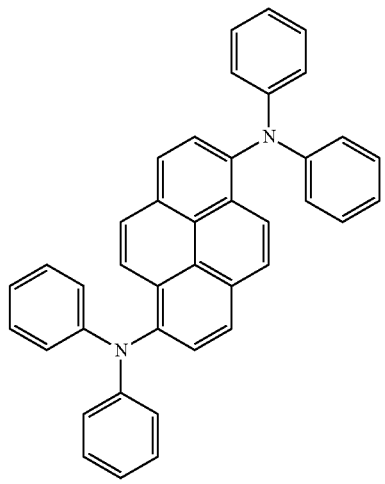

FD2
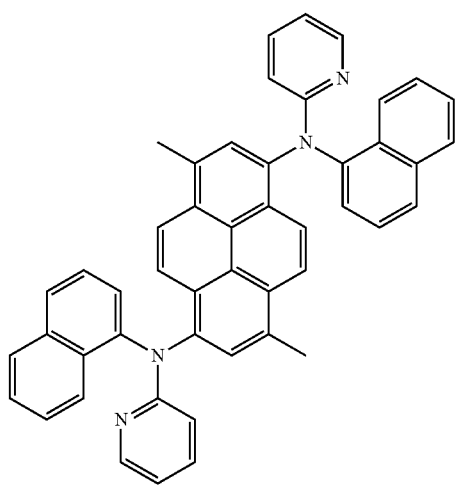

FD3
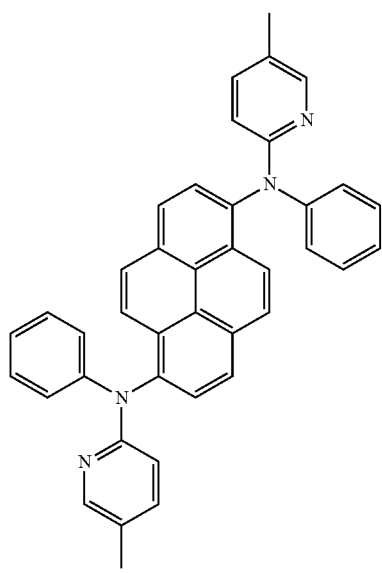
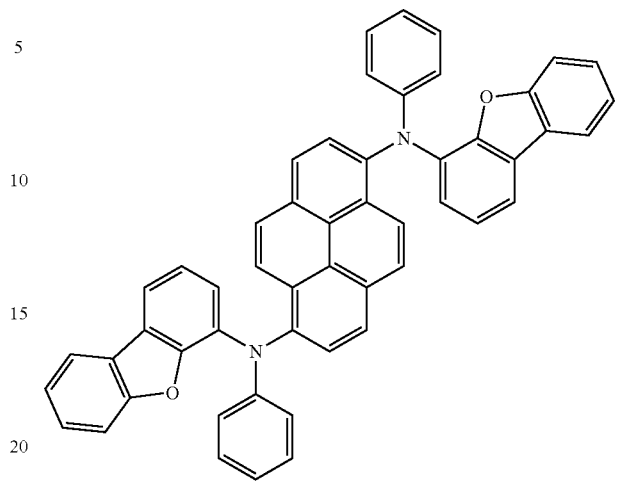
FD5
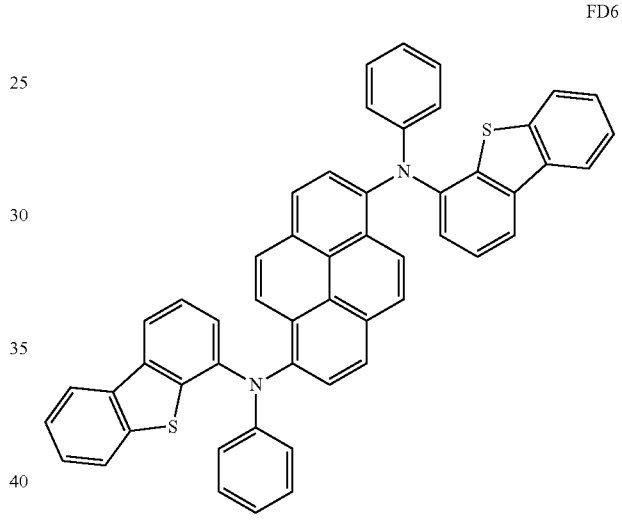
FD6
FD4
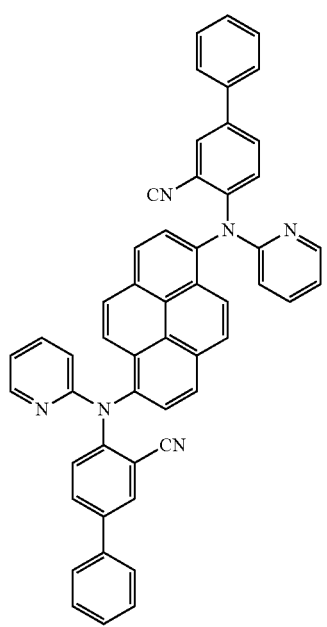
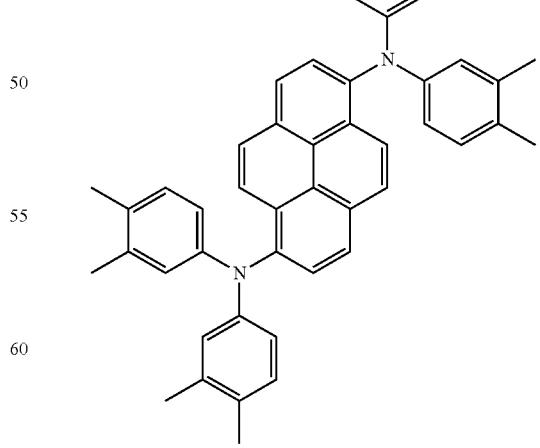
FD7

-continued
FD8
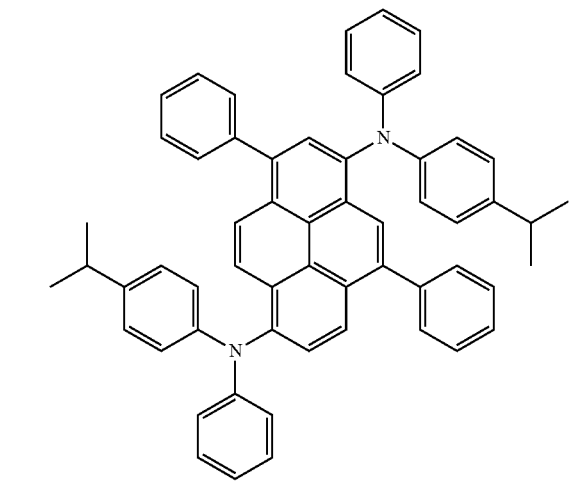
FD9
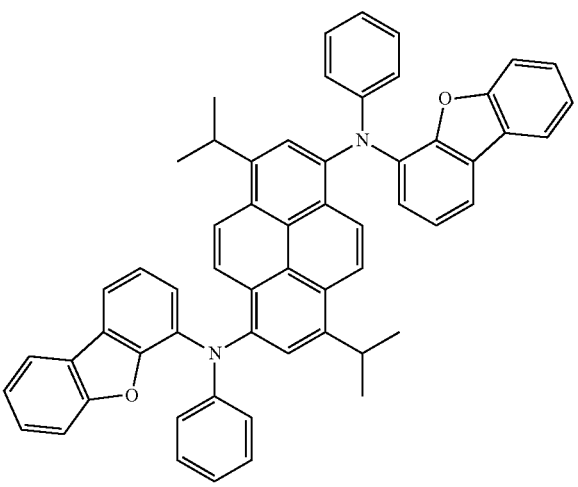
FD10
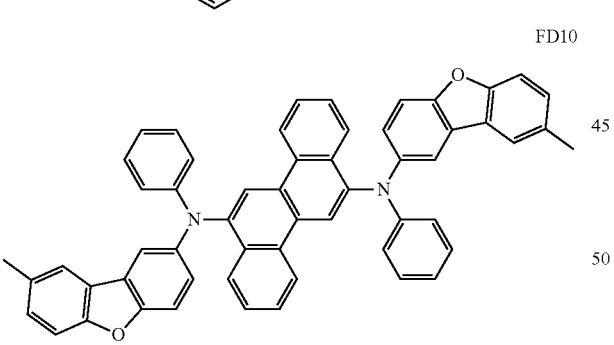
FD11
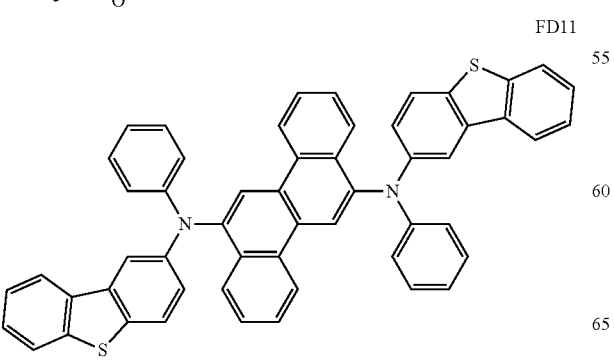
FD12
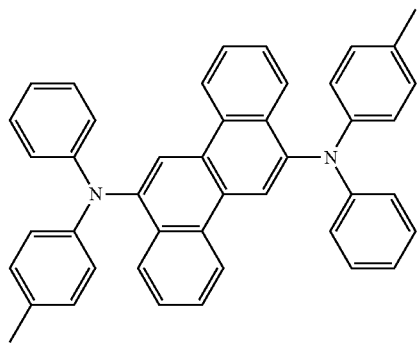
FD13
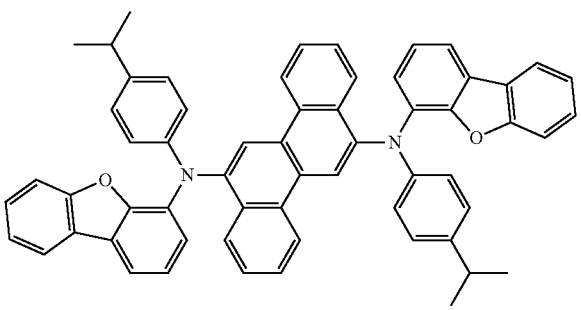
FD14
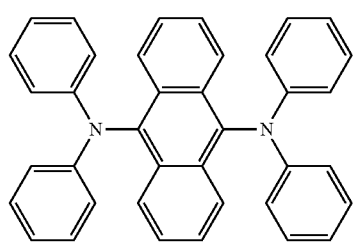
FD15
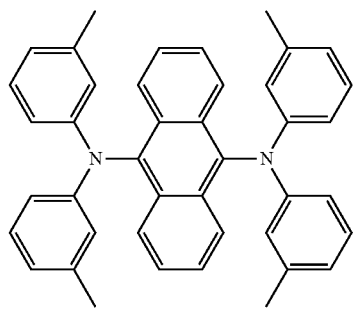
FD16
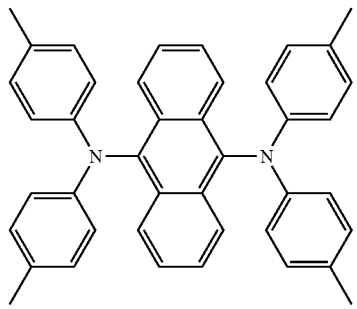

FD17
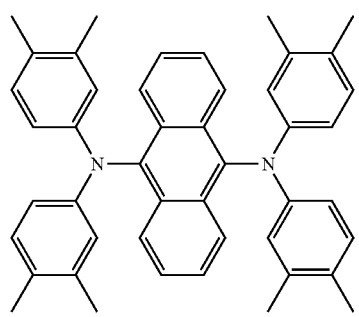
FD18
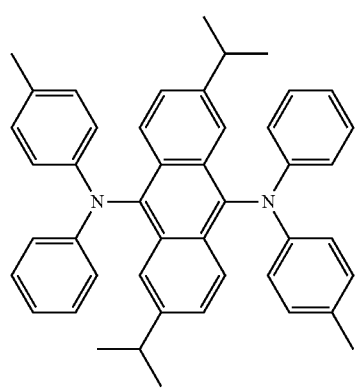
FD19
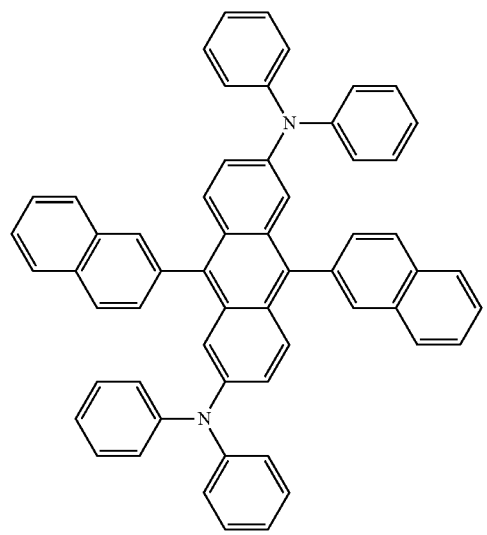
FD20
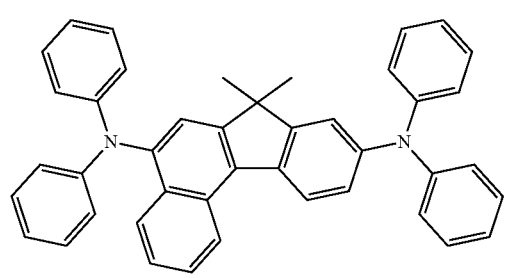
FD21
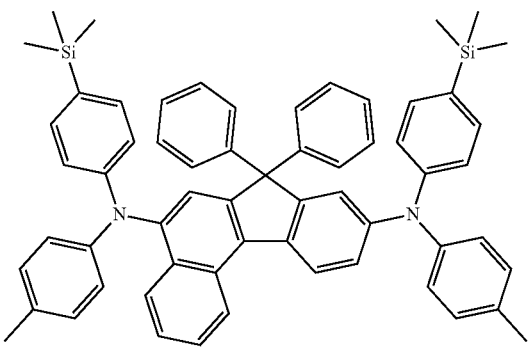
FD22
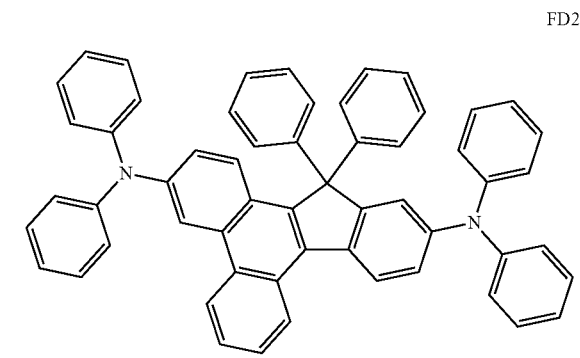
FD23
FD24
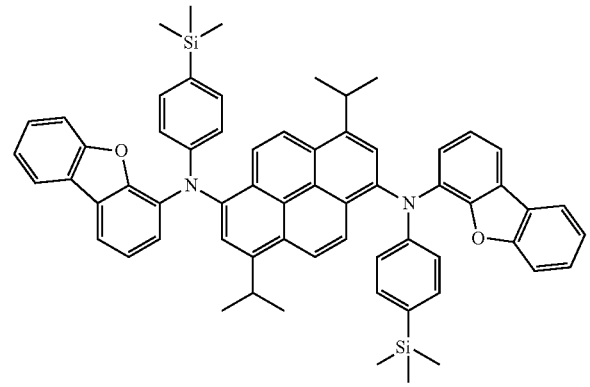

-continued
FD25
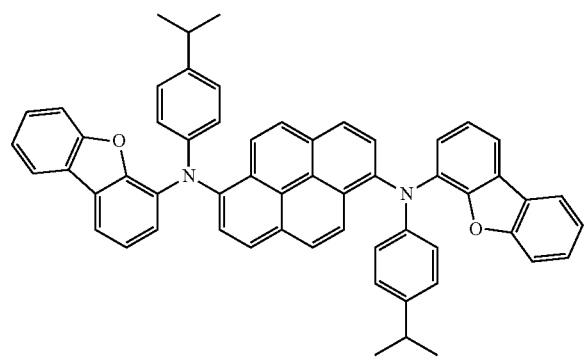
FD29
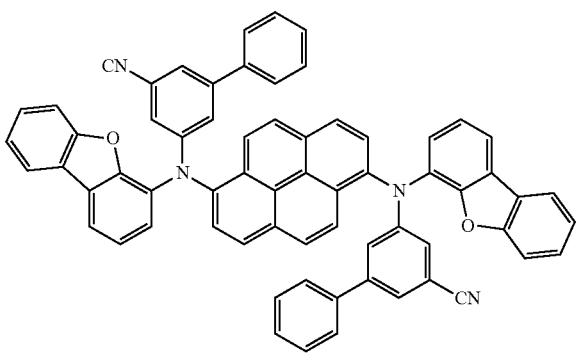
FD26
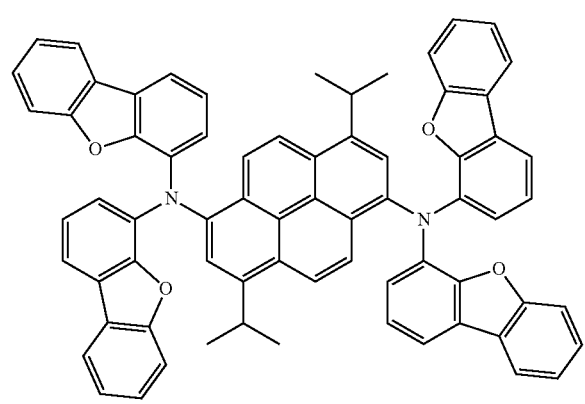
FD30
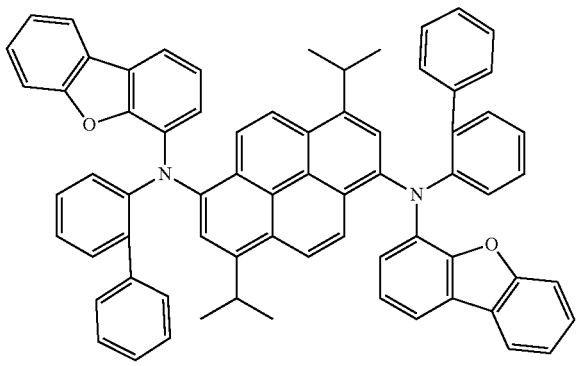
FD27
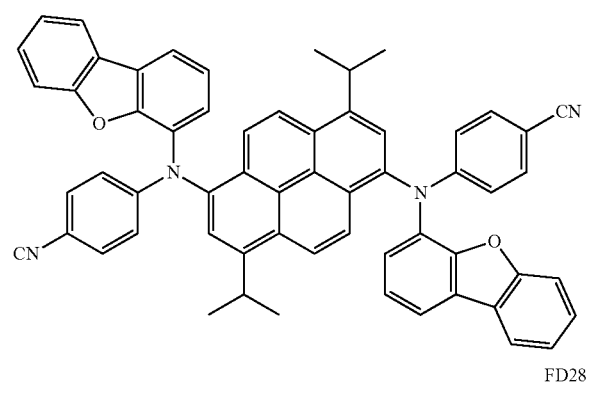
FD31
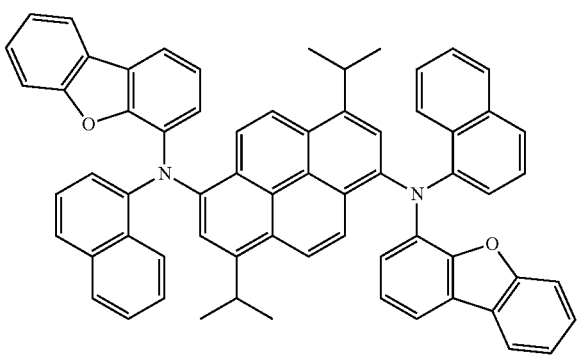
FD28
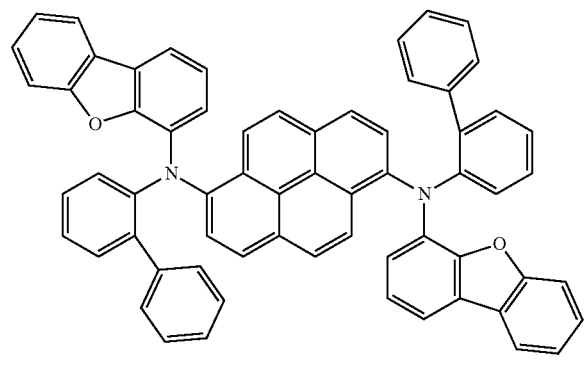
FD32
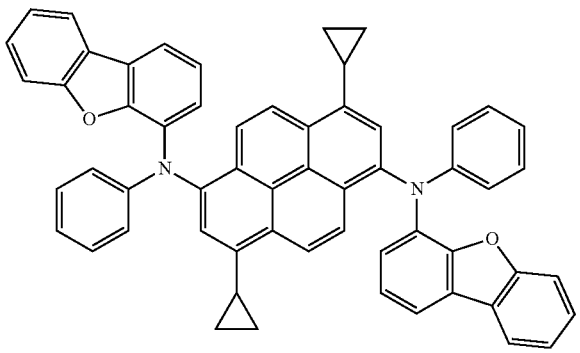

-continued

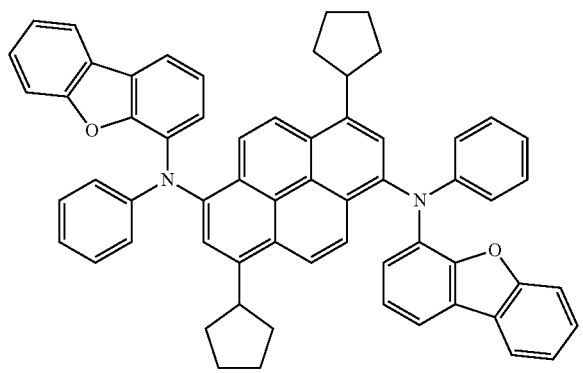
FD33

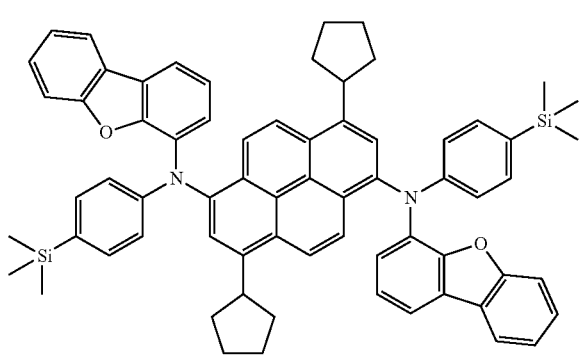
FD34

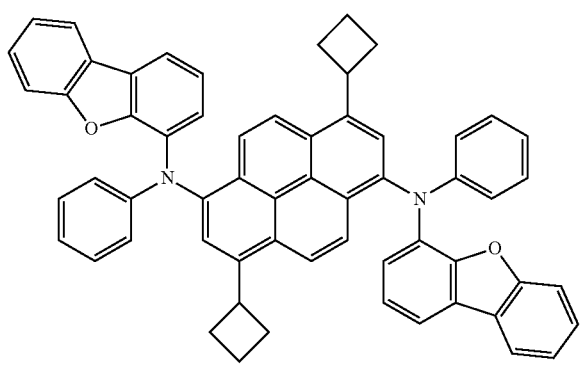
FD35

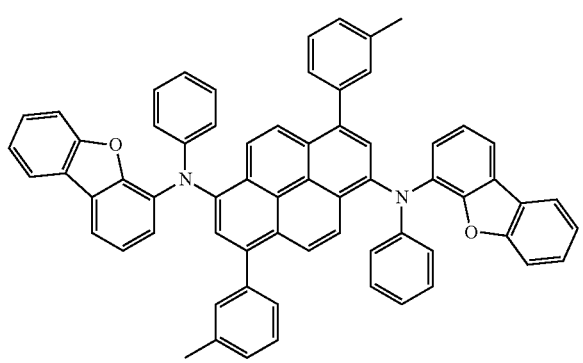
FD36

-continued

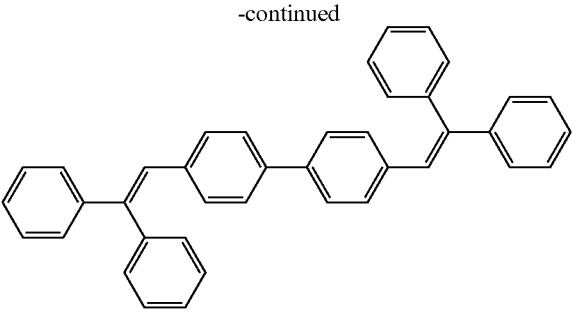
DPVBi

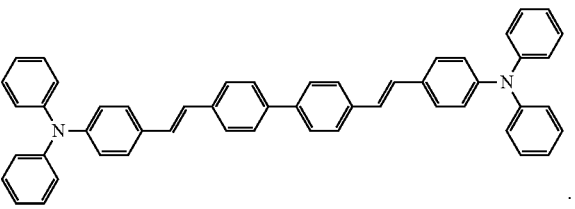
DPAVBi

Delayed Fluorescent Material

The emission layer may include a delayed fluorescent material.

The delayed fluorescent material, as described herein, may be selected from any suitable compound that is capable of emitting delayed fluorescent light based on a delayed fluorescence emission mechanism.

The delayed fluorescent material included in the emission layer may act as a host or a dopant depending on the type (or composition) of other materials included in the emission layer.

In an embodiment, the difference between the triplet energy level (eV) of the delayed fluorescent material and the singlet energy level (eV) of the delayed fluorescent material may be 0 eV or more and 0.5 eV or less. When the difference between the triplet energy level (eV) of the delayed fluorescent material and the singlet energy level (eV) of the delayed fluorescent material satisfies the above-described range, up-conversion from the triplet state to the singlet state of the delayed fluorescent materials may effectively occur, and thus, the luminescence efficiency of the organic light-emitting device 10 may be improved.

In an embodiment, the delayed fluorescent material may include i) a material that includes at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), ii) a material including a $C_8$-$C_{60}$ polycyclic group in which two or more cyclic groups share boron (B) and are condensed with (e.g., combined together with) each other.

The delayed fluorescent material may include at least one of compounds DF1 to DF9:

DF1(DMAC-DPS)
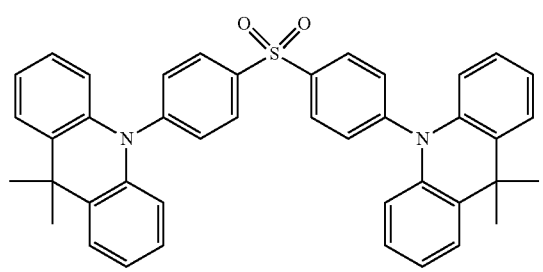
DF2(ACRFLCN)
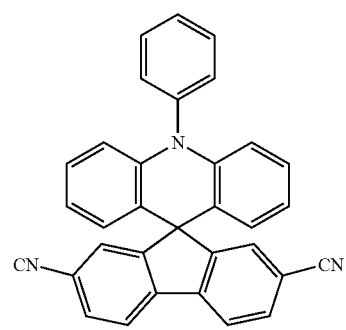
DF3(ACRSA)
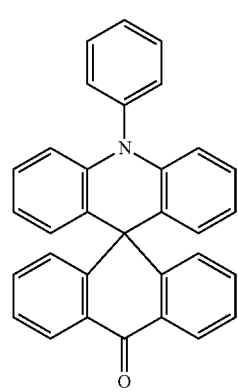
DF4(CC2TA)
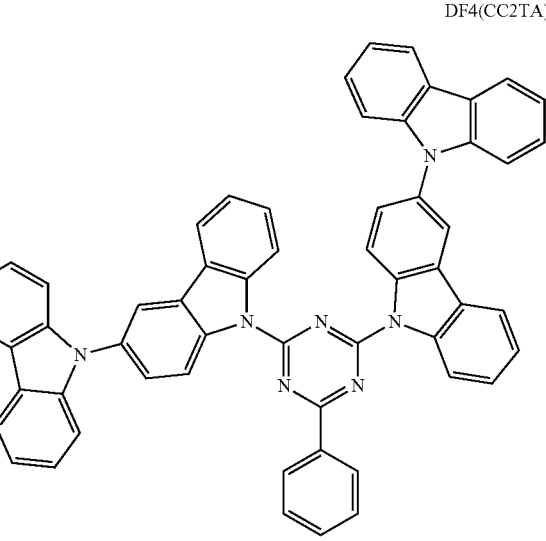
DF5(PIC-TRZ)
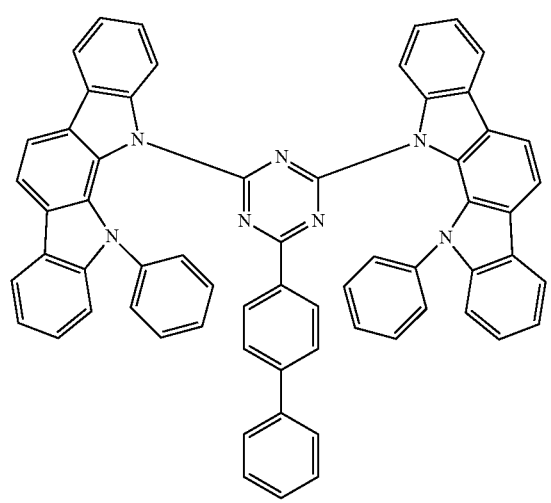
DF6(PIC-TRZ2)
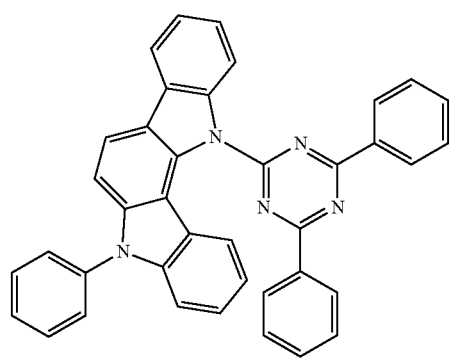
DF7(PXZ-TRZ)
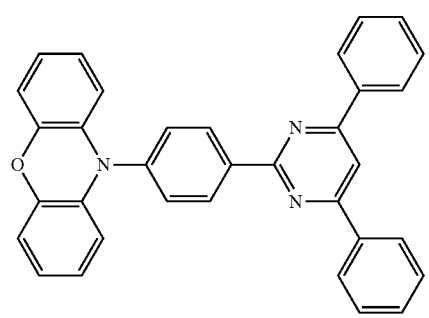
DF8(DABNA-1)
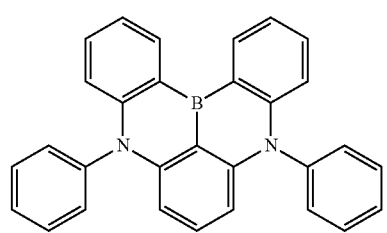

DF9(DABNA-2)

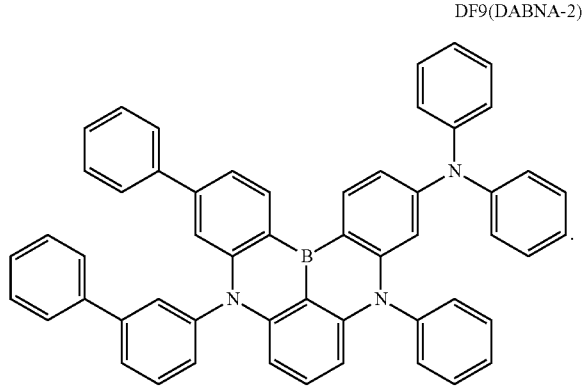 [SMILES: c1ccc(-c2cccc(N3c4cc(-c5ccccc5)ccc4B4c5ccc(N(c6ccccc6)c6ccccc6)cc5N(c5ccccc5)c5cccc3c54)c2)cc1]

Quantum Dot

The emission layer may include a quantum dot. The quantum dot used herein refers to the crystal of a semiconductor compound, and may include any suitable material that is capable of emitting light of various suitable emission wavelengths depending on the size of the crystal.

A diameter of the quantum dot may be, for example, in a range of about 1 nm to about 10 nm.

The quantum dot may be synthesized by a wet chemical process, an organometallic chemical vapor deposition process, a molecular beam epitaxy process, and/or a process that is similar to these processes.

The wet chemical process refers to a method in which a solvent and a precursor material are mixed, and then, a quantum dot particle crystal is grown. When the crystal grows, the organic solvent acts as a dispersant naturally coordinated on the surface of the quantum dot crystal and controls the growth of the crystal. Accordingly, by using a process that is easily performed at low cost as compared to a vapor deposition process, such as a metal organic chemical vapor deposition (MOCVD) process and a molecular beam epitaxy (MBE) process, the growth of quantum dot particles may be controlled.

The quantum dot may include a Group II-VI semiconductor compound; a Group III-V semiconductor compound; a Group III-VI semiconductor compound; a Group I-III-VI semiconductor compound; a Group IV-VI semiconductor compound; a Group IV element or compound; or any combination thereof.

Examples of the Groups II-VI semiconductor compound are a binary compound, such as CdSe, CdTe, ZnS, ZnSe, ZnTe, ZnO, HgS, HgSe, HgTe, MgSe, and/or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound, such as CdZnSeS, CdZnSeTe, CdZnSTe, CdHgSeS, CdHgSeTe, CdHgSTe, HgZnSeS, HgZnSeTe, and/or HgZnSTe; and any combination thereof.

Examples of the Group III-V semiconductor compound are a binary compound, such as GaN, GaP, GaAs, GaSb, AlN, AlP, AlAs, AlSb, InN, InP, InAs, and/or InSb; a ternary compound, such as GaNP, GaNAs, GaNSb, GaPAs, GaPSb, AlNP, AlNAs, AlNSb, AlPAS, AlPSb, InGaP, InNP, InAlP, InNAs, InNSb, InPAs, and/or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb; and any combination thereof. The Group III-V semiconductor compound may further include a Group II element. Examples of the Group III-V semiconductor compound further including a Group II element are InZnP, InGaZnP, and InAlZnP.

Examples of the Group III-VI semiconductor compound are a binary compound, such as GaS, GaSe, $Ga_2Se_3$, GaTe, InS, InSe, $In_2S_3$, $In_2Se_3$, and/or InTe; a ternary compound, such as $InGaS_3$, and/or $InGaSe_3$; and any combination thereof.

Examples of the Group I-III-VI semiconductor compound are a ternary compound, such as AgInS, $AgInS_2$, CuInS, $CuInS_2$, $CuGaO_2$, $AgGaO_2$, and/or $AgAlO_2$; and any combination thereof.

Examples of the Group IV-VI semiconductor compound are a binary compound, such as SnS, SnSe, SnTe, PbS, PbSe, and/or PbTe; a ternary compound, such as SnSeS, SnSeTe, SnSTe, PbSeS, PbSeTe, PbSTe, SnPbS, SnPbSe, and/or SnPbTe; a quaternary compound, such as SnPbSSe, SnPbSeTe, and/or SnPbSTe; and any combination thereof.

In an embodiment, the Group IV element or compound may include a single element compound, such as Si and/or Ge; a binary compound, such as SiC and/or SiGe; or any combination thereof.

Each element included in the multi-element compound such as the binary compound, ternary compound, and quaternary compound may be present in a particle at a uniform concentration or a non-uniform concentration.

In some embodiments, the quantum dot may have a single structure having a uniform concentration of each element included in the corresponding quantum dot or a dual structure of a core-shell. In an embodiment, the material included in the core may be different from the material included in the shell.

The shell of the quantum dot may function as a protective layer for maintaining semiconductor characteristics by preventing or reducing chemical degeneration of the core and/or may function as a charging layer for imparting electrophoretic characteristics to the quantum dot. The shell may be a single layer or a multilayer. An interface between the core and the shell may have a concentration gradient in which the concentration of elements existing in the shell decreases along a direction toward the center.

Examples of the shell of the quantum dot may be an oxide of a metal, a metalloid, or a non-metal, a semiconductor compound, and any combination thereof. Examples of the oxide of metal, metalloid, or non-metal are a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; a ternary compound, such as $MgAl_2O_4$, $CoFe_2O_4$, $NiFe_2O_4$, and/or $CoMn_2O_4$; and any combination thereof. Examples of the semiconductor compound are, as described herein, a Group II-VI semiconductor compound; a Group III-V semiconductor compound; a Group III-VI semiconductor compound; a Group I-III-VI semiconductor compound; a Group IV-VI semiconductor compound; and any combination thereof. In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width of half maximum (FWHM) of an emission wavelength spectrum of the quantum dot may be about 45 nm or less, for example, about 40 nm or less, for example, about 30 nm or less. When the FWHM of the emission wavelength spectrum of the quantum dot is within any of the foregoing ranges, color purity and/or color reproduction may be improved. In addition, light emitted through such quantum dot is irradiated in omnidirection (e.g., in substantially every direction). Accordingly, a wide viewing angle may be increased.

In some embodiments, the quantum dot may be, for example, a spherical, pyramidal, multi-arm, or cubic nanoparticle, a nanotube, a nanowire, a nanofiber, or nanoplate particle.

By adjusting the size of the quantum dot, the energy band gap may also be adjusted, thereby obtaining light of various suitable wavelengths in the quantum dot emission layer. Therefore, by using quantum dots of different sizes, a light-emitting device that emits light of various suitable wavelengths may be implemented. In an embodiment, the size of the quantum dot may be selected to emit red, green and/or blue light. In addition, the size of the quantum dot may be configured by combining light of various suitable colors, so as to emit white light.

Electron Transport Region in Interlayer 130

The electron transport region may have: i) a single-layered structure including (or consisting of) a single layer including (or consisting of) a single material, ii) a single-layered structure including (or consisting of) a single layer including (or consisting of) a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

In an embodiment, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from an emission layer.

The electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601 below:

[Ar$_{601}$]$_{xe11}$-[(L$_{601}$)$_{xe1}$-R$_{601}$]$_{xe21}$     Formula 601 wherein, in Formula 601,
Ar$_{601}$ and L$_{601}$ may each independently be a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$,
xe11 may be 1, 2, or 3,
xe1 may be 0, 1, 2, 3, 4, or 5,
R$_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si(Q$_{601}$)(Q$_{602}$)(Q$_{603}$), —C(=O)(Q$_{601}$), —S(=O)$_2$(Q$_{601}$), or —P(=O)(Q$_{601}$)(Q$_{602}$),
Q$_{601}$ to Q$_{603}$ are the same as described in connection with Q$_1$, xe21 may be 1, 2, 3, 4, or 5, and
at least one of Ar$_{601}$, L$_{601}$, and R$_{601}$ may each independently be a 1r electron-deficient nitrogen-containing $C_1$-$C_{60}$ cyclic group unsubstituted or substituted with at least one $R_{10a}$.

In one or more embodiments, when xe11 in Formula 601 is 2 or more, two or more of Ar$_{601}$(s) may be linked to each other via a single bond.

In an embodiment, Ar$_{601}$ in Formula 601 may be a substituted or unsubstituted anthracene group.

In an embodiment, the electron transport region may include a compound represented by Formula 601-1:

Formula 601-1

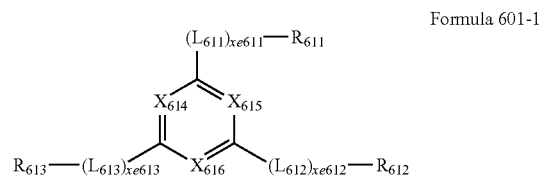

wherein, in Formula 601-1,
$X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ may be understood by referring to the description presented in connection with $L_{601}$, xe611 to xe613 may be understood by referring to the description presented in connection with xe1, $R_{611}$ to $R_{613}$ may be understood by referring to the description presented in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formula 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), Alq$_3$, BAlq, TAZ, NTAZ, or any combination thereof:

ET1

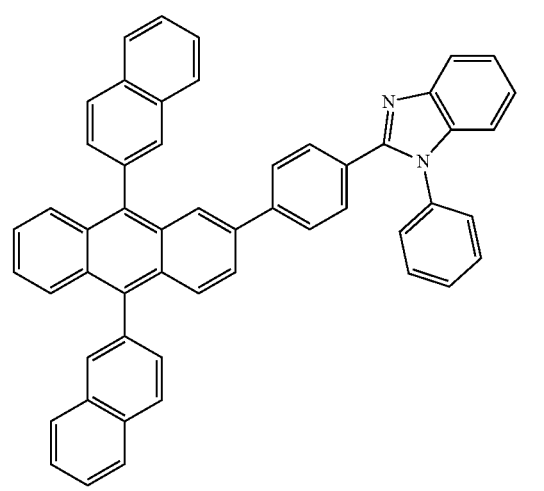

ET2
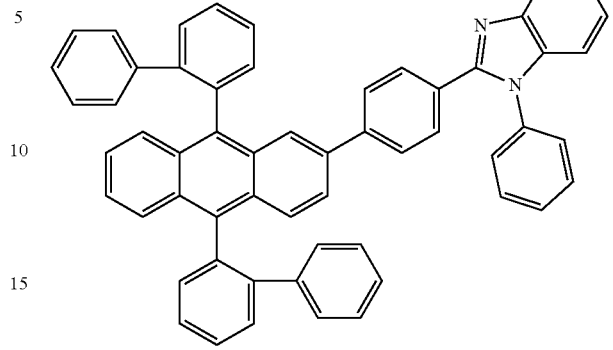
ET3
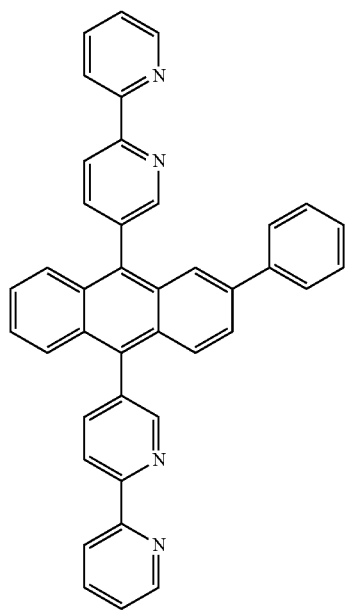
ET5
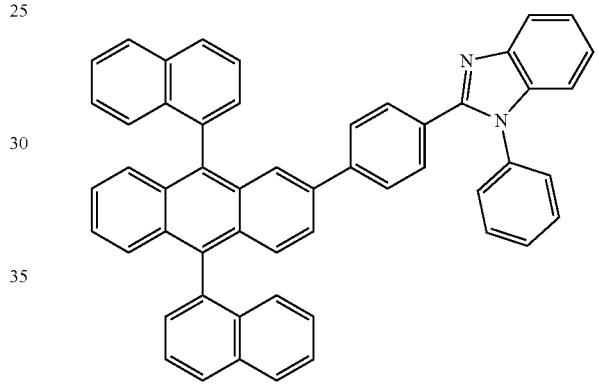
ET6
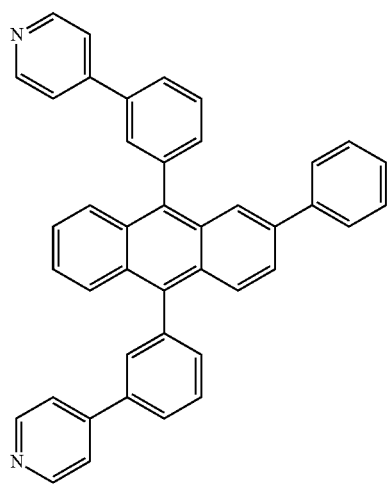
ET4
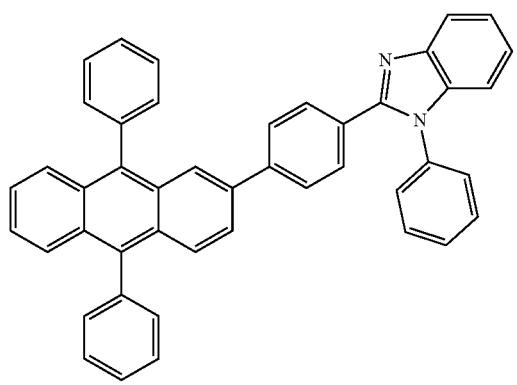
ET7
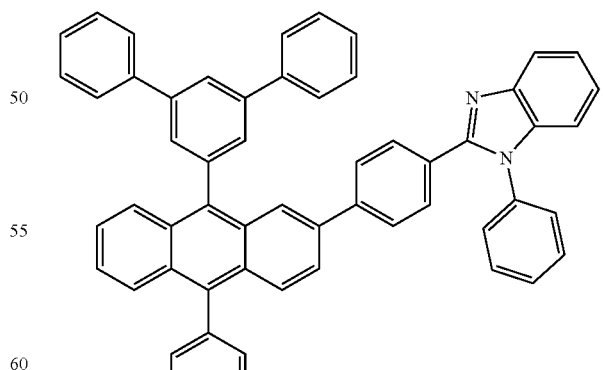
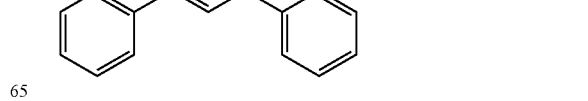

149
-continued
ET8
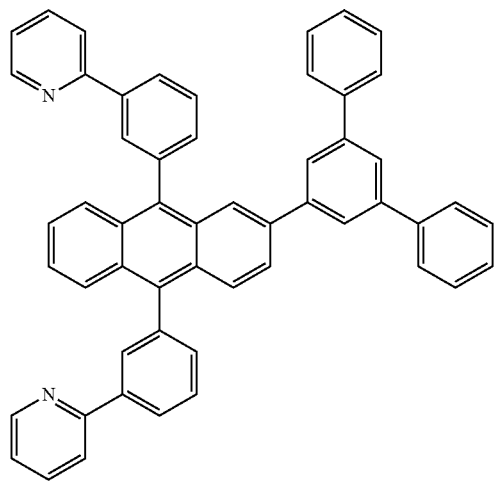
149
-continued
ET9
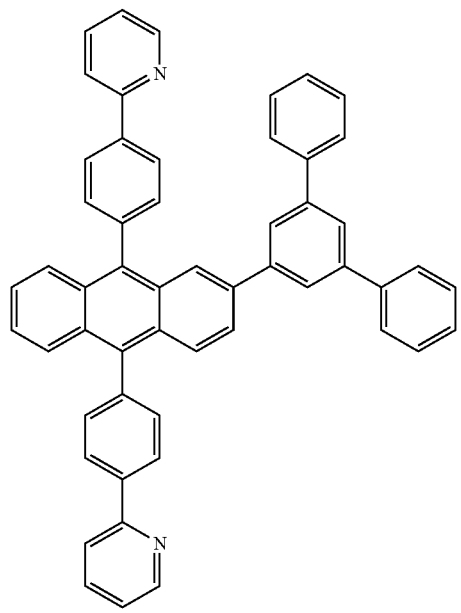
150
-continued
ET10
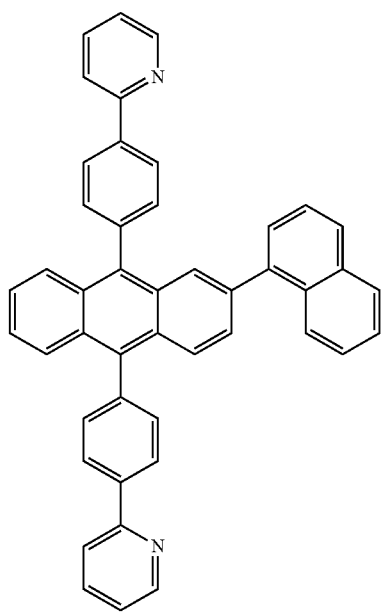
ET11
ET12
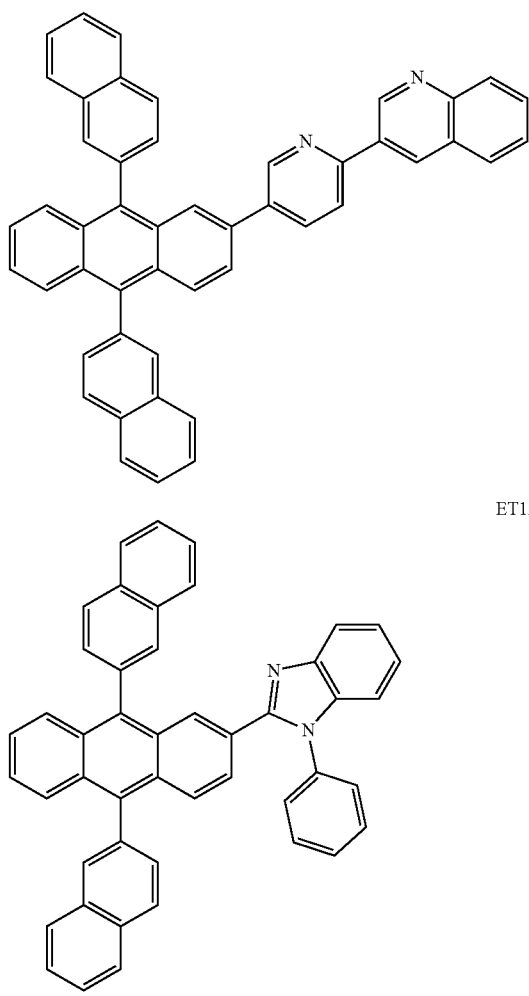

-continued
ET13
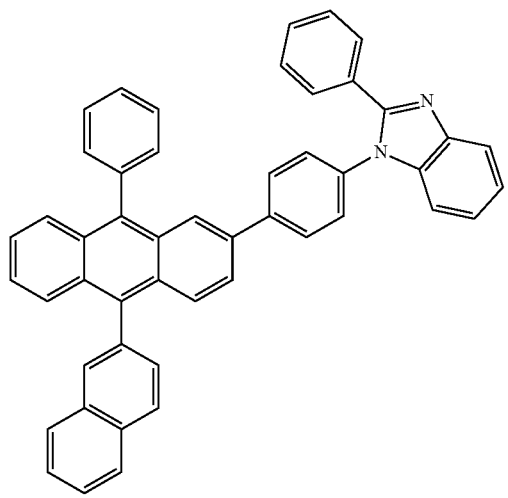
ET14
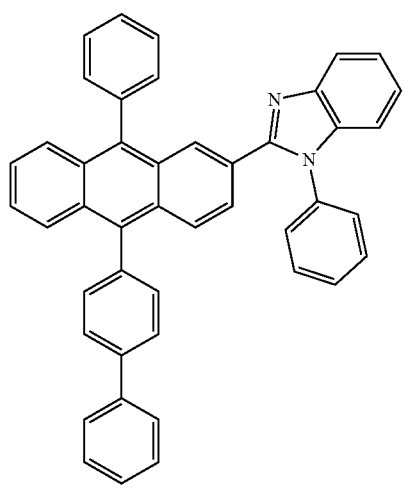
ET15
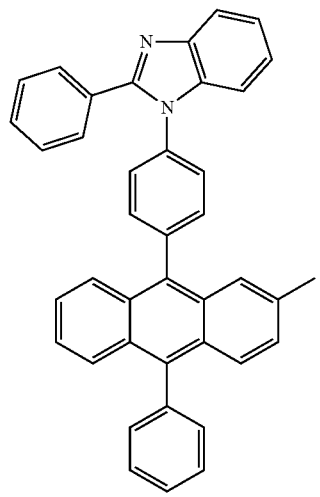
-continued
ET16
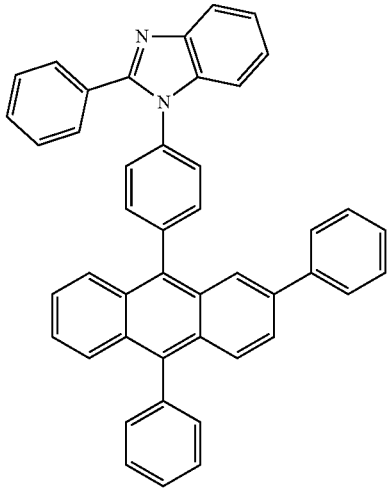
ET17
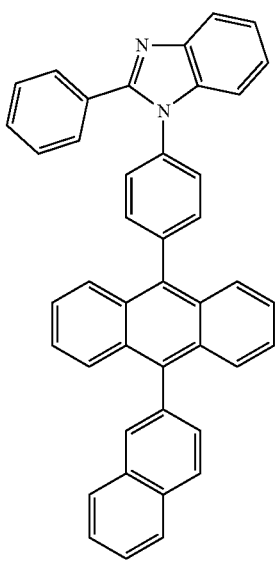
ET18
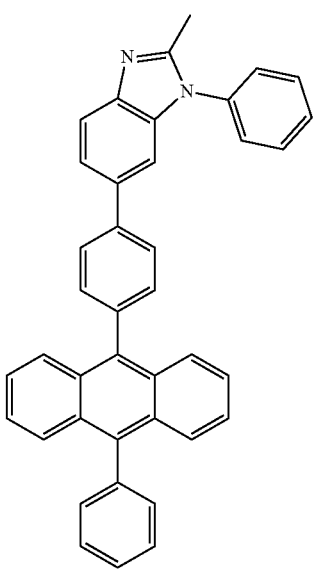

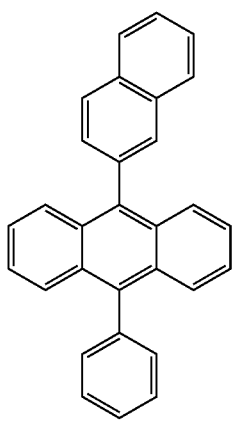
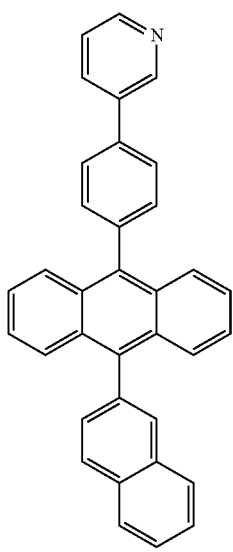
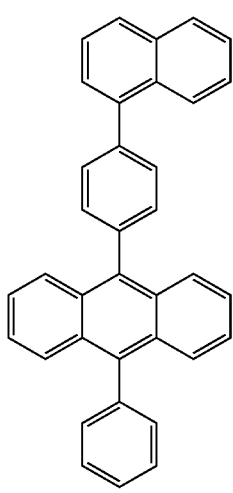
ET19
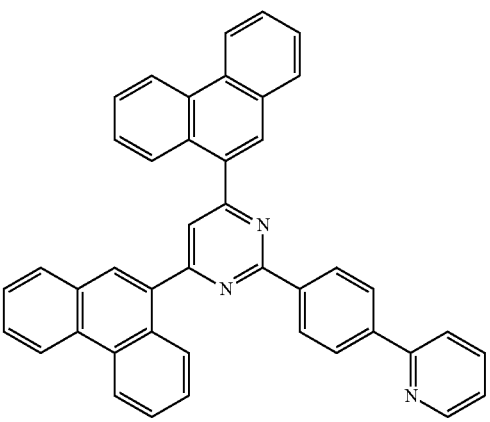
ET22
ET20
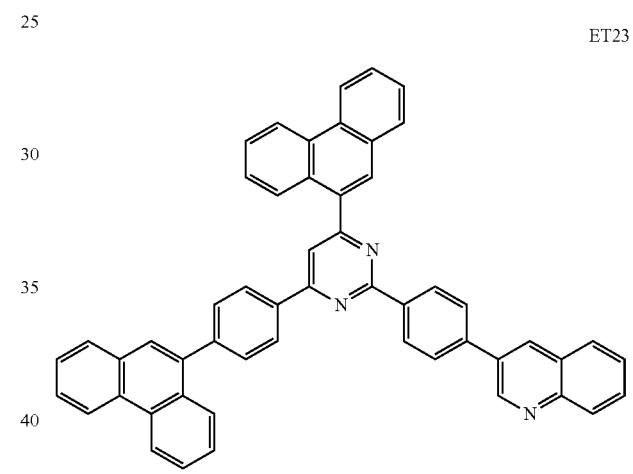
ET23
ET21
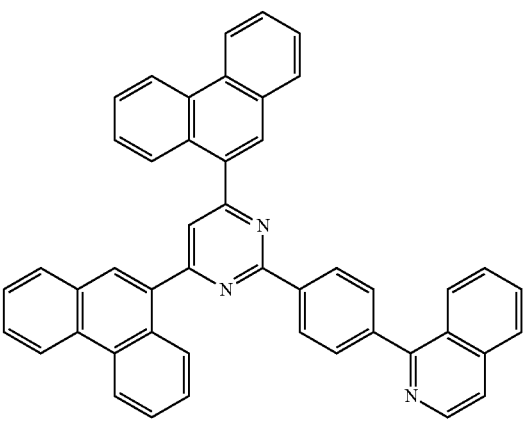
ET24

ET25
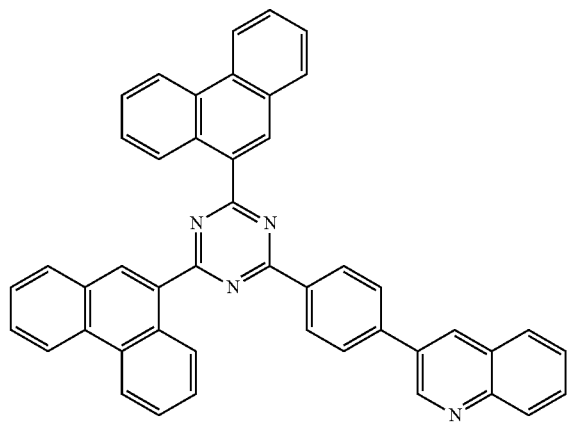
ET28
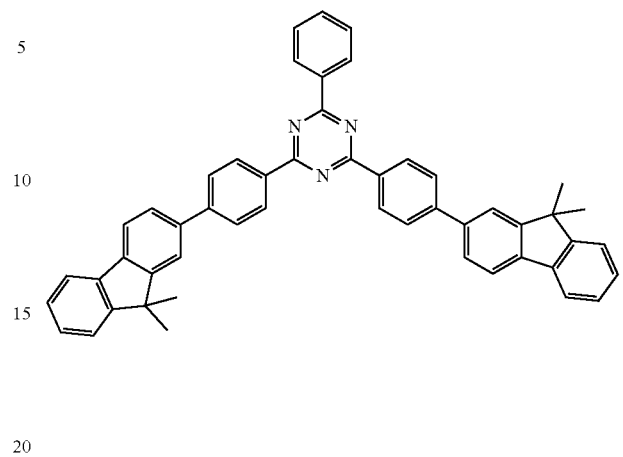
ET26
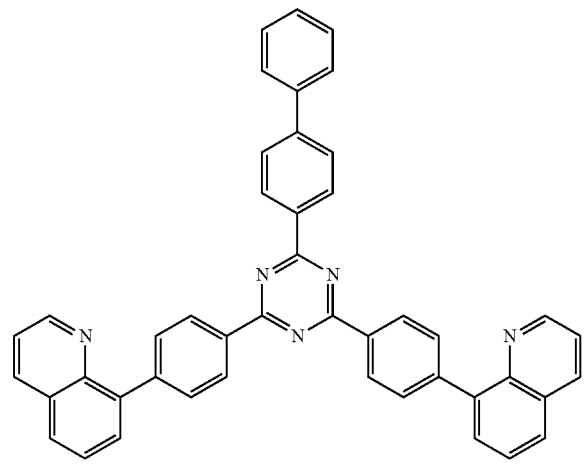
ET29
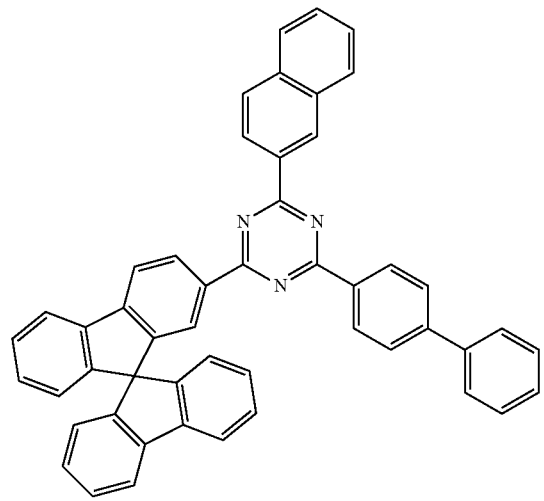
ET27
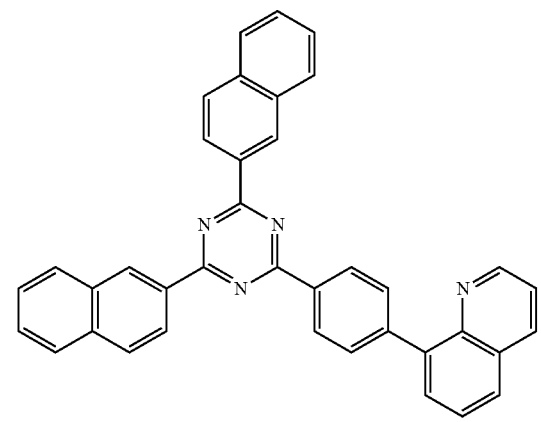
ET30
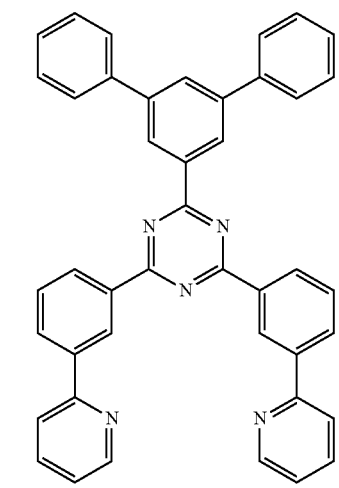

-continued
ET31
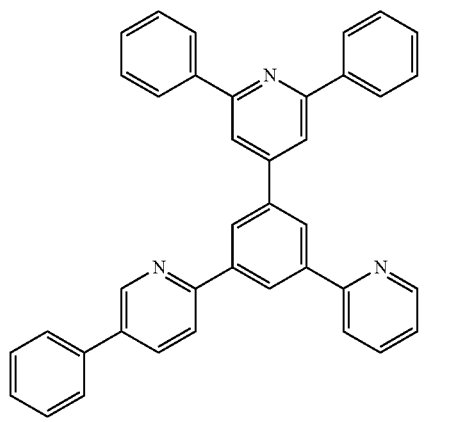
ET32
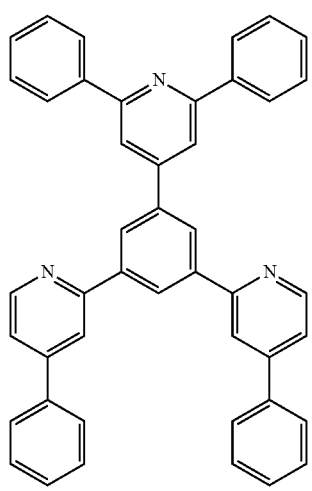
ET33
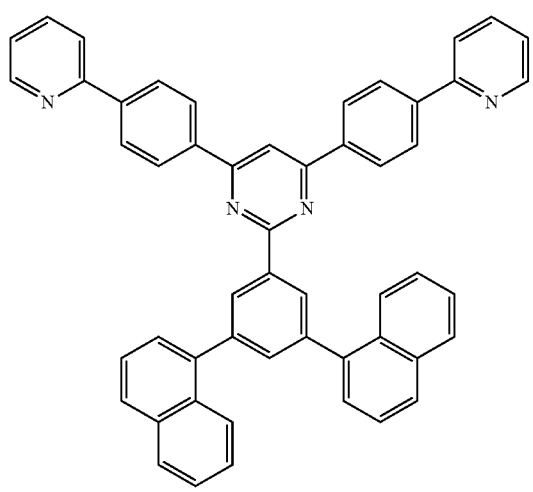
-continued
ET34
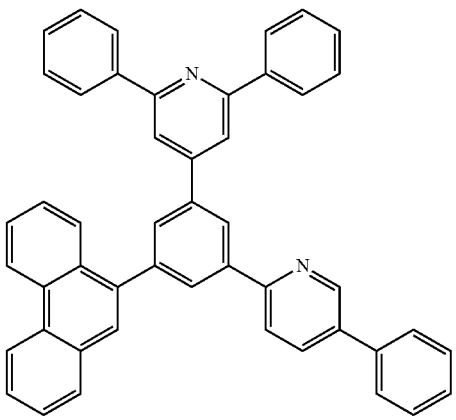
ET35
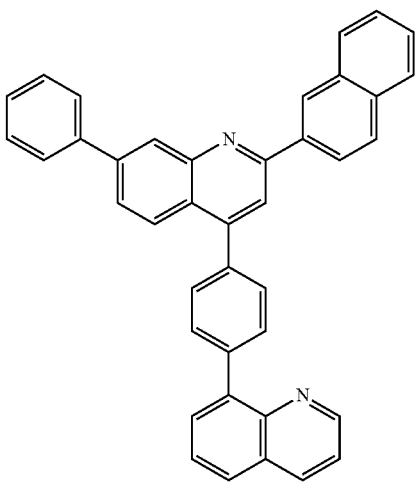
ET36
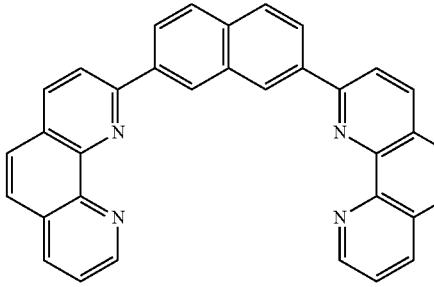
HT37
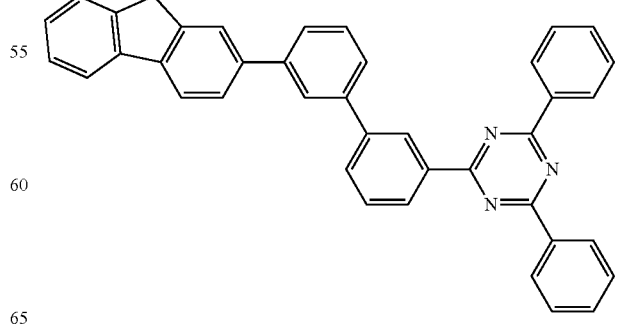

-continued
HT38
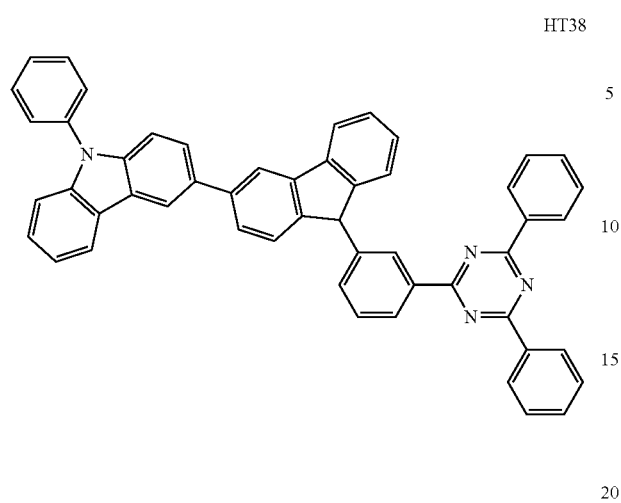
ET41
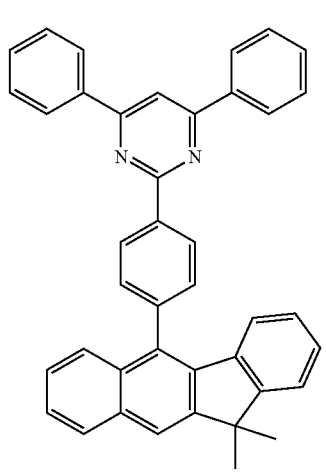
HT39
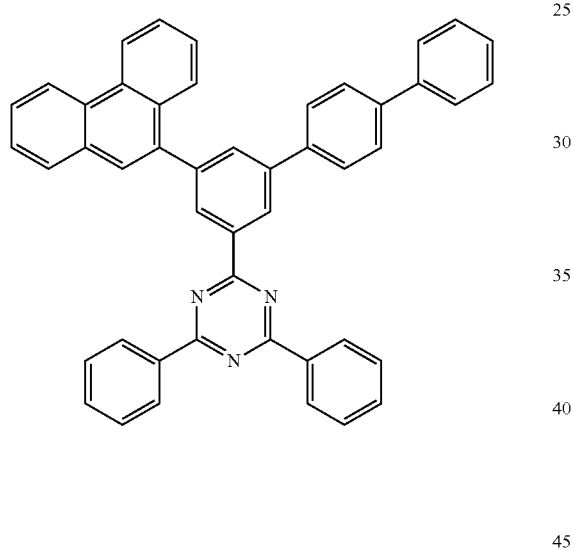
ET42
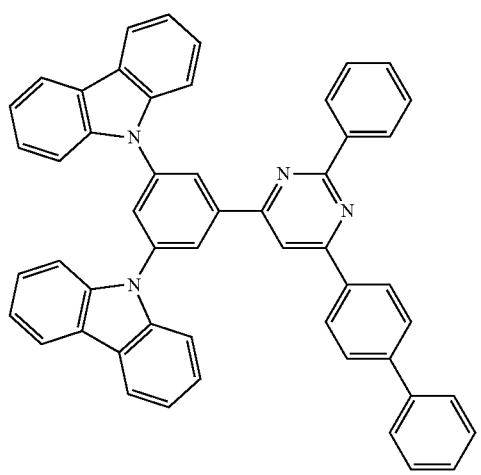
ET40
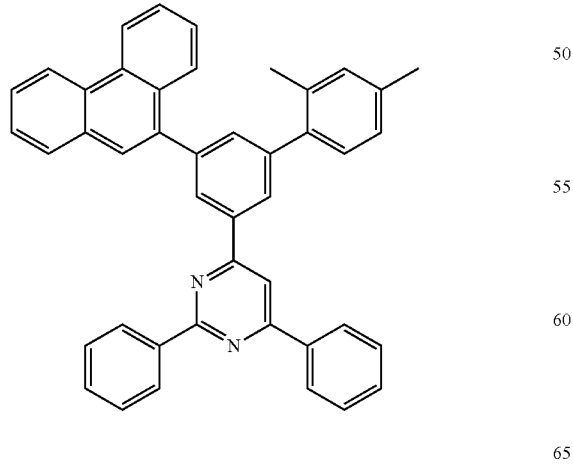
ET43
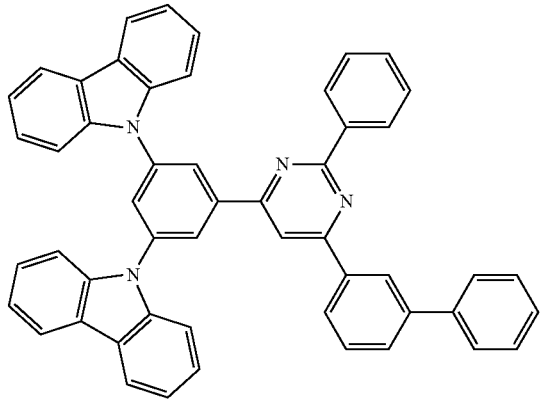

-continued

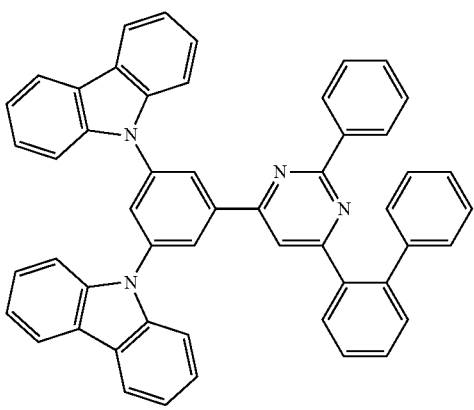
ET44

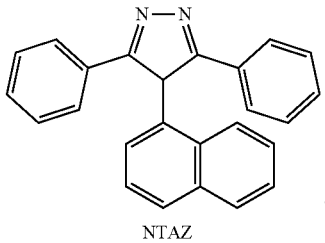
NTAZ

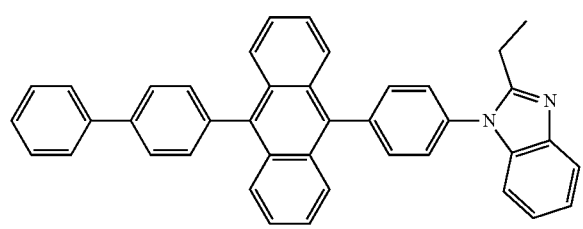
ET45

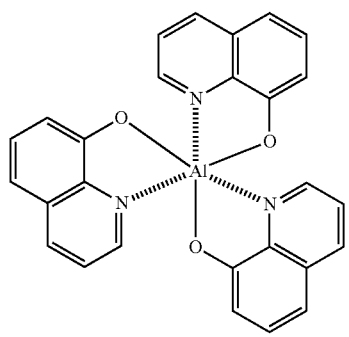
Alq₃

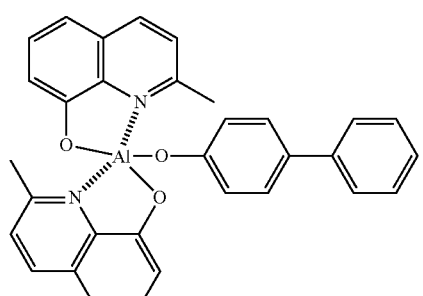
BAlq

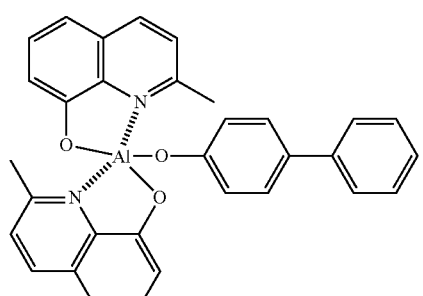

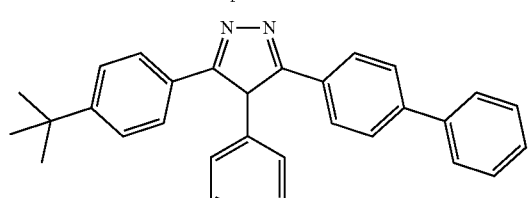
TAZ

The thickness of the electron transport region may be in a range of from about 100 Å to about 5000 Å, for example, about 160 Å to about 4000 Å. When the electron transport region includes a buffer layer, a hole blocking layer, an electron control layer, an electron transport layer, or any combination thereof, the thickness of the buffer layer, the hole blocking layer, or the electron control layer may each independently be in a range of from about 20 Å to about 1000 Å, for example, about 30 Å to about 300 Å, and the thickness of the electron transport layer may be in a range of from about 100 Å to about 1000 Å, for example, about 150 Å to about 500 Å. When the thickness of the buffer layer, the hole blocking layer, the electron control layer, and/or the electron transport layer are within the foregoing ranges, suitable or satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth-metal complex, or any combination thereof. A metal ion of the alkali metal complex may be a Li ion, a Na ion, a K ion, a Rb ion, or a Cs ion, and a metal ion of the alkaline earth-metal complex may be a Be ion, a Mg ion, a Ca ion, a Sr ion, or a Ba ion. A ligand coordinated with the metal ion of the alkali metal complex or the alkaline earth-metal complex may be a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or ET-D2:

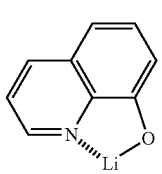
ET-D1

ET-D2

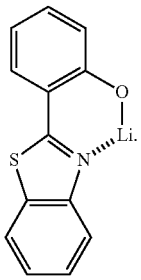

The electron transport region may include an electron injection layer that facilitates the injection of electrons from the second electrode 150. The electron injection layer may directly contact the second electrode 150.

The electron injection layer may have: i) a single-layered structure including (or consisting of) a single layer including (or consisting of) a single material, ii) a single-layered structure including (or consisting of) a single layer including (or consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combinations thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides and/or halides (for example, fluorides, chlorides, bromides, and/or iodides) of the alkali metal, the alkaline earth metal, and the rare earth metal, telluride, or any combination thereof.

The alkali metal-containing compound may be alkali metal oxides, such as $Li_2O$, $Cs_2O$. and/or $K_2O$, and alkali metal halides, such as LiF, NaF, CsF, KF, LiI, NaI, CsI, and/or KI, or any combination thereof. The alkaline earth metal-containing compound may include an alkaline earth metal compound, such as BaO, SrO, CaO, $Ba_xSr_{1-x}O$ (x is a real number that satisfies the condition of 0<x<1), or $Ba_xCa_{1-x}O$ (x is a real number that satisfies the condition of 0<x<1). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) ions of the alkali metal, the alkaline earth metal, and/or the rare earth metal and ii), as a ligand linked to the metal ion, for example, hydroxyquinoline, hydroxyl isoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may include (or consist of) an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof, or may further include an organic material (for example, a compound represented by Formula 601).

In an embodiment, the electron injection layer may include (or consist of) i) an alkali metal-containing compound (for example, an alkali metal halide), and/or ii) a) an alkali metal-containing compound (for example, an alkali metal halide); and b) an alkali metal, an alkaline earth metal, a rare earth metal, or any combination thereof. In an embodiment, the electron injection layer may be a KI:Yb co-deposited layer and/or a RbI:Yb co-deposited layer.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within any of the ranges described above, the electron injection layer may have suitable or satisfactory electron injection characteristics without a substantial increase in driving voltage.

Second Electrode 150

The second electrode 150 may be located on the interlayer 130 having such a structure. The second electrode 150 may be a cathode, which is an electron injection electrode, and as the material for the second electrode 150, a metal, an alloy, an electrically conductive compound, or any combination thereof, each having a low work function, may be used.

The second electrode 150 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode.

The second electrode 150 may have a single-layered structure or a multi-layered structure including two or more layers.

Capping Layer

A first capping layer may be located outside the first electrode 110, and/or a second capping layer may be located outside the second electrode 150. In more detail, the organic light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer of the interlayer 130 of the organic light-emitting device 10 may be extracted (or irradiated) toward the outside through the first electrode 110 and the first capping layer, each of which may be a semi-transmissive electrode or a transmissive electrode, or light generated in an emission layer of the interlayer 130 of the organic light-emitting device 10 may be extracted (or irradiated) toward the outside through the second electrode 150 and the second capping layer, each of which may be a semi-transmissive electrode or a transmissive electrode.

The first capping layer and the second capping layer may increase external luminescence efficiency according to the principle of constructive interference. Accordingly, the light extraction efficiency of the organic light-emitting device 10 is increased, so that the luminescence efficiency of the organic light-emitting device 10 may be improved.

Each of the first capping layer and the second capping layer may include a material having a refractive index of 1.6 or more (at 589 nm).

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include a carbocyclic compound, a heterocyclic compound, an amine group-containing compound, a porphyrine derivative, a phthalocyanine derivative, a naphthalocyanine derivative, an alkali metal complex, an alkaline earth-metal complex, or a combination thereof. The carbocyclic compound, the heterocyclic compound, and the amine group-containing compound may be optionally substituted with a substituent containing O, N, S, Se, Si, F, Cl, Br, I, or any combination thereof.

In an embodiment, at least one of the first capping layer and the second capping layer may each independently include an amine group-containing compound.

In an embodiment, at least one of the first capping layer and second capping layer may each independently include a compound represented by Formula 201, a compound represented by Formula 202, or any combination thereof.

In one or more embodiments, at least one of the first capping layer and the second capping layer may each independently include a compound selected from Compounds HT28 to HT33, Compounds CP1 to CP6, β—NPB, or any combination thereof:

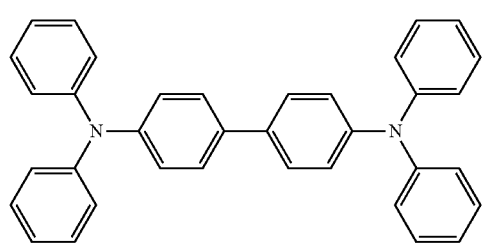

CP1

-continued

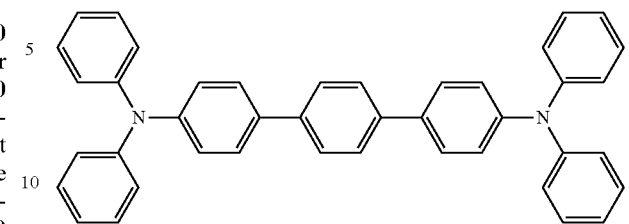

CP2

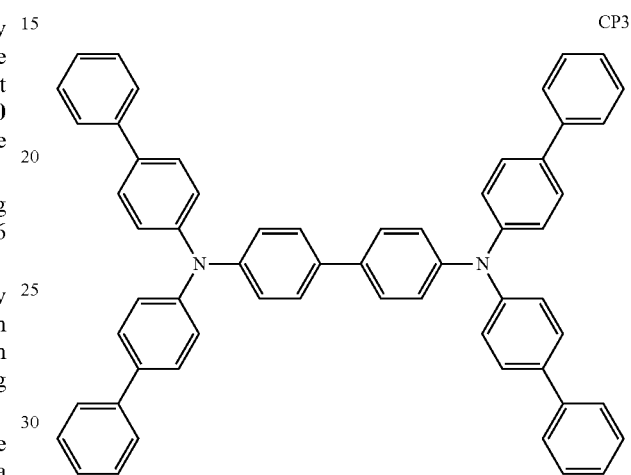

CP3

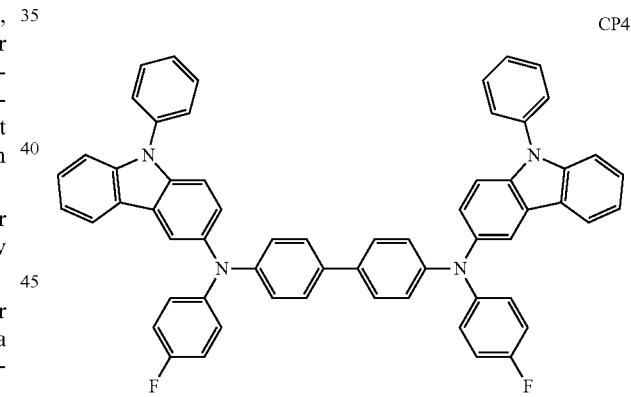

CP4

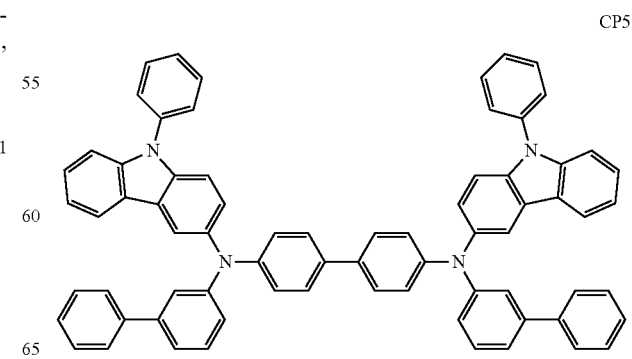

CP5

-continued

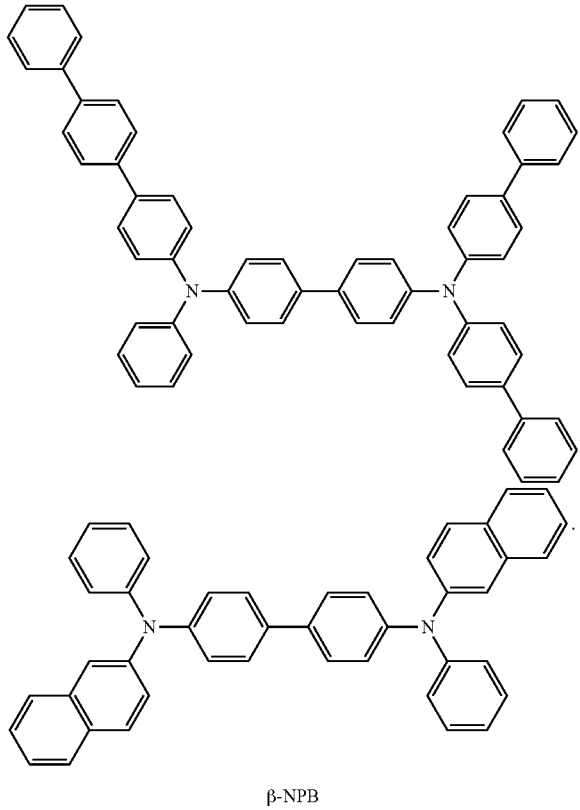

CP8

β-NPB

Electronic Apparatus

The light-emitting device may be included in various suitable electronic apparatuses. In an embodiment, the electronic apparatus including the light-emitting device may be a light-emitting apparatus, an authentication apparatus, and/or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In an embodiment, light emitted from the light-emitting device may be blue light or white light. The light-emitting device may be the same as described above. In an embodiment, the color conversion layer may include quantum dots. The quantum dot may be, for example, a quantum dot as described herein.

The electronic apparatus may include a first substrate. The first substrate includes a plurality of subpixel areas, the color filter includes a plurality of color filter areas corresponding to the plurality of subpixel areas, respectively, and the color conversion layer may include a plurality of color conversion areas corresponding to the subpixel areas, respectively.

A pixel-defining film may be located between the plurality of subpixel areas to define each of the subpixel areas.

The color filter may further include the color filter areas and a light-blocking pattern located between adjacent color filter areas, and the color conversion layer may further include the color conversion areas and a light-blocking pattern located between adjacent color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. In an embodiment, the first color light may be red light, the second color light may be green light, and the third color light may be blue light. In an embodiment, the color filter areas (or the color conversion areas) may include quantum dots. In more detail, the first area may include a red quantum dot, the second area may include a green quantum dot, and the third area may not include a quantum dot. The quantum dot is the same as described in the present specification. Each of the first area, the second area and/or the third area may further include a scattering body.

In an embodiment, the light-emitting device may emit a first light, the first area may absorb the first light to emit a first first-color light, the second area may absorb the first light to emit a second first-color light, and the third area may absorb the first light to emit a third first-color light. In this regard, the first first-color light, the second first-color light, and the third first-color light may have different maximum emission wavelengths from one another. In more detail, the first light may be blue light, the first first-color light may be red light, the second first-color light may be green light, and the third first-color light may be blue light.

The electronic apparatus may further include a thin-film transistor in addition to the light-emitting device 1 as described above. The thin-film transistor may include a source electrode, a drain electrode, and an activation layer, wherein any one selected from the source electrode and the drain electrode may be electrically coupled to any one selected from the first electrode and the second electrode of the light-emitting device.

The thin-film transistor may further include a gate electrode, a gate insulation layer, and/or the like.

The activation layer may include crystalline silicon, amorphous silicon, organic semiconductor, oxide semiconductor, and/or the like.

The electronic apparatus may further include a sealing portion for sealing the light-emitting device. The sealing portion may be located between the color filter and/or the color conversion layer and the light-emitting device. The sealing portion allows light from the light-emitting device 10 to be extracted to the outside, while concurrently (e.g., simultaneously) preventing or reducing penetration of external air and moisture into the light-emitting device 10. The sealing portion may be a sealing substrate including a transparent glass substrate and/or a plastic substrate. The sealing portion may be a thin film encapsulation layer including at least one layer of an organic layer and/or an inorganic layer. When the sealing portion is a thin film encapsulation layer, the electronic apparatus may be flexible.

On the sealing portion, in addition to the color filter and/or color conversion layer, various suitable functional layers may be further located according to the use of the electronic apparatus. The functional layers may include a touch screen layer, a polarizing layer, and/or the like. The touch screen layer may be a pressure-sensitive touch screen layer, a capacitive touch screen layer, and/or an infrared touch screen layer. The authentication apparatus may be, for example, a biometric authentication apparatus for authenticating an individual by using biometric information of a biometric body (for example, a finger tip, a pupil, and/or the like).

The authentication apparatus may further include, in addition to the light-emitting device, a biometric information collector.

The electronic apparatus may be applied to various suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various suitable measuring instruments, meters (for example, meters for a vehicle, an aircraft, and/or a vessel), projectors, and/or the like.

Figure 2:
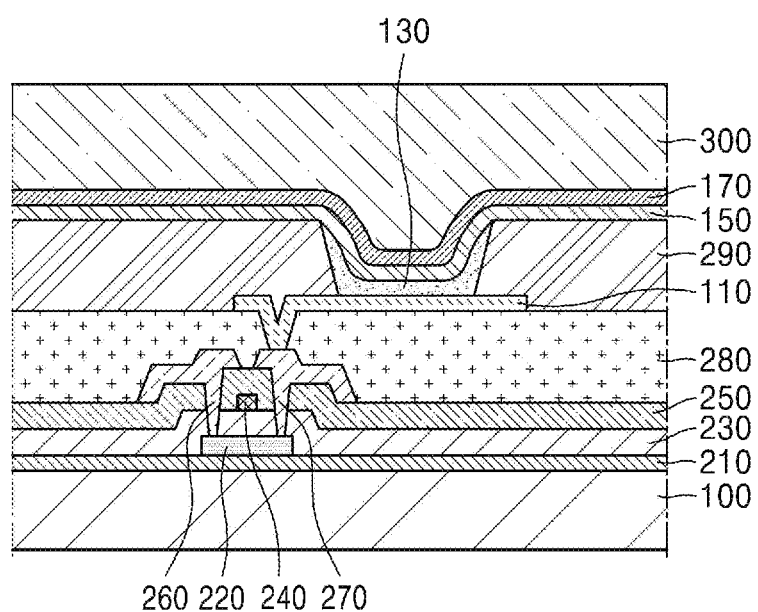
FIG. 2 is a cross-sectional view showing a light-emitting apparatus according to an embodiment of the present disclosure.
Figure 3:
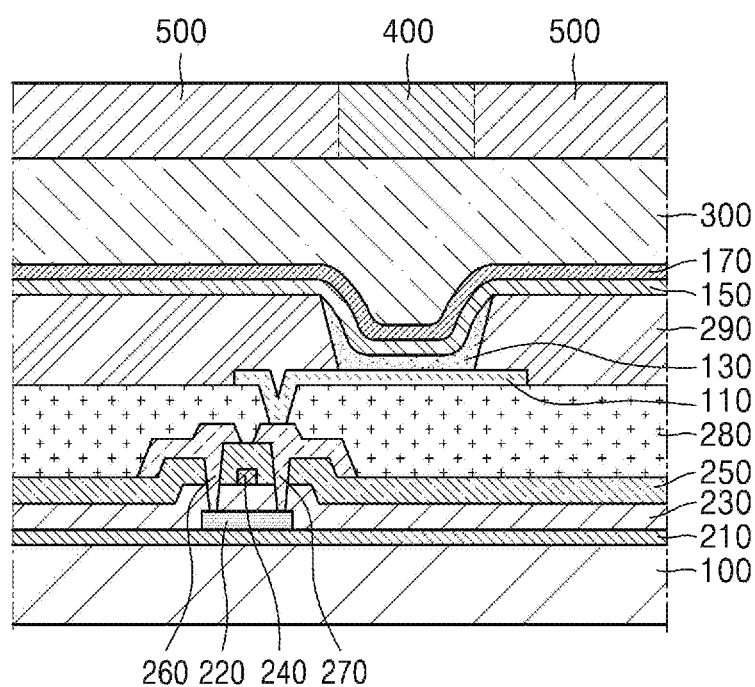
FIG. 3 is a cross-sectional view showing a light-emitting apparatus according to an embodiment of the present disclosure.

Description of FIGS. 2 and 3

FIG. 2 is a cross-sectional view showing a light-emitting apparatus according to an embodiment of the present disclosure.

The light-emitting apparatus of FIG. 2 includes a substrate 100, a thin-film transistor (TFT), a light-emitting device, and an encapsulation portion 300 that seals light-emitting device.

The substrate 100 may be a flexible substrate, a glass substrate, and/or a metal substrate. A buffer layer 210 may be located on the substrate 100. The buffer layer 210 prevents or reduces the penetration of impurities through the substrate 100 and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor such as silicon and/or polysilicon, an organic semiconductor, and/or an oxide semiconductor, and may include a source region, a drain region and a channel region.

A gate insulating film 230 for insulating the activation layer 220 from the gate electrode 240 may be located on the activation layer 220, and the gate electrode 240 may be located on the gate insulating film 230.

An interlayer insulating film 250 may be located on the gate electrode 240. The interlayer insulating film 250 is located between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be located to be in contact (e.g., physical contact) with the exposed portions of the source region and the drain region of the activation layer 220.

The TFT may be electrically coupled to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device includes the first electrode 110, the interlayer 130, and the second electrode 150.

The first electrode 110 may be located on the passivation layer 280. The passivation layer 280 does not completely cover the drain electrode 270 and exposes a portion of the drain electrode 270, and the first electrode 110 may be coupled to the exposed portion of the drain electrode 270.

A pixel defining layer 290 including an insulating material may be located on the first electrode 110. The pixel defining layer 290 may expose a certain region of the first electrode 110, and the interlayer 130 may be formed in the exposed region of the first electrode 110. The pixel defining layer 290 may be a polyimide or polyacryl-based organic film. In some embodiments, at least one layer of the interlayer 130 may extend to the upper portion of the pixel defining layer 290 and may be located in the form of a common layer.

A second electrode 150 may be located on the interlayer 130, and a capping layer 170 may be additionally formed on the second electrode 150. The capping layer 170 may be formed to cover the second electrode 150.

An encapsulation portion 300 may be located on the capping layer 170. The encapsulation portion 300 may be located on a light-emitting device and protects the light-emitting device from moisture and/or oxygen. The encapsulation portion 300 may include: an inorganic film including silicon nitride (SiNx), silicon oxide (SiOx), indium tin oxide, indium zinc oxide, or a combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate or polyacrylic acid), an epoxy-based resin (for example, aliphatic glycidyl ether (AGE)), or a combination thereof; or a combination of an inorganic film and an organic film.

FIG. 3 is a cross-sectional view showing a light-emitting apparatus according to an embodiment of the present disclosure.

The light-emitting apparatus of FIG. 3 is the same as the light-emitting apparatus of FIG. 2, except that a light-blocking pattern 500 and a functional region 400 are additionally located on the encapsulation portion 300. The functional region 400 may be i) a color filter area, ii) a color conversion areas, or iii) a combination of the color filter area and the color conversion area. In an embodiment, the light-emitting device included in the light-emitting apparatus of FIG. 3 may be a tandem light-emitting device.

Preparation Methods

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/see to about 100 Å/see by taking into account a material to be included in a layer to be formed and the structure of a layer to be formed.

Definition of at Least Some of the Terms

The term "$C_3$-$C_{60}$ carbocyclic group," as used herein, refers to a cyclic group that include (or consists of) carbon only and has three to sixty carbon atoms, preferably $C_5$-$C_{60}$ carbocyclic group, and the term "$C_1$-$C_{60}$ heterocyclic group" as used herein refers to a cyclic group that has one to sixty carbon atoms and further includes, in addition to carbon, a heteroatom. The $C_3$-$C_{60}$ carbocyclic group and a $C_1$-$C_{60}$ heterocyclic group may each be a monocyclic group that includes (or consists of) one ring or a polycyclic group in which two or more rings are condensed with (e.g., combined together with) each other. In an embodiment, the number of ring-forming atoms of the $C_1$-$C_{60}$ heterocyclic group may be from 3 to 61.

The term "cyclic group," as used herein, includes the $C_3$-$C_{60}$ carbocyclic group and the $C_1$-$C_{60}$ heterocyclic group.

The term "π electron-rich $C_3$-$C_{60}$ cyclic group," as used herein, refers to a cyclic group that has one to sixty carbon atoms and does not include *—N=*' as a ring-forming moiety, and the term "π electron-deficient nitrogen-containing $C_1$-$C_{60}$ cyclic group," as used herein, refers to a heterocyclic group that has one to sixty carbon atoms and includes *—N=*' as a ring-forming moiety.

For example, the $C_3$-$C_{60}$ carbocyclic group may be i) a group $T_1$ or ii) a condensed cyclic group in which two or more groups $T_1$ are condensed with (e.g., combined together with) each other (for example, a cyclopentadiene group, an adamantane group, a norbornane group, a benzene group, a pentalene group, a naphthalene group, an azulene group, an indacene group, acenaphthene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spirobifluorene group, a benzofluorene group, an indenophenanthrene group, and/or an indenoanthracene group), the $C_1$-$C_{60}$ heterocyclic group may be i) a group $T_2$, ii) a condensed cyclic group in which two or more groups $T_2$ are condensed with (e.g., combined together with) each other, or iii) a condensed cyclic group in which at least one groups $T_2$ and at least one group $T_1$ are condensed with (e.g., combined together with) each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran benzofurodibenzofuran group, a benzofurodibenzothiophene group, a benzothieno dibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, and/or an azadibenzofuran group), the π electron-rich $C_3$-$C_{60}$ cyclic group may be i) a group $T_1$, ii) a condensed cyclic group in which two or more groups T1 are condensed with (e.g., combined together with) each other, iii) a group T3, iv) a condensed cyclic group in which two or more groups T3 are condensed with (e.g., combined together with) each other, or v) a condensed cyclic group in which at least one group T3 and at least one group T1 are condensed with (e.g., combined together with) each other (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, and/or a benzothienodibenzothiophene group), the π electron-deficient nitrogen-containing $C_1$-$C_{60}$ cyclic group may be i) a group T4, ii) a condensed cyclic group in which two or more groups T4 are condensed with (e.g., combined together with) each other, iii) a condensed cyclic group in which at least one group T4 and at least one group T1 are condensed with (e.g., combined together with) each other, iv) a condensed cyclic group in which at least one group T4 and at least one group T3 are condensed with (e.g., combined together with) each other, or v) a condensed cyclic group in which at least one group T4, at least one group T1, and at least one group T3 are condensed with (e.g., combined together with) each other (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, and/or an azadibenzofuran group), the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane group (or, a bicyclo[2.2.1]heptane group), a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group," "$C_3$-$C_{60}$ carbocyclic group," "$C_1$-$C_{60}$ heterocyclic group," "π electron-rich $C_3$-$C_{60}$ cyclic group," and "π electron-deficient nitrogen-containing $C_1$-$C_{60}$ cyclic group," as used herein, refer to a group that is condensed with (e.g., combined together with) a cyclic group, a monovalent group, a polyvalent group (for example, a divalent group, a trivalent group, a tetravalent group, or the like), according to the structure of a formula described with corresponding terms. In an embodiment, "a benzene group" may be a benzo group, a phenyl group, a phenylene group, or the like, which may be easily understand by one of ordinary skill in the art according to the structure of a formula including the "benzene group."

In an embodiment, examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group," as used herein, refers to a linear or branched aliphatic hydrocarbon monovalent group having 1 to 60 carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group," as used herein, refers to a divalent group having substantially the same structure as the $C_1$-$C_{60}$ alkyl group.

The term "$C_2$-$C_{60}$ alkenyl group," as used herein, refers to a monovalent hydrocarbon group having at least one carbon-carbon double bond at a main chain (e.g., in the middle) or at a terminal end (e.g., the terminus) of a $C_2$-$C_{60}$ alkyl group, and examples thereof include an ethenyl group, a propenyl group, and a butenyl group. The term "$C_2$-$C_{60}$ alkenylene group," as used herein, refers to a divalent group having substantially the same structure as the $C_2$-$C_{60}$ alkenyl group.

The term "$C_2$-$C_{60}$ alkynyl group," as used herein, refers to a monovalent hydrocarbon group having at least one carbon-carbon triple bond at a main chain (e.g., in the middle) or at a terminal end (e.g., the terminus) of a $C_2$-$C_{60}$ alkyl group, and examples thereof include an ethynyl group, and a propynyl group. The term "$C_2$-$C_{60}$ alkynylene group," as used herein, refers to a divalent group having substantially the same structure as the $C_2$-$C_{60}$ alkynyl group.

The term "$C_1$-$C_{60}$ alkoxy group," as used herein, refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group," as used herein, refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group," as used herein, refers to a divalent group having substantially the same structure as the $C_3$-$C_{10}$ cycloalkyl group.

The term "$C_1$-$C_{10}$ heterocycloalkyl group," as used herein, refers to a monovalent cyclic group that further includes, in addition to a carbon atom, at least one heteroatom as a ring-forming atom and has 1 to 10 carbon atoms, and examples thereof are a 1, 2, 3,4-oxatriazolidinyl group, a tetrahydrofuranyl group, and a tetrahydrothiophenyl group. The term "$C_1$-$C_{10}$ heterocycloalkylene group," as used herein, refers to a divalent group having substantially the same structure as the $C_1$-$C_{10}$ heterocycloalkyl group.

The term "$C_3$-$C_{10}$ cycloalkenyl group," as used herein, refers to a monovalent monocyclic group that has 3 to 10 carbon atoms and at least one carbon-carbon double bond in the ring thereof and no aromaticity (e.g., is not aromatic), and non-limiting examples thereof include a cyclopentenyl group, a cyclohexenyl group, and a cycloheptenyl group. The term "$C_3$-$C_{10}$ cycloalkenylene group," as used herein, refers to a divalent group having substantially the same structure as the $C_3$-$C_{10}$ cycloalkenyl group.

The term "$C_1$-$C_{10}$ heterocycloalkenyl group," as used herein, refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group," as used herein, refers to a divalent group having substantially the same structure as the $C_1$-$C_{10}$ heterocycloalkenyl group.

The term "$C_6$-$C_{60}$ aryl group," as used herein, refers to a monovalent group having a carbocyclic aromatic system having 6 to 60 carbon atoms, and the term "$C_6$-$C_{60}$ arylene group," as used herein, refers to a divalent group having a carbocyclic aromatic system having 6 to 60 carbon atoms. Examples of the $C_6$-$C_{60}$ aryl group are a fluorenyl group, a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the two or more rings may be fused to (e.g., combined together with) each other.

The term "$C_1$-$C_{60}$ heteroaryl group," as used herein, refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group," as used herein, refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group are a carbazolyl group, a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the two or more rings may be condensed with (e.g., combined together with) each other.

The term "monovalent non-aromatic condensed polycyclic group," as used herein, refers to a monovalent group (for example, having 8 to 60 carbon atoms) having two or more rings condensed with (e.g., combined together with) each other, only carbon atoms as ring-forming atoms, and no aromaticity in its entire molecular structure (e.g., the entire molecular structure is not aromatic). Examples of the monovalent non-aromatic condensed polycyclic group are an indenyl group, a fluorenyl group, a spiro-bifluorenyl group, a benzofluorenyl group, an indenophenanthrenyl group, and an indenoanthracenyl group. The term "divalent non-aromatic condensed polycyclic group," as used herein, refers to a divalent group having substantially the same structure as the monovalent non-aromatic condensed polycyclic group.

The term "monovalent non-aromatic condensed heteropolycyclic group," as used herein, refers to a monovalent group (for example, having 1 to 60 carbon atoms) having two or more rings condensed to each other (e.g., combined together), at least one heteroatom other than carbon atoms, as a ring-forming atom, and no aromaticity in its entire molecular structure (e.g., the entire structure is not aromatic). Examples of the monovalent non-aromatic condensed heteropolycyclic group are a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group," as used herein, refers to a divalent group having substantially the same structure as the monovalent non-aromatic condensed heteropolycyclic group.

The term "$C_6$-$C_{60}$ aryloxy group," as used herein, refers to —$OA_{102}$ (wherein $A_{102}$ is the $C_6$-$C_{60}$ aryl group), and the term "$C_6$-$C_{60}$ arylthio group," as used herein, refers to —$SA_{103}$ (wherein $A_{103}$ is the $C_6$-$C_{60}$ aryl group).

The term "$R_{10a}$," as used herein, refers to:
deuterium (-D), —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —$C_1$, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

The term "$C_1$-$C_{60}$ heterocyclic group," as used herein, refers to a group having substantially the same structure as the $C_3$-$C_{60}$ carbocyclic group, except that as a ring-forming atom, at least one heteroatom selected from N, O, Si, P, and S is used in addition to carbon (the number of carbon atoms may be in a range of 2 to 60).

In the present specification, at least one substituent of the substituted $C_3$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

- deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;
- a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$),
- a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group,
- a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$), and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

$Q_1$ to $Q_3$, $Q_{11}$ to $Q_{13}$, $Q_{21}$ to $Q_{23}$ and $Q_{31}$ to $Q_{33}$, as used herein, may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "hetero atom," as used herein, refers to any atom other than a carbon atom. Examples of the heteroatom are O, S, N, P, Si, B, Ge, Se, and any combination thereof.

The term "Ph," as used herein, refers to a phenyl group, the term "Me," as used herein, refers to a methyl group, the term "Et," as used herein, refers to an ethyl group, the term "tert-Bu" or "But," as used herein, refers to a tert-butyl group, and the term "OMe," as used herein, refers to a methoxy group.

The term "biphenyl group," as used herein, refers to "a phenyl group substituted with a phenyl group." In other words, the "biphenyl group" is a substituted phenyl group having a $C_6$-$C_{60}$ aryl group as a substituent.

The term "terphenyl group," as used herein, refers to "a phenyl group substituted with a biphenyl group." For example, the "terphenyl group" may be a substituted phenyl group having, as a substituent, a $C_6$-$C_{60}$ aryl group substituted with a $C_6$-$C_{60}$ aryl group.

*, *', and*'', as used herein, unless defined otherwise, each refer to a binding site to a neighboring atom in a corresponding formula.

Hereinafter, a compound according to embodiments and an organic light-emitting device according to embodiments will be described in more detail with reference to Synthesis Examples and Examples. The wording "B was used instead of A" used in describing Synthesis Examples refers to that an identical molar equivalent of B was used in place of A.

Synthesis Example

Synthesis Example 1: Synthesis of Compound 1

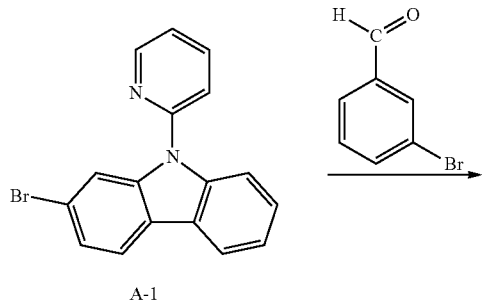

A-1

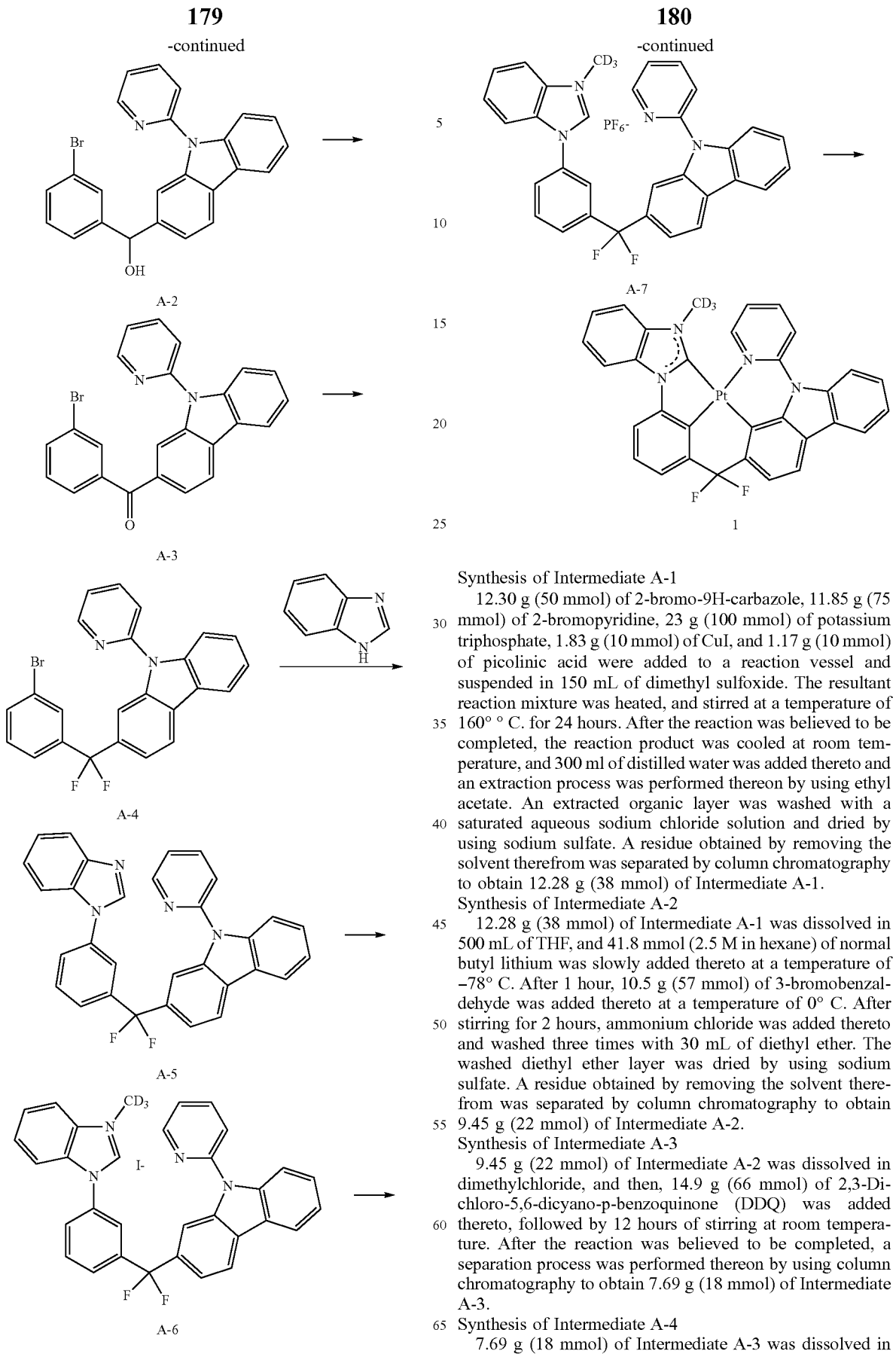

Synthesis of Intermediate A-1

12.30 g (50 mmol) of 2-bromo-9H-carbazole, 11.85 g (75 mmol) of 2-bromopyridine, 23 g (100 mmol) of potassium triphosphate, 1.83 g (10 mmol) of CuI, and 1.17 g (10 mmol) of picolinic acid were added to a reaction vessel and suspended in 150 mL of dimethyl sulfoxide. The resultant reaction mixture was heated, and stirred at a temperature of 160° ° C. for 24 hours. After the reaction was believed to be completed, the reaction product was cooled at room temperature, and 300 ml of distilled water was added thereto and an extraction process was performed thereon by using ethyl acetate. An extracted organic layer was washed with a saturated aqueous sodium chloride solution and dried by using sodium sulfate. A residue obtained by removing the solvent therefrom was separated by column chromatography to obtain 12.28 g (38 mmol) of Intermediate A-1.

Synthesis of Intermediate A-2

12.28 g (38 mmol) of Intermediate A-1 was dissolved in 500 mL of THF, and 41.8 mmol (2.5 M in hexane) of normal butyl lithium was slowly added thereto at a temperature of −78° C. After 1 hour, 10.5 g (57 mmol) of 3-bromobenzaldehyde was added thereto at a temperature of 0° C. After stirring for 2 hours, ammonium chloride was added thereto and washed three times with 30 mL of diethyl ether. The washed diethyl ether layer was dried by using sodium sulfate. A residue obtained by removing the solvent therefrom was separated by column chromatography to obtain 9.45 g (22 mmol) of Intermediate A-2.

Synthesis of Intermediate A-3

9.45 g (22 mmol) of Intermediate A-2 was dissolved in dimethylchloride, and then, 14.9 g (66 mmol) of 2,3-Dichloro-5,6-dicyano-p-benzoquinone (DDQ) was added thereto, followed by 12 hours of stirring at room temperature. After the reaction was believed to be completed, a separation process was performed thereon by using column chromatography to obtain 7.69 g (18 mmol) of Intermediate A-3.

Synthesis of Intermediate A-4

7.69 g (18 mmol) of Intermediate A-3 was dissolved in dimethylchloride under nitrogen conditions, and then, 18 mL of HF-pyridine was added thereto, followed by 24 hours of stirring at a temperature of 50° C. After the reaction was believed to be completed, diethyl ether was added to the residue from which the solvent was removed, and then the resultant mixture was washed with a sodium bicarbonate solution. The washed diethyl ether layer was dried by using sodium sulfate. After the solvent-removed residue was stirred under hexane, a recrystallization process was performed thereon by using 7.64 g (17 mmol) of Intermediate A-4.

Synthesis of Intermediate A-5

7.64 g (17 mmol) of Intermediate A-4, 1.65 g (14 mmol) of 1H-benzo[d]imidazole, 6.44 g (28 mmol) of potassium triphosphate, 0.51 g (2.8 mmol) of CuI, and 0.32 g (2.8 mmol) of picolinic acid were added to a reaction vessel and suspended in 40 mL of dimethyl sulfoxide. The resultant reaction mixture was heated, and stirred at a temperature of 160 °C for 12 hours. After the reaction was believed to be completed, the reaction product was cooled at room temperature, and 100 ml of distilled water was added thereto and an extraction process was performed thereon by using ethyl acetate. An extracted organic layer was washed with a saturated aqueous sodium chloride solution and dried over sodium sulfate. A residue obtained by removing the solvent therefrom was separated by column chromatography to obtain 4.86 g (10 mmol) of Intermediate A-5.

Synthesis of Intermediate A-6

4.86 g (10 mmol) of Intermediate A-5 was suspended in excess deuterium-substituted iodine methane. The reaction mixture was heated, and stirred at a temperature of 110° ° C. for 24 hours. After the reaction was believed to be completed, the resultant mixture was cooled to room temperature, and the resulting solid was filtered and washed with ether. The washed solid was separated by recrystallization to obtain 5.05 g (8.0 mmol) of Intermediate A-6.

Synthesis of Intermediate A-7

5.05 g (8.0 mmol) of Intermediate A-6 and 5.31 g (32 mmol) of ammonium hexafluorophosphate were added to a reaction vessel and suspended in a mixed solution including 80 mL of methyl alcohol and 20 ml of water. The resultant reaction mixture was stirred at room temperature for 24 hours. After the reaction was believed to be completed, the resulting solid was filtered and washed with ether. The washed solid was dried to obtain 5.0 g (7.7 mmol) of Intermediate A-7.

Synthesis of Compound 1

5.0 g (7.7 mmol) of Intermediate A-7, 2.96 g (8.08 mmol) of dichloro(1,5-cyclooctadiene) platinum, and 1.26 g (15.4 mmol) of sodium acetate were suspended in 80 ml of dioxane. The resultant reaction mixture was heated, and stirred at a temperature of 110° C. for 72 hours. After the reaction was believed to be completed, the reaction product was cooled at room temperature, and 100 ml of distilled water was added thereto and an extraction process was performed thereon by using ethyl acetate. An extracted organic layer was washed with a saturated aqueous sodium chloride solution and dried over sodium sulfate. A residue obtained by removing the solvent therefrom was separated by column chromatography to obtain 1.6 g (2.3 mmol) of Compound 1.

Synthesis Example 2: Synthesis of Compound 10

Compound 10 was obtained in substantially the same manner as in Synthesis Example 1, except that 2-bromo-9-(4-(t-butyl)pyridine-2-nyl)-9H-carbazole was used instead of Intermediate A-1 and 3-bromo-5-(t-butyl)benzaldehyde was used instead of 3-bromo benzaldehyde.

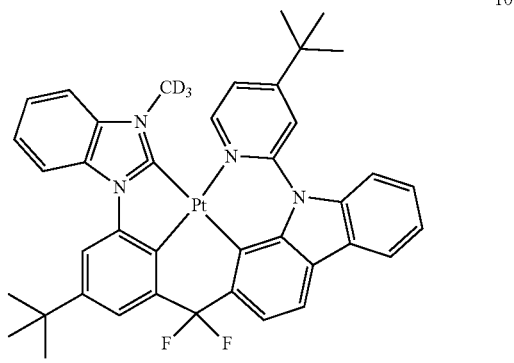

Synthesis Example 3: Synthesis of Compound 37

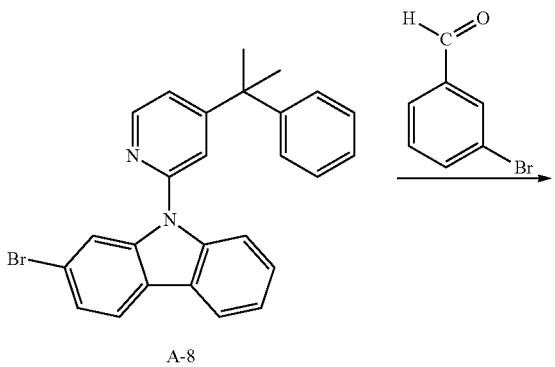

A-8

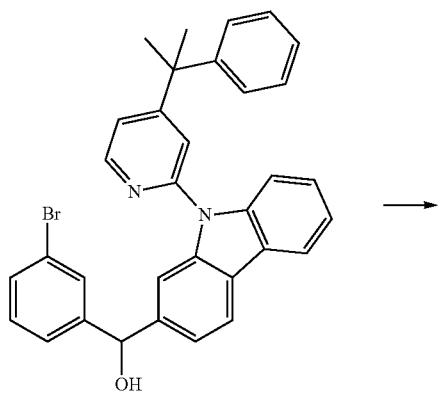

A-9

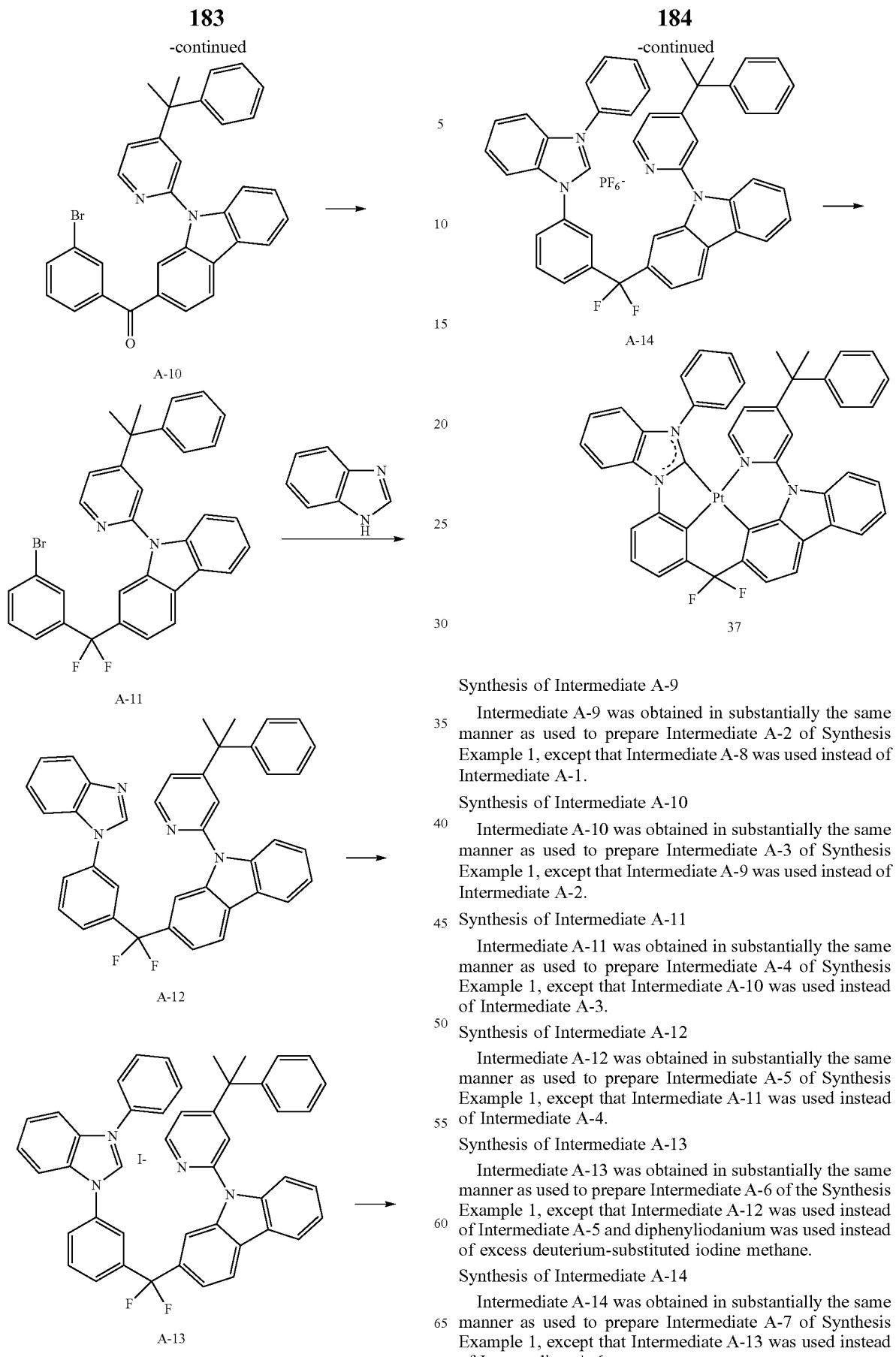

Synthesis of Intermediate A-9

Intermediate A-9 was obtained in substantially the same manner as used to prepare Intermediate A-2 of Synthesis Example 1, except that Intermediate A-8 was used instead of Intermediate A-1.

Synthesis of Intermediate A-10

Intermediate A-10 was obtained in substantially the same manner as used to prepare Intermediate A-3 of Synthesis Example 1, except that Intermediate A-9 was used instead of Intermediate A-2.

Synthesis of Intermediate A-11

Intermediate A-11 was obtained in substantially the same manner as used to prepare Intermediate A-4 of Synthesis Example 1, except that Intermediate A-10 was used instead of Intermediate A-3.

Synthesis of Intermediate A-12

Intermediate A-12 was obtained in substantially the same manner as used to prepare Intermediate A-5 of Synthesis Example 1, except that Intermediate A-11 was used instead of Intermediate A-4.

Synthesis of Intermediate A-13

Intermediate A-13 was obtained in substantially the same manner as used to prepare Intermediate A-6 of the Synthesis Example 1, except that Intermediate A-12 was used instead of Intermediate A-5 and diphenyliodanium was used instead of excess deuterium-substituted iodine methane.

Synthesis of Intermediate A-14

Intermediate A-14 was obtained in substantially the same manner as used to prepare Intermediate A-7 of Synthesis Example 1, except that Intermediate A-13 was used instead of Intermediate A-6.

Synthesis of Compound 37

Compound 37 was obtained in substantially the same manner as used to prepare Compound 1 of Synthesis Example 1, except that Intermediate A-14 was used instead of Intermediate A-7.

Synthesis Example 4: Synthesis of Compound 44

Compound 44 was obtained in substantially the same manner as in Synthesis Example 3, except that 2-bromo-9-(4-((1r,3r,5r,7r)-2-phenyladamantane-2-nyl)pyridine-2-nyl)-9H-carbazole was used instead of Intermediate A-8, and 3-bromo-5-(t-butyl)benzaldehyde was used instead of 3-bromobenzaldehyde.

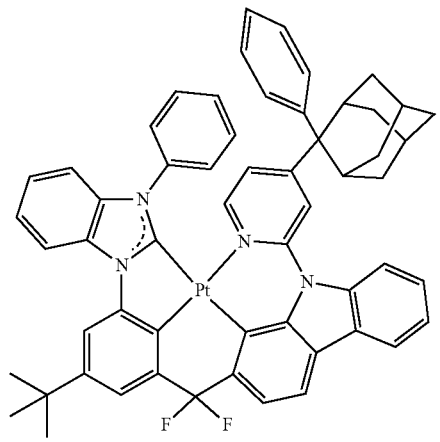

44

Synthesis Example 5: Synthesis of Compound 53

Compound 53 was obtained in substantially the same manner as in Synthesis Example 1, except that 2-bromo-9-(4-(t-butyl)pyridine-2-nyl)-9H-carbazole was used instead of Intermediate A-1 and bis(4-(t-butyl)phenyl)iodanium was used instead of excess deuterium-substituted iodine methane.

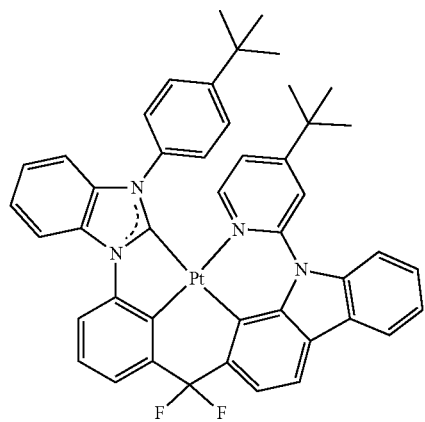

53

Synthesis Example 6: Synthesis of Compound 63

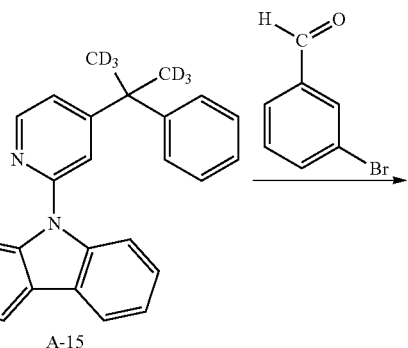

A-15

A-16

A-17

A-18

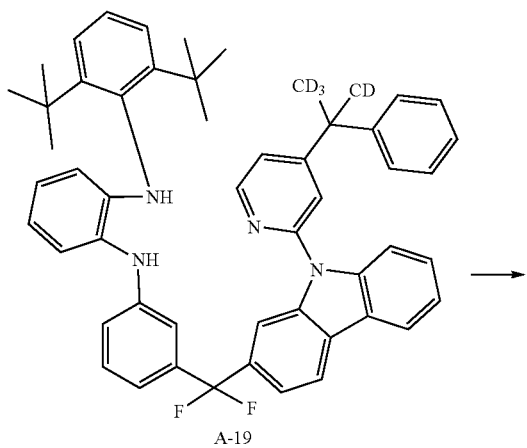

A-19

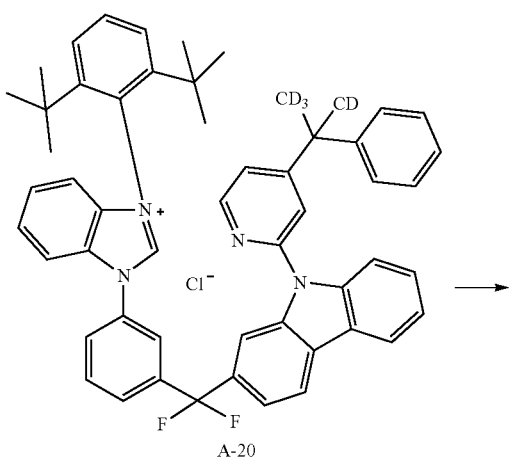

A-20

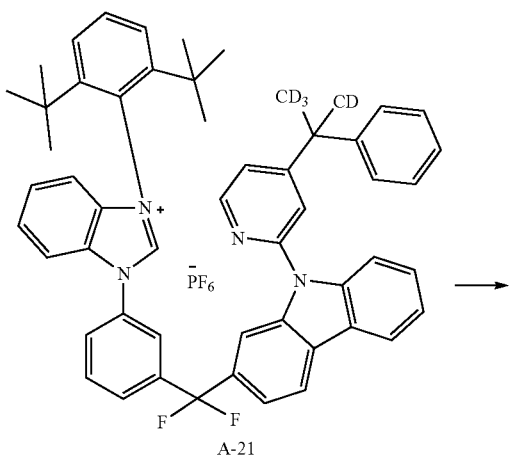

A-21

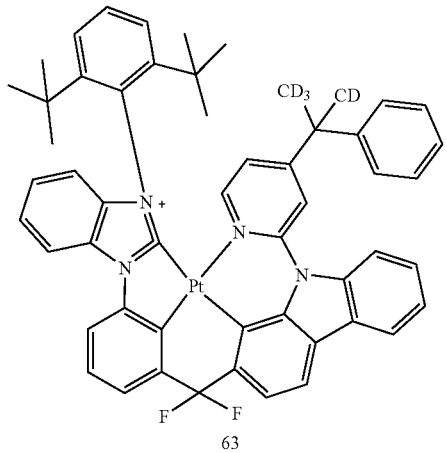

63

Synthesis of Intermediate A-18

Intermediate A-18 was obtained in substantially the same manner as used to prepare Intermediate A-11 of Synthesis Example 3, except that Intermediate A-15 was used instead of Intermediate A-8.

Synthesis of Intermediate A-19

5.73 g (10 mmol) of Intermediate A-18, 3.26 g (11 mmol) of N1-(2,6-di-t-butylphenyl)benzene-1,2-diamine, SPhos (0.75 mmol), $Pd_2(dba)_3$ (0.5 mmol), and sodium t-butoxide (20 mmol) were suspended with 100 ml of toluene solvent, heated to a temperature of 100° C., and stirred for 5 hours. After the reaction was believed to be completed, a solvent was removed therefrom under reduced pressure, and extracted with methylene chloride and distilled water. An extracted organic layer was washed with a saturated aqueous sodium chloride solution and dried over sodium sulfate. A residue obtained by removing the solvent therefrom was separated by column chromatography to obtain 6.15 g (7.8 mmol) of Intermediate A-19.

Synthesis of Intermediate A-20

6.15 g (7.8 mmol) of Intermediate A-19 was dissolved in 380 mmol of triethylorthoformate, and then, 9.14 mmol HCl was added dropwise thereto. The temperature was raised to 100° C. and the mixture was stirred for 20 hours. After the reaction was believed to be completed, a solvent was removed therefrom under reduced pressure, and extracted with methylene chloride and distilled water. An extracted organic layer was washed with a saturated aqueous sodium chloride solution and dried over sodium sulfate. A residue obtained by removing the solvent therefrom was separated by column chromatography to obtain 5.01 g (6.0 mmol) of Intermediate A-20.

Synthesis of Intermediate A-21

Intermediate A-21 was obtained in substantially the same manner as used to prepare Intermediate A-7 of Synthesis Example 1, except that Intermediate A-20 was used instead of Intermediate A-6.

Synthesis of Compound 63

Compound 63 was obtained in substantially the same manner as used to prepare Compound 1 of Synthesis Example 1, except that Intermediate A-21 was used instead of Intermediate A-7.

Synthesis Example 7: Synthesis of Compound 78
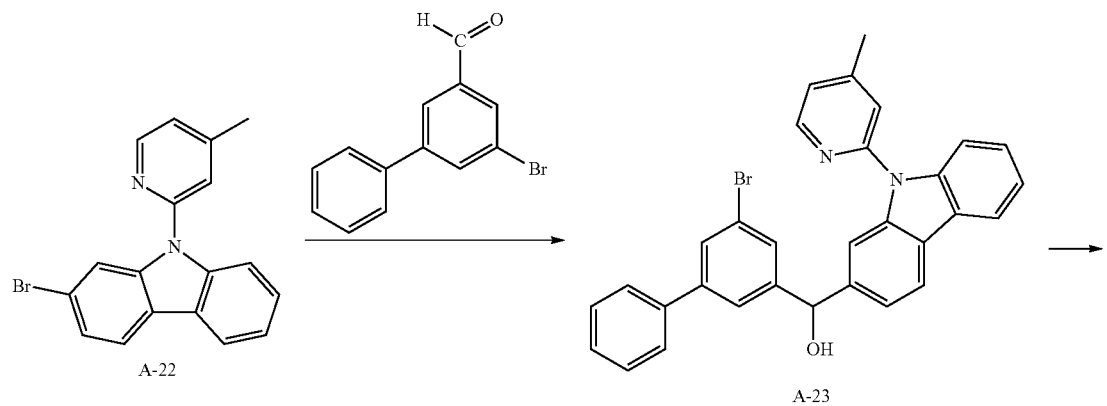
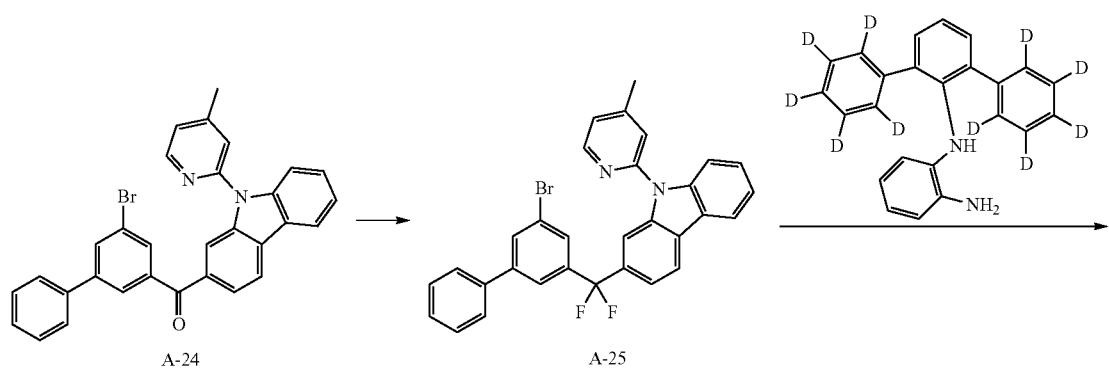
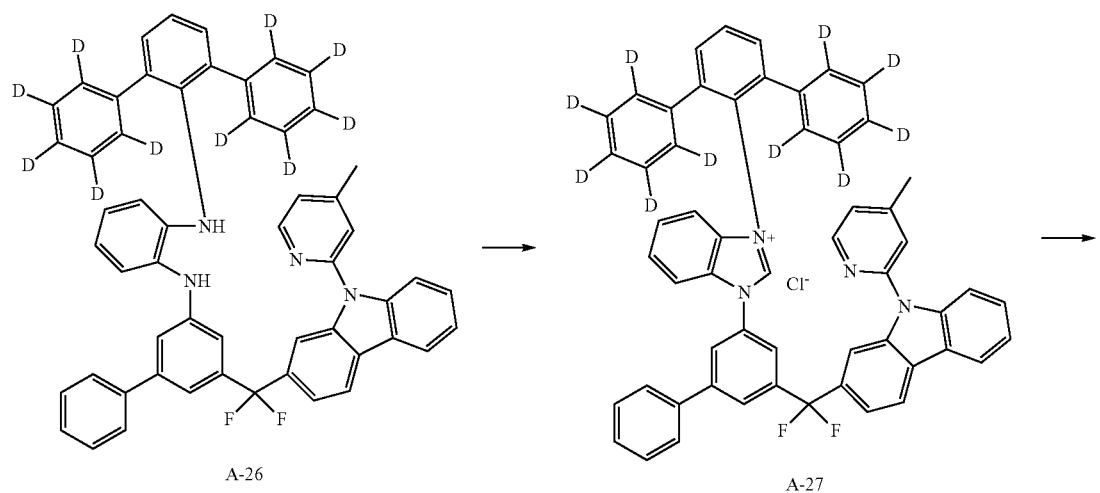

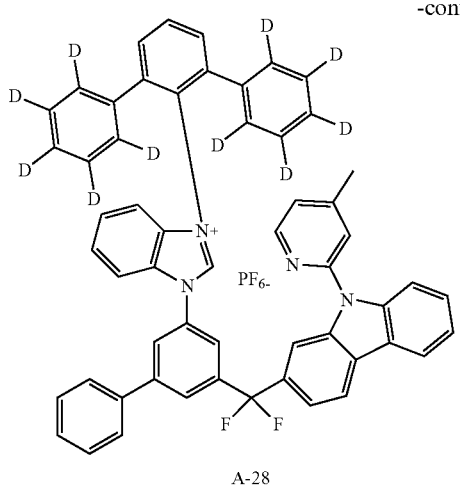

A-28

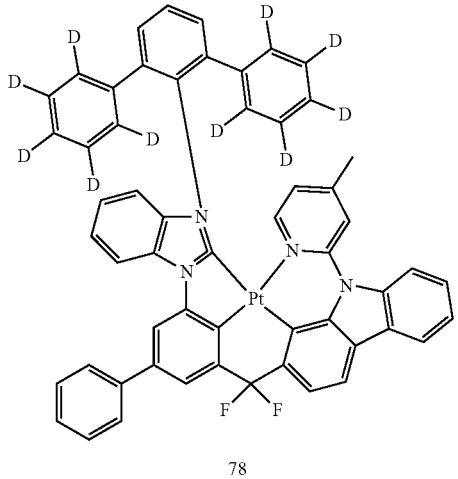

78

Synthesis of Intermediate A-25

Intermediate A-25 was obtained in substantially the same manner as used to obtain Intermediate A-11 of Synthesis Example 3, except that Intermediate A-22 was used instead of Intermediate A-8 and 5-bromo-[1,1'-biphenyl]–3-carbaldehyde was used instead of 3-bromo benzaldehyde.

Synthesis of Intermediate A-26

Intermediate A-26 was obtained in substantially the same manner as used to obtain Intermediate A-19 of Synthesis Example 6, except that Intermediate A-25 was used instead of Intermediate A-18 and N1-([1,1':3',1''-terphenyl]-2'-nyl-2,2'',3,3'',4,4'',5,5'',6,6''-d10)benzene-1,2-diamine was used instead of N1-(2,6-di-t-butylphenyl)benzene-1,2-diamine.

Synthesis of Intermediate A-27

Intermediate A-27 was obtained in substantially the same manner as used to prepare Intermediate A-20 of Synthesis Example 6, except that Intermediate A-26 was used instead of Intermediate A-19.

Synthesis of Intermediate A-28

Intermediate A-28 was obtained in substantially the same manner as used to prepare Intermediate A-7 of Synthesis Example 1, except that Intermediate A-27 was used instead of Intermediate A-6.

Synthesis of Compound 78

Compound 78 was obtained in substantially the same manner as used to prepare Compound 1 of Synthesis Example 1, except that Intermediate A-28 was used instead of Intermediate A-7.

Synthesis Example 8: Synthesis of Compound 88

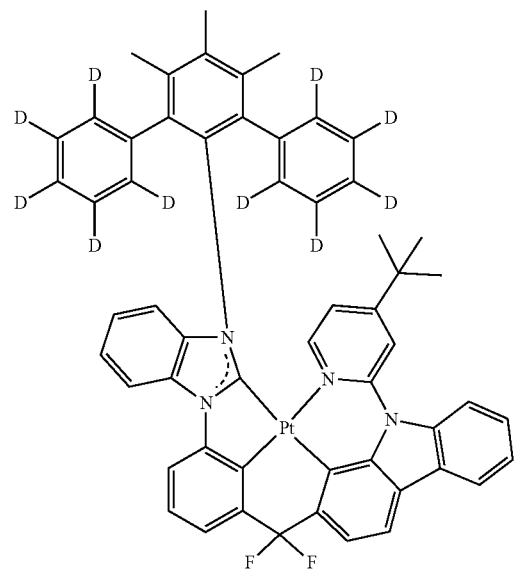

88

Compound 88 was obtained in substantially the same manner as used to obtain Compound 63 of Synthesis Example 6, except that 2-bromo-9-(4-(t-butyl)pyridine-2-nyl)-9H-carbazole was used instead of Intermediate A-15 and N1-(4',5',6'-trimethyl-[1,1':3', 1''-terphenyl]-2'-nyl-2,2'',3,3'',4,4'',5,5'',6,6''-d10)benzene-1,2-diamine was used instead of N1-(2,6-di-t-butylphenyl)benzene-1,2-diamine.

Synthesis Example 9: Synthesis of Compound 105

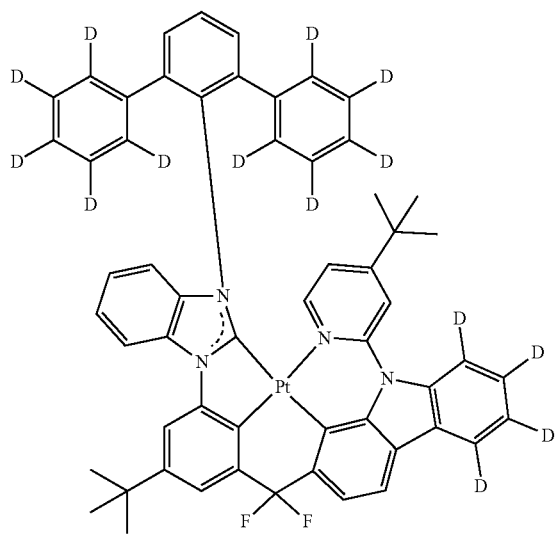

Compound 105

Compound 105 was obtained in substantially the same manner as used to prepare Compound 78 of Synthesis Example 7, except that 2-bromo-9-(4-(t-butyl)pyridine-2-nyl)-9H-carbazole-5,6,7,8-d4 was used instead of Intermediate A-22 and 3-bromo-5-(t-butyl)benzaldehyde was used instead of 3-bromo benzaldehyde.

The compounds synthesized according to Synthesis Examples above were identified by 1H NMR and MS/FAB, and results are shown in Table 1 below. Compounds other than the compounds shown in Table 1 may be easily recognized by those skilled in the art by referring to the above synthesis routes and source materials.

TABLE 1

| Compound No. | $^1$H NMR (CDCl$_3$, 400 MHz) | MS/FAB found | calc. |
|---|---|---|---|
| 1 | δ 8.77(d, 1H), 8.46(d, 1H), 8.19-8.16(m, 2H), 8.02(d, 1H), 7.56-7.46(m, 5H), 7.24-7.19(m, 4H), 7.08-7.07(m, 1H), 6.99(m, 1H), 6.72-6.71(m, 1H) | 696.1490 | 696.1492 |
| 10 | δ 8.74(d, 1H), 8.45(d, 1H), 8.19(d, 1H), 7.58-7.57(m, 1H), 7.50-7.43(m, 7H), 7.21(m, 1H), 7.08-7.05(m, 2H), 6.71-6.70(m, 1H), 1.40(s, 9H), 1.33(s, 9H) | 808.2745 | 808.2744 |
| 37 | δ 8.73(d, 1H), 8.46(d, 1H), 8.20(d, 1H), 7.58-7.15(m, 18H), 7.01-6.96(m, 5H), 1.69(s, 6H) | 873.2244 | 873.2243 |
| 44 | δ 8.73(d, 1H), 8.46(d, 1H), 8.19(d, 1H), 7.58-7.57(m, 1H), 7.54-7.16(m, 16H), 7.04-6.96(m, 5H), 1.72(m, 5H), 1.45(m, 4H), 1.41(s, 9H), 1.09(s, 5H) | 1021.3494 | 1021.3495 |
| 53 | δ 8.74(d, 1H), 8.46(d, 1H), 8.19(d, 1H), 7.58-7.57(m, 1H), 7.52-7.46(m, 4H), 7.23-7.12(m, 9H), 6.99-6.95(m, 3H), 1.37(s, 9H), 1.34(s, 9H) | 867.2710 | 867.2712 |
| 63 | δ 8.74(d, 1H), 8.46(d, 1H), 8.19(d, 1H), 7.58-7.57(m, 1H), 7.50-7.46(m, 2H), 7.25-7.12(m, 12H), 7.00-6.95(m, 6H), 1.37(s, 18H) | 991.3873 | 991.3871 |
| 78 | δ 8.74(d, 1H), 8.46(d, 1H), 8.21-8.18(m, 3H), 7.76-7.75(m, 2H), 7.58-7.39(m, 10H), 7.30(s, 1H), 7.20-7.14(m, 3H), 7.00-6.97(m, 2H), 2.47(s, 3H) | 1007.3182 | 1007.3183 |
| 88 | δ 8.75(d, 1H), 8.45(d, 1H), 8.20(d, 1H), 7.58(d, 1H), 7.50-7.42(m, 4H), 7.23-7.15(m, 5H), 7.00-6.95(m, 3H), 2.60(s, 6H), 2.18(s, 3H), 1.33(s, 9H) | 1015.3810 | 1015.3809 |
| 105 | δ 8.73(d, 1H), 8.43(d, 1H), 8.20(d, 2H), 7.46-7.39(m, 5H), 7.15-7.14(m, 2H), 7.05(s, 1H), 6.97-6.95(m, 2H), 1.43(s, 9H), 1.32(s, 9H) | 1033.4216 | 1033.4217 |

EXAMPLES

Example 1

As a substrate and an anode, a glass substrate with 15 Ωcm² (1,200 Å) ITO thereon, which was manufactured by Corning Inc., was cut to a size of 50 mm×50 mm×0.7 mm, and the glass substrate was sonicated by using isopropyl alcohol and pure water for 5 minutes each, and then ultraviolet (UV) light was irradiated for 30 minutes thereto and ozone was exposed thereto for cleaning. Then, the resultant glass substrate was loaded onto a vacuum deposition apparatus.

2-TNATA was vacuum-deposited on the ITO anode formed on the ITO glass substrate to form a hole injection layer having a thickness of 600 Å, and NPB was vacuum-deposited on the hole injection layer to form a hole transport layer having a thickness of 300 Å.

Compound 1, which was a dopant, and mCBP, which was a host, were co-deposited on the hole transport layer to a weight ratio of 10:90 to form an emission layer having a thickness of 300 Å.

Diphenyl(4-(triphenylsilyl)phenyl)-phosphine oxide (TSPO1) was deposited on the emission layer to form a hole blocking layer having a thickness of 50 Å, Alq₃ was deposited on the hole blocking layer to form an electron transport layer having a thickness of 300 Å, LiF was deposited on the electron transport layer to form an electron injection layer having a thickness of 10 Å, and A₁ was vacuum-deposited on the electron injection layer to form a cathode having a thickness of 3,000 Å and HT28 was deposited on the cathode to form a capping layer having a thickness of 700 Å, thereby completing the manufacture of an organic light-emitting device.

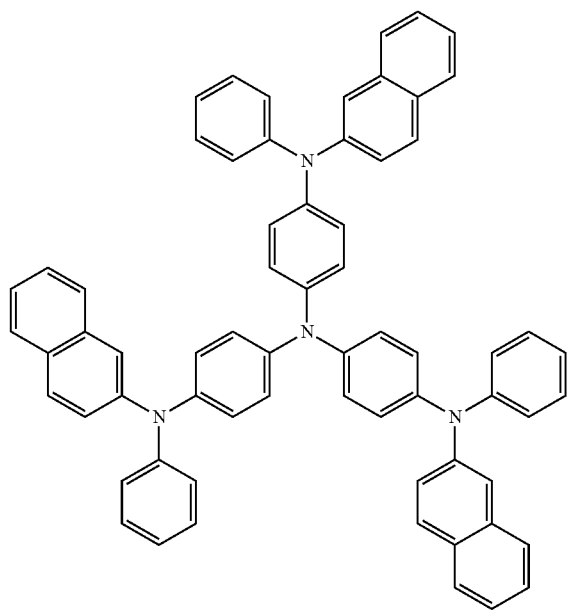

2-TNATA

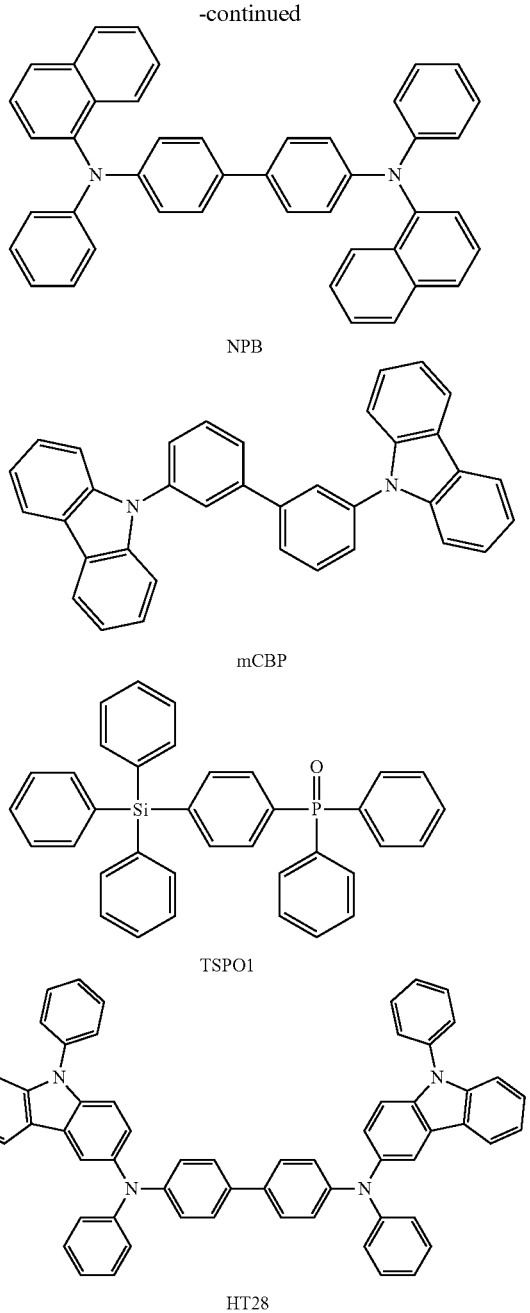

NPB mCBP

TSPO1

HT28

Examples 2 to 9 and Comparative Examples 1 and 2

Organic light-emitting devices were manufactured in substantially the same manner as in Example 1, except that in forming an emission layer, for use as a dopant, corresponding compounds shown in Table 1 were used instead of Compound 1. Evaluation Example 1

The driving voltage, current density, luminance, luminescence efficiency, emission color, emission wavelength, and lifespan (T95) of the organic light-emitting devices manufactured according to Examples 1 to 9, and Comparative Examples 1 and 2 were measured by using Keithley SMU 236 and a luminance photometer PR650, and results thereof are shown in Table 2. The lifespan (T95) refers to the amount of time taken when luminance becomes 95% of the initial luminance.

TABLE 2

|  | Dopant in emission layer | Driving voltage (V) | Current density (mA/cm$^2$) | Luminance (cd/m$^2$) | Luminance Efficiency (cd/A) | Emission color | Emission wavelength (nm) | Lifespan (T95, hr) |
|---|---|---|---|---|---|---|---|---|
| Example 1 | 1 | 5.35 | 50 | 4025 | 8.05 | Blue | 452 | 48 |
| Example 2 | 10 | 5.19 | 50 | 4130 | 8.26 | Blue | 455 | 61 |
| Example 3 | 37 | 5.02 | 50 | 4165 | 8.33 | Blue | 456 | 89 |
| Example 4 | 44 | 5.42 | 50 | 4110 | 8.22 | Blue | 459 | 83 |
| Example 5 | 53 | 5.25 | 50 | 4200 | 8.40 | Blue | 458 | 72 |
| Example 6 | 63 | 5.13 | 50 | 4315 | 8.63 | Blue | 453 | 79 |
| Example 7 | 78 | 5.22 | 50 | 4275 | 8.55 | Blue | 457 | 93 |
| Example 8 | 88 | 5.15 | 50 | 4300 | 8.60 | Blue | 451 | 97 |
| Example 9 | 105 | 5.05 | 50 | 4350 | 8.71 | Blue | 453 | 105 |
| Comparative Example 1 | A | 5.43 | 50 | 3870 | 7.74 | Blue | 454 | 2 |
| Comparative Example 2 | B | 5.32 | 50 | 3885 | 7.81 | Blue | 455 | 10 |

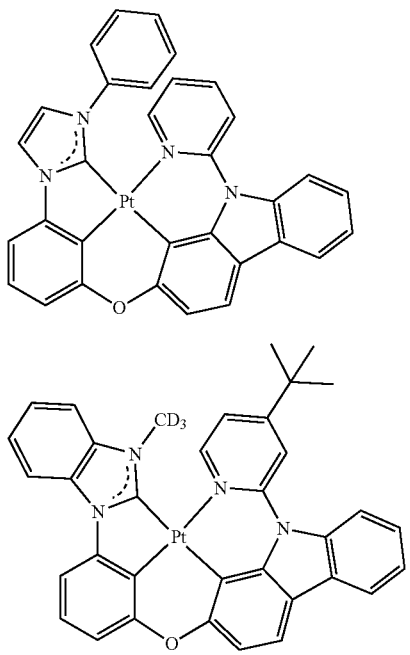

A

B

Referring to Table 2, it can be seen that the organic light-emitting devices of Examples 1 to 9 had a lower driving voltage, a higher level of luminance, a higher luminescence efficiency, and a longer lifespan than the organic light-emitting devices of Comparative Examples 1 and 2.

The organic light-emitting device including the organometallic compound represented by Formula 1 may have a low driving voltage, high luminance, high efficiency, and a long lifespan.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. An organic light-emitting device comprising:
a first electrode,
a second electrode facing the first electrode, and
an interlayer located between the first electrode and the second electrode and comprising an emission layer,
the interlayer comprising at least one organometallic compound represented by Formula 1:

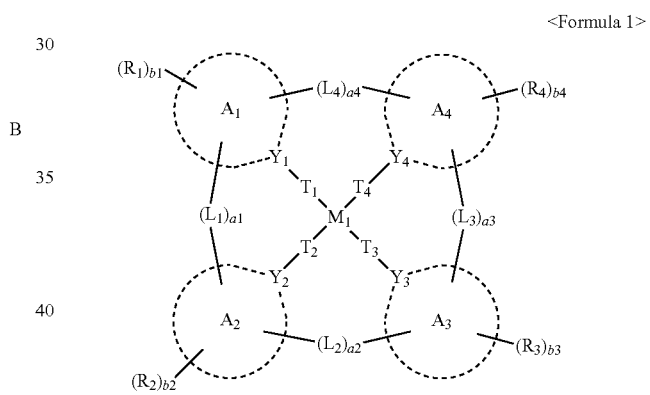

<Formula 1> wherein, in Formula 1,
$M_1$ is selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), Terbium (Tb), and thulium (Tm);
$Y_1$ to $Y_4$ are each independently selected from a carbon atom (C) and a nitrogen atom (N),
$T_1$ to $T_4$ are each independently a chemical bond, O, S, B(R'), N(R'), P(R'), C(R')(R"), Si(R')(R"), Ge(R')(R"), C(=O), B(R')(R"), N(R')(R"), or P(R')(R"), when $T_1$ is a chemical bond, $Y_1$ and $M_1$ directly bond to each other, when $T_2$ is a chemical bond, $Y_2$ and $M_1$ directly bond to each other, when $T_3$ is a chemical bond, $Y_3$ and $M_1$ directly bond to each other, and when $T_4$ is a chemical bond, $Y_4$ and $M_1$ directly bond to each other,
two bonds selected from a bond between $Y_1$ or $T_1$ and $M_1$, a bond between $Y_2$ or $T_2$ and $M_1$, a bond between $Y_3$ or $T_3$, and $M_1$ and a bond between $Y_4$ or $T_4$ and $M_1$ are each a coordination bond, and the other two bonds are each a covalent bond,
ring $A_1$ to ring $A_4$ are each independently selected from a $C_5$-$C_{60}$ carbocyclic group and a $C_1$-$C_{60}$ heterocyclic group, $L_1$ to $L_4$ are each independently selected from a single bond, a double bond, *—N($R_5$)—*', *—B($R_5$)—*', *—P($R_5$)—*', *—C($R_5$)($R_6$)—*', *—Si($R_5$)($R_6$)—*', *—Ge($R_5$)($R_6$)—*', *—S—*', *—Se—*',*—O—*', *—C(=O)—*', *—S(=O)—*', *—S(=O)$_2$—*', *—C($R_5$)=*', *=C($R_5$)—*', *—C($R_5$)=C($R_6$)—*', *—C(=S)—*', and *—C≡C—*', a1 to a4 are each independently an integer selected from 0 to 3, and, when a1 is 0, $A_1$ and $A_2$ are not linked to each other, when a2 is 0, $A_2$ and $A_3$ are not linked to each other, when a3 is 0, $A_3$ and $A_4$ are not linked to each other, and when a4 is 0, $A_4$ and $A_1$ are not linked to each other, the sum of a1, a2, a3, and a4 is equal to or greater than 1, at least one of $L_1$ to $L_4$ is *—CF$_2$—*', R', R", and $R_1$ to $R_6$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), b1 to b4 are each independently an integer selected from 1 to 20, any two neighboring groups of $R_1$ to $R_6$ are optionally linked to each other to form a substituted or unsubstituted $C_5$-$C_{60}$ carbocyclic group or a substituted or unsubstituted $C_1$-$C_{60}$ heterocyclic group,

* and *' each indicate a binding site to a neighboring atom, and at least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —$C_1$, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amino group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

2. The organic light-emitting device of claim 1, wherein the first electrode is an anode, the second electrode is a cathode, the interlayer further comprises a hole transport region located between the first electrode and the emission layer and an electron transport region located between the emission layer and the second electrode, the hole transport region comprises a hole injection layer, a hole transport layer, an emission auxiliary layer, an electron blocking layer, or any combination thereof, and the electron transport region comprises a buffer layer, a hole blocking layer, an electron control layer, an electron transport layer, an electron injection layer, or any combination thereof.

3. The organic light-emitting device of claim 1, further comprising a second capping layer located on the second electrode, wherein the second capping layer comprises a material having a refractive index of about 1.6 or more at a wavelength of 589 nm.

4. The organic light-emitting device of claim 1, wherein the emission layer comprises the at least one organometallic compound represented by Formula 1.

5. The organic light-emitting device of claim 4, wherein the emission layer further comprises a host, and the amount of the at least one organometallic compound represented by Formula 1 is from 0.01 parts by weight to 49.99 parts by weight based on 100 parts by weight of the emission layer.

6. The organic light-emitting device of claim 4, wherein the emission layer emits blue light having a maximum luminescence wavelength in a range of about 430 nm to about 480 nm.

7. The organic light-emitting device of claim 2, wherein the electron transport region comprises a phosphine oxide-containing compound.

8. An organometallic compound represented by Formula 1:

<Formula 1>

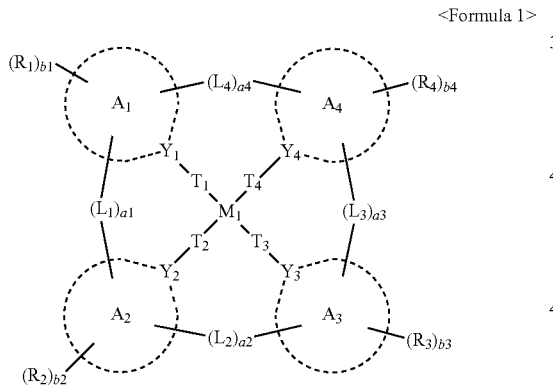

wherein, in Formula 1, $M_1$ is selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), Terbium (Tb), and thulium (Tm), $Y_1$ to $Y_4$ are each independently selected from a carbon atom (C) and a nitrogen atom (N), $T_1$ to $T_4$ are each independently a chemical bond, O, S, B(R'), N(R'), P(R'), C(R')(R''), Si(R')(R''), Ge(R')(R''), C(=O), B(R')(R''), N(R')(R''), or P(R')(R''), when $T_1$ is a chemical bond, $Y_1$ and $M_1$ directly bond to each other, when $T_2$ is a chemical bond, $Y_2$ and $M_1$ directly bond to each other, when $T_3$ is a chemical bond, $Y_3$ and $M_1$ directly bond to each other, and when $T_4$ is a chemical bond, $Y_4$ and $M_1$ directly bond to each other, two bonds selected from a bond between $Y_1$ or $T_1$ and $M_1$, a bond between $Y_2$ or $T_2$ and $M_1$, a bond between $Y_3$ or $T_3$, and $M_1$ and a bond between $Y_4$ or $T_4$ and $M_1$ are each a coordination bond, and the other two bonds are each a covalent bond, ring $A_1$ to ring $A_4$ are each independently selected from a $C_5$-$C_{60}$ carbocyclic group and a $C_1$-$C_{60}$ heterocyclic group, $L_1$ to $L_4$ are each independently selected from a single bond, a double bond, *—N($R_5$)—*', *—B($R_5$)—*', *—P($R_5$)—*', *—C($R_5$)($R_6$)—*', *—Si($R_5$)($R_6$)—*', *—Ge($R_5$)($R_6$)—*', *—S—*', *—Se—*,*—O—*', *—C(=O)—*', *—S(=O)—*', *—S(=O)$_2$—*', *—C($R_5$)=*, *=C($R_5$)—*', *—C($R_5$)=C($R_6$)—*', *—C(=S)—*', and *—C≡C—*', a1 to a4 are each independently an integer selected from 0 to 3, and, when a1 is 0, $A_1$ and $A_2$ are not linked to each other, when a2 is 0, $A_2$ and $A_3$ are not linked to each other, when a3 is 0, $A_3$ and $A_4$ are not linked to each other, and when a4 is 0, $A_4$ and $A_1$ are not linked to each other, the sum of a1, a2, a3, and a4 is equal to or greater than 1, at least one of $L_1$ to $L_4$ is *—$CF_2$—*', R', R'', and $R_1$ to $R_6$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), b1 to b4 are each independently an integer selected from 1 to 20, any two neighboring groups of $R_1$ to $R_6$ are optionally linked to each other to form a substituted or unsubstituted $C_5$-$C_{60}$ carbocyclic group or a substituted or unsubstituted $C_1$-$C_{60}$ heterocyclic group,

* and *' each indicate a binding site to a neighboring atom, and at least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amino group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

9. The organometallic compound of claim 8, wherein $M_1$ is selected from Pt, Pd, Cu, Ag, Au, Rh, Ir, Ru, and Os.

10. The organometallic compound of claim 8, wherein $T_1$ to $T_4$ are each a chemical bond, and at least one selected from a bond between $Y_1$ and $M_1$ and a bond between $Y_2$ and $M_1$ is a coordination bond.

11. The organometallic compound of claim 8, wherein $Y_1$ to $Y_3$ are each C, and $Y_4$ is N.

12. The organometallic compound of claim 8, wherein $A_1$ to $A_4$ are each independently selected from:

a benzene group, a naphthalene group, an anthracene group, a phenanthrene group, a triphenylene group, a pyrene group, a chrysene group, a cyclopentane group, a cyclopentadiene group, a cyclohexane group, a cyclohexene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, 1,2,4-triazole group, a tetrazole group, a 2,3-dihydrotriazole group, an azasilole group, a diazasilole group, a triazasilole group, an oxazole group, an isooxazole group, a thiazole group, an isothiazole group, an oxadiazole group, a thiadiazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

13. The organometallic compound of claim 8, wherein at least one of $A_1$ to $A_4$ is a 5-membered ring having two or more N(s) or a condensed cyclic group comprising the 5-membered ring having two or more N(s), and at least one of $A_1$ to $A_4$ is a 5-membered ring having one or more N(s) or a condensed cyclic group comprising the 5-membered ring having one or more N(s).

14. The organometallic compound of claim 8, wherein $A_1$ is a group represented by one of Formulae 2A-1 to 2A-17, $A_2$ is a group represented by one of Formulae 2B-1 to 2B-15, $A_3$ is a group represented by one of Formulae 2C-1 to 2C-17, and $A_4$ is a group represented by one of Formulae 2D-1 to 2D-16:

2A-1

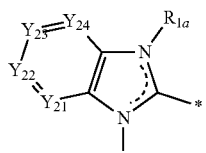
2A-2
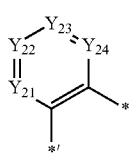
2A-3
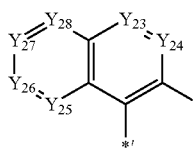
2A-4
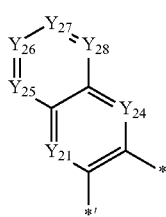
2A-5
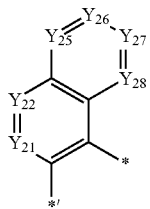
2A-6
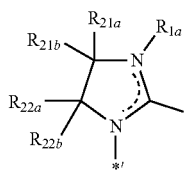
2A-7
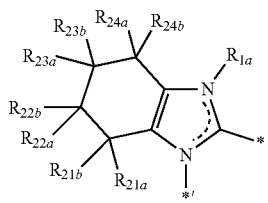
2A-8
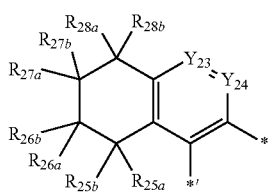
2A-9
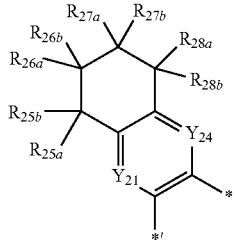
2A-10
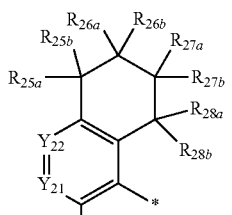
2A-11
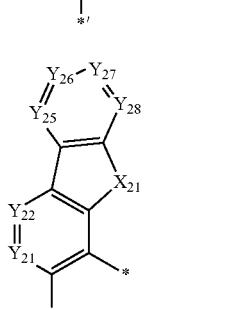
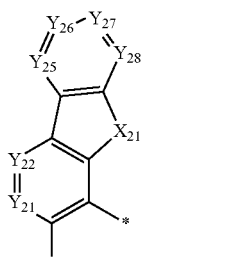
2A-12
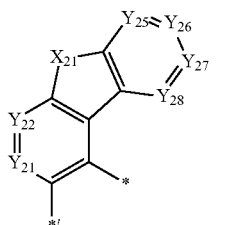
2A-13
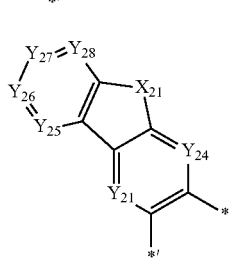
2A-14
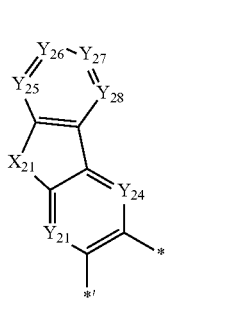
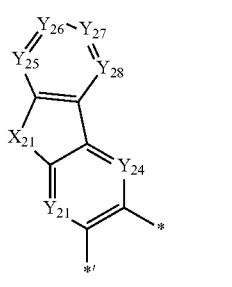
2A-15

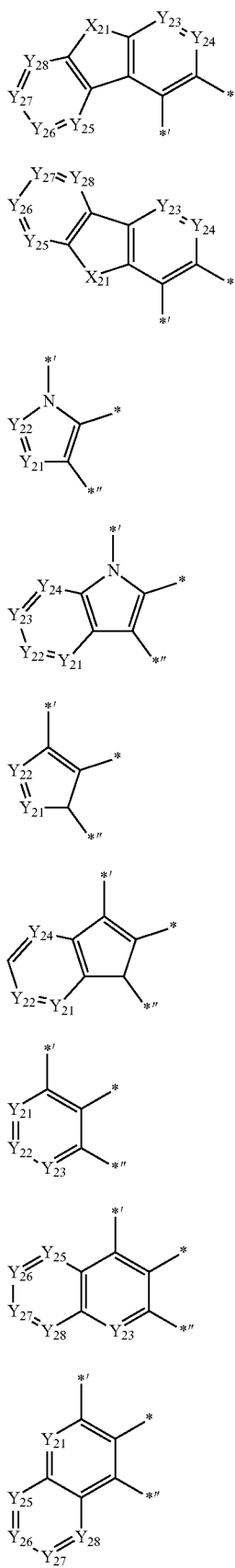
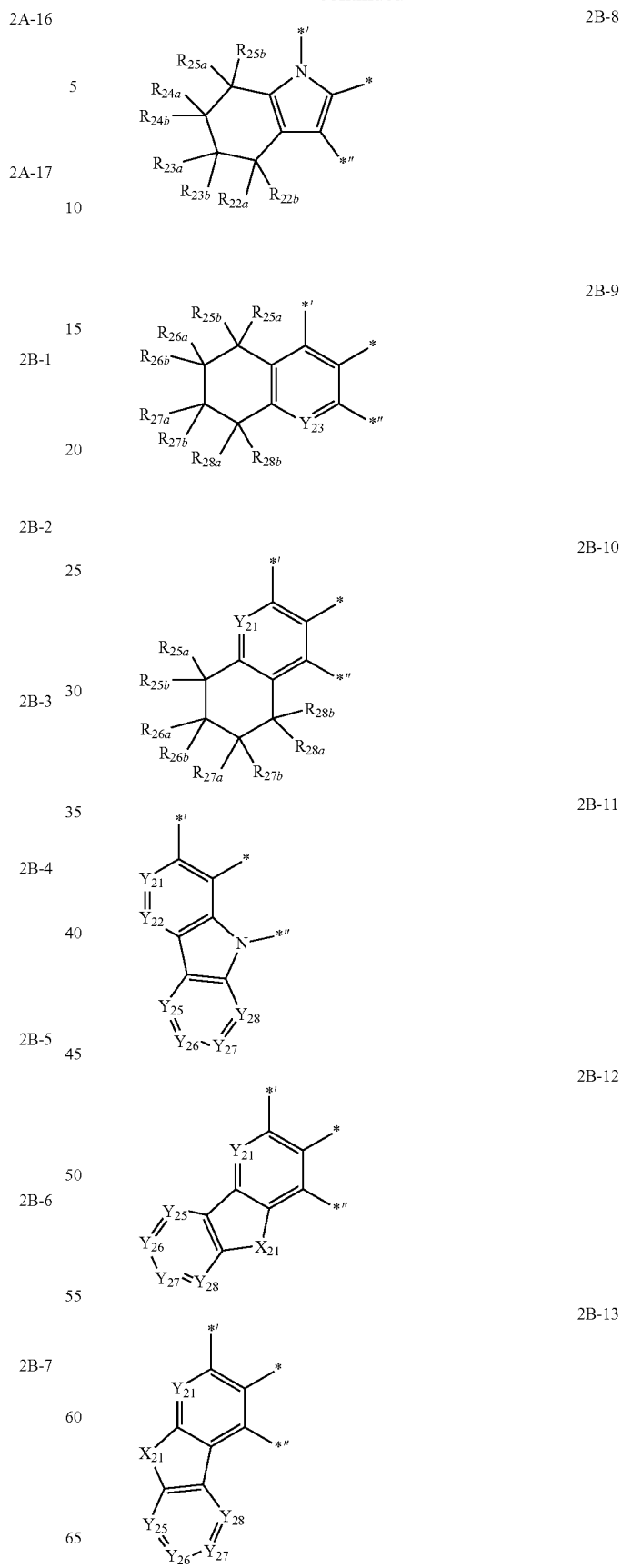

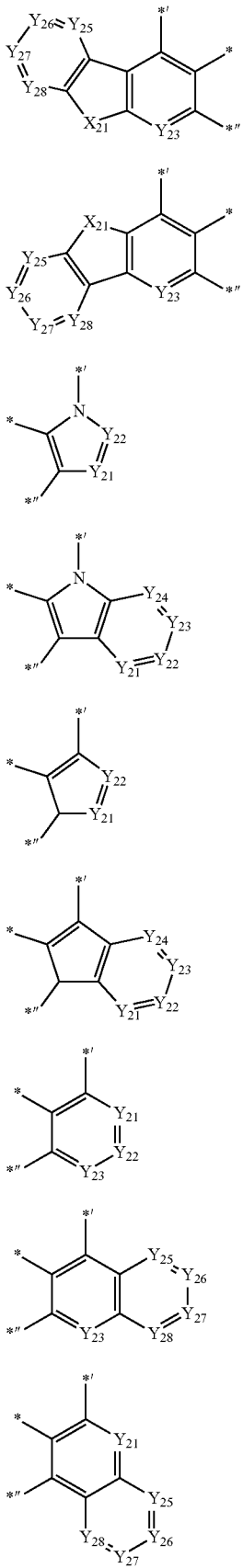
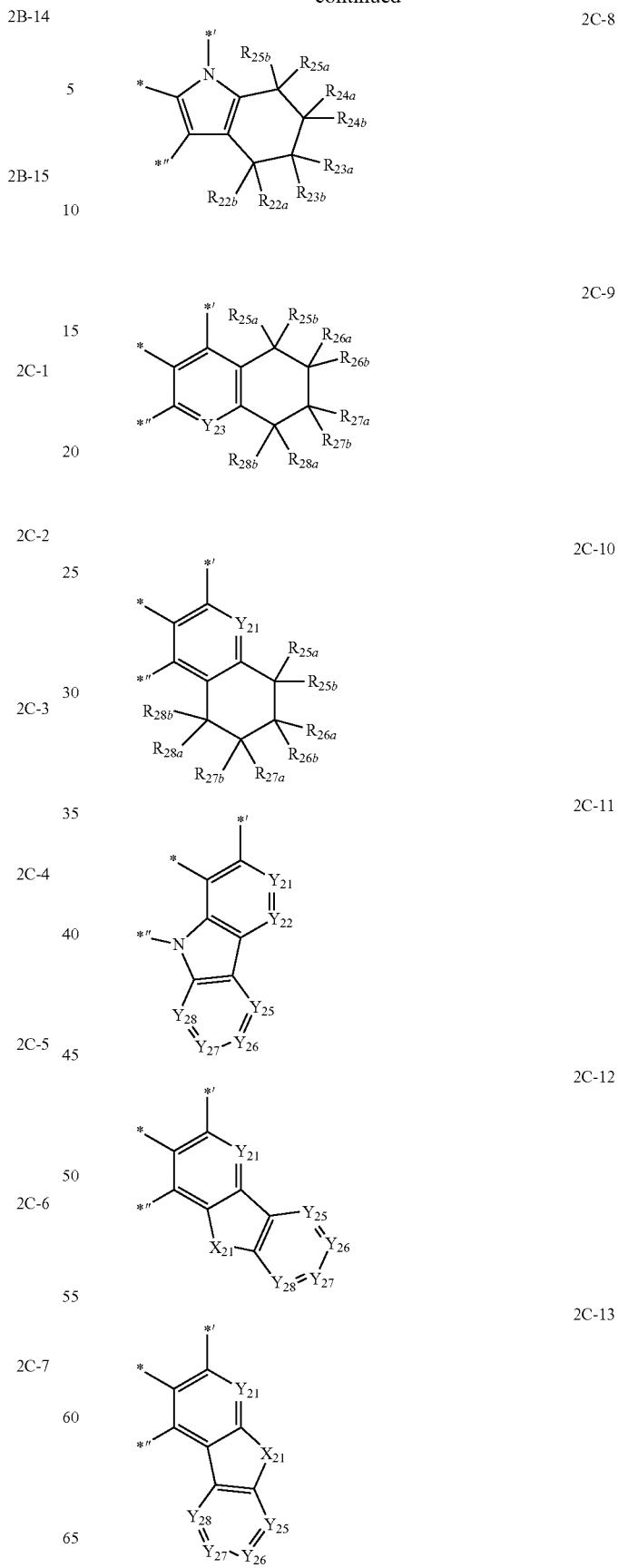

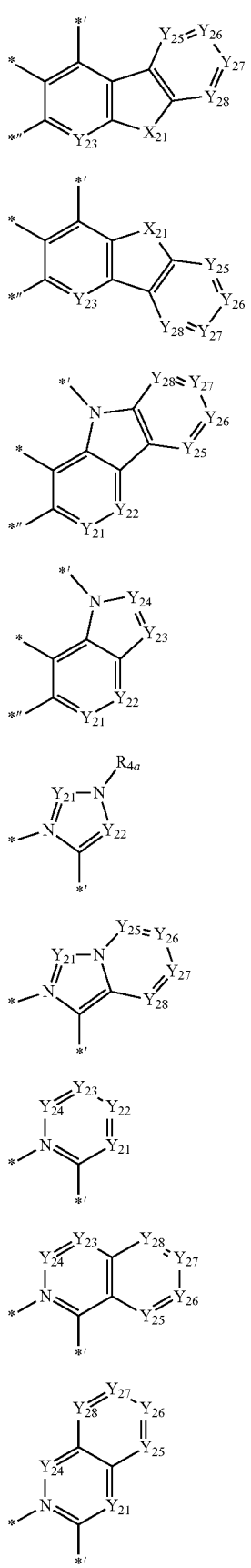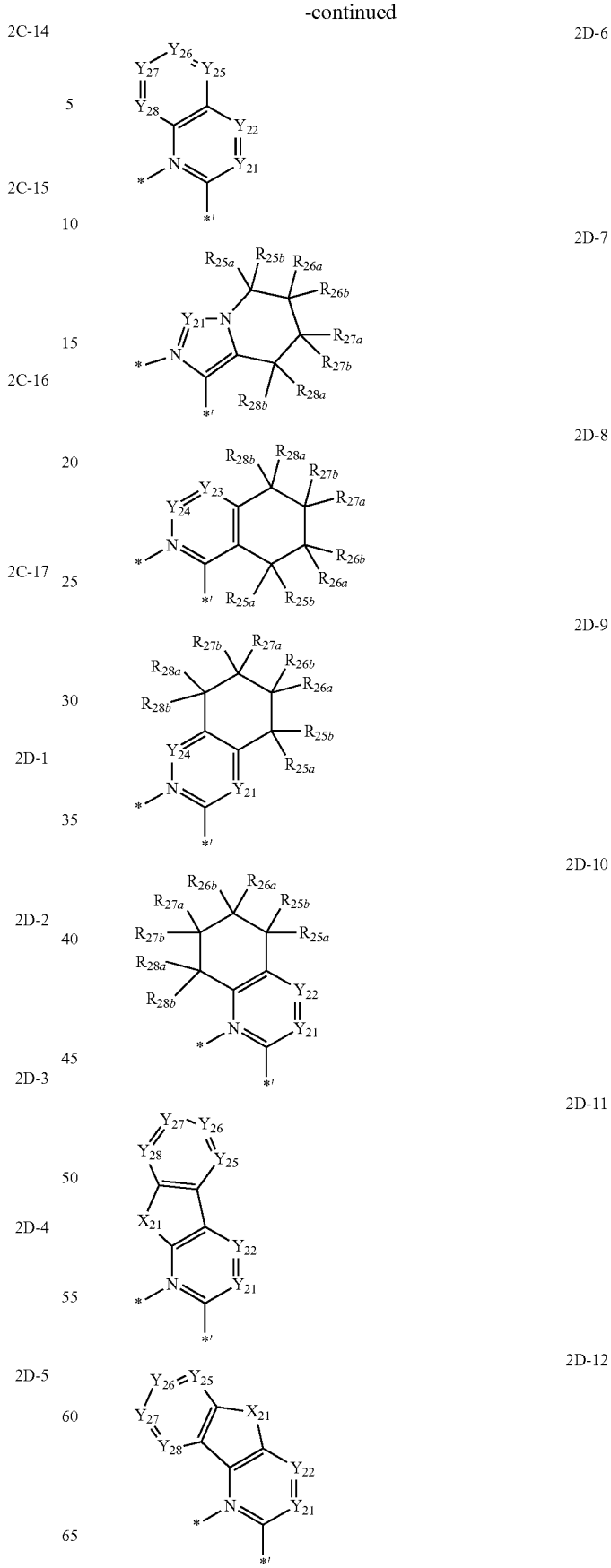

-continued

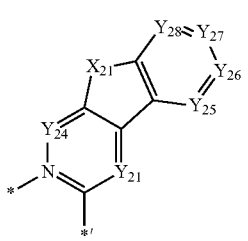
2D-13

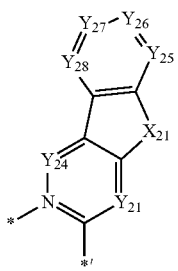
2D-14

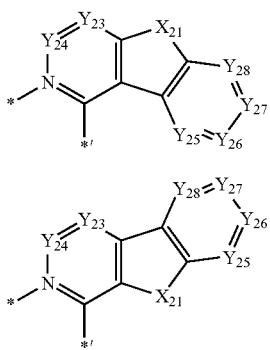
2D-15

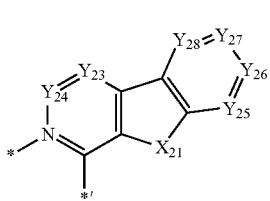
2D-16 wherein, in Formulae 2A-1 to 2A-17, Formulae 2B-1 to 2B-15, Formulae 2C-1 to 2C-17, and Formulae 2D-1 to 2D-16, $Y_{21}$ is N or $C(R_{21})$, $Y_{22}$ is N or $C(R_{22})$, $Y_{23}$ is N or $C(R_{23})$, $Y_{24}$ is N or $C(R_{24})$, $Y_{25}$ is N or $C(R_{25})$, $Y_{26}$ is N or $C(R_{26})$, and $Y_{27}$ is N or $C(R_{27})$, and $Y_{28}$ is N or $C(R_{28})$, $X_{21}$ is $N(R_{21})$ or $C(R_{21})(R_{22})$, $R_{1a}$, $R_{4a}$, $R_{21}$ to $R_{28}$, $R_{21a}$ to $R_{28a}$, and $R_{21b}$ to $R_{28b}$ are the same as described in connection with R', R", and $R_1$ to $R_6$ described in claim 8, and

* indicates a binding site to a neighboring $T_1$, $T_2$, $T_3$, or $T_4$, and *' and *" each indicate a binding site to a neighboring $L_1$, $L_2$, $L_3$, or $L_4$.

15. The organometallic compound of claim 8, wherein a1 to a3 are each 1, a4 is 0, and $L_2$ is *—$CF_2$—*.

16. The organometallic compound of claim 8, wherein R', R" and $R_1$ to $R_6$ are each independently selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, and $C_1$-$C_{20}$ alkoxy group;

a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, a pyrrolyl group, an indolyl group, an isoindolyl group, an indazolyl group, a quinolinyl group, an isoquinolinyl group, a quinoxalinyl group, a quinazolinyl group, a cinnolinyl group, and a triazinyl group; and a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$;

a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$; and —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, —$P(=O)(Q_1)(Q_2)$, —$P(=S)(Q_1)(Q_2)$, =O, =S, =$N(Q_1)$, and =$C(Q_1)(Q_2)$, wherein $Q_1$ to $Q_3$ and $Q_{31}$ to $Q_{33}$ are each independently selected from hydrogen, deuterium, —F, —Cl, —Br, —I, a cyano group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group.

17. The organometallic compound of claim 8, wherein the organometallic compound represented by Formula 1 is represented by Formula 1-1:

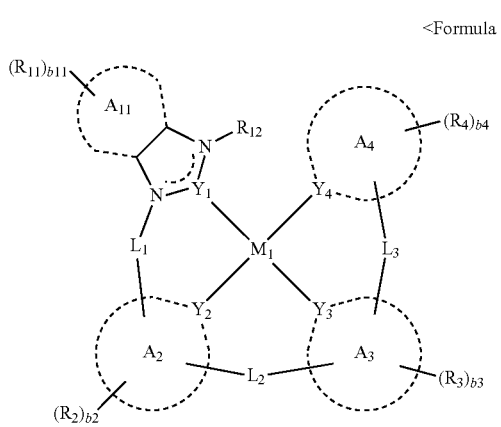

<Formula 1-1> wherein, in Formula 1-1, $M_1$, $A_2$ to $A_4$, $Y_2$ to $Y_4$, $L_1$ to $L_3$, $R_2$ to $R_4$, and b2 to b4 are the same as described in connection with claim 8, at least one of $L_1$ to $L_3$ is *—$CF_2$—*', $A_{11}$ is the same as described in connection with $A_1$ to $A_4$ described in claim 8, $R_{11}$ and $R_{12}$ are the same as described in connection with R', R", and $R_1$ to $R_6$ described in claim 8, and b11 is the same as described in connection with b1 to b4 described in claim 8.

18. The organometallic compound of claim 8, wherein the organometallic compound represented by Formula 1 is represented by Formula 1A:

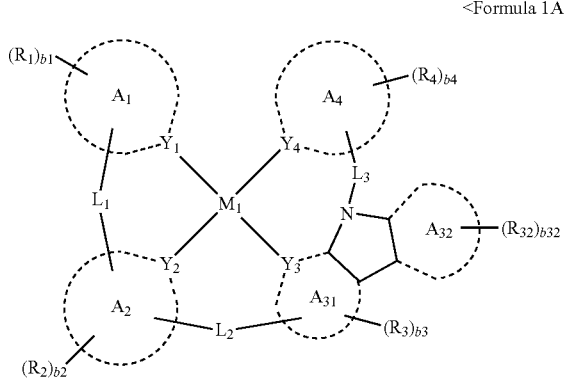

<Formula 1A> wherein, in Formula 1A, $M_1$, $A_1$, $A_2$, $A_4$, $Y_1$ to $Y_4$, $L_1$ to $L_3$, $R_1$, $R_2$, $R_4$, b1, b2, and b4 are the same as described in connection with claim 8, at least one of $L_1$ to $L_3$ is *—$CF_2$—*', $A_{31}$ and $A_{32}$ are the same as described in connection with $A_1$ to $A_4$ described in claim 8, $R_{31}$ and $R_{32}$ are the same as described in connection with R', R", and $R_1$ to $R_6$ described in claim 8, and b31 and b32 are the same as described in connection with b1 to b4 described in claim 8.

19. The organometallic compound of claim 8, wherein the organometallic compound represented by Formula 1 is represented by Formula 1A-1:

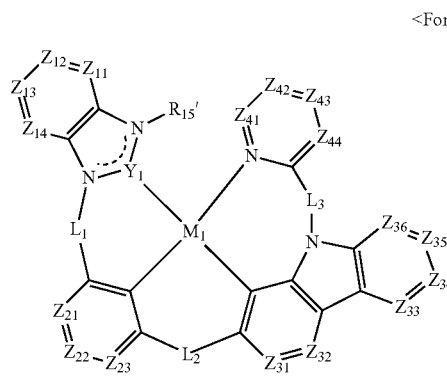

<Formula 1A-1> wherein, in Formula 1A-1, $M_1$ and $L_1$ to $L_3$ are the same as described in connection with claim 8, at least one of $L_1$ to $L_3$ is *—$CF_2$—*', $Z_{11}$ is N or $C(R_{11}')$, $Z_{12}$ is N or $C(R_{12}')$, $Z_{13}$ is N or $C(R_{13}')$, $Z_{14}$ is N or $C(R_{14}')$, $Z_{21}$ is N or $C(R_{21}')$, $Z_{22}$ is N or $C(R_{22}')$, $Z_{23}$ is N or $C(R_{23}')$, $Z_{31}$ is N or $C(R_{31}')$, $Z_{32}$ is N or $C(R_{32}')$, $Z_{33}$ is N or $C(R_{33}')$, $Z_{34}$ is N or $C(R_{34}')$, $Z_{35}$ is N or $C(R_{35}')$, $Z_{36}$ is N or $C(R_{36}')$, $Z_{41}$ is N or $C(R_{41}')$, $Z_{42}$ is N or $C(R_{42}')$, $Z_{43}$ is N or $C(R_{43}')$, and $Z_{44}$ is N or $C(R_{44}')$, and $R_{11}'$ to $R_{15}'$, $R_{21}'$ to $R_{23}'$, $R_{31}'$ to $R_{36}'$, and $R_{41}'$ to $R_{44}'$ are the same as described in connection with R', R", and $R_1$ to $R_6$ described in claim 8.

20. The organometallic compound of claim 8, wherein the organometallic compound represented by Formula 1 is selected from Compounds 1 to 120:

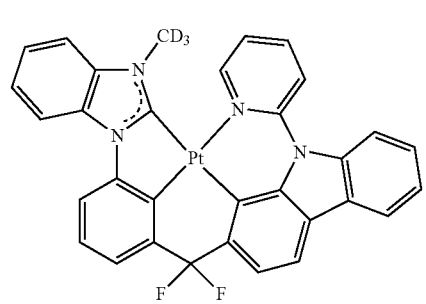

1

-continued
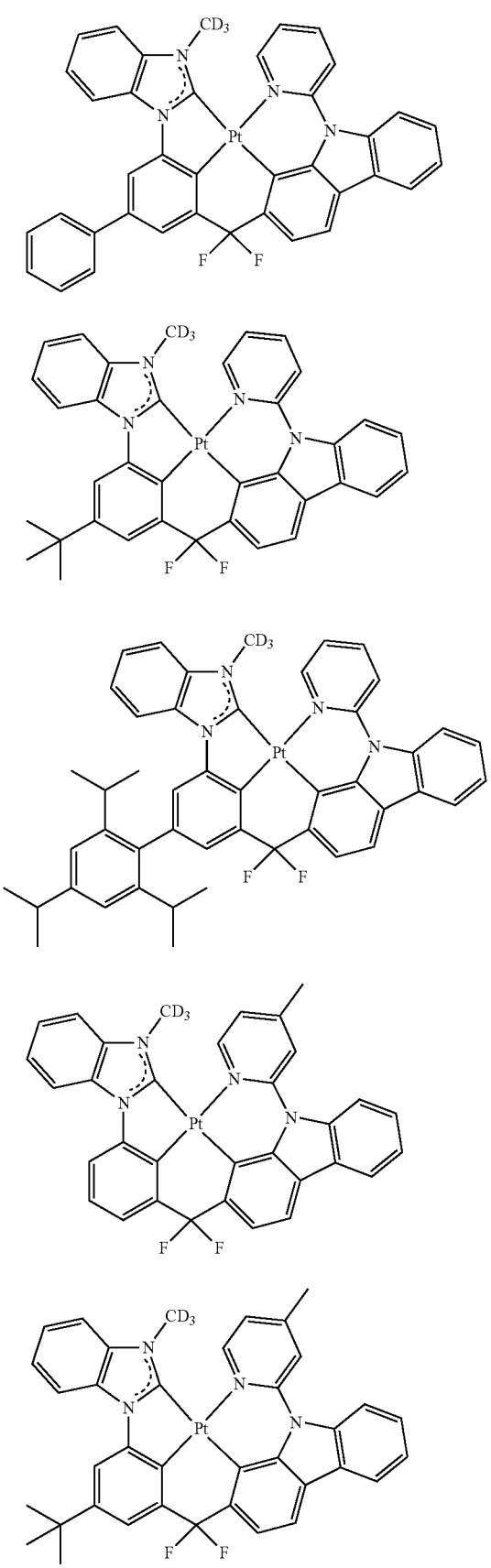
-continued
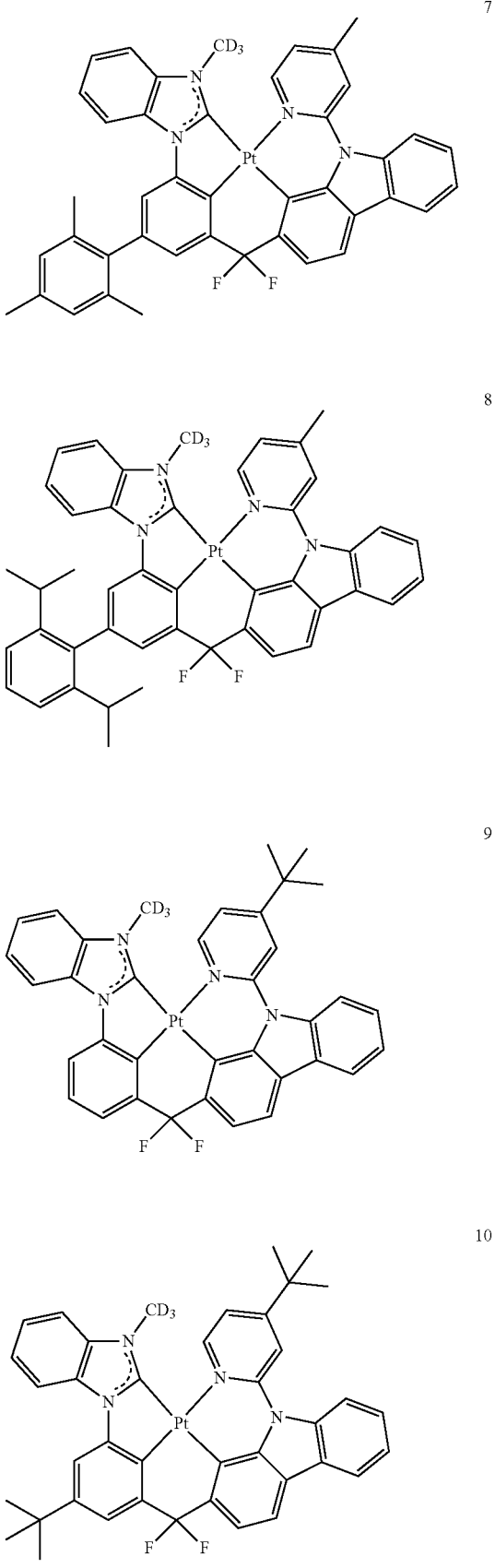

11
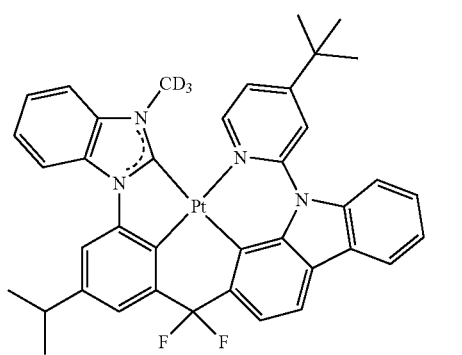
12
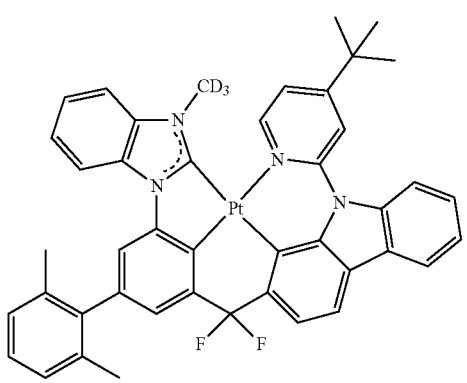
13
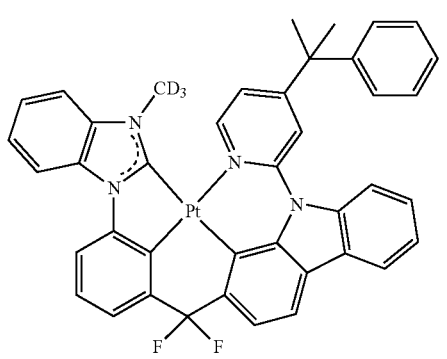
14
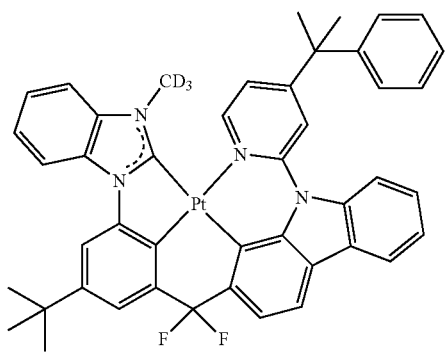
15
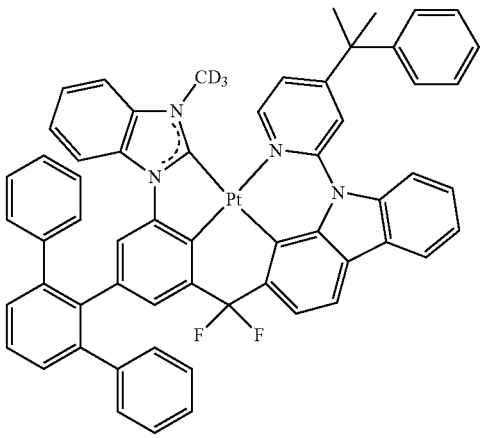
16
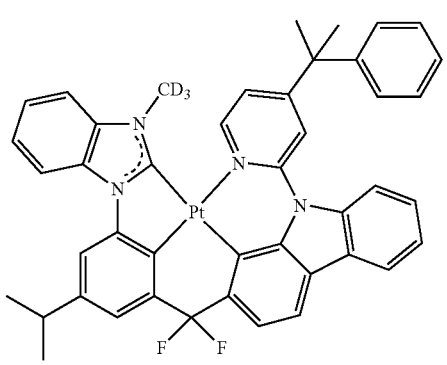
17
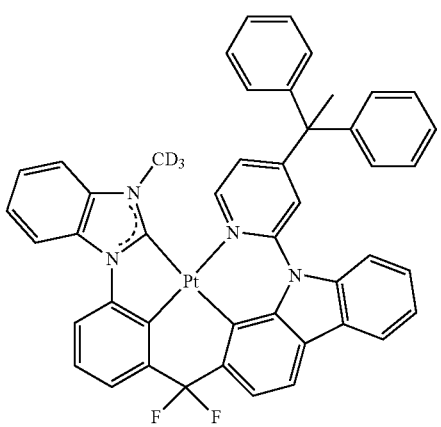
18
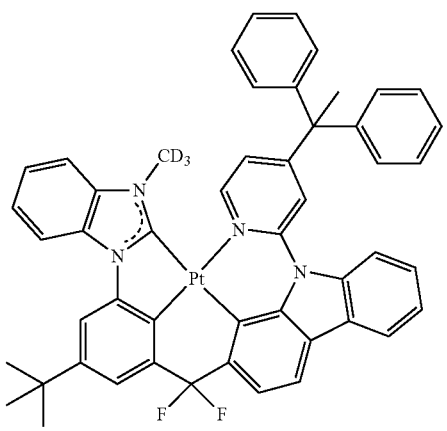

-continued
19
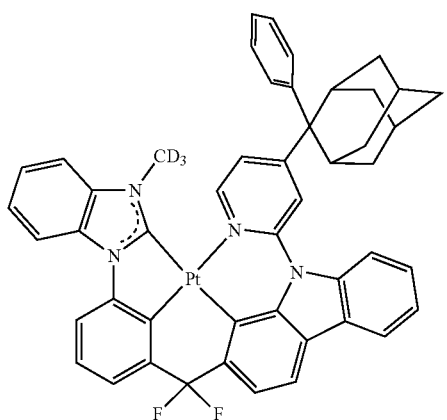
20
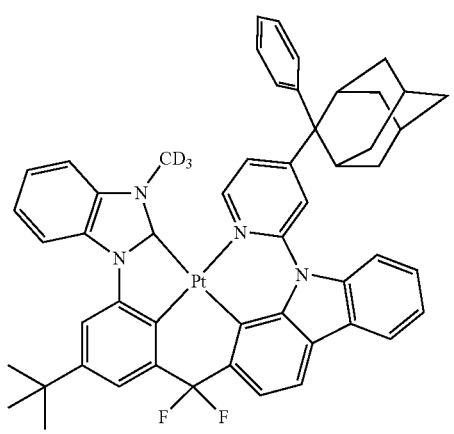
21
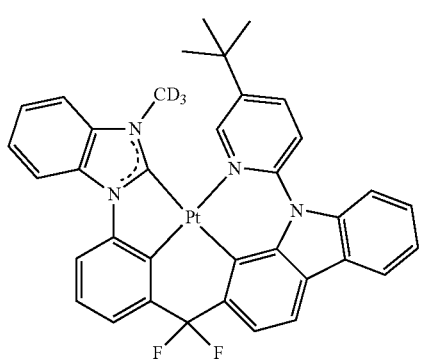
22
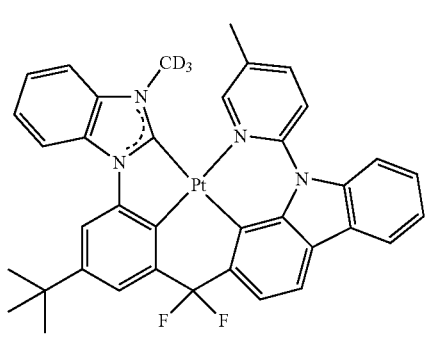
-continued
23
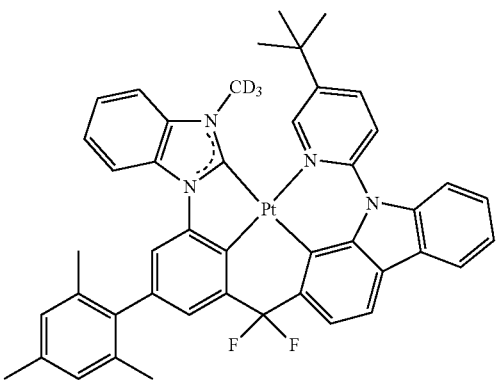
24
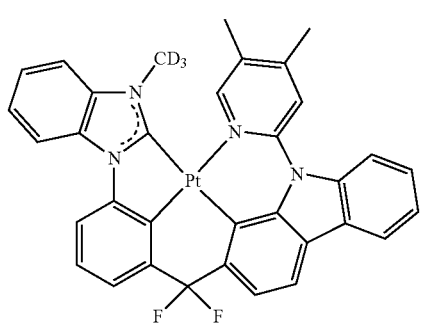
25
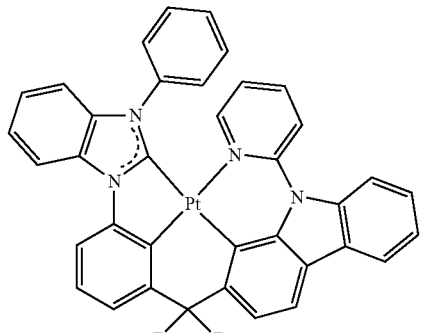
26
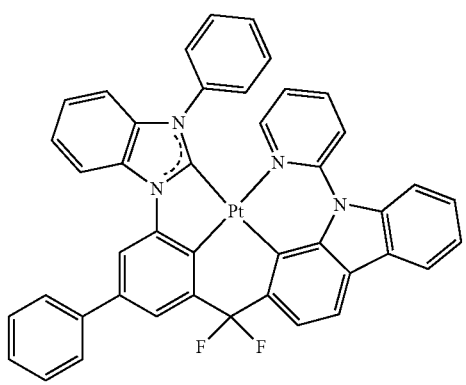

27
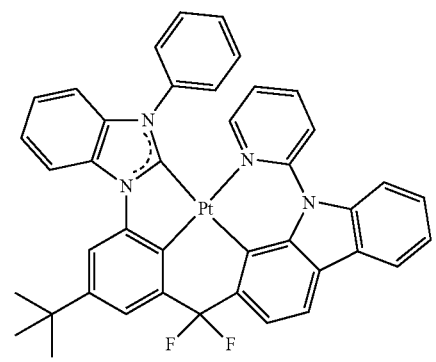
28
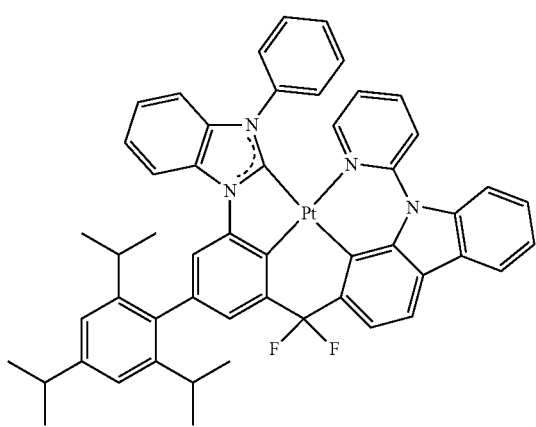
29
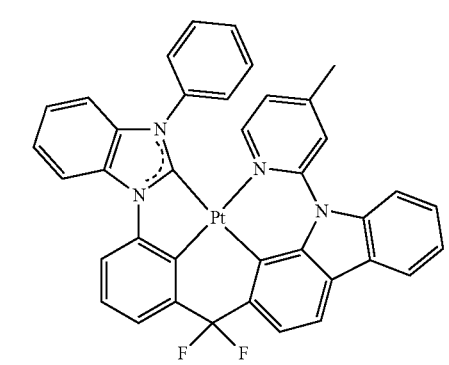
30
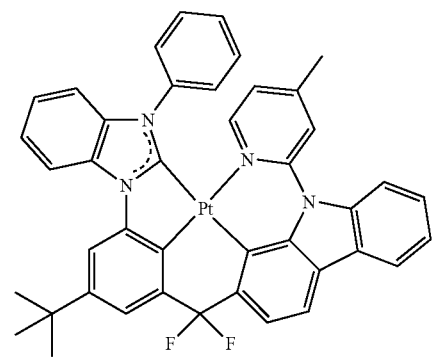
31
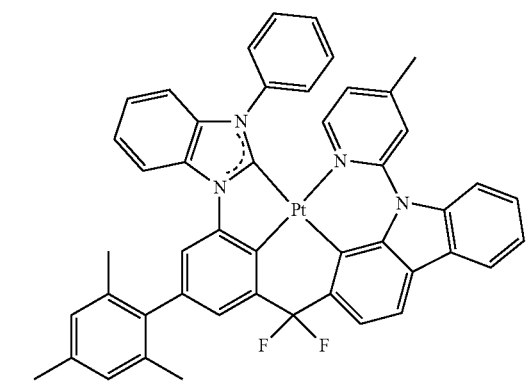
32
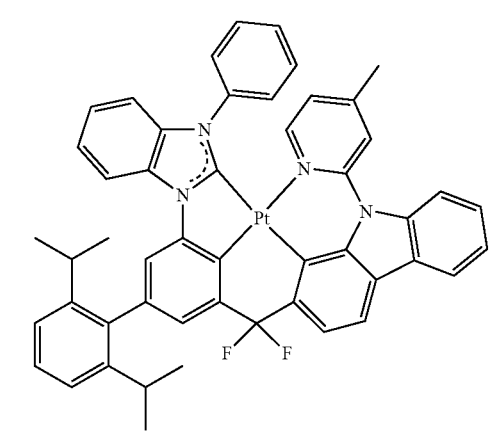
33
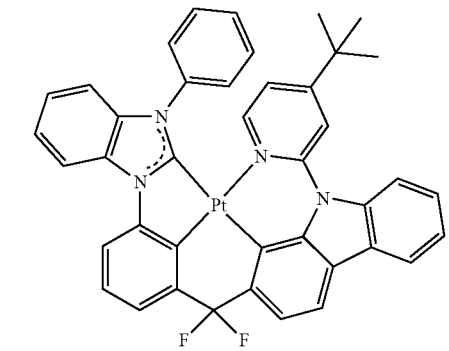
34
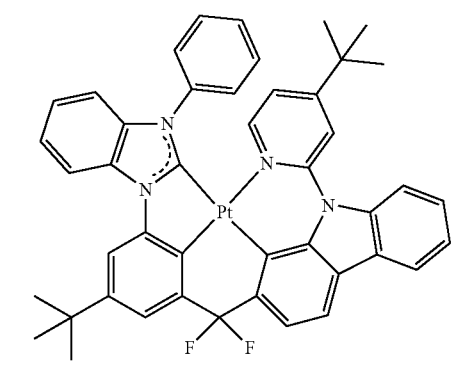

35
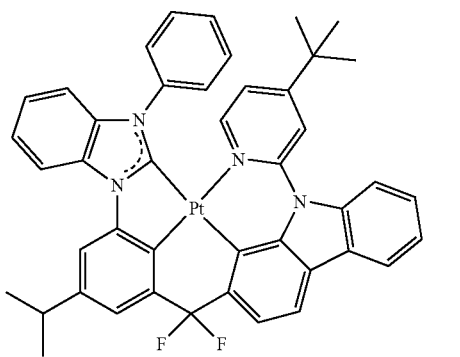
36
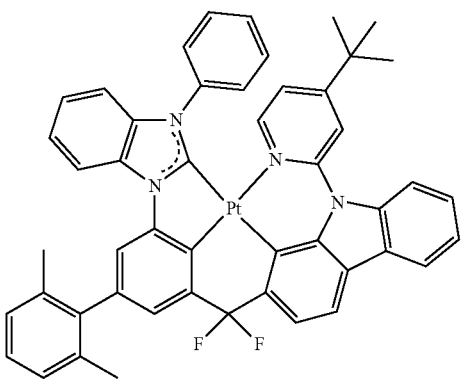
37
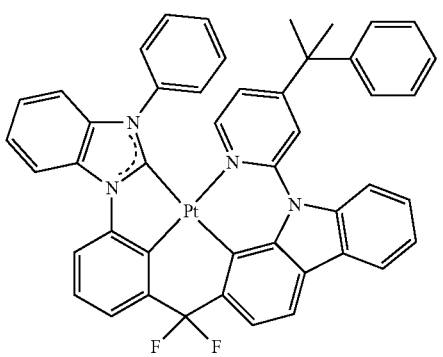
38
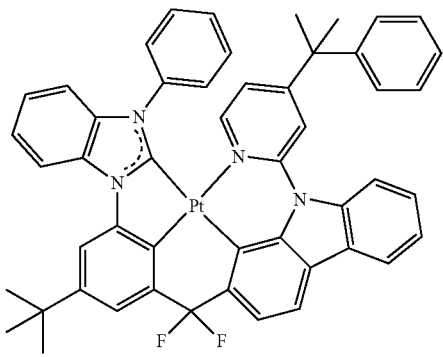
39
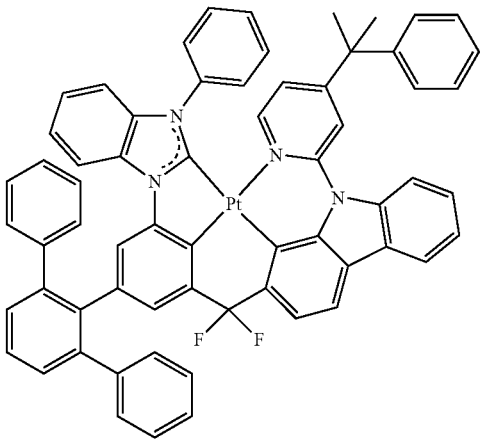
40
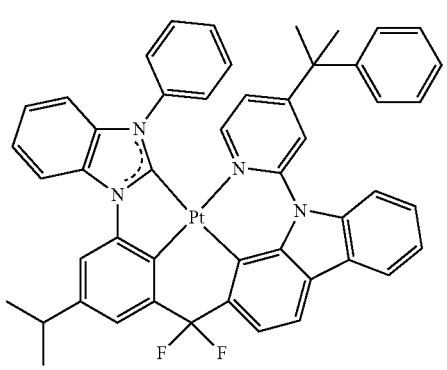
41
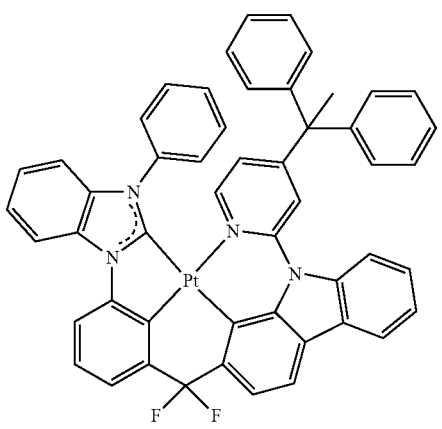
42
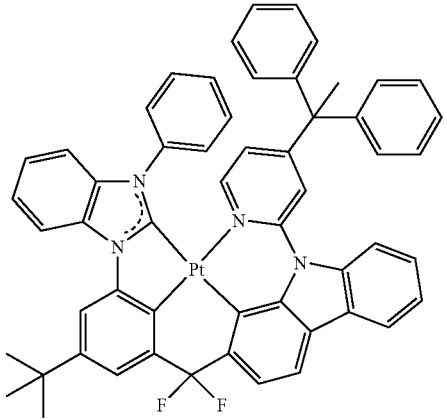

43
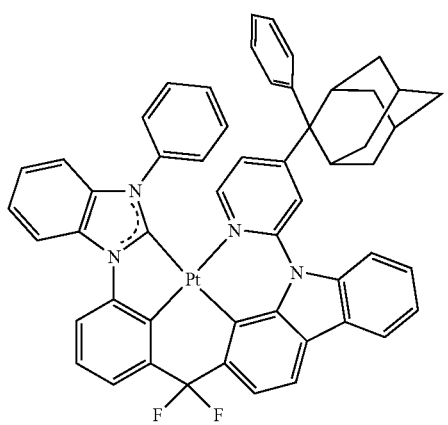
44
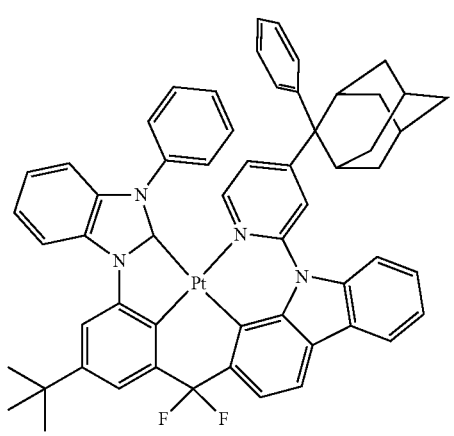
45
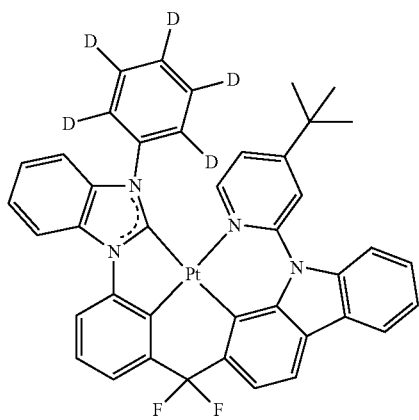
46
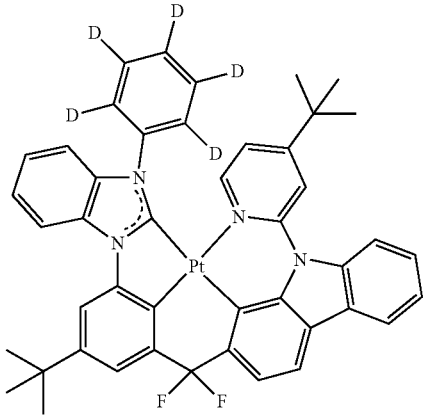
47
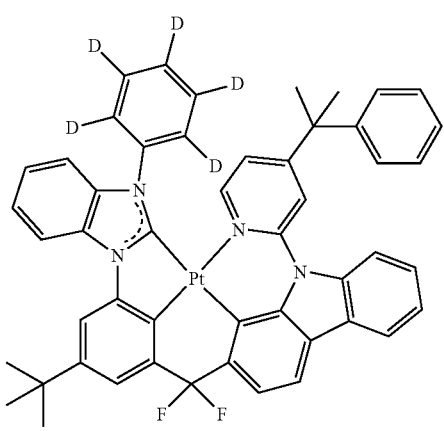
48
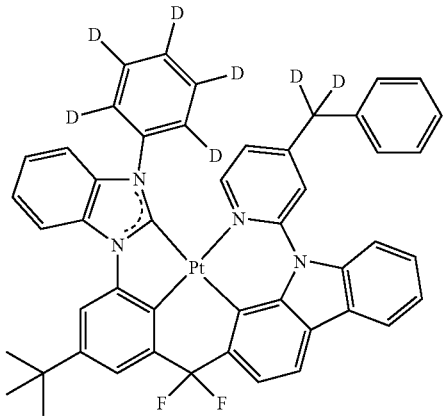

-continued
49
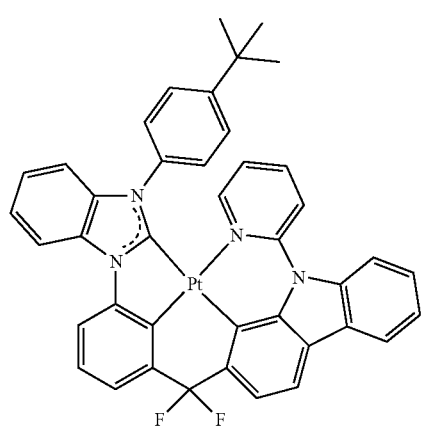
50
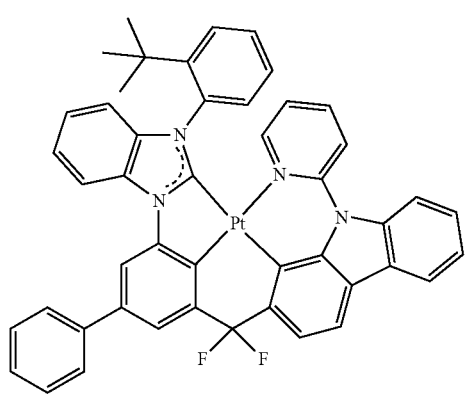
51
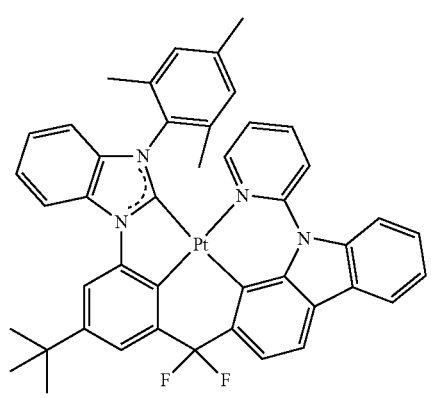
-continued
52
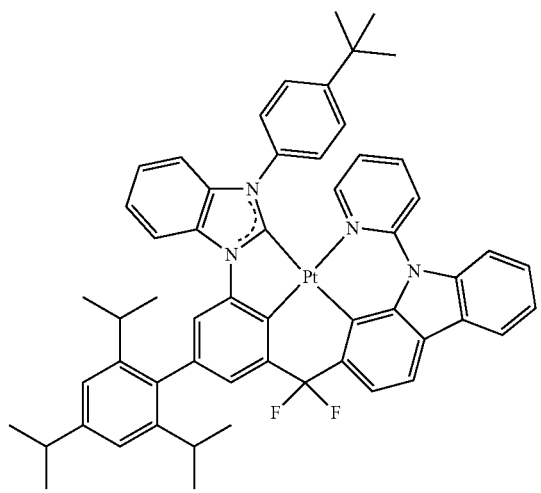
53
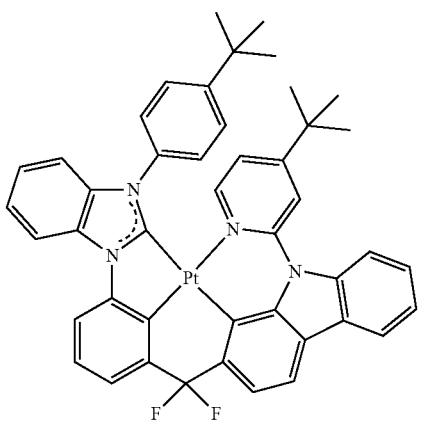
54
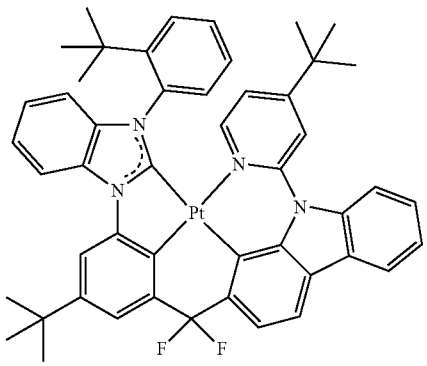

231
-continued
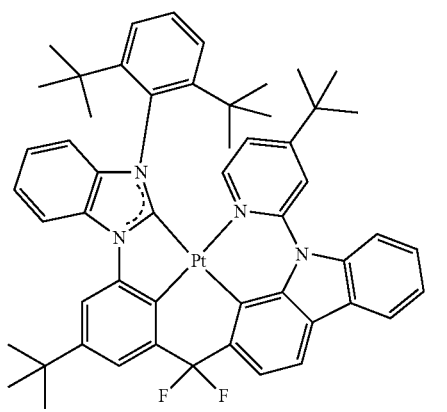
55
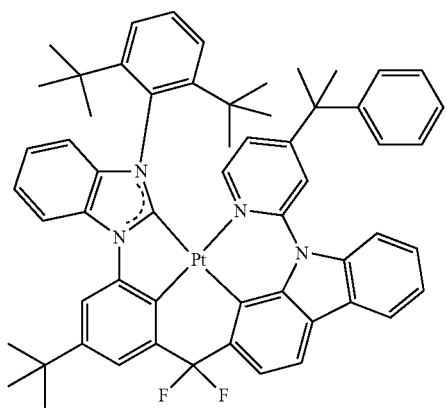
56
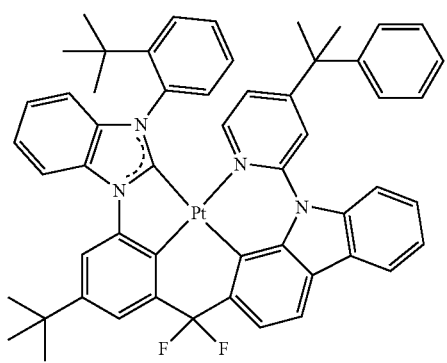
57
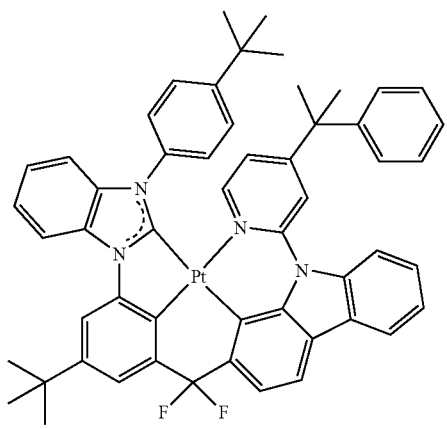
58
232
-continued
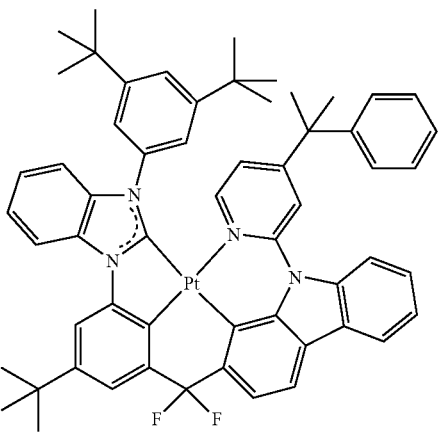
59
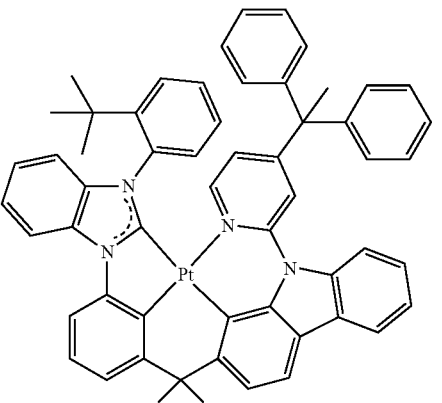
60
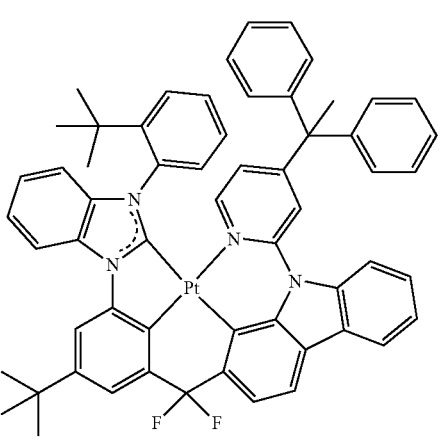
61

62
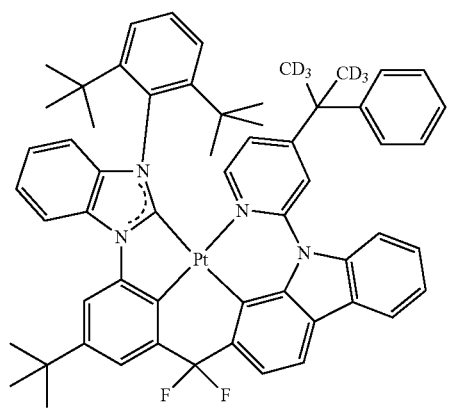
63
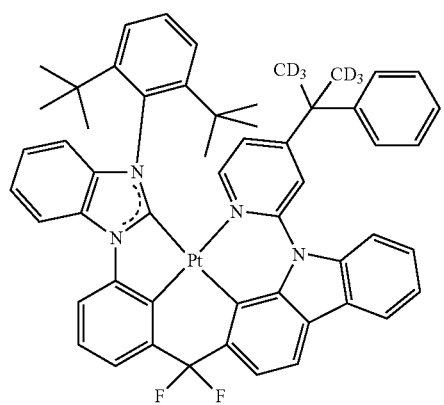
64
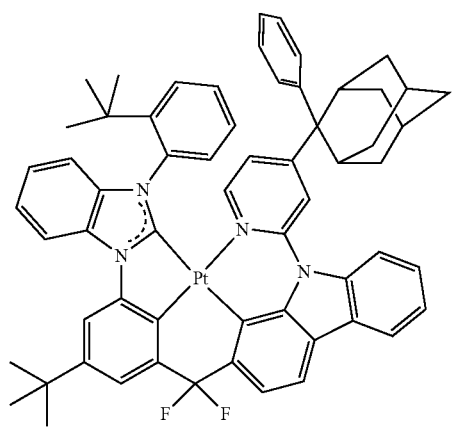
65
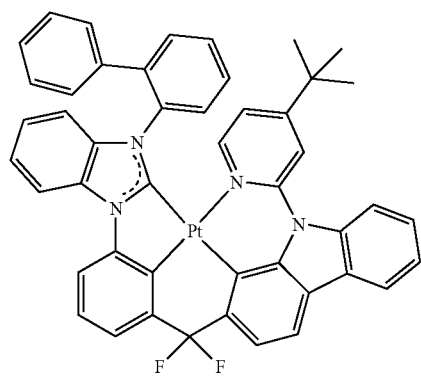
66
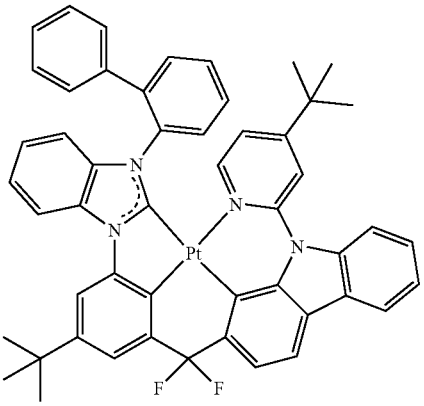
67
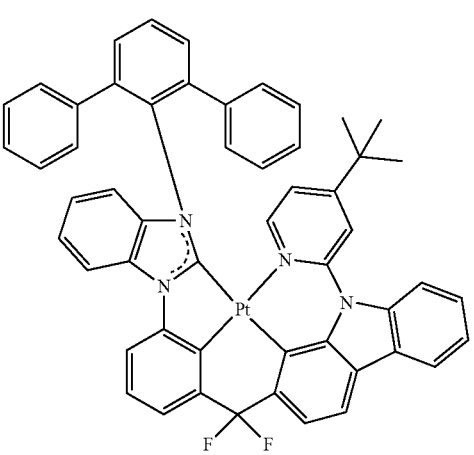
68
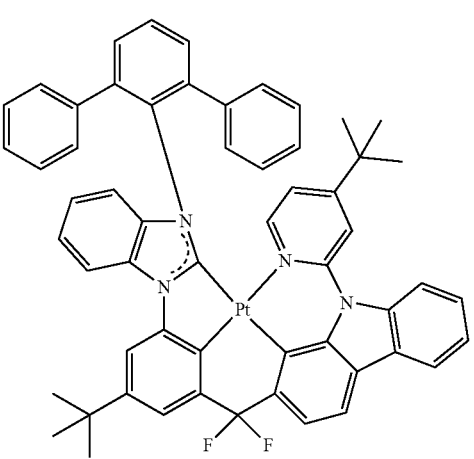

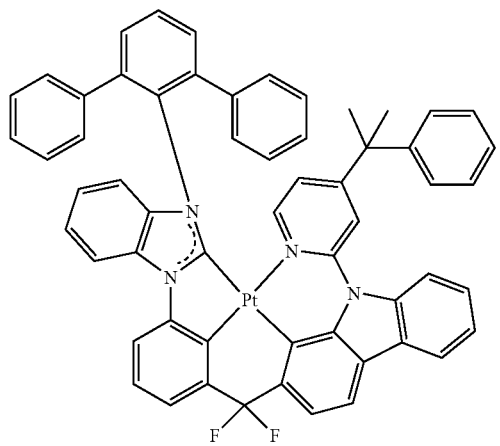
69
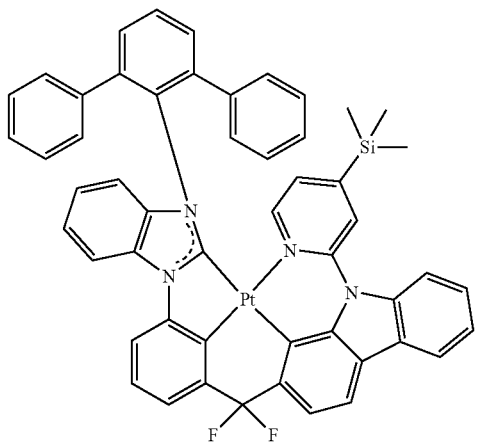
72
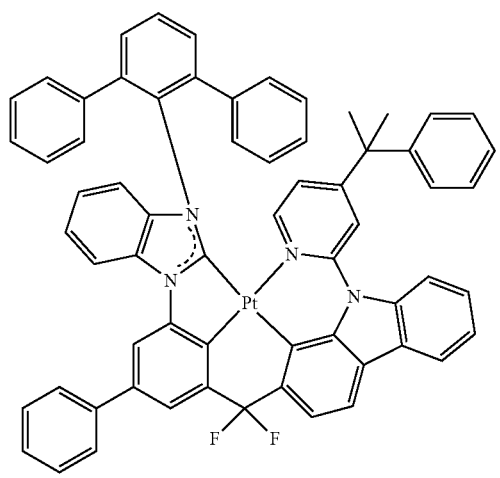
70
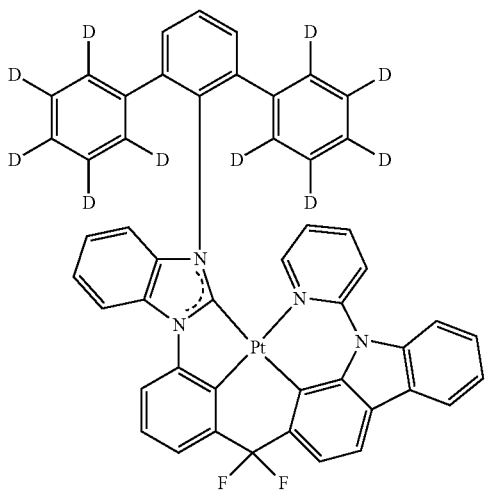
73
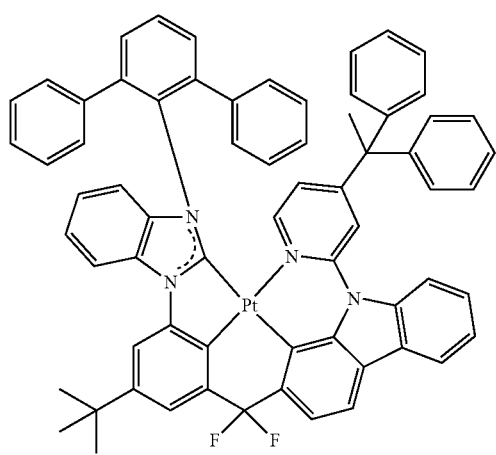
71
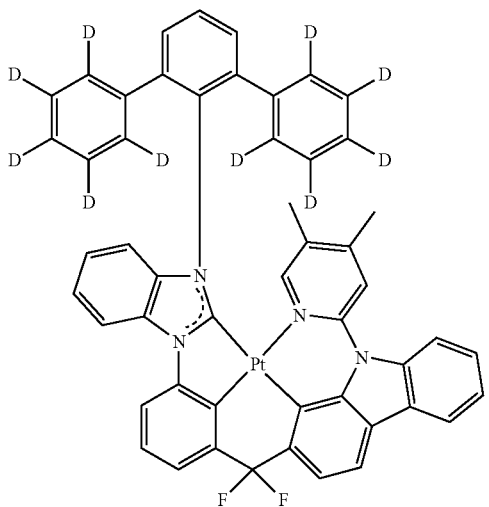
74

237
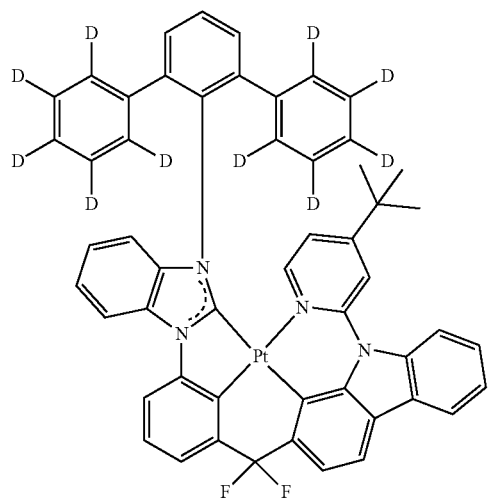
75
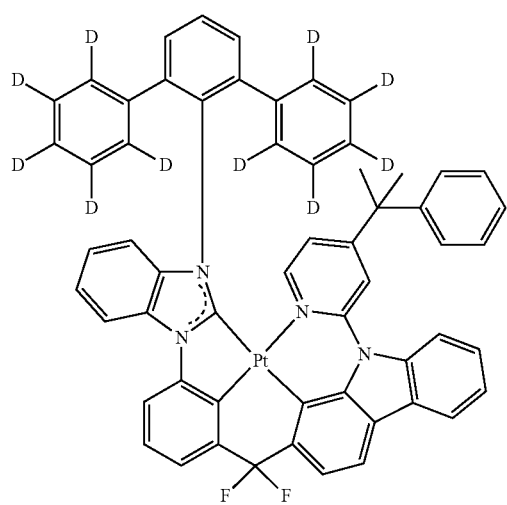
76
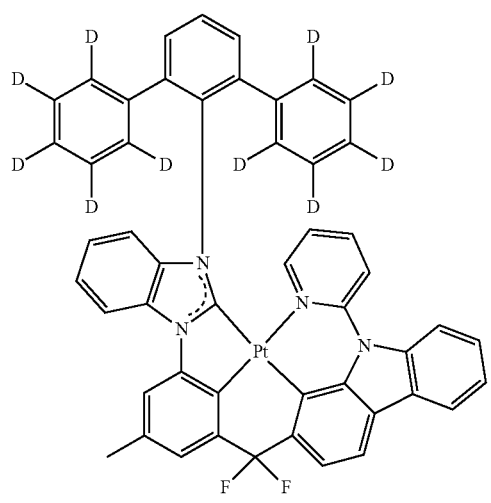
77
238
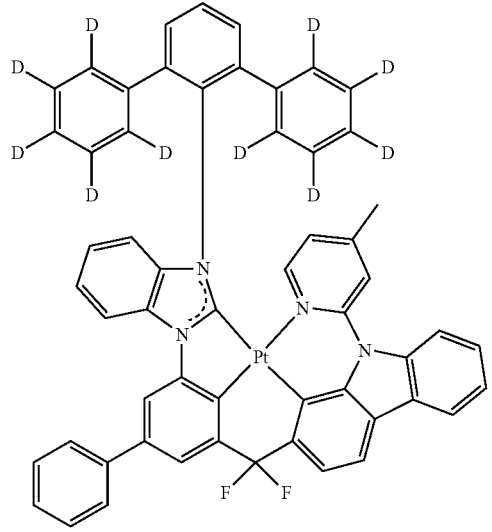
78
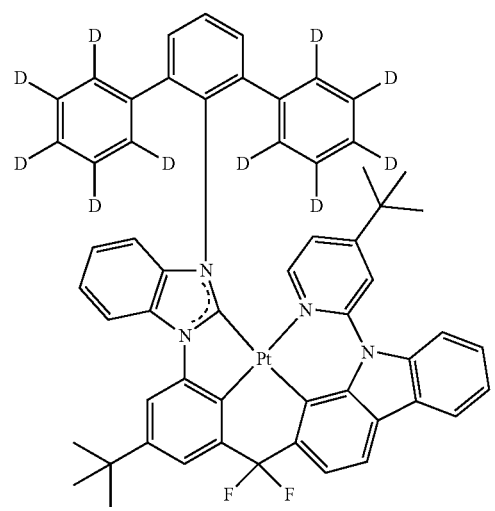
79
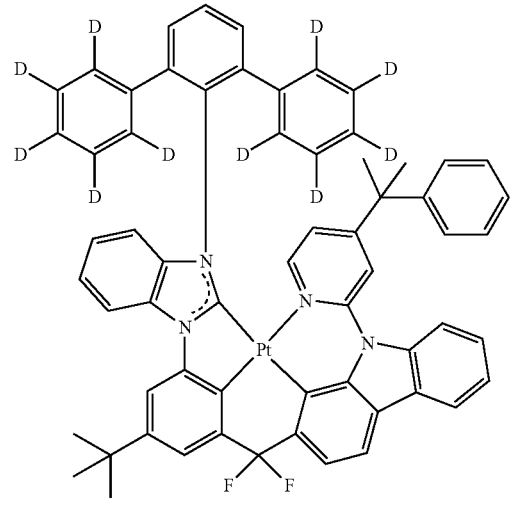
80

-continued
81
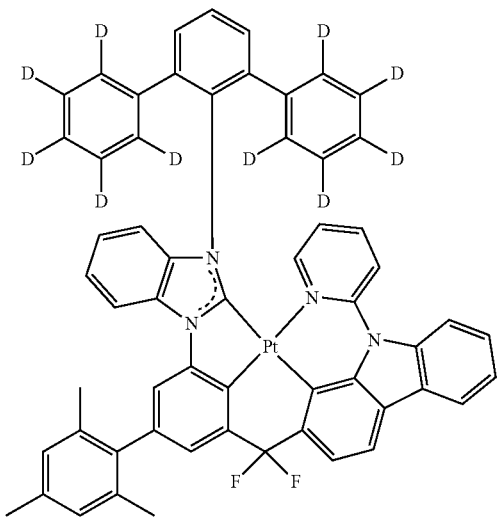
82
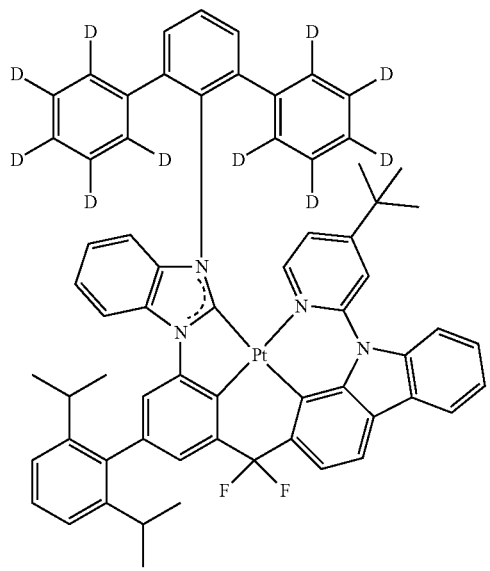
83
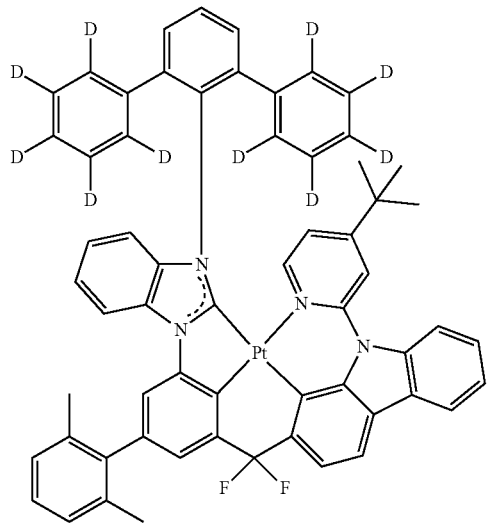
-continued
84
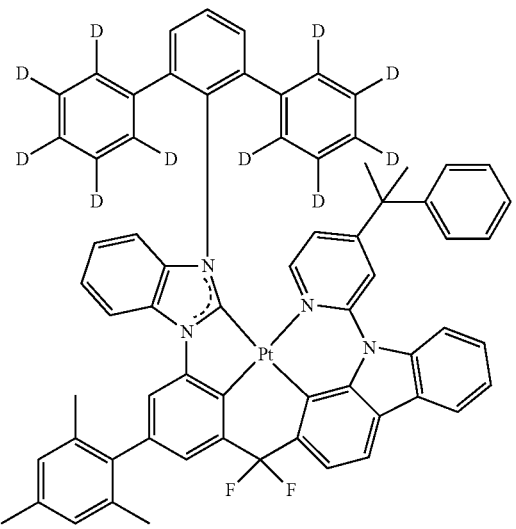
85
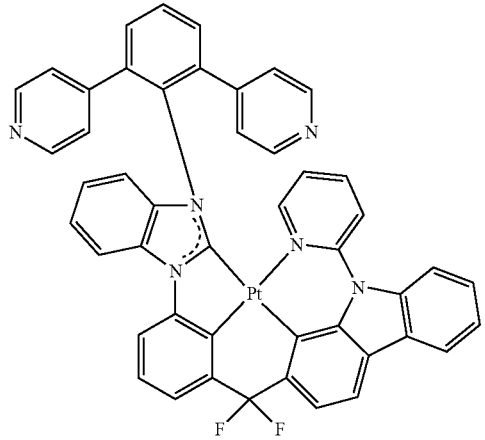
86
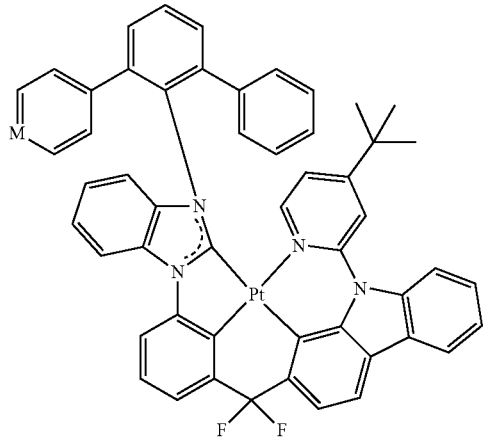

87
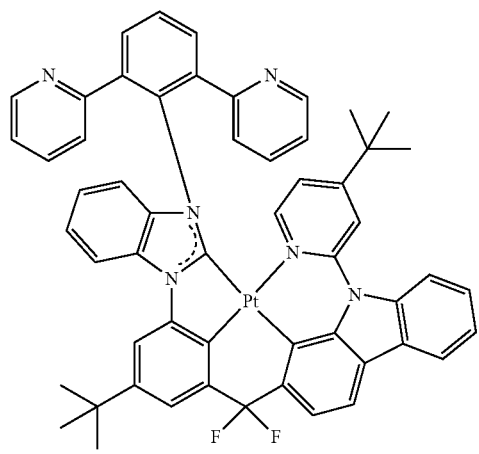
88
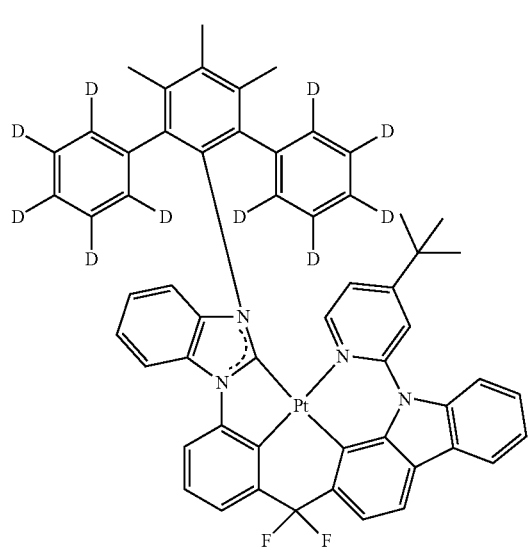
89
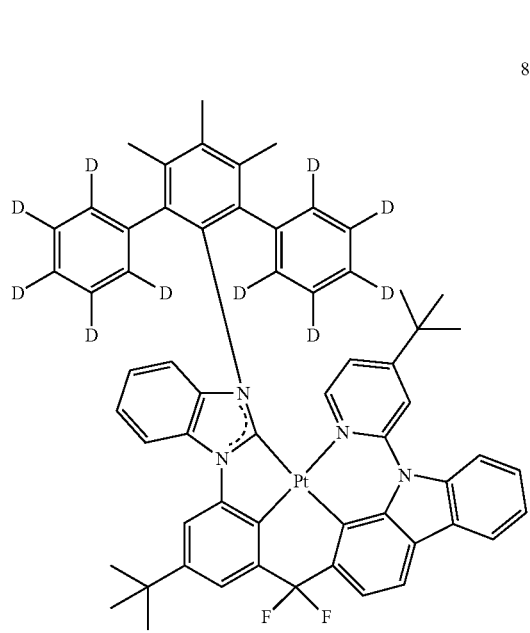
90
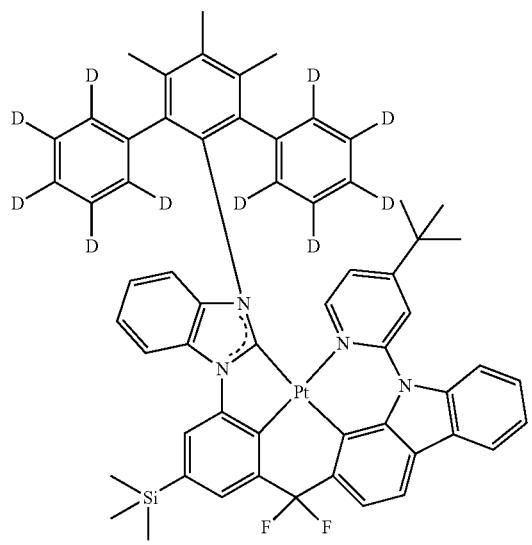
91
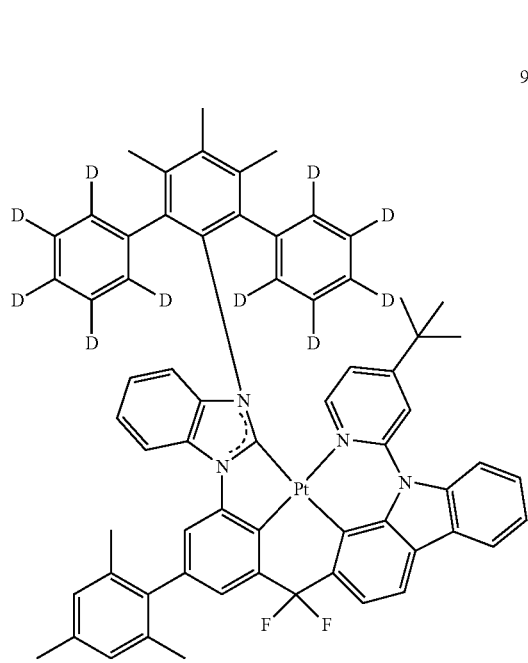

243
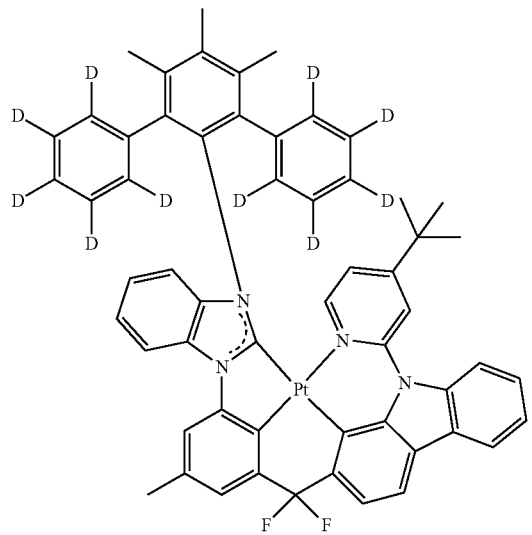
244
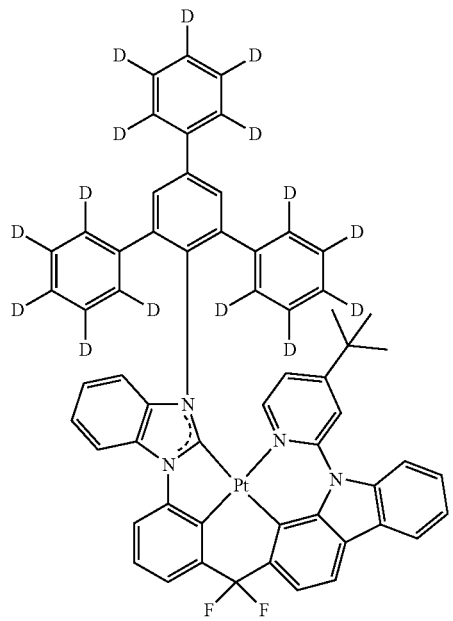
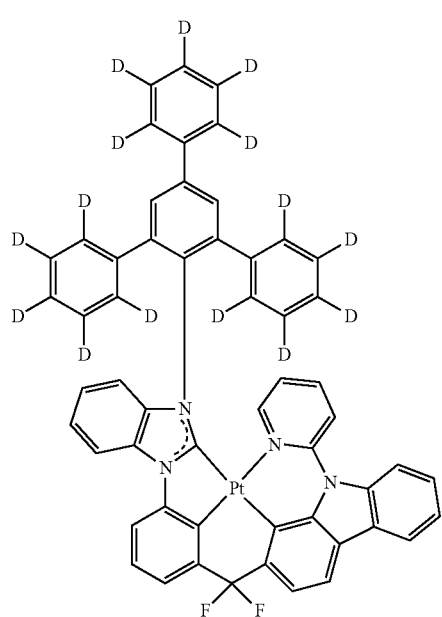
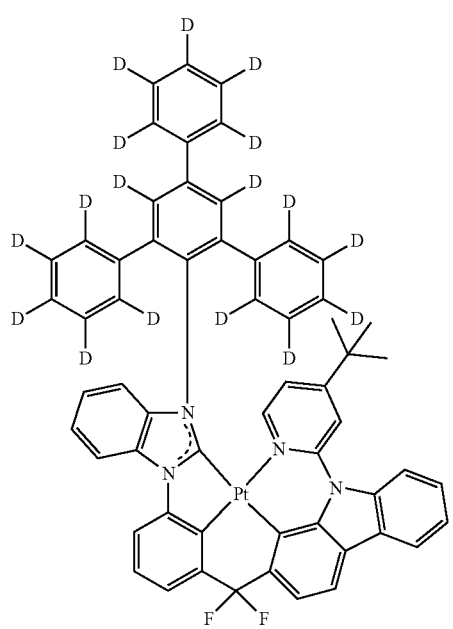

96
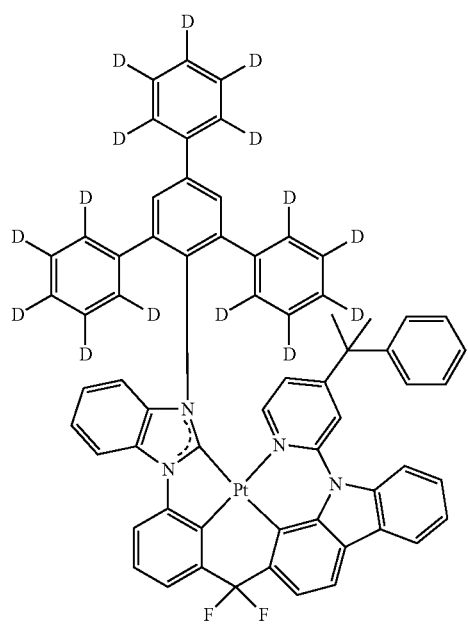
98
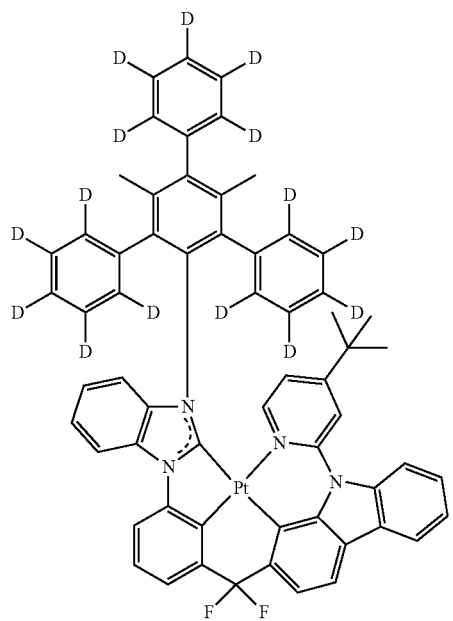
97
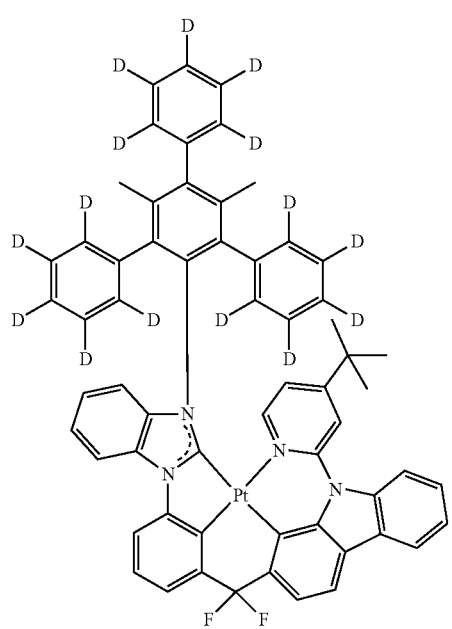
99
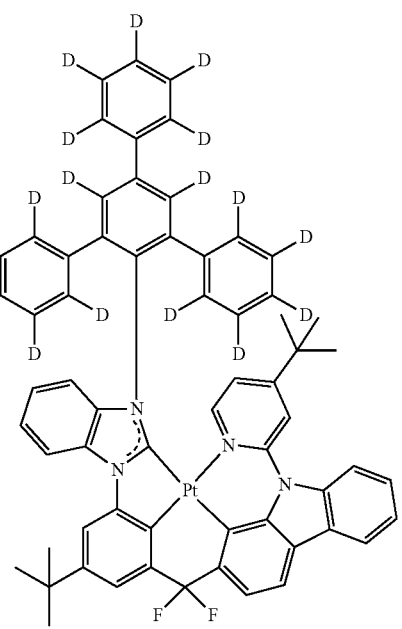

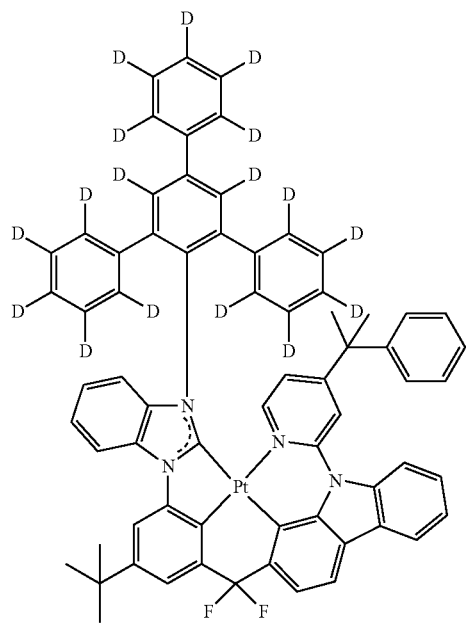
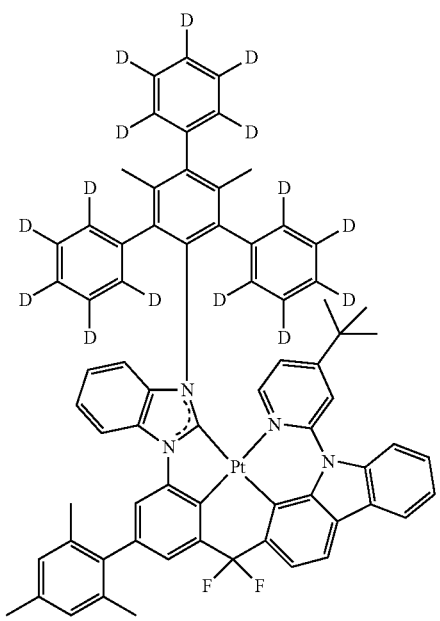
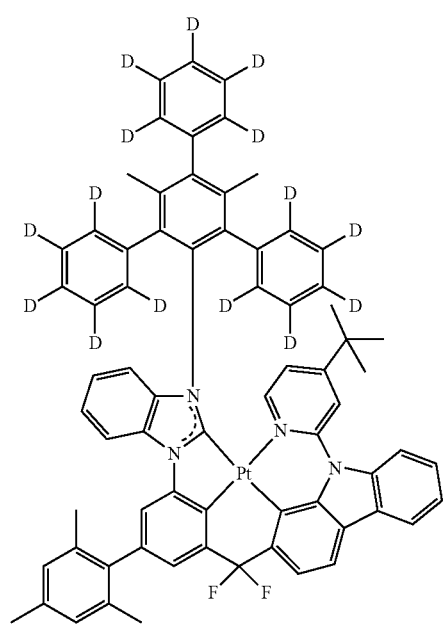

-continued
104
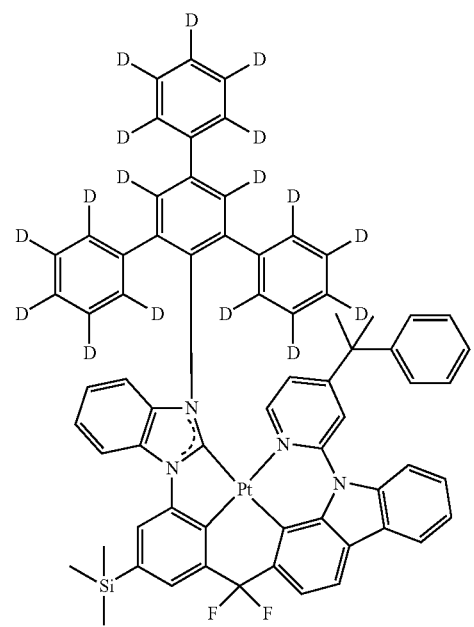
105
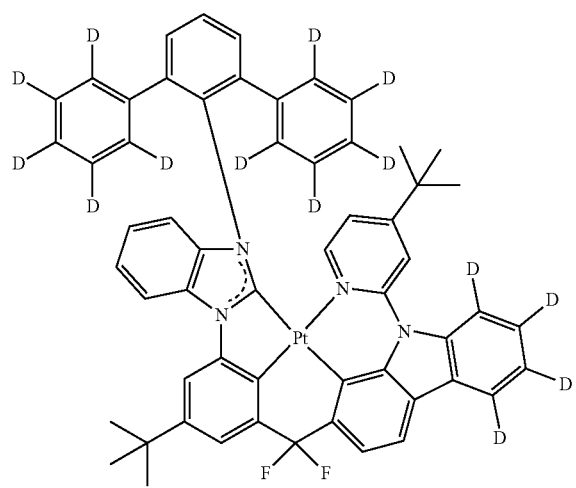
106
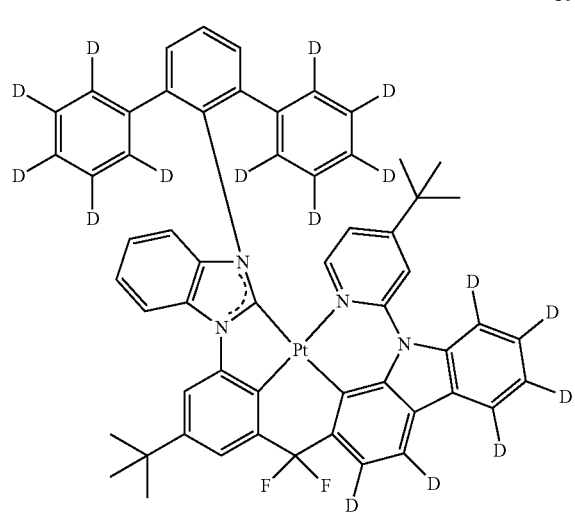
-continued
107
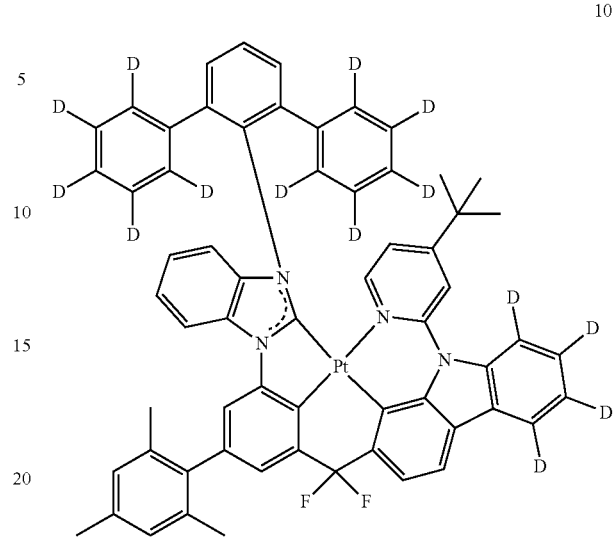
108
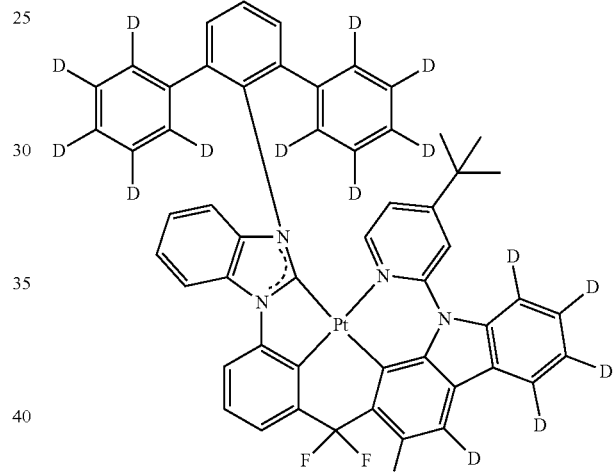
109
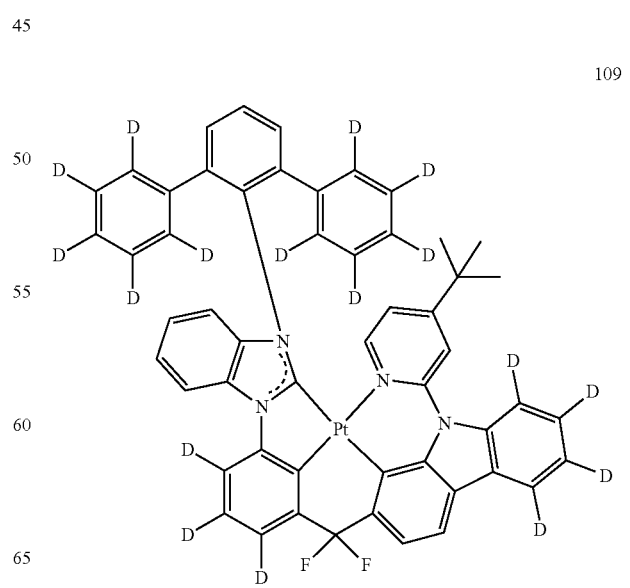

251
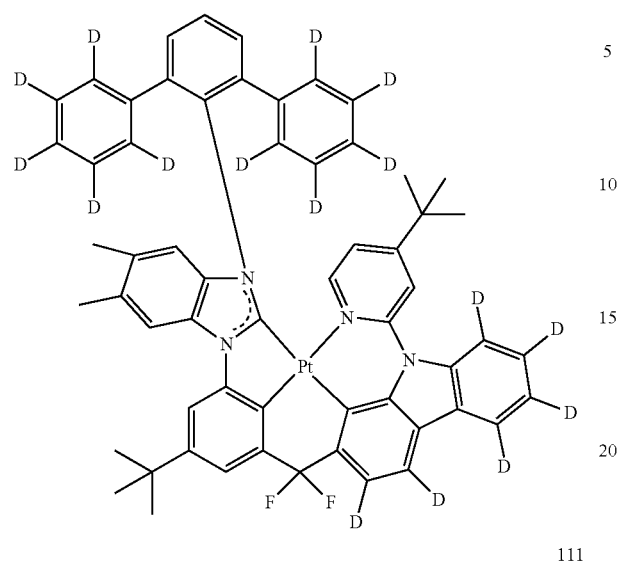
110
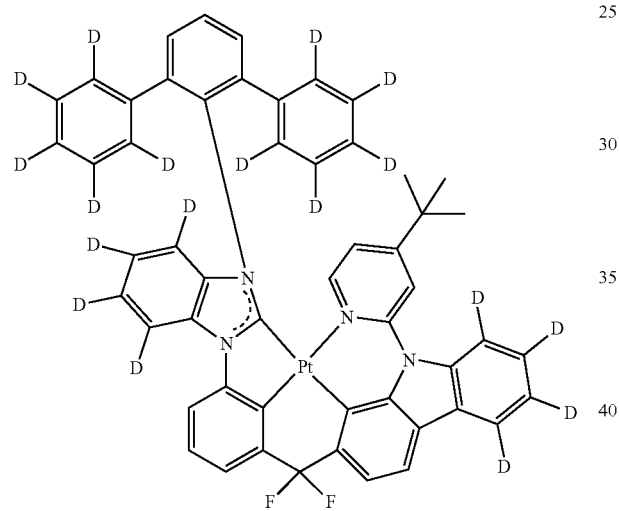
111
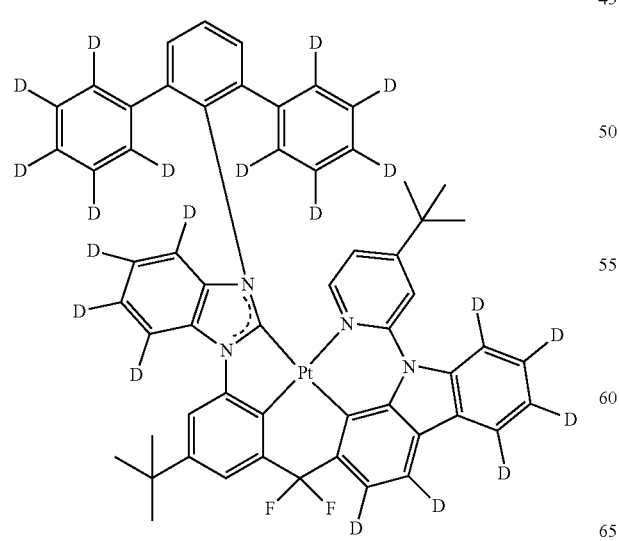
112
252
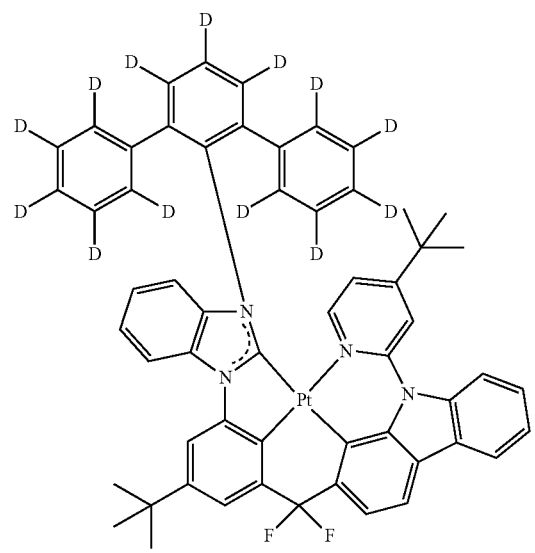
113
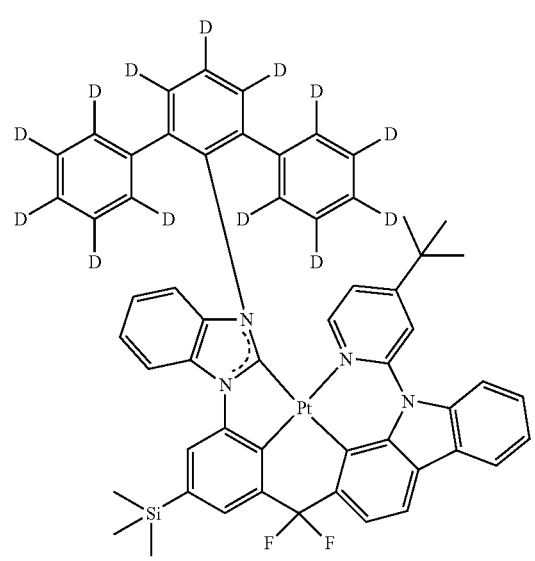
114

253
-continued
254
-continued
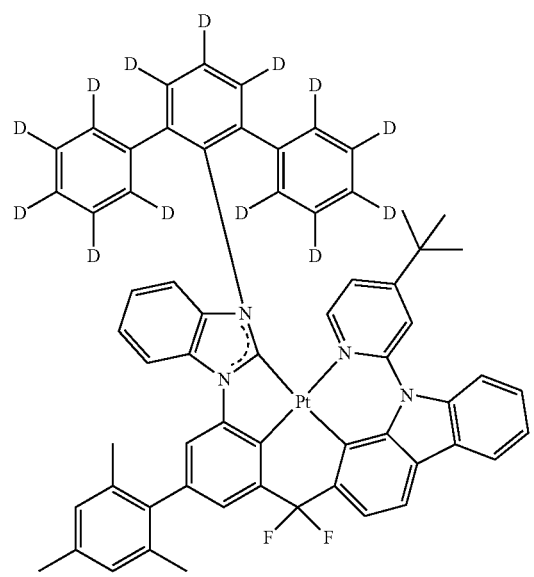

255
-continued
119
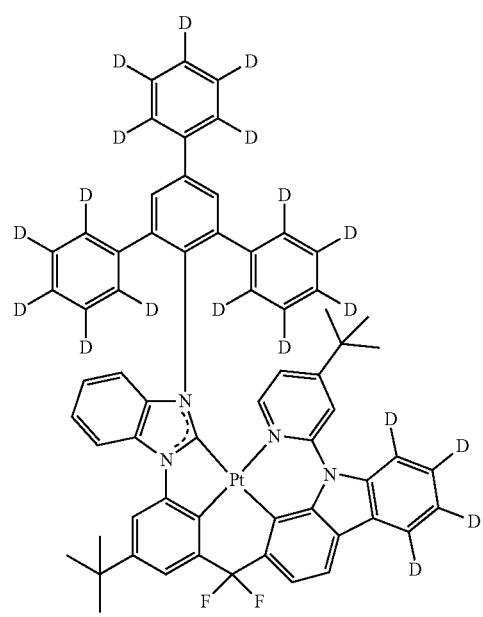
256
-continued
120
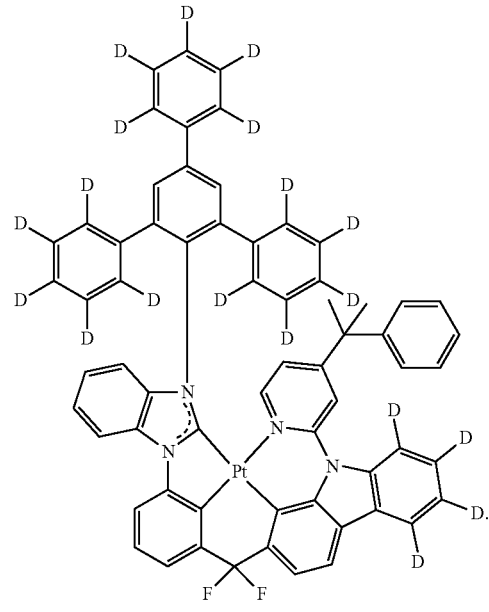
* * * * *